United States Patent [19]
Perlov et al.

[11] Patent Number: 6,086,457
[45] Date of Patent: Jul. 11, 2000

[54] WASHING TRANSFER STATION IN A SYSTEM FOR CHEMICAL MECHANICAL POLISHING

[75] Inventors: Ilya Perlov; Eugene Gantvarg, both of Santa Clara, Calif.

[73] Assignee: Applied Materials, Inc., Santa Clara, Calif.

[21] Appl. No.: 09/290,042

[22] Filed: Apr. 12, 1999

Related U.S. Application Data

[62] Division of application No. 09/042,204, Mar. 13, 1998, which is a division of application No. 08/549,336, Oct. 27, 1995, Pat. No. 5,738,574.

[51] Int. Cl.⁷ ............................................. B24B 1/00
[52] U.S. Cl. ............................ 451/41; 451/285; 451/288; 451/287; 451/57
[58] Field of Search ................................. 451/41, 5, 285, 451/291, 401, 57

[56] References Cited

U.S. PATENT DOCUMENTS

| | | |
|---|---|---|
| 3,659,386 | 5/1972 | Goetz et al. . |
| 3,913,271 | 10/1975 | Boettcher . |
| 4,141,180 | 2/1979 | Gill, Jr. et al. . |
| 4,502,252 | 3/1985 | Iwabuchi . |
| 5,329,732 | 7/1994 | Karlsrud et al. . |
| 5,421,768 | 6/1995 | Fujiwara et al. . |
| 5,655,954 | 8/1997 | Oishi et al. . |
| 5,679,059 | 10/1997 | Nishi et al. . |
| 5,827,110 | 10/1998 | Yajima et al. . |

FOREIGN PATENT DOCUMENTS

648575 A1  4/1995  European Pat. Off. .

*Primary Examiner*—Robert A. Rose
*Assistant Examiner*—George Nguyen
*Attorney, Agent, or Firm*—Charles S. Guenzer

[57] ABSTRACT

An apparatus and method for polishing semiconductor wafers and other workpieces that includes a polishing pads mounted on respective platens at multiple polishing stations. A transfer and washing station is disposed similarly to the polishing pads. The carousel simultaneously positions one of the heads over the transfer and washing station while the remaining heads are located over polishing stations for wafer polishing so that loading and unloading of wafers and washing of wafers and wafer heads can be performed concurrently with wafer polishing. A robot positioned to the side of the polishing apparatus automatically moves cassettes filled with wafers into a holding tub, and transfers individual wafers vertically held in the cassettes between the holding tub and the transfer and washing station. The transfer and washing station operates to not only transfer the wafers between the robot and the polishing heads, but also to wash the wafer and the polishing heads, for example, by liquid nozzles locate to the side of the station.

24 Claims, 74 Drawing Sheets

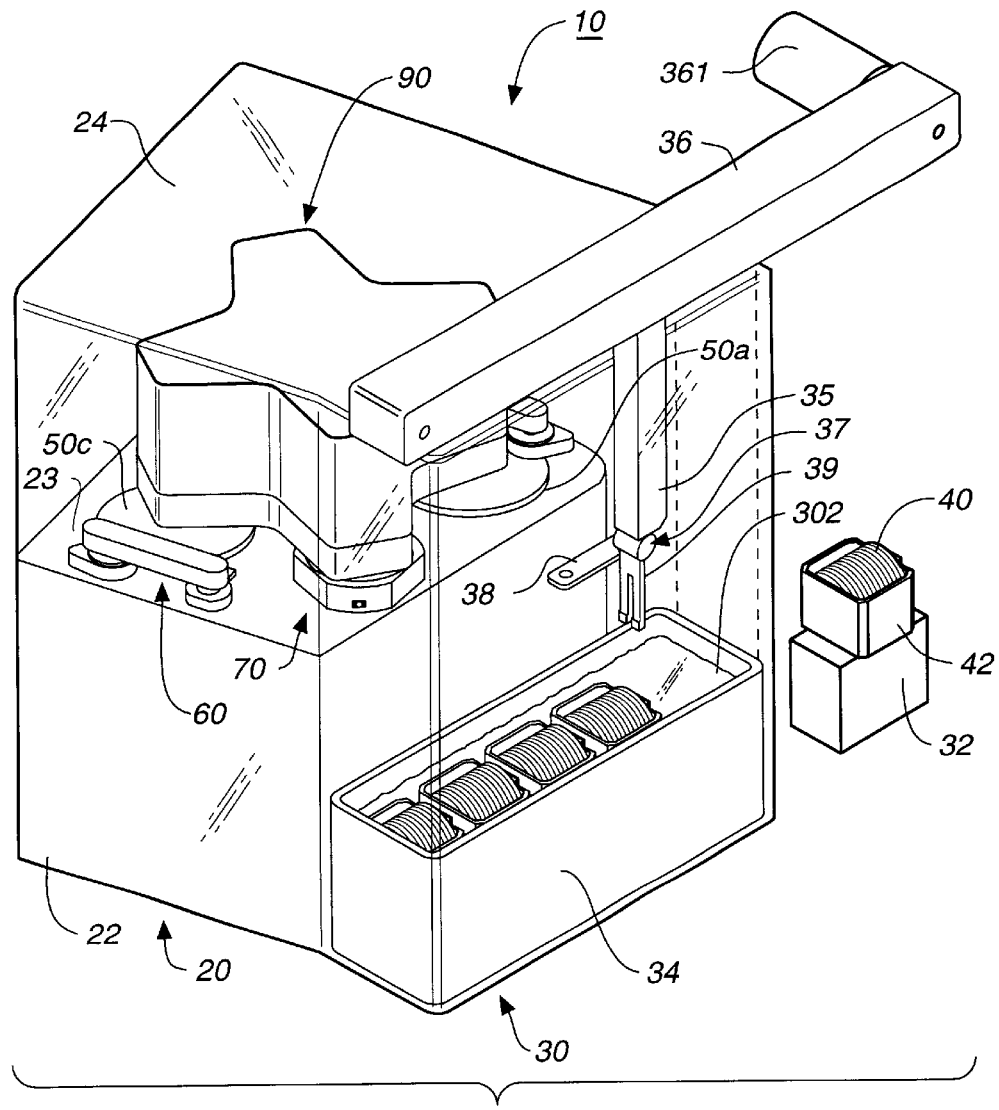
FIG._1
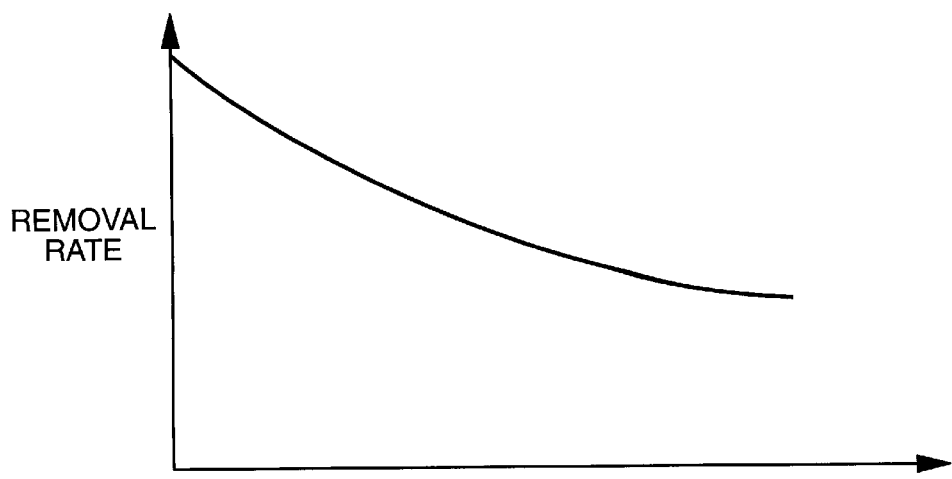
FIG._3

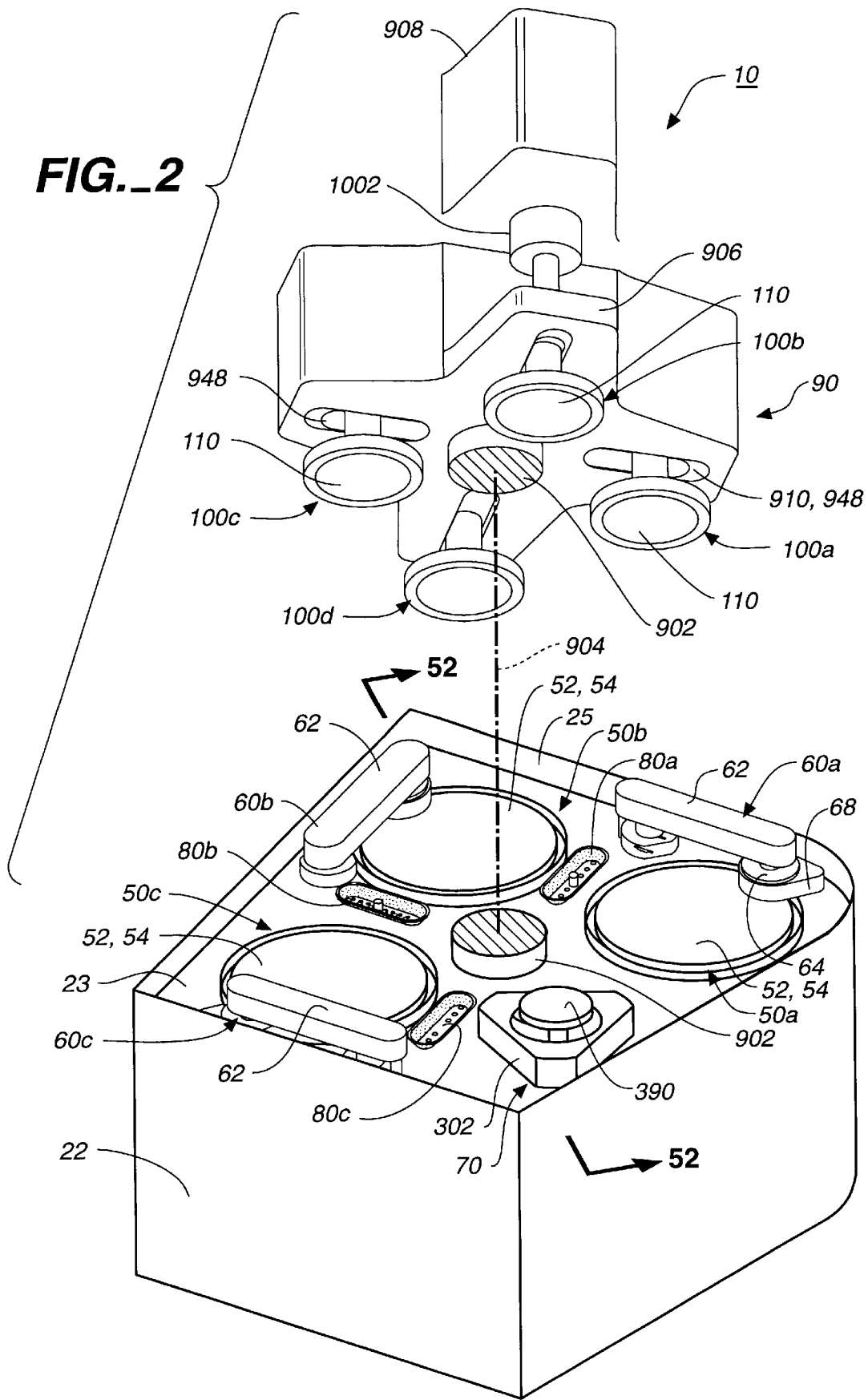

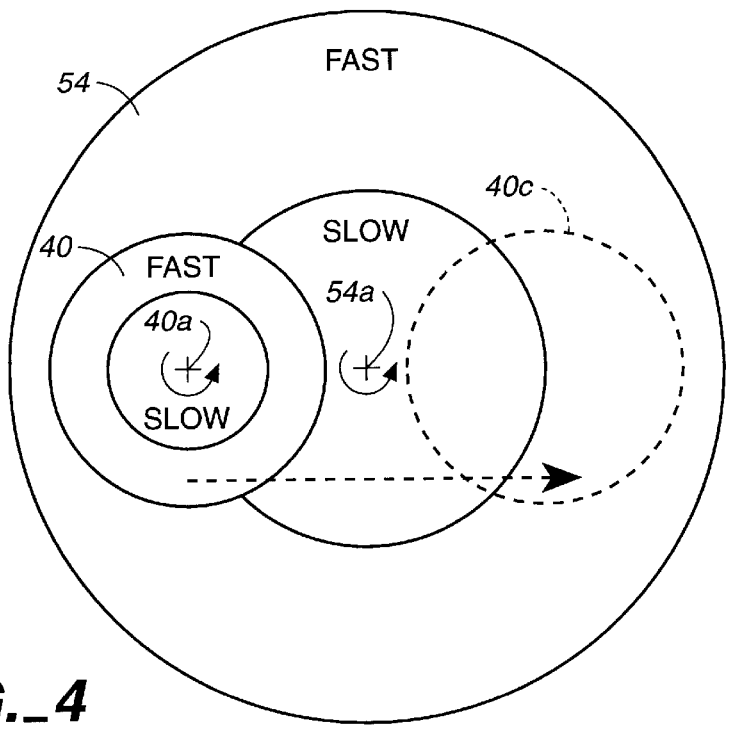
FIG._4
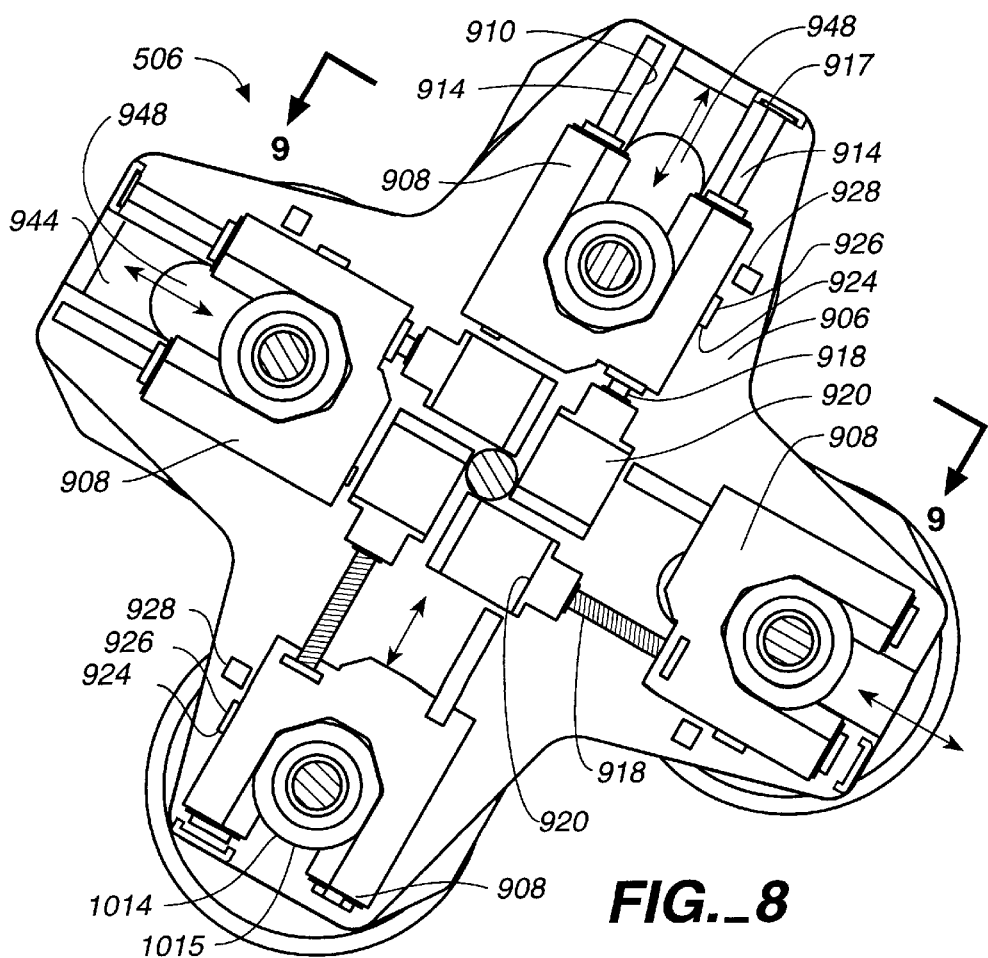
FIG._8

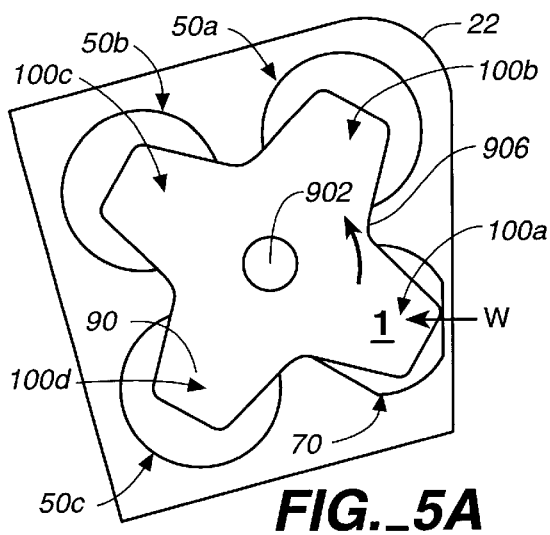
*FIG._5A*
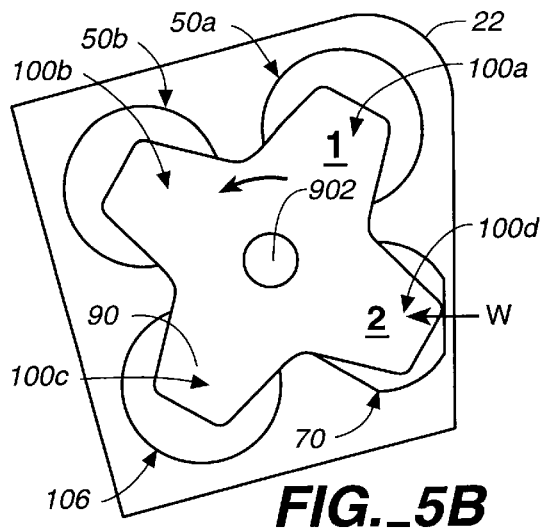
*FIG._5B*
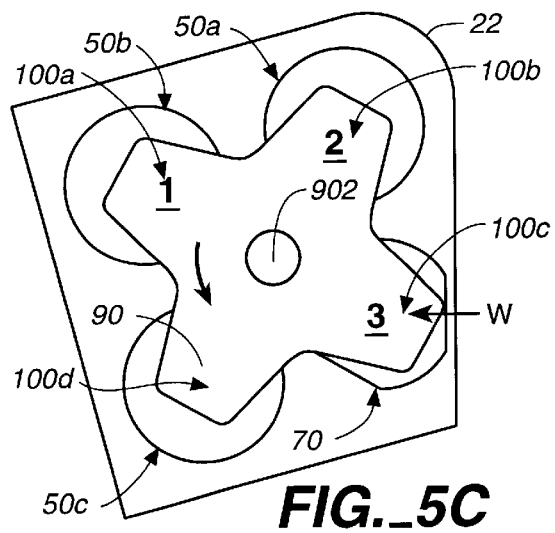
*FIG._5C*
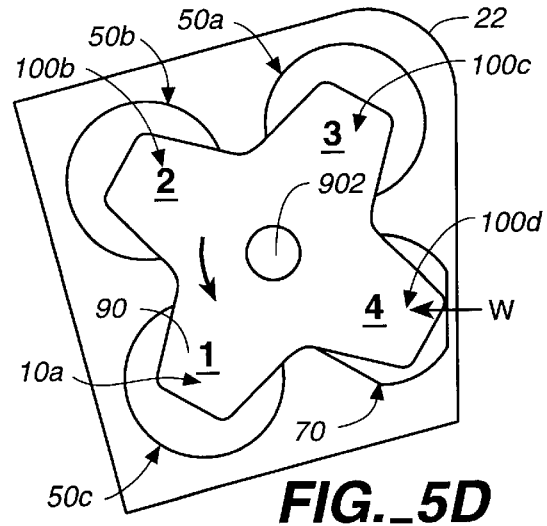
*FIG._5D*
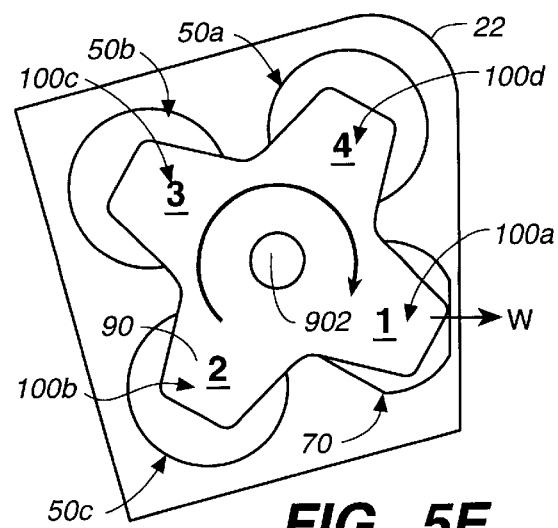
*FIG._5E*
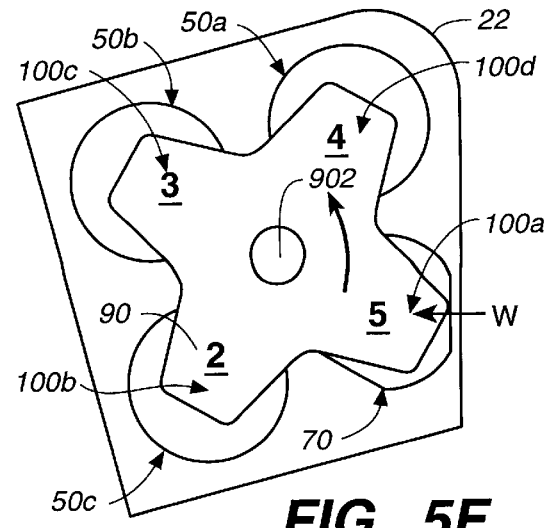
*FIG._5F*

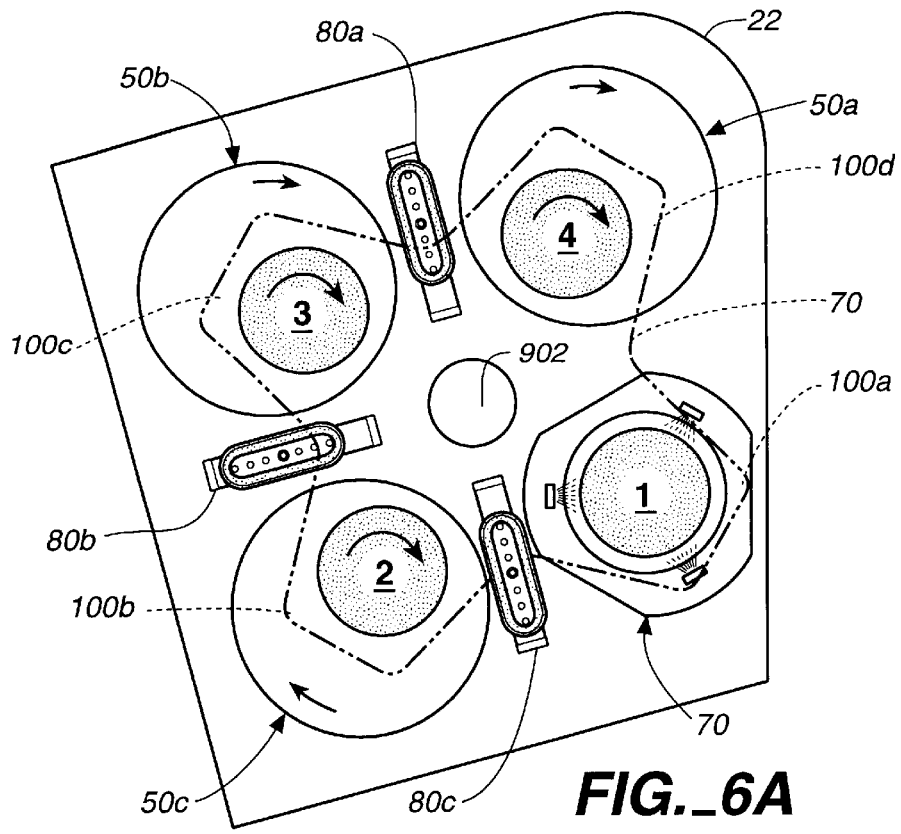
FIG._6A
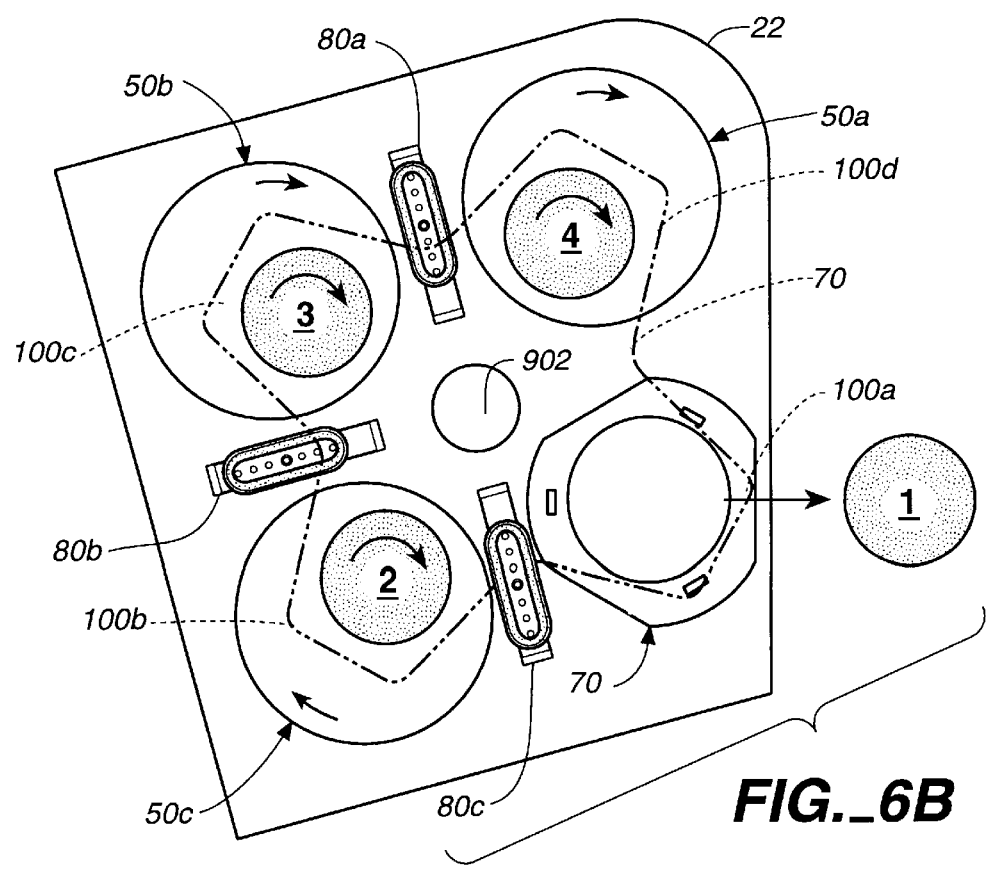
FIG._6B

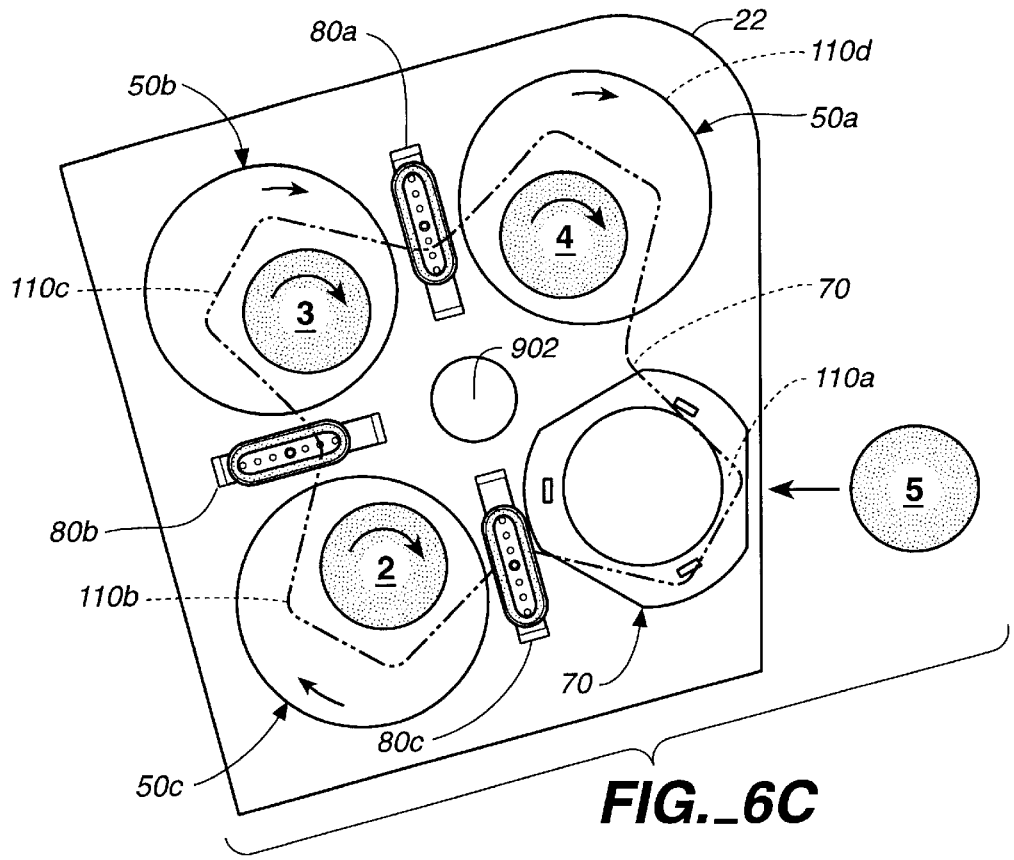
FIG._6C
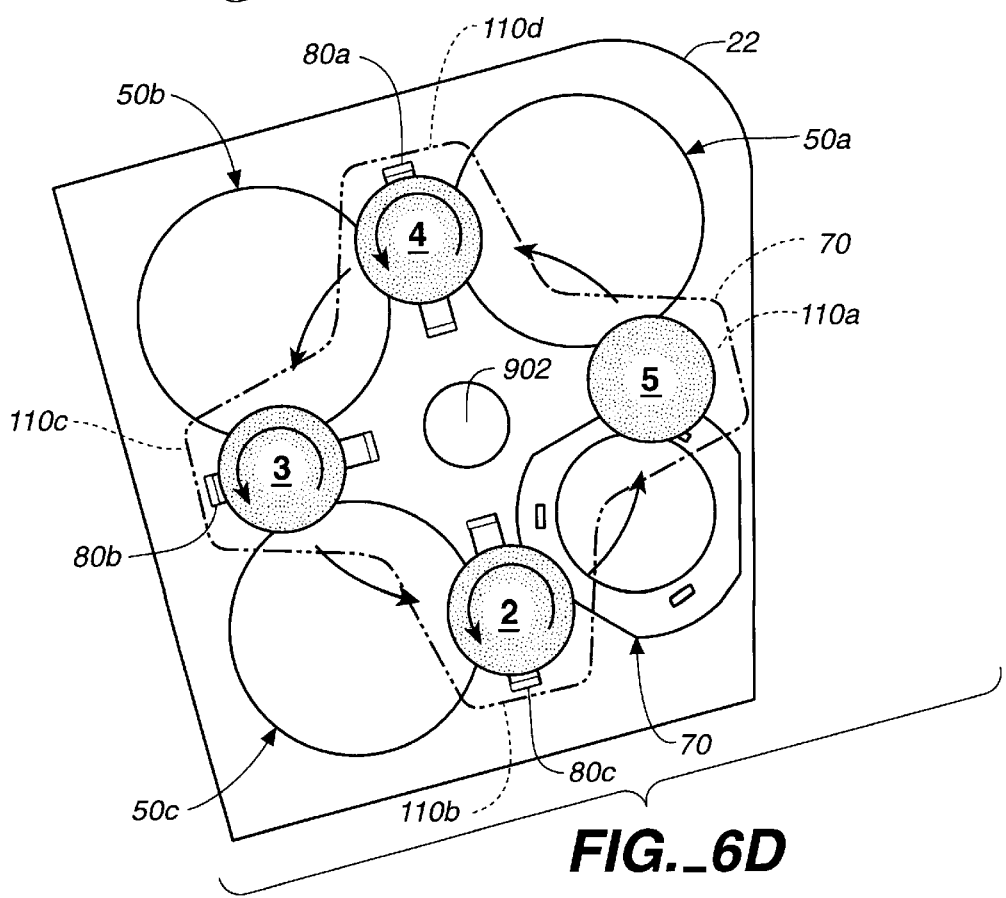
FIG._6D

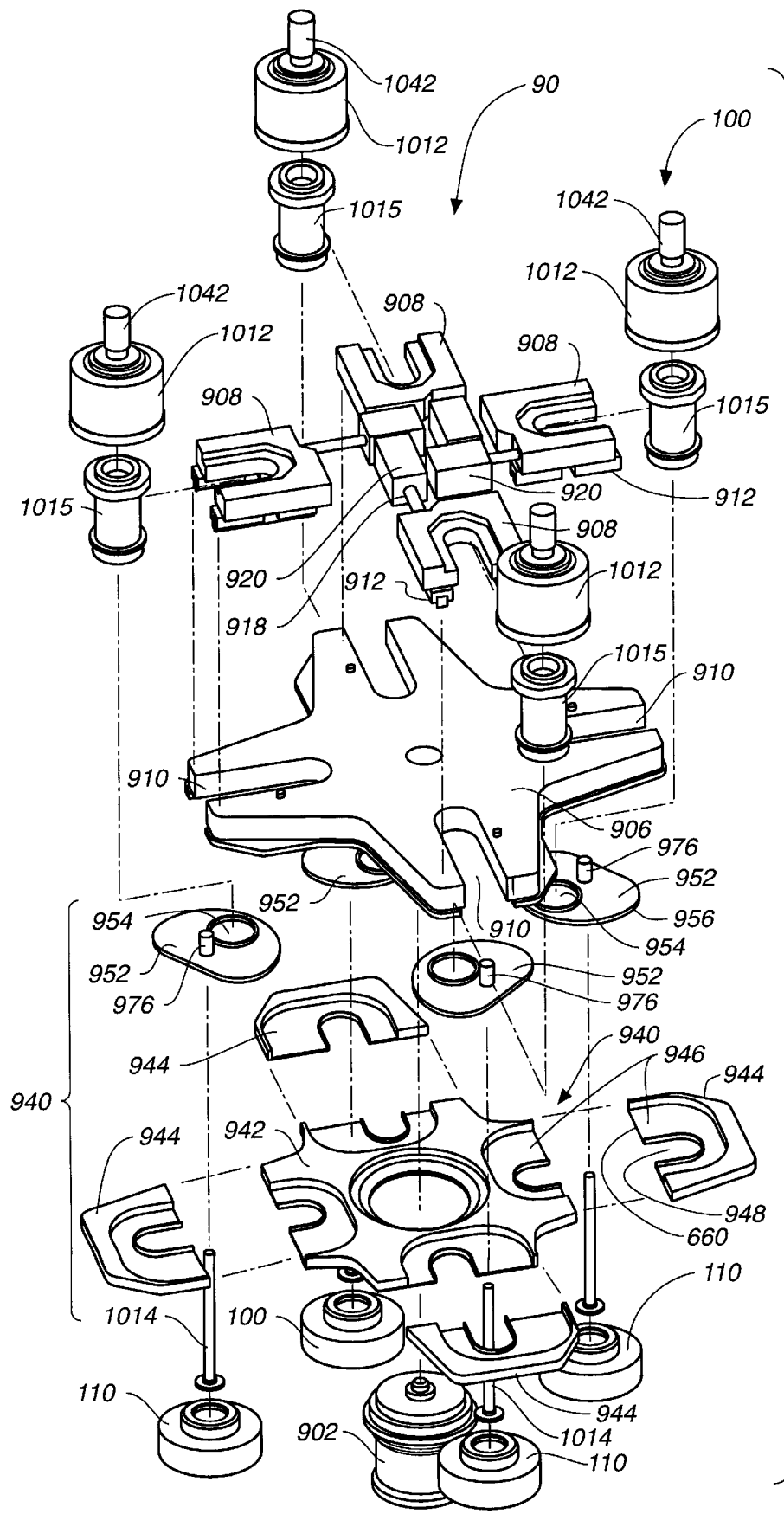
FIG._7

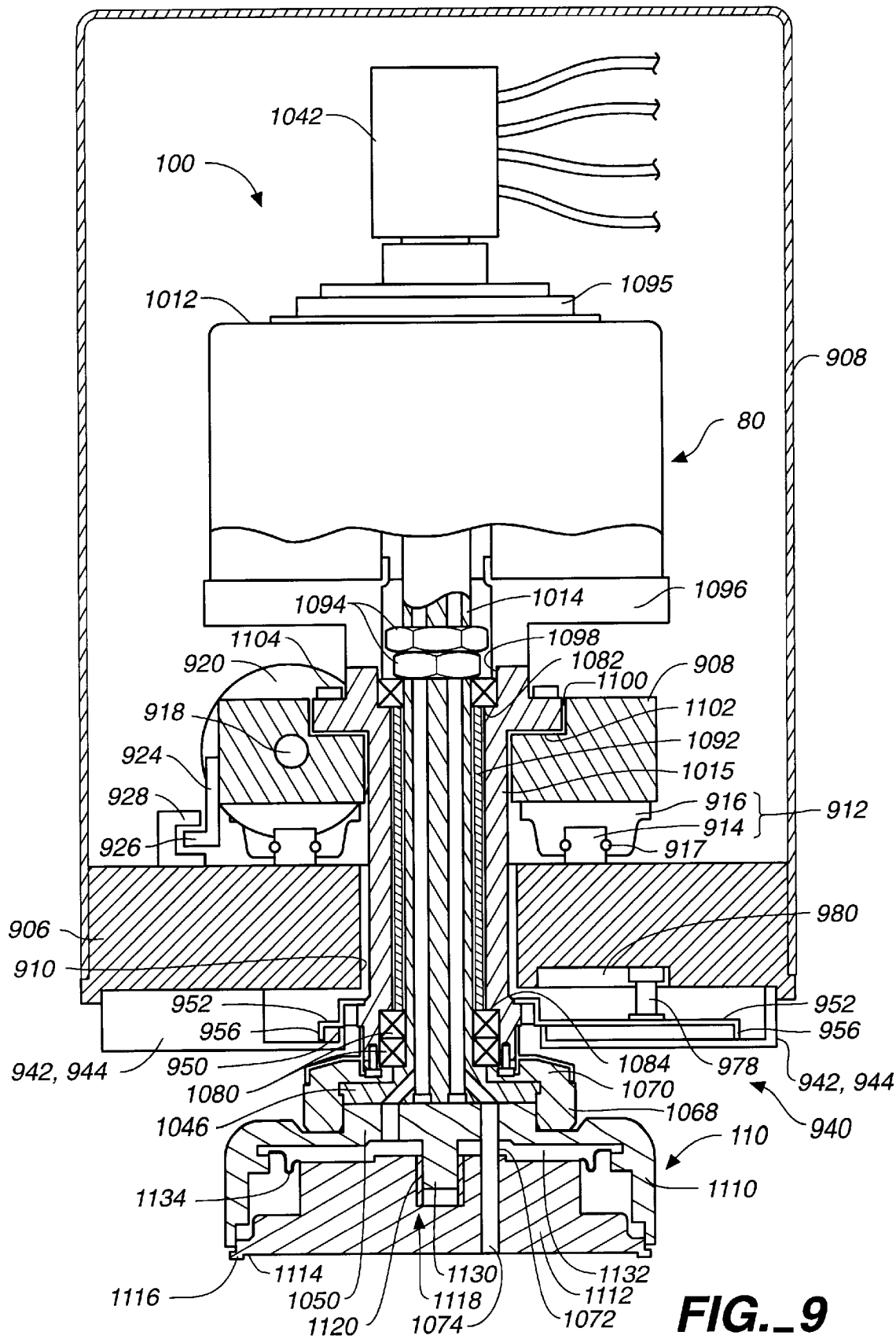
FIG._9

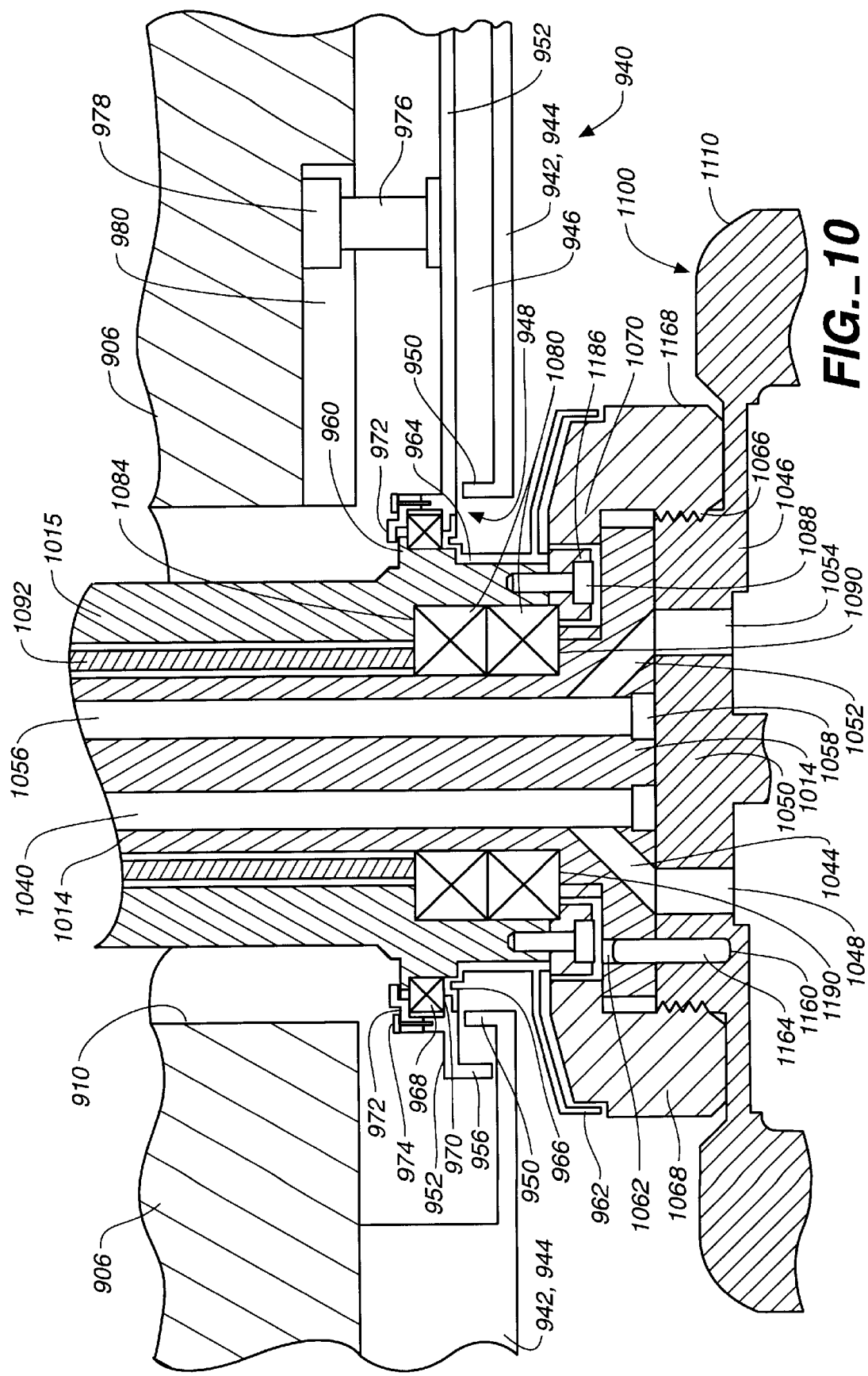
FIG._10

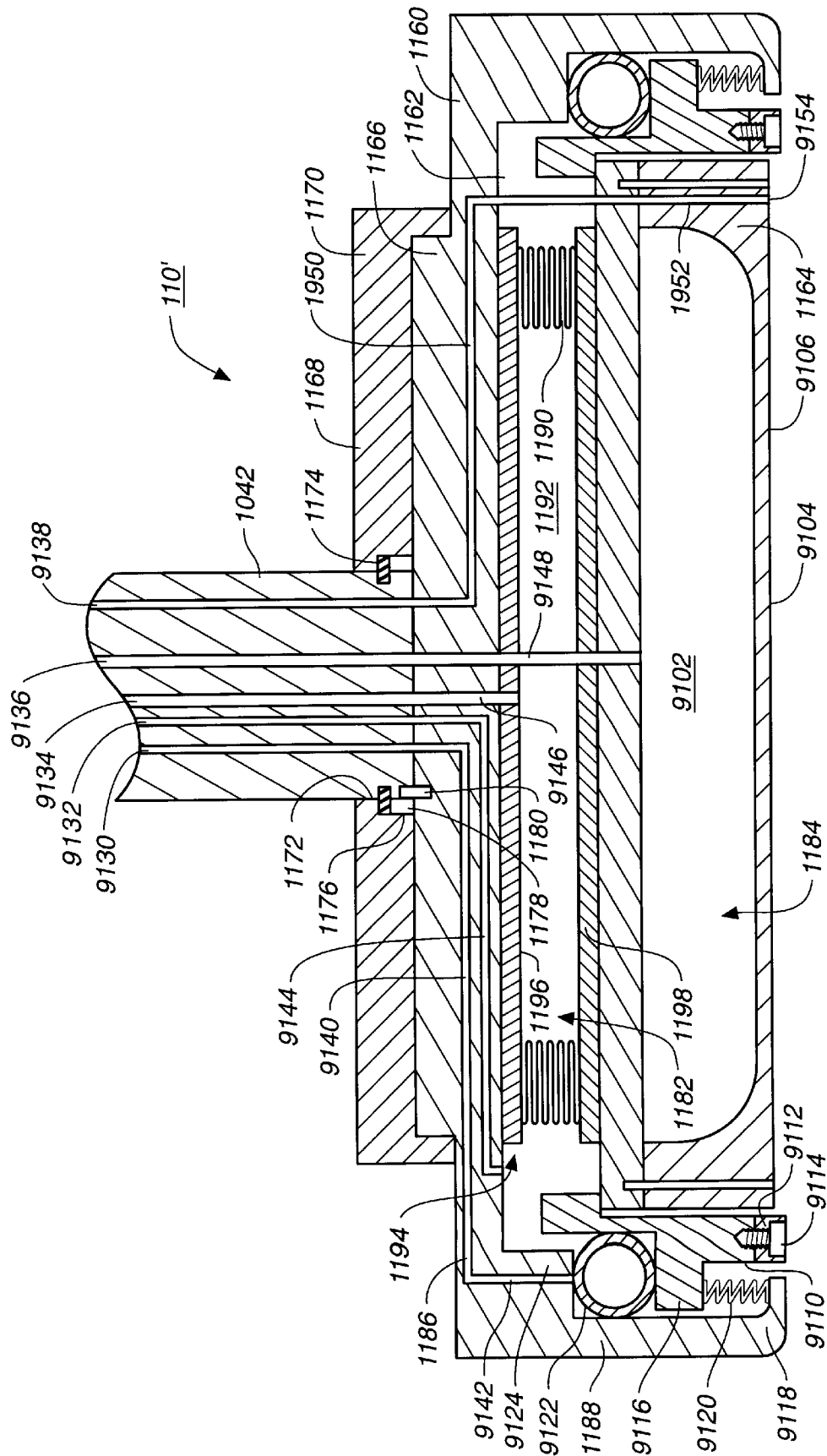
FIG._11

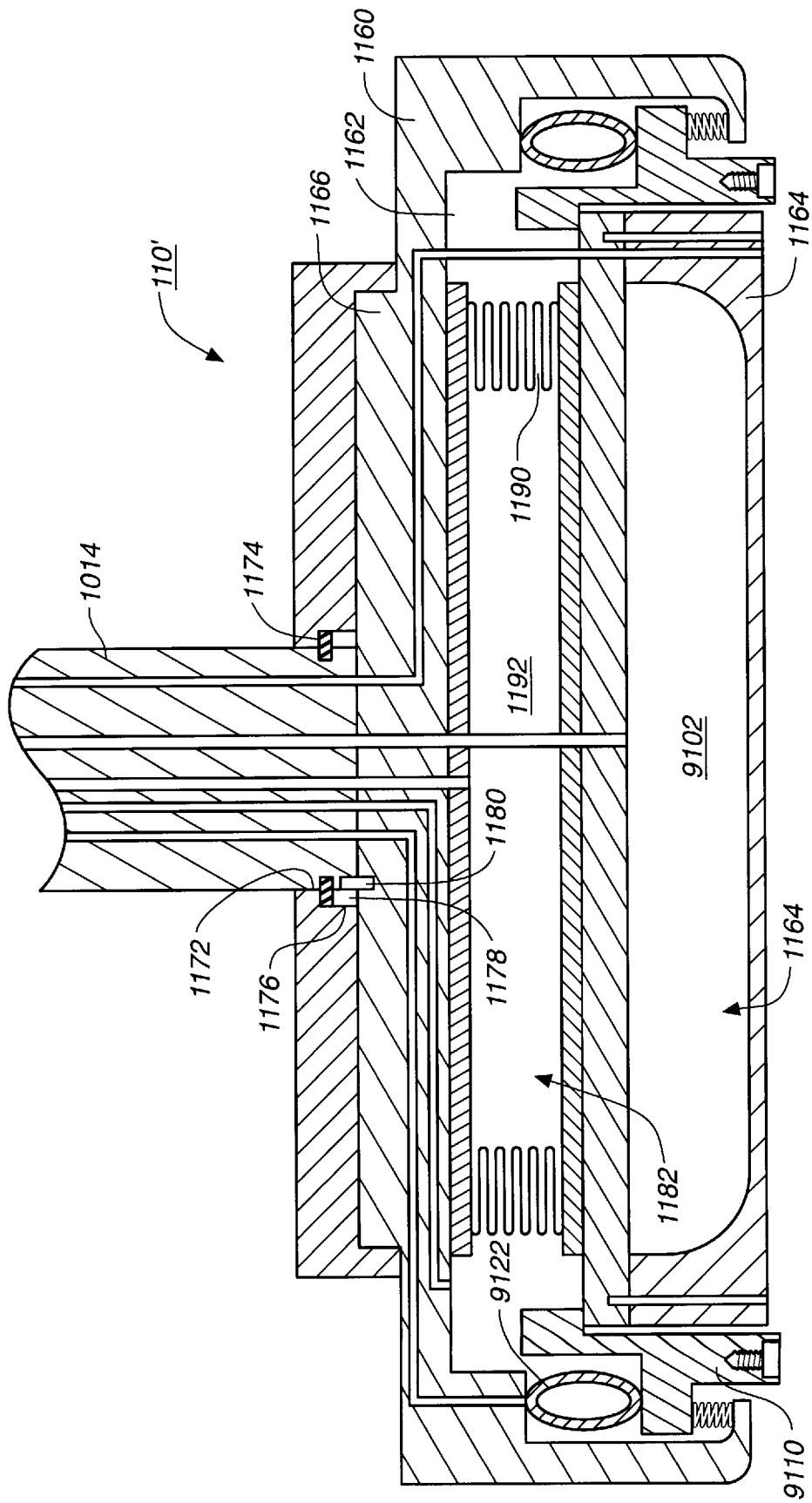
FIG._12

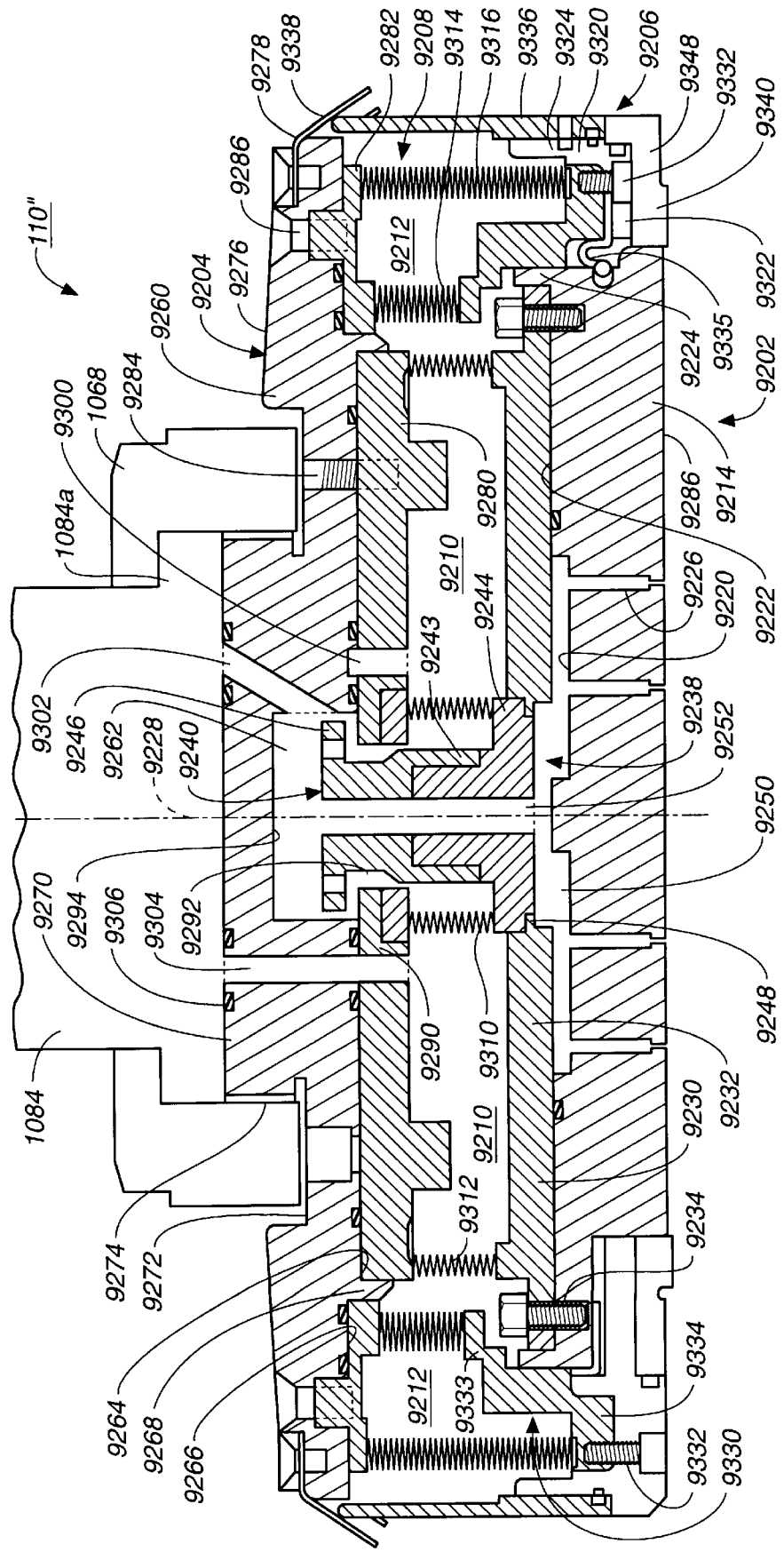
FIG._12A

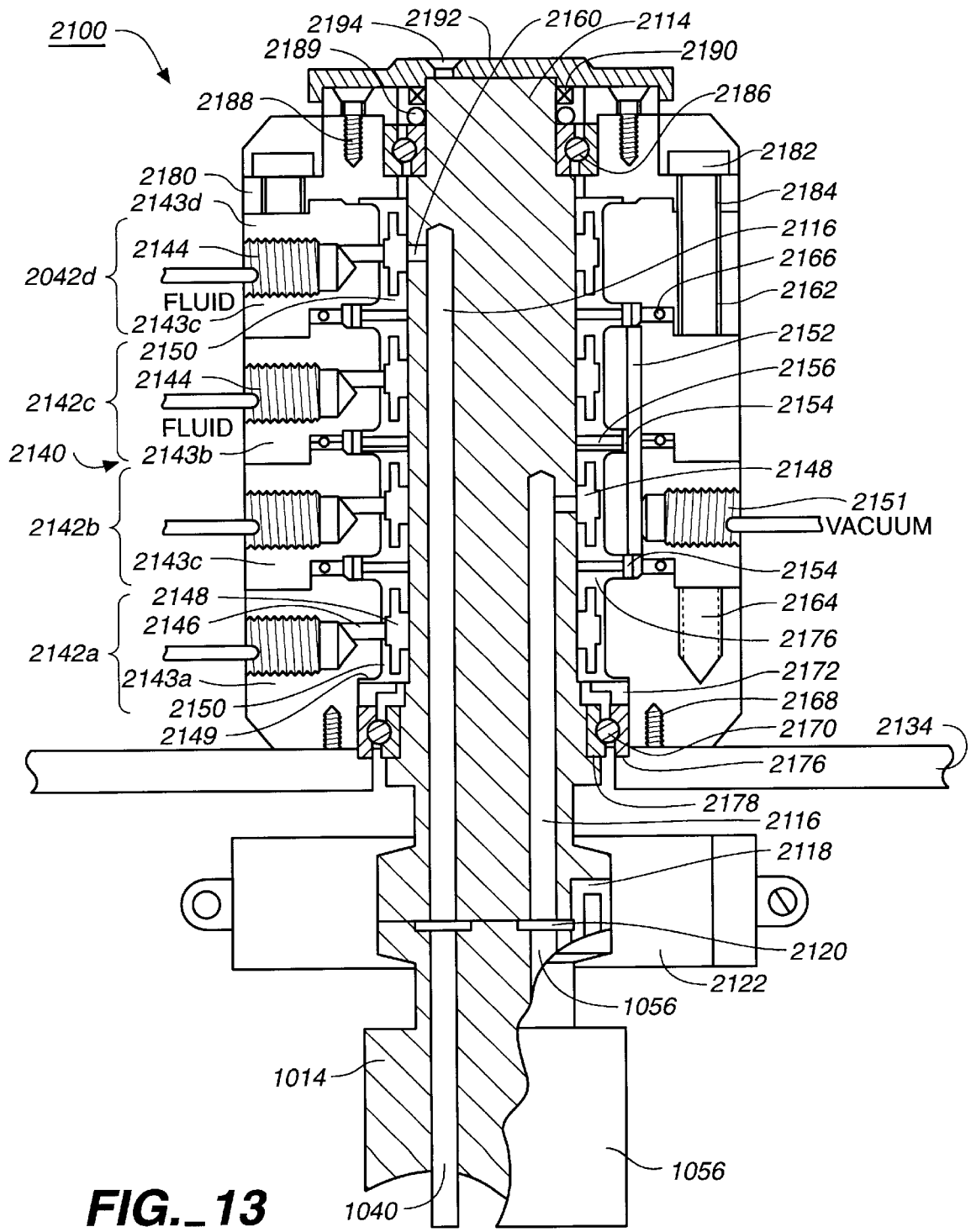
FIG._13

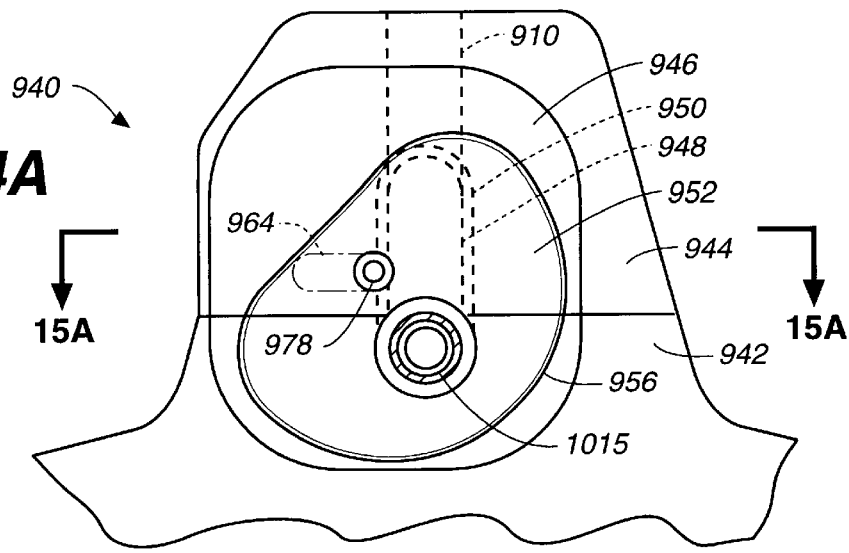
FIG._14A
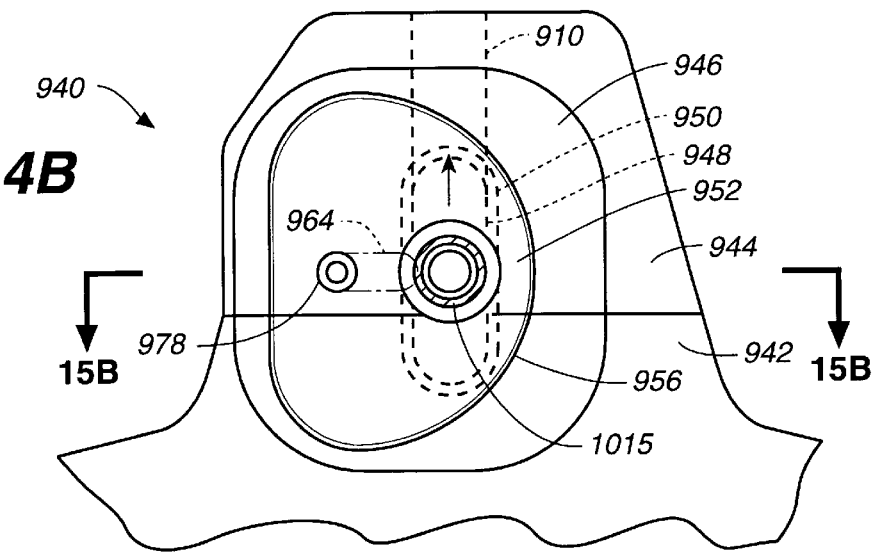
FIG._14B
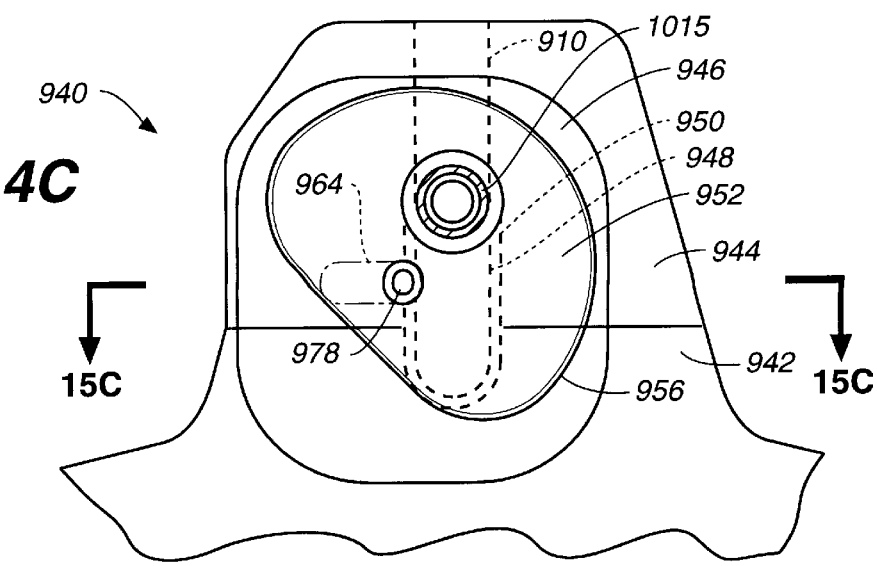
FIG._14C

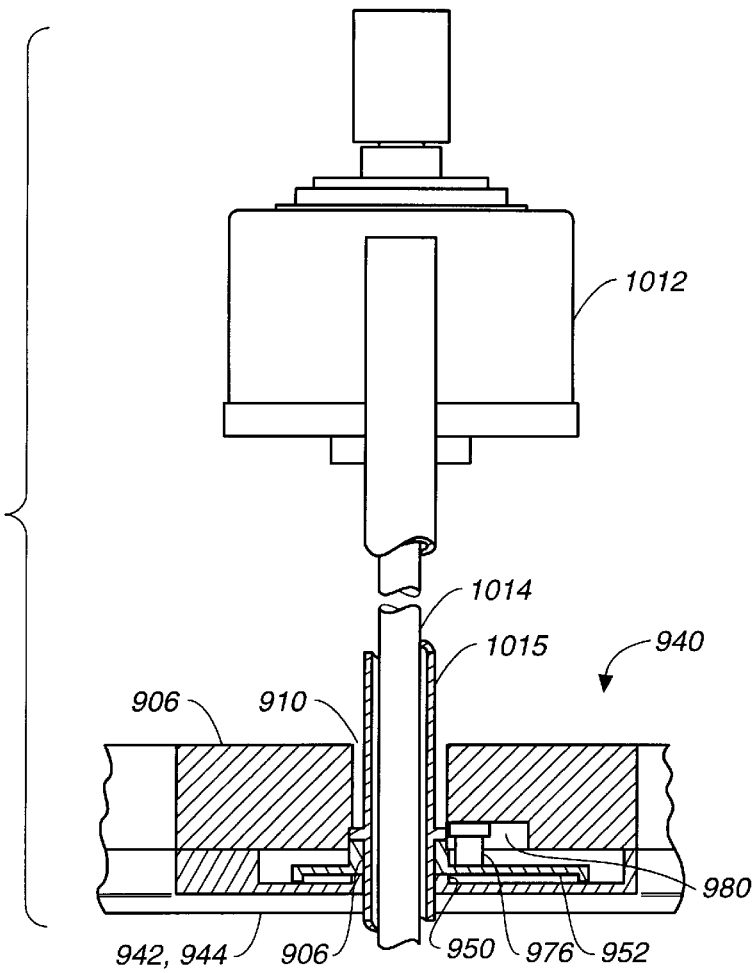
FIG._15A
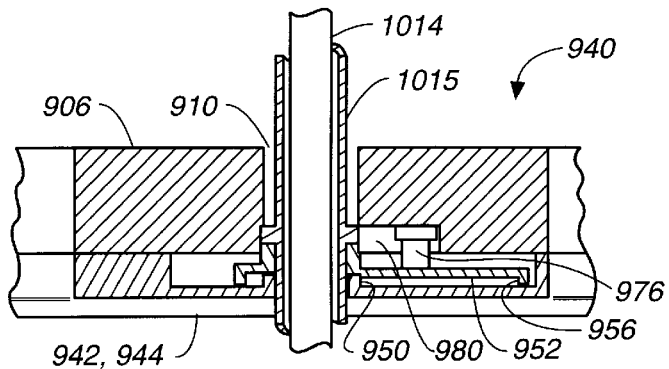
FIG._15B
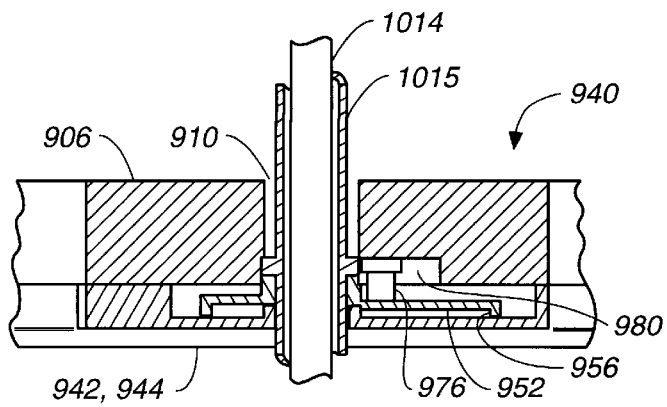
FIG._15C

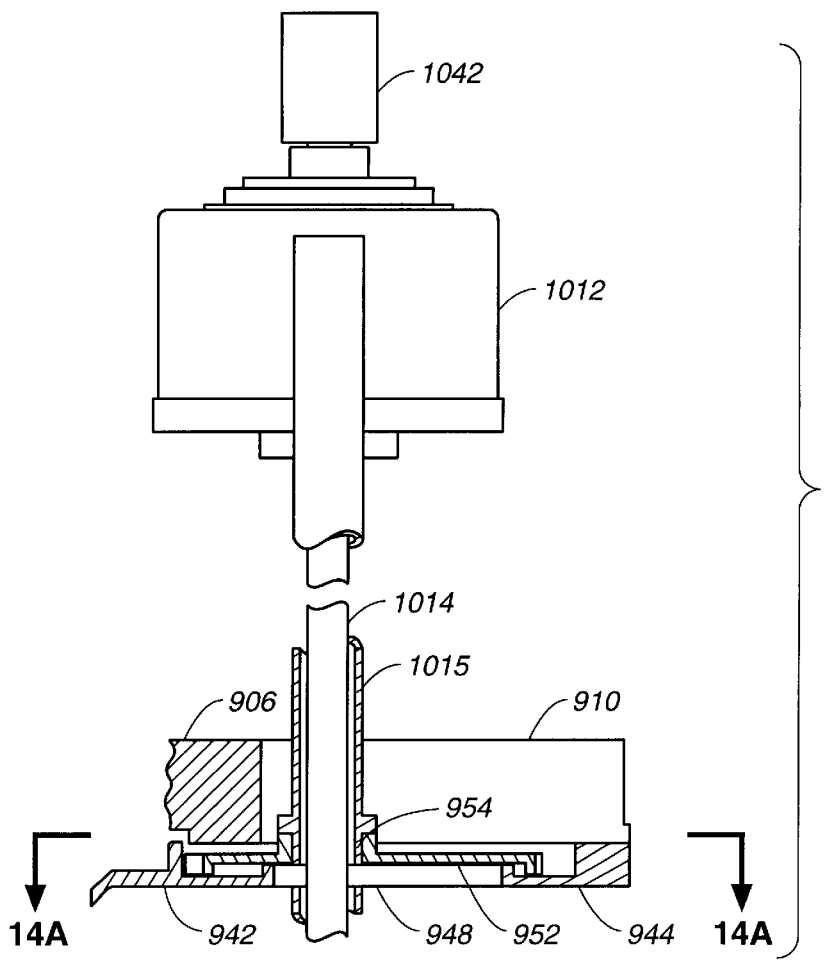
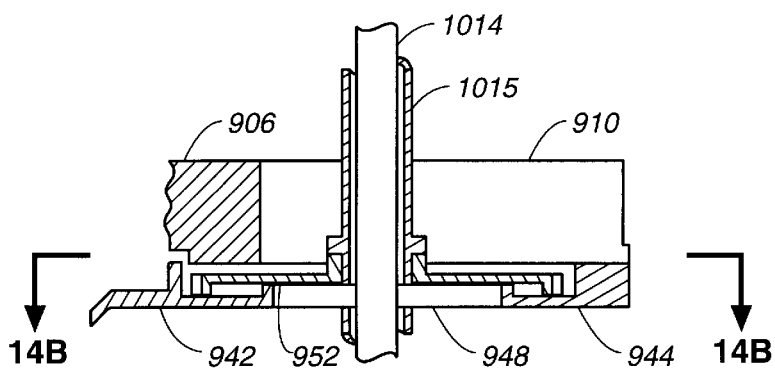
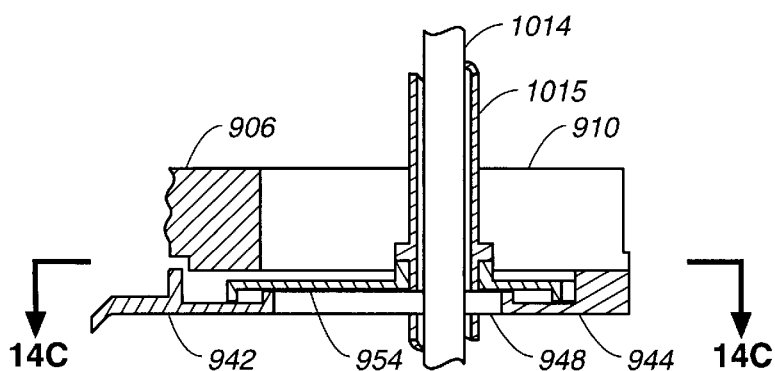

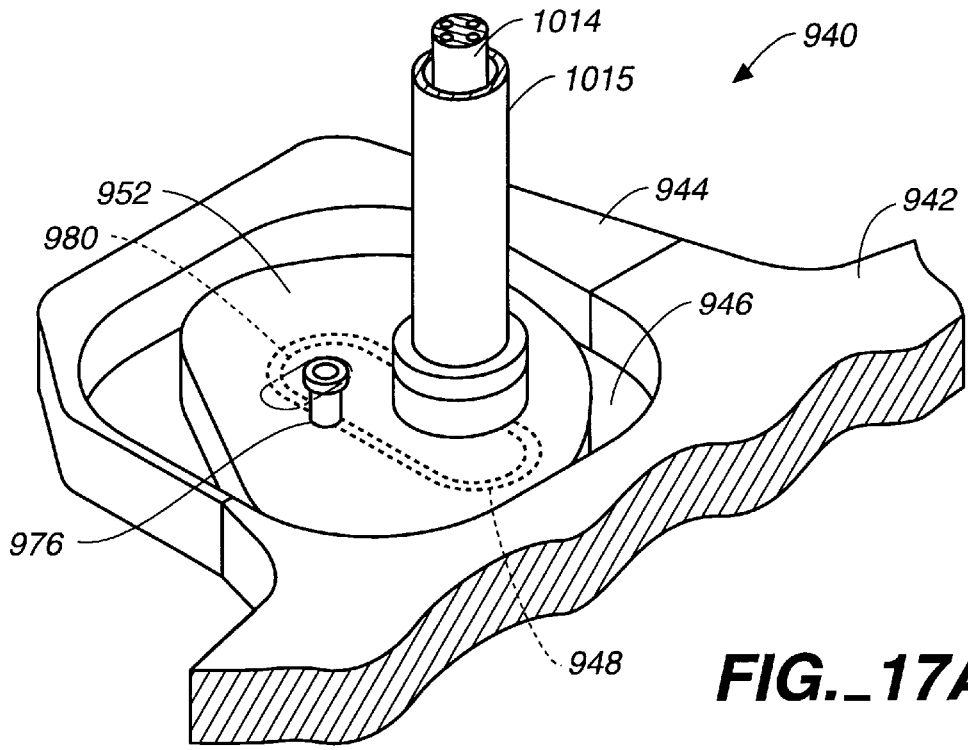
FIG._17A
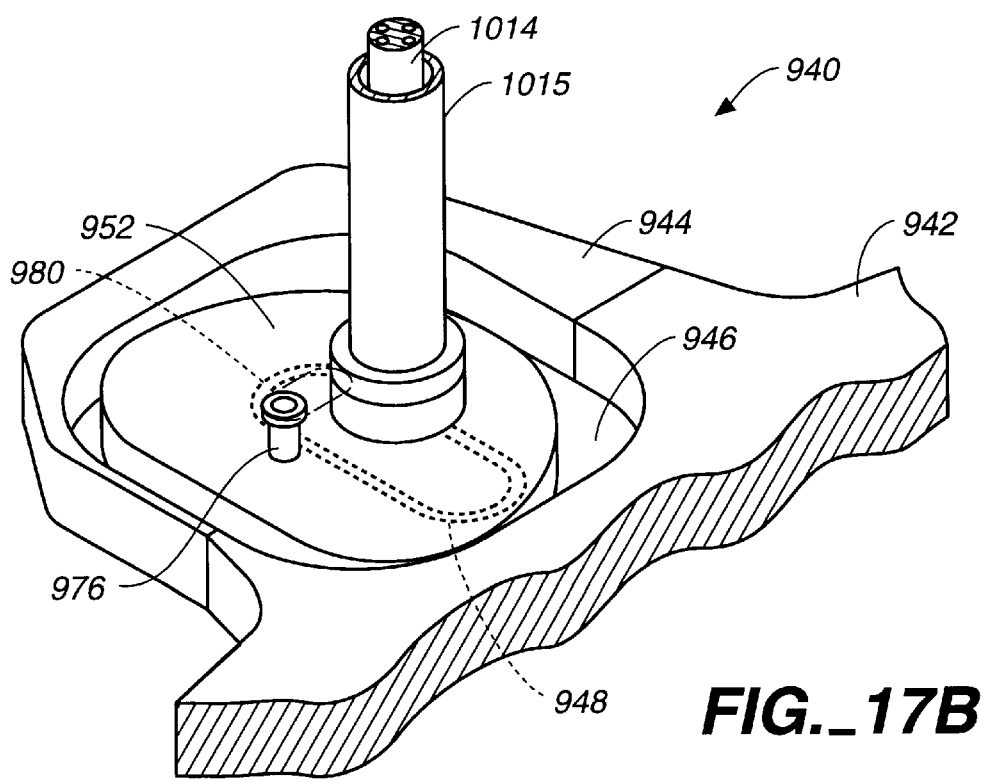
FIG._17B

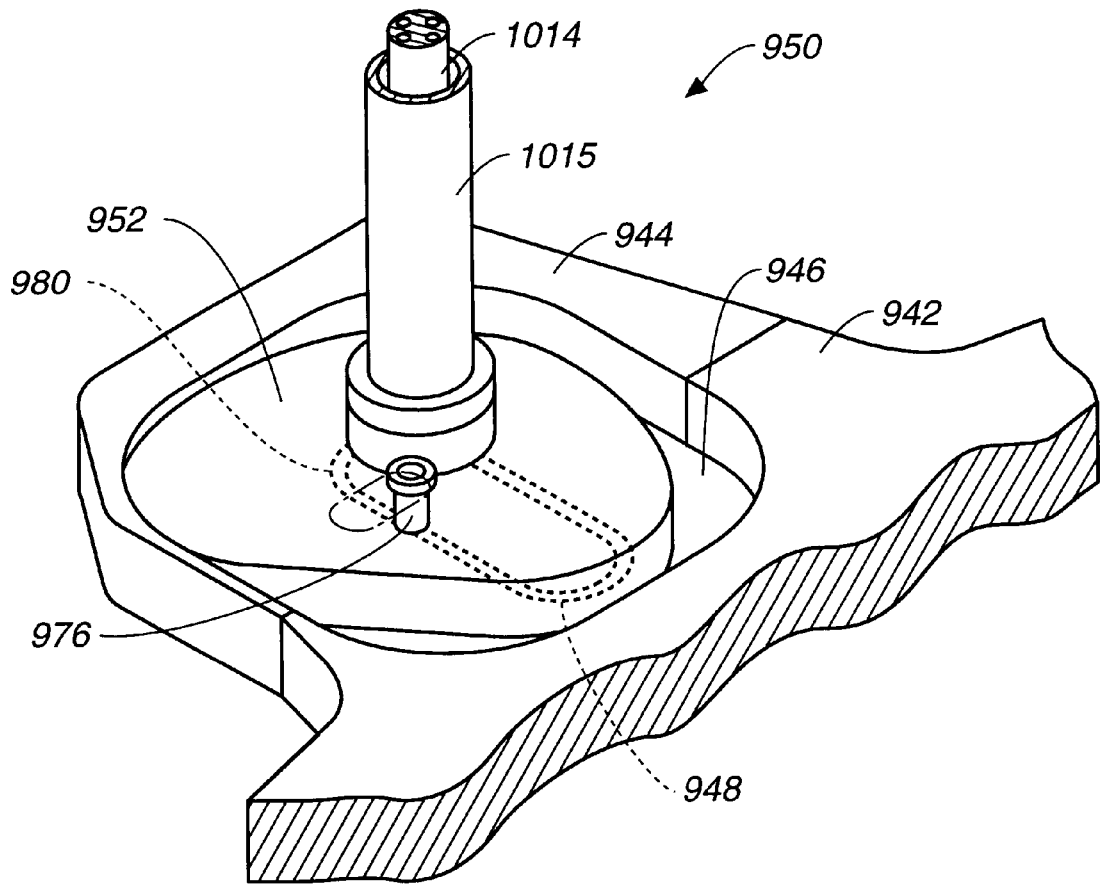
FIG._17C

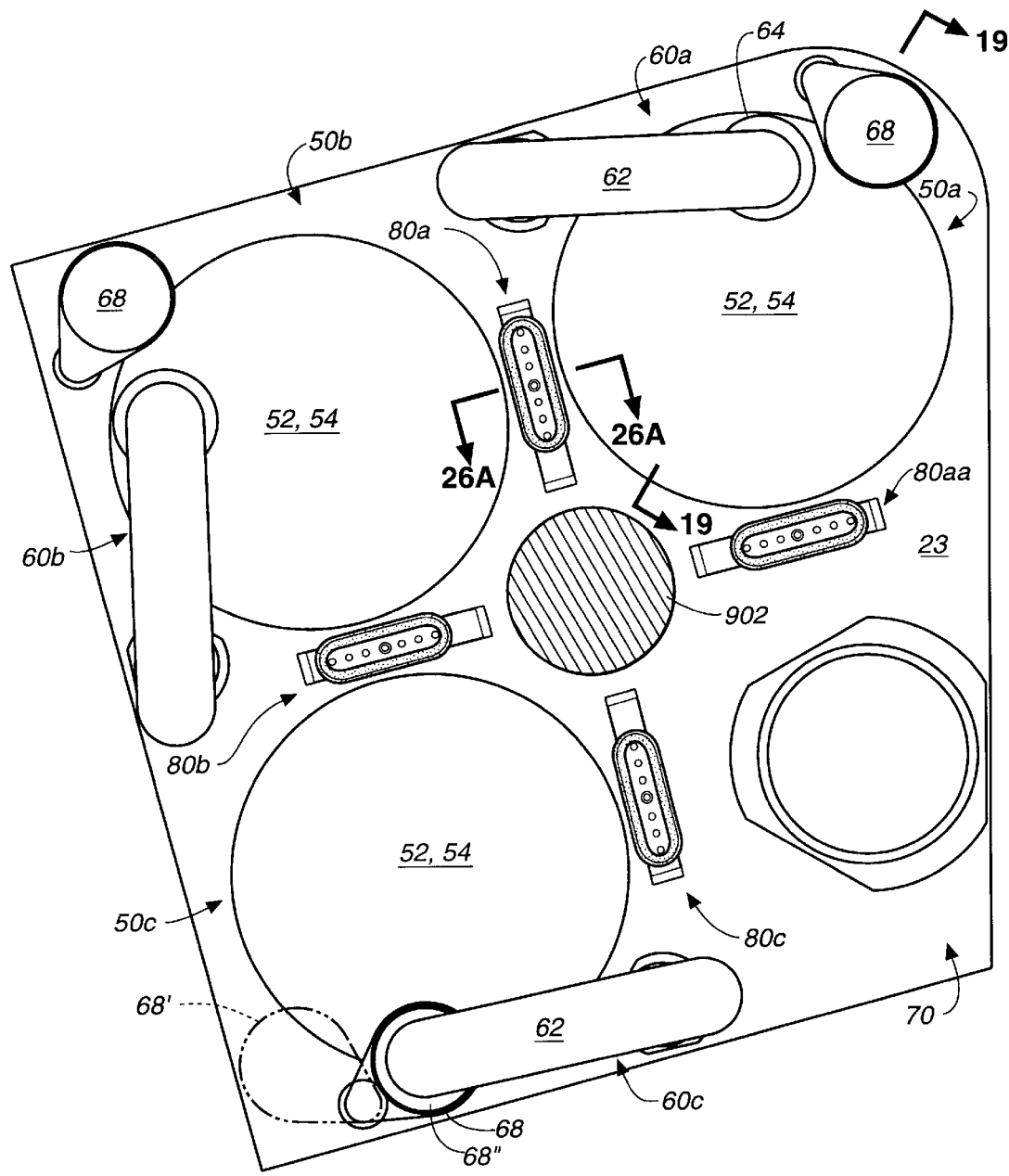
FIG._18

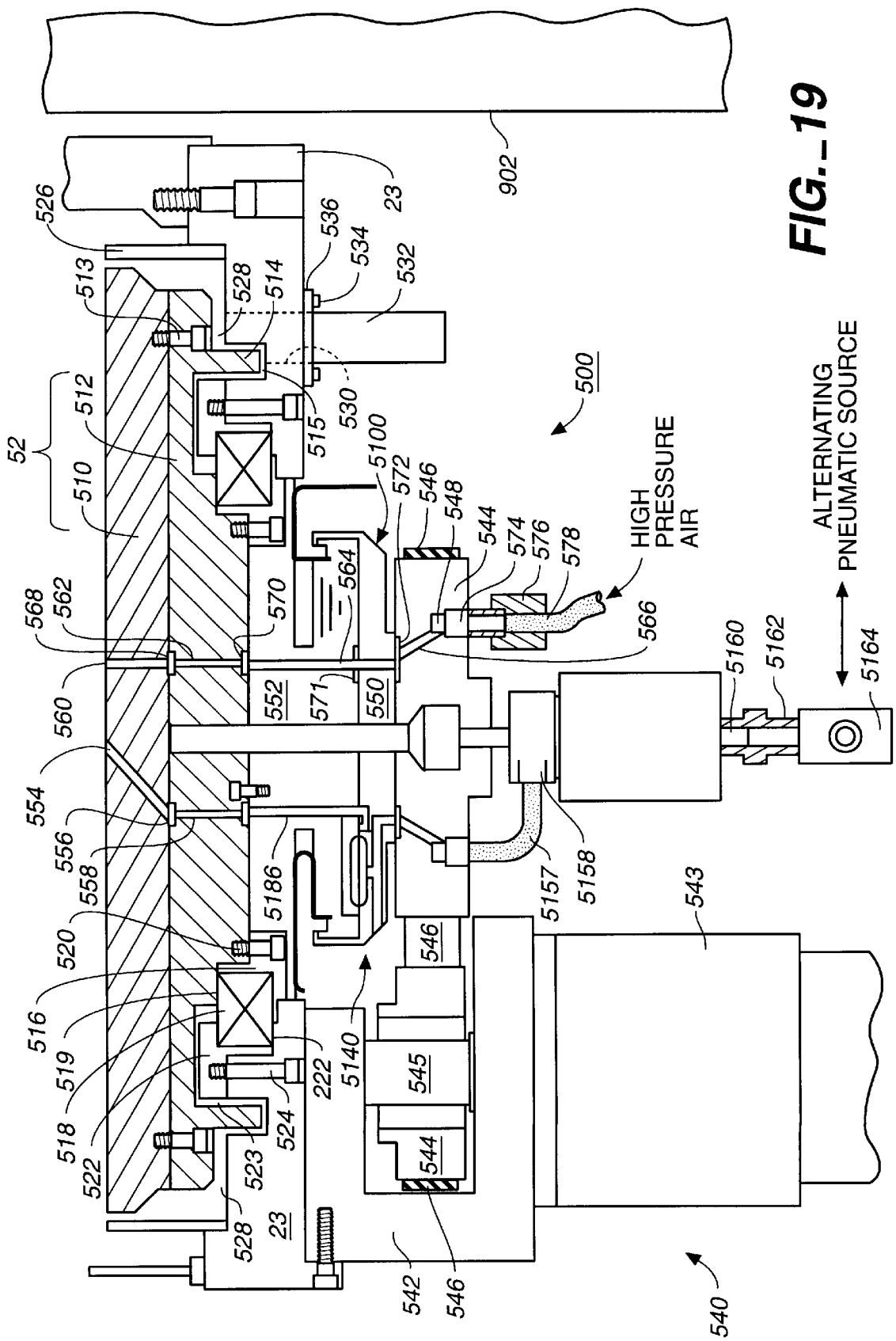
FIG._19

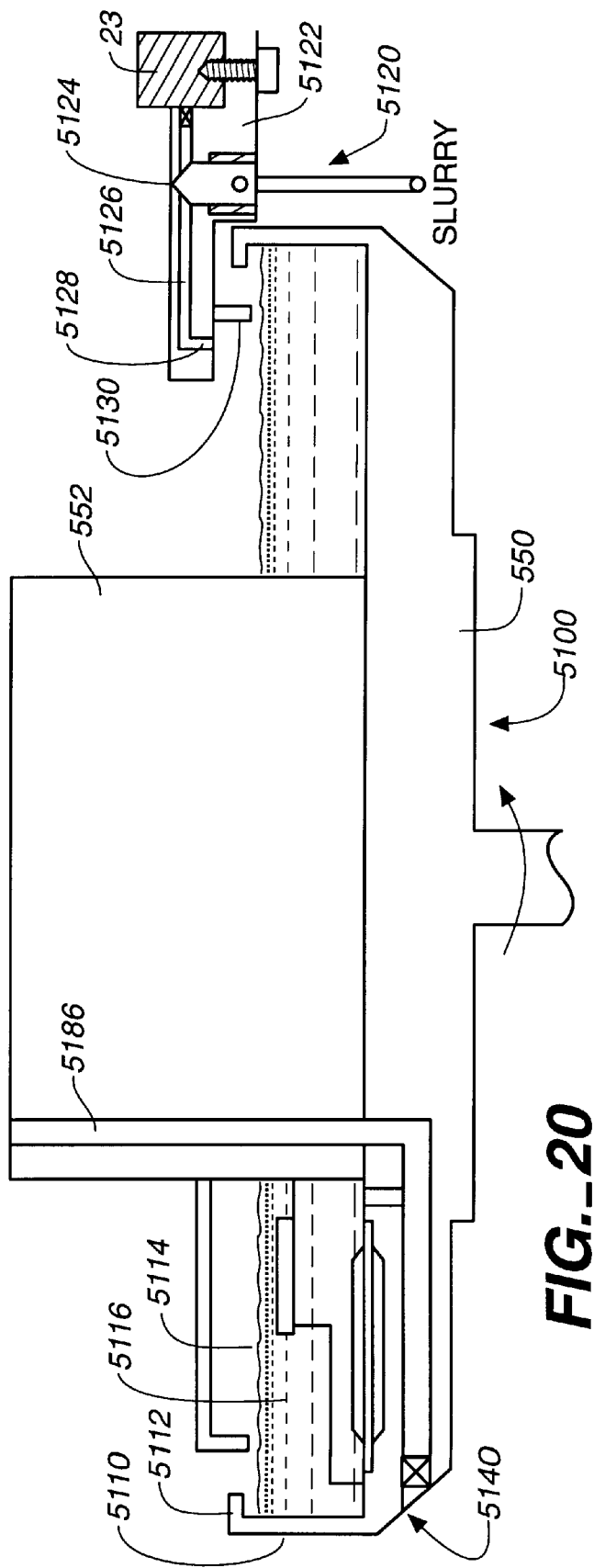
FIG._20

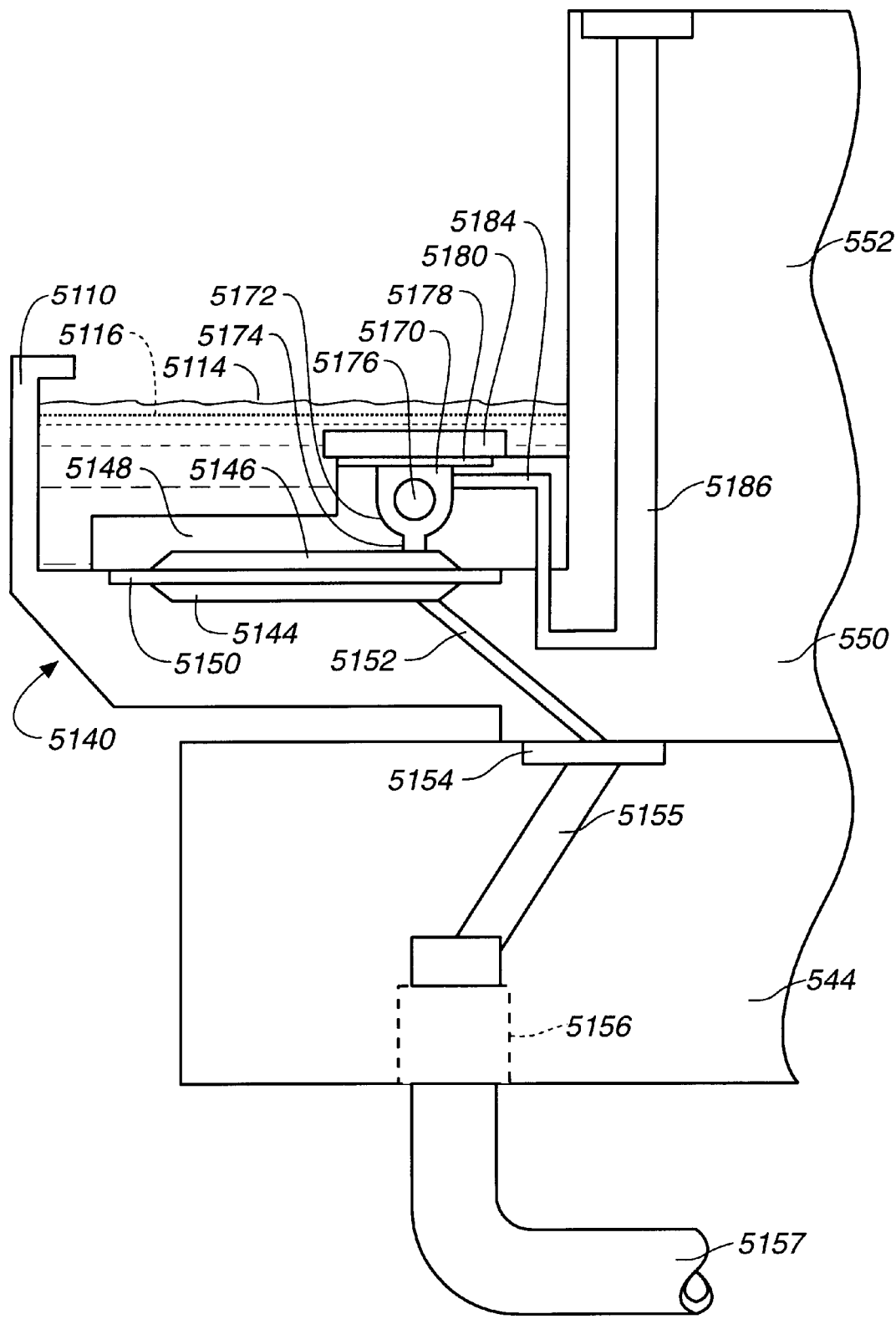
FIG._21

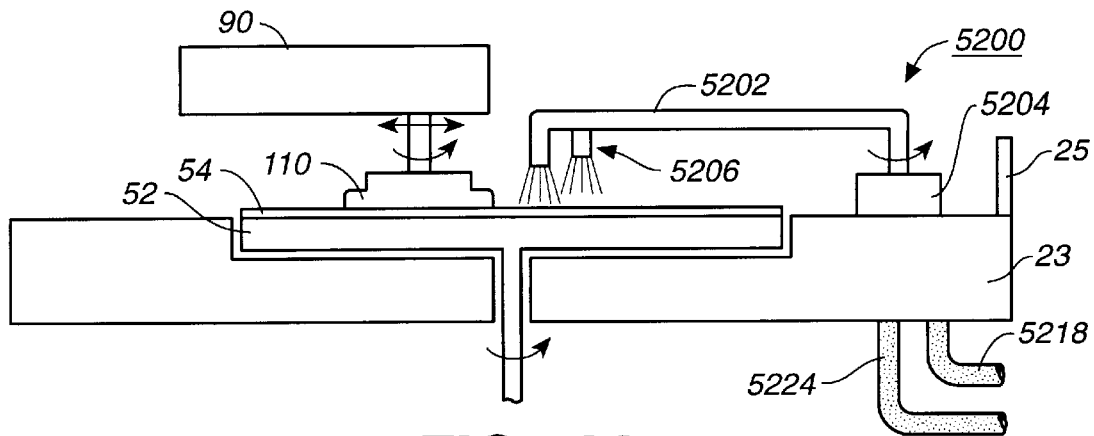
FIG._22
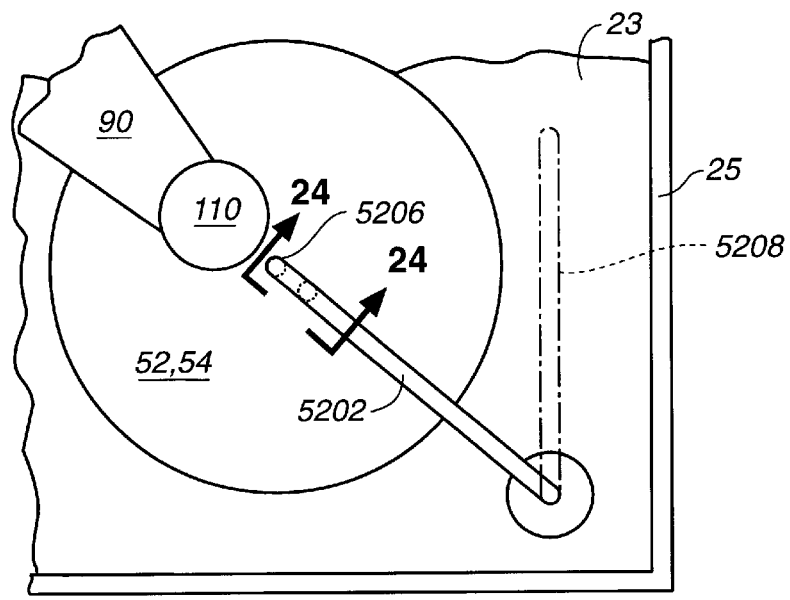
FIG._23
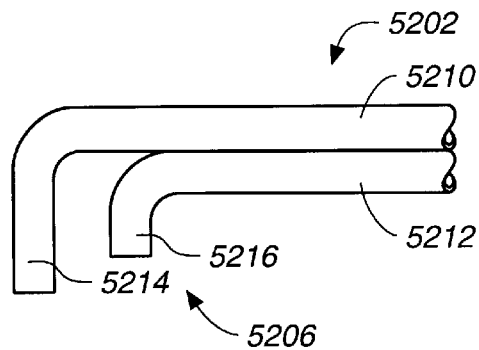
FIG._24

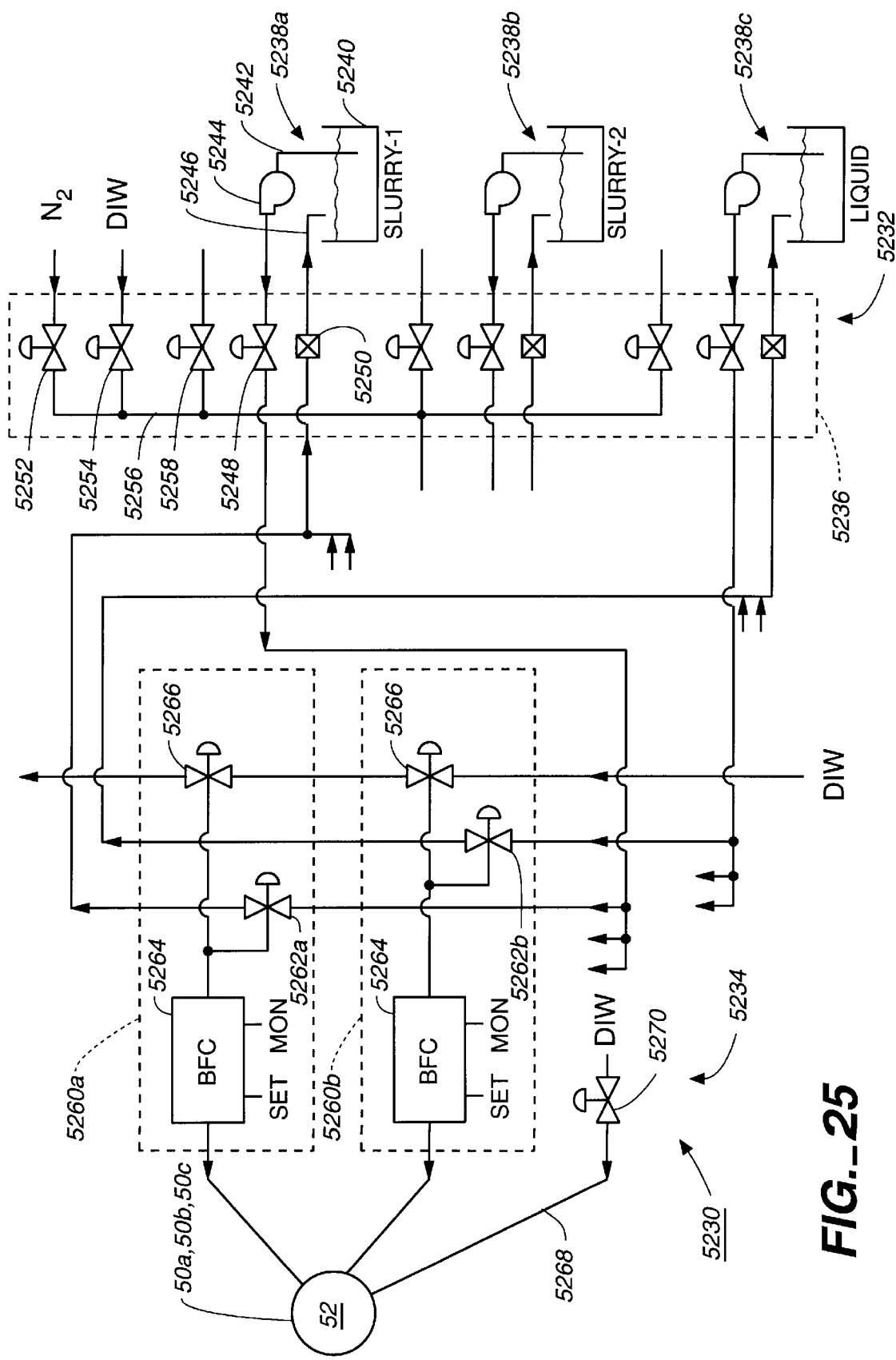
FIG._25

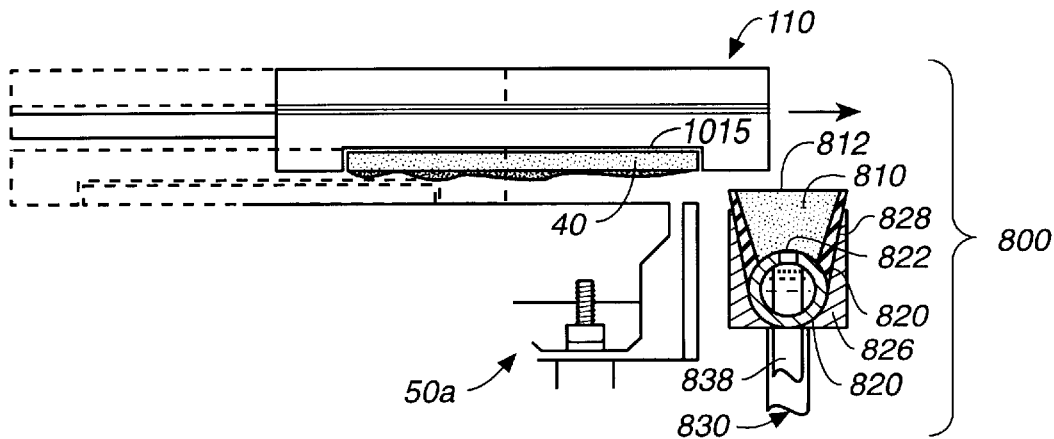
FIG._26A
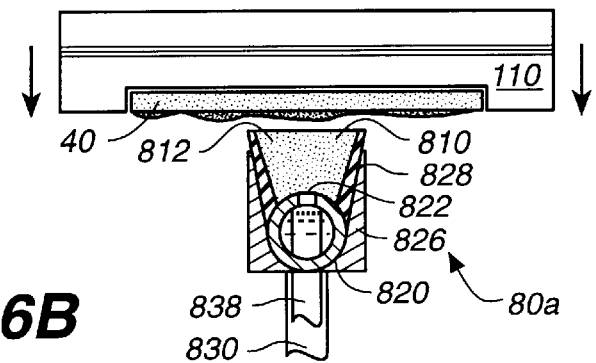
FIG._26B
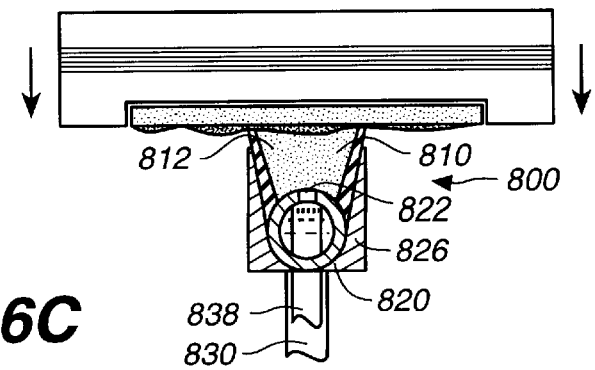
FIG._26C

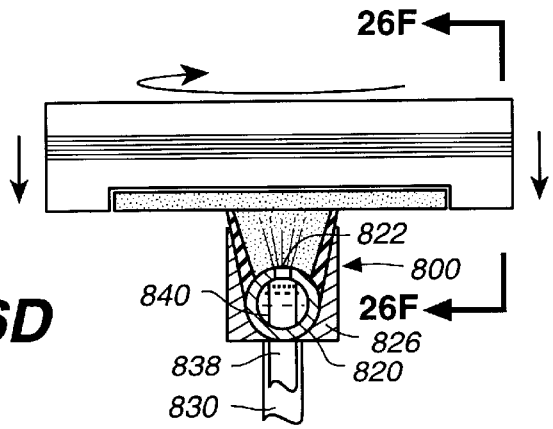
FIG._26D
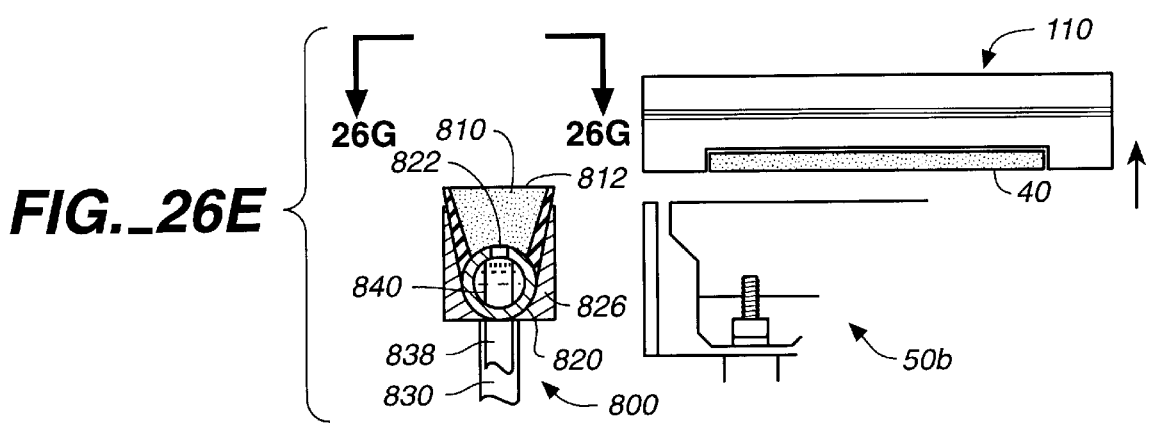
FIG._26E
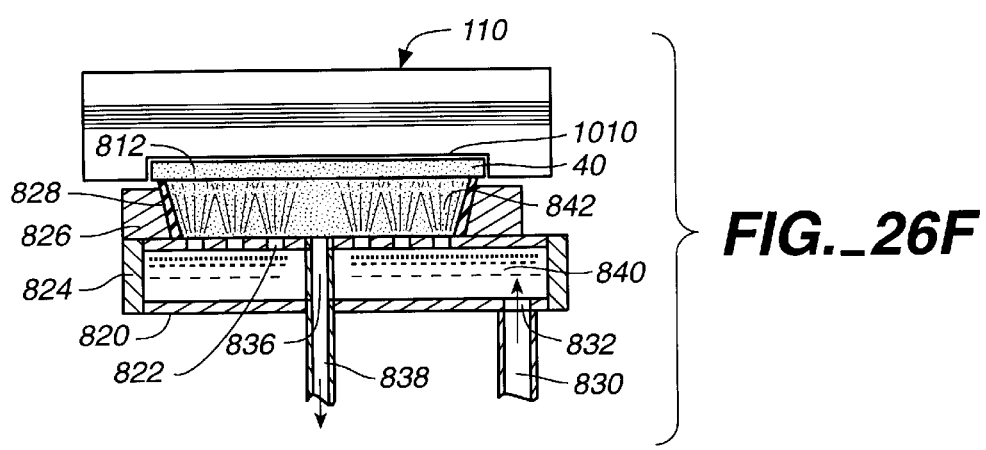
FIG._26F
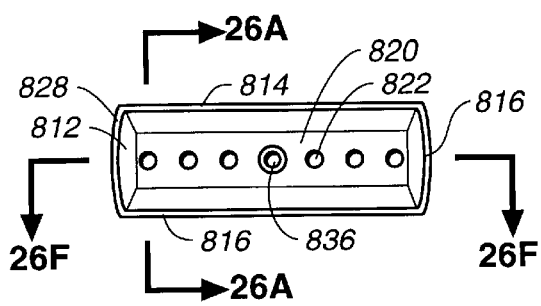
FIG._26G

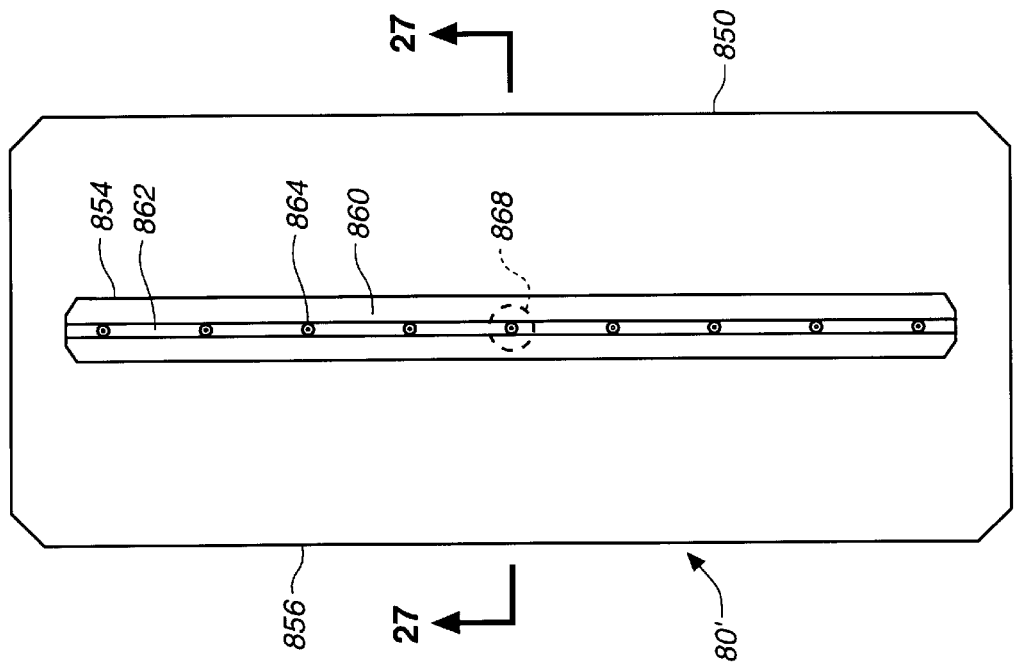
FIG._28
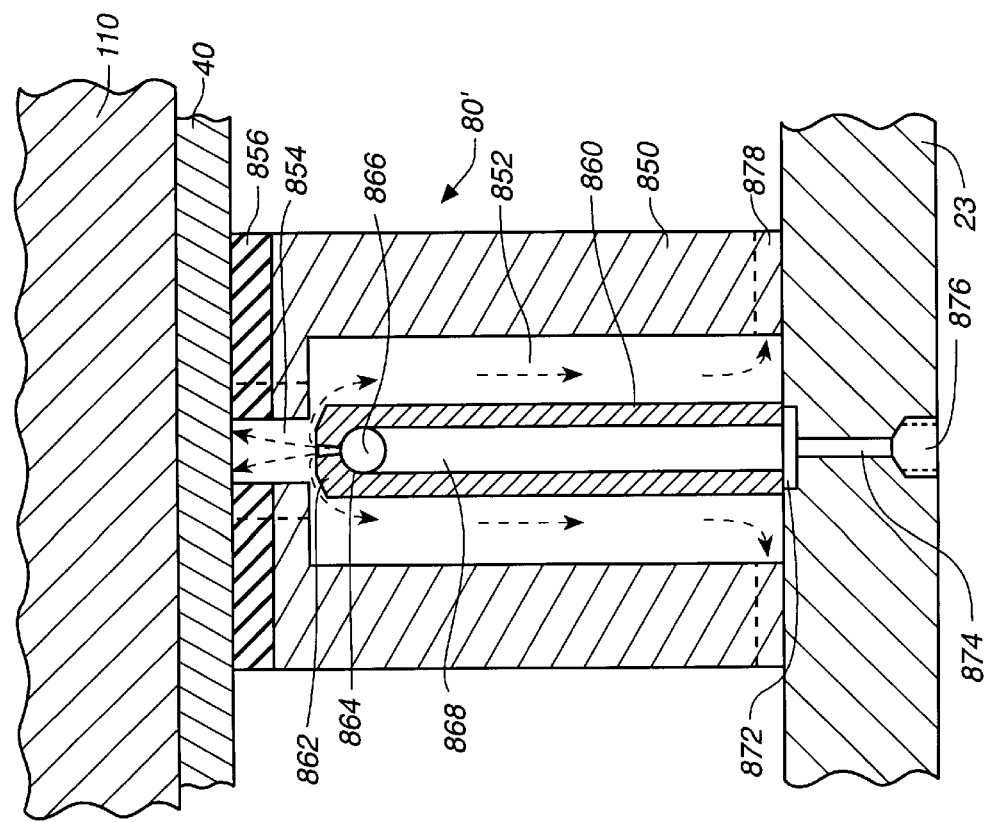
FIG._27

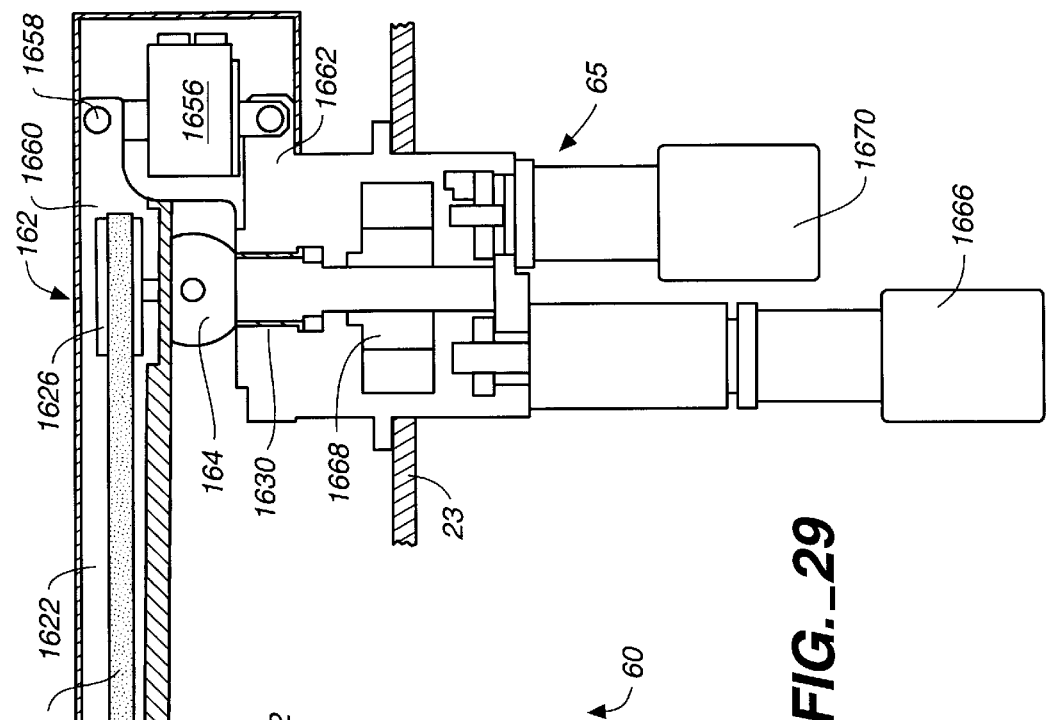
FIG._29
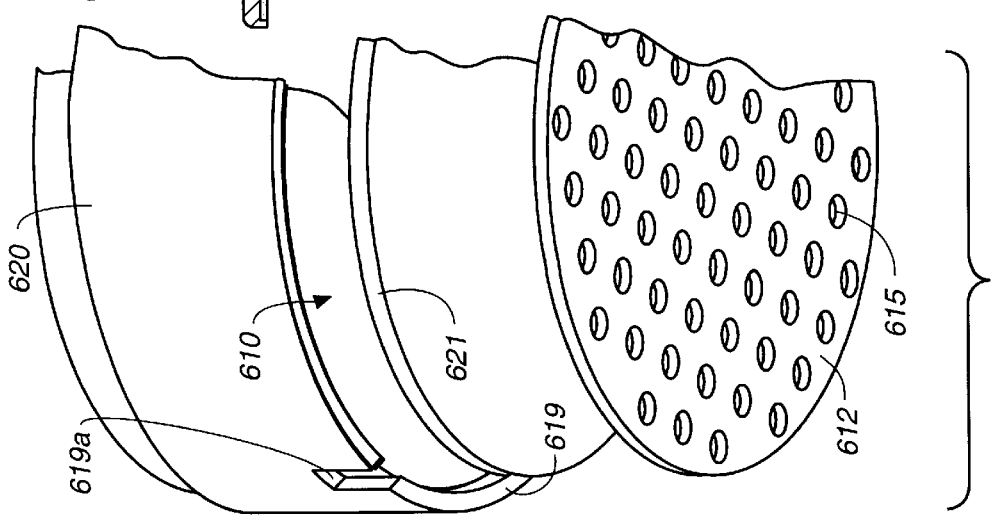
FIG._30

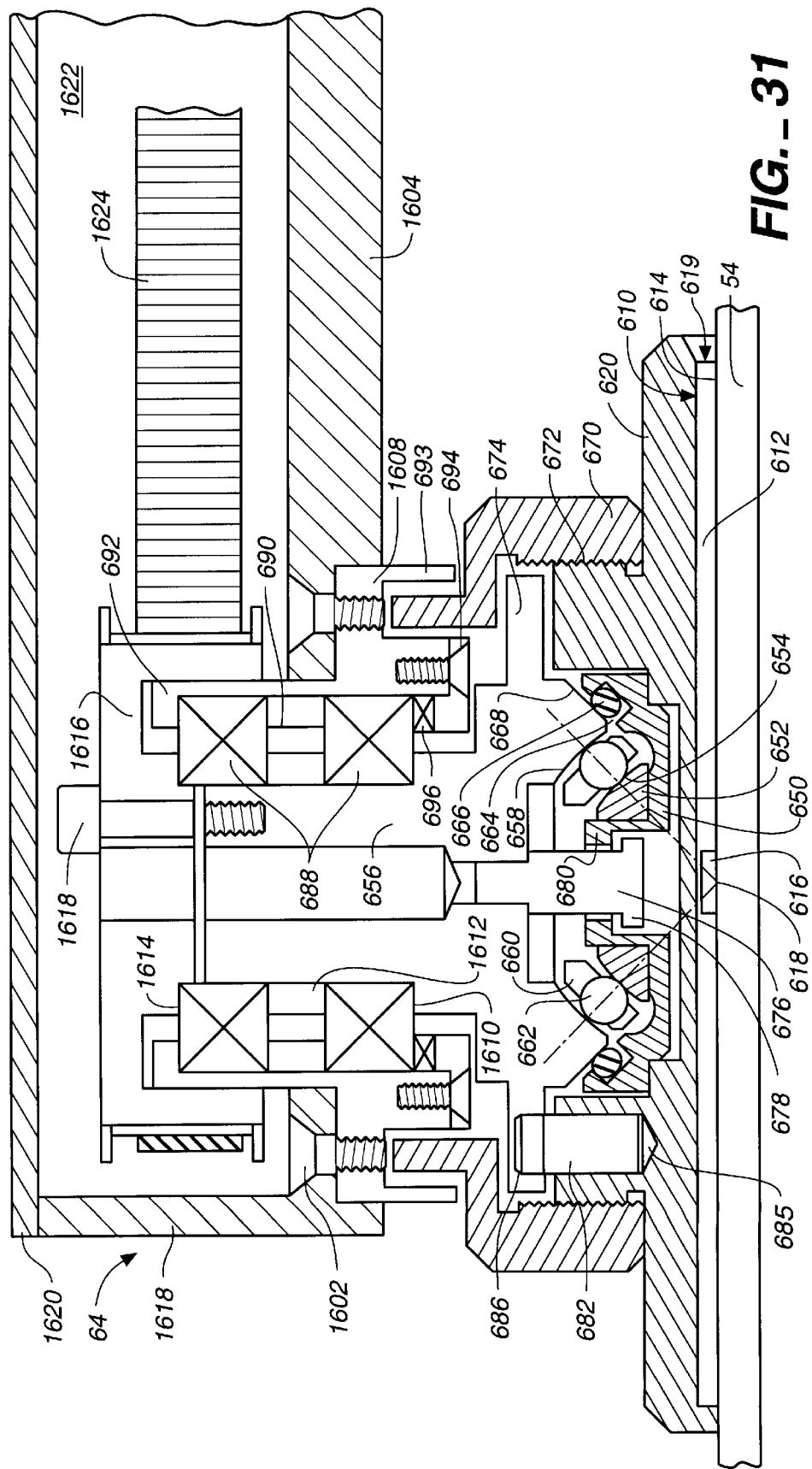
FIG._31

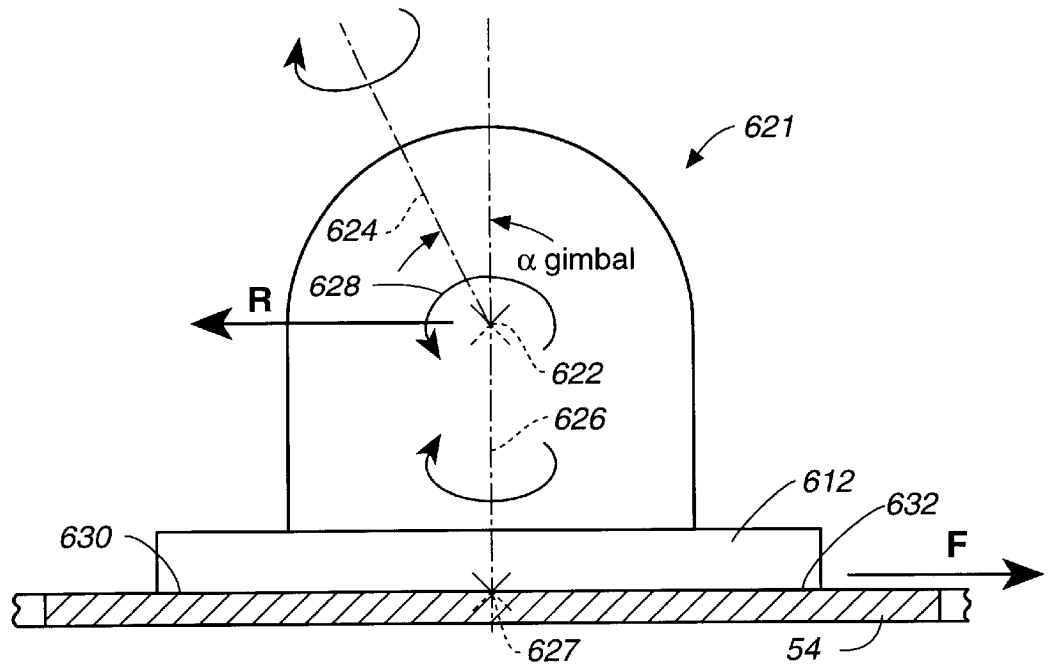
FIG._32
(PRIOR ART)
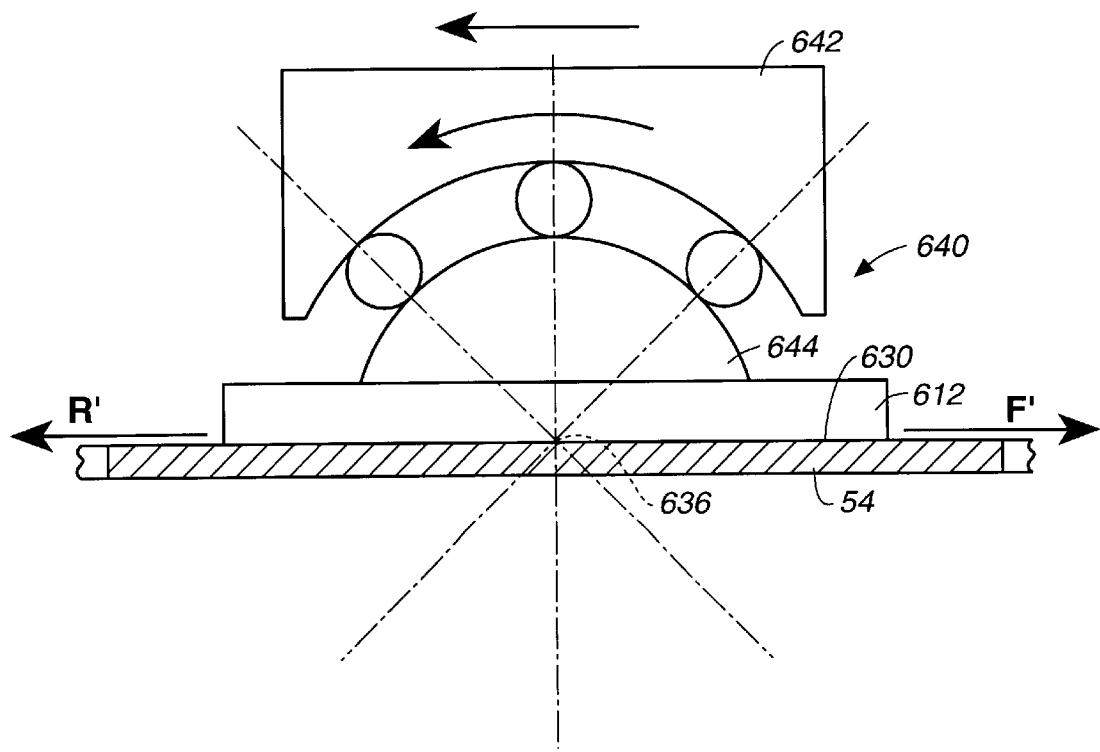
FIG._33

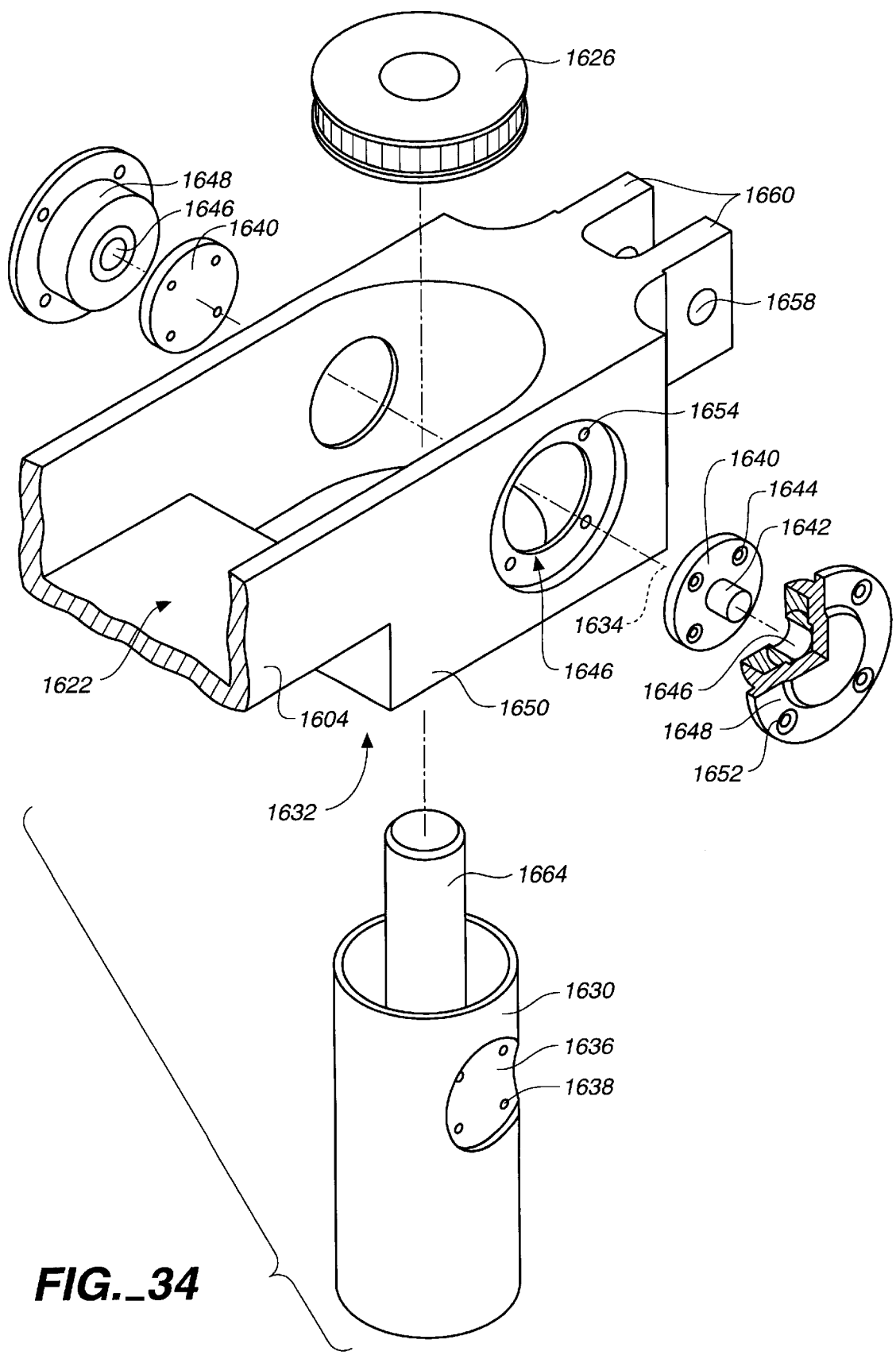
FIG._34

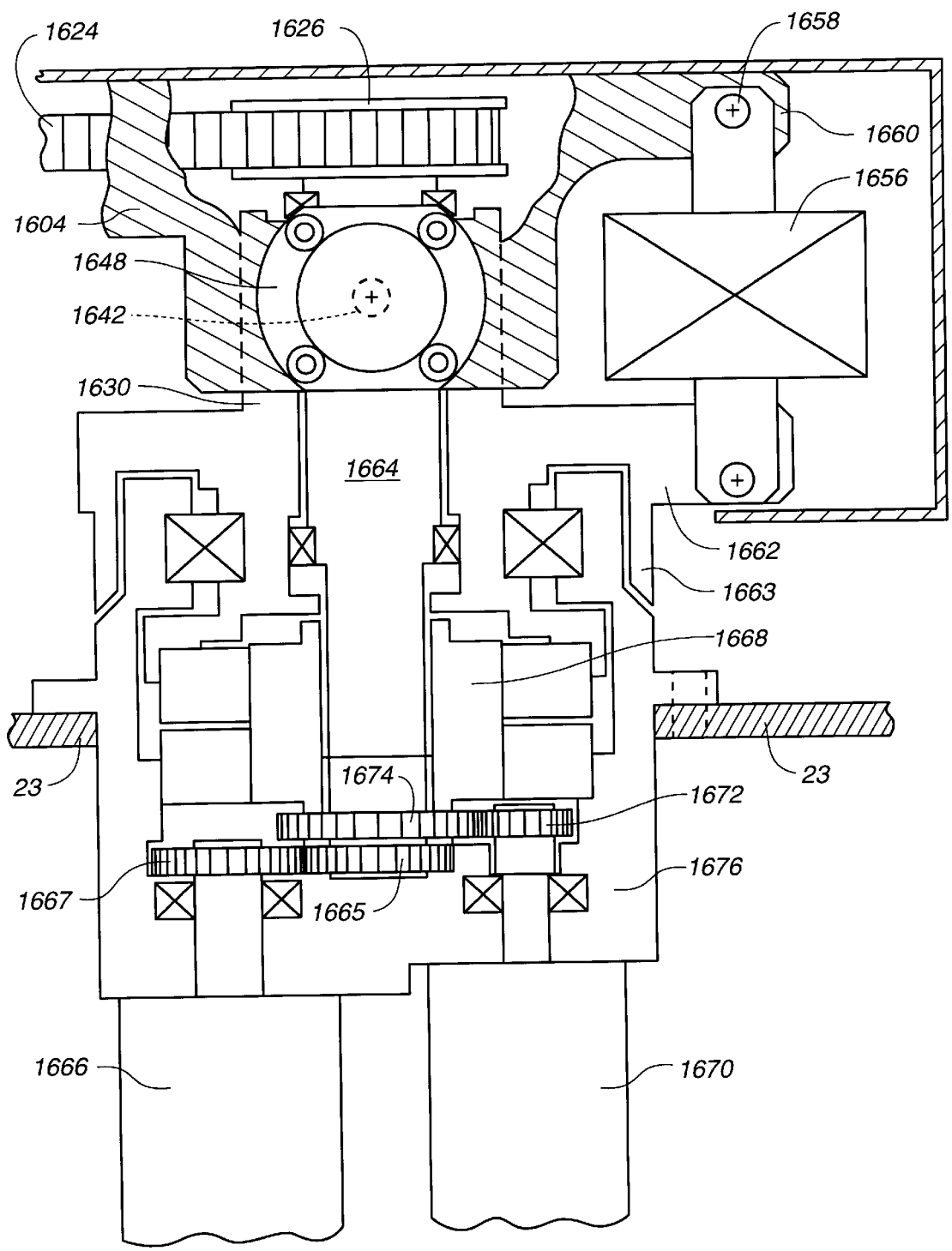
FIG._35

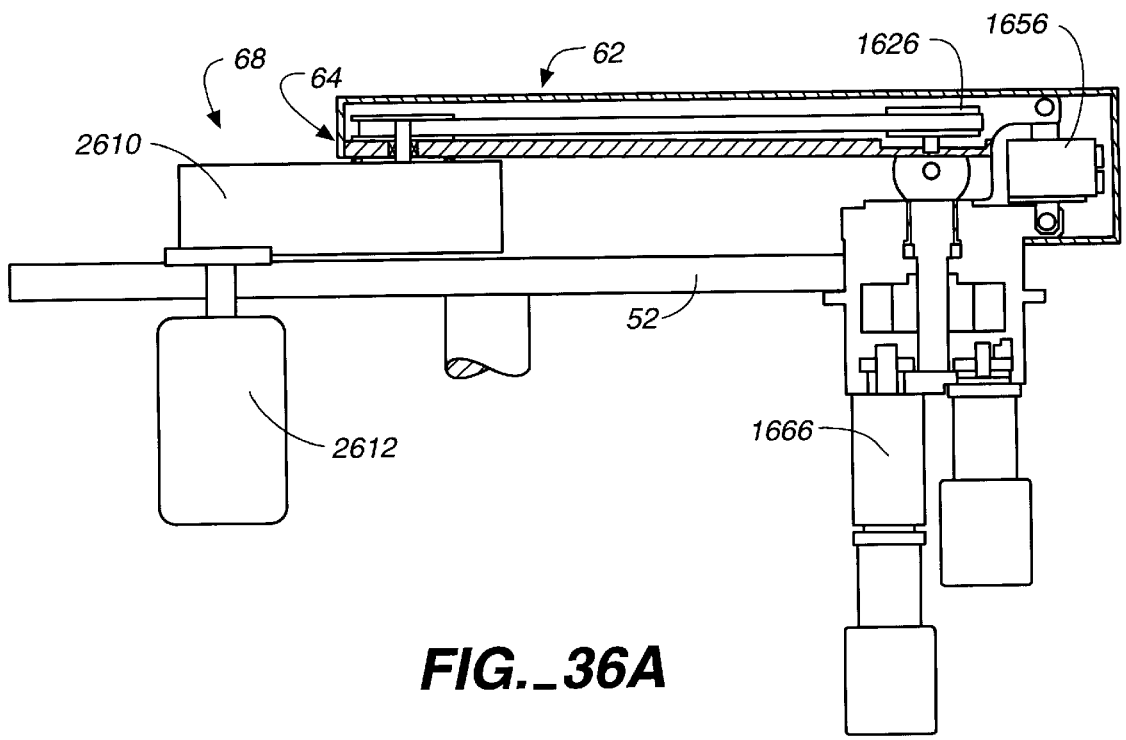
FIG._36A
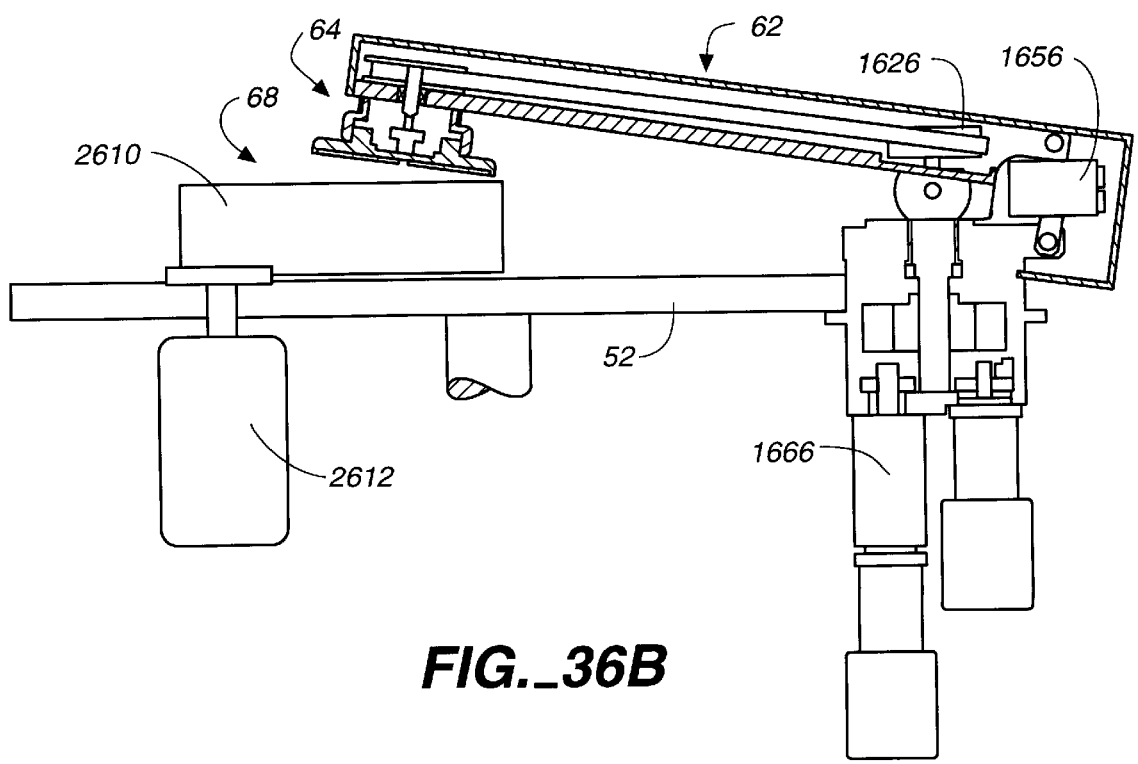
FIG._36B

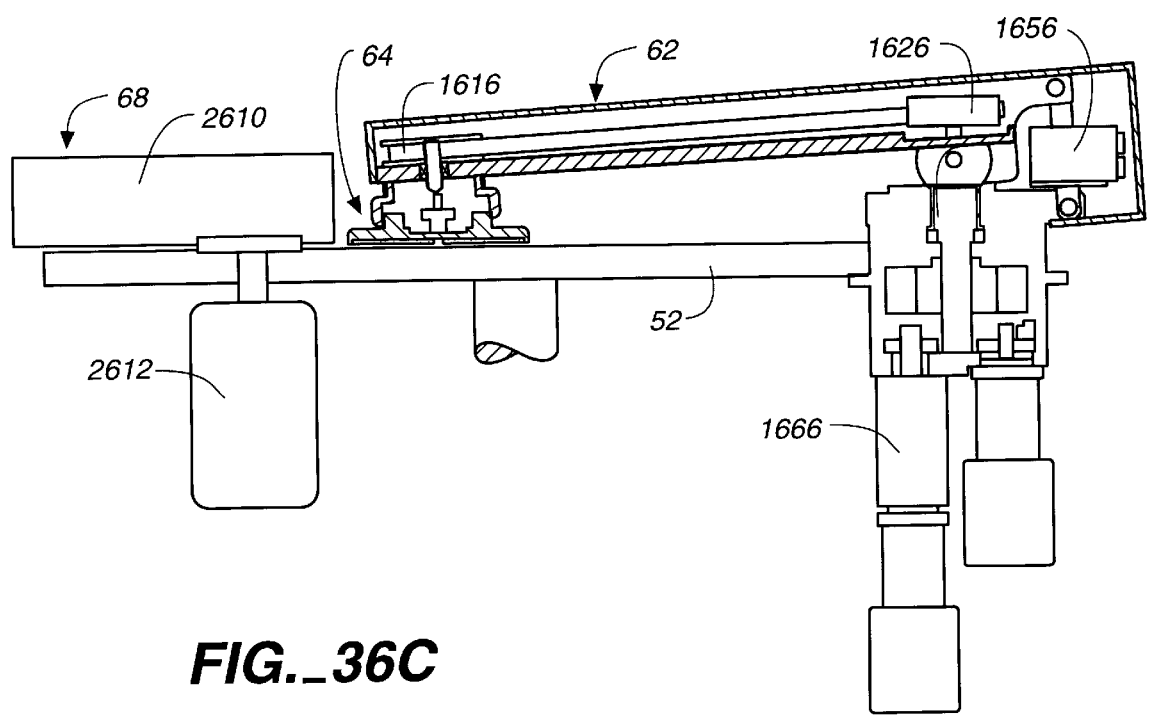
FIG._36C

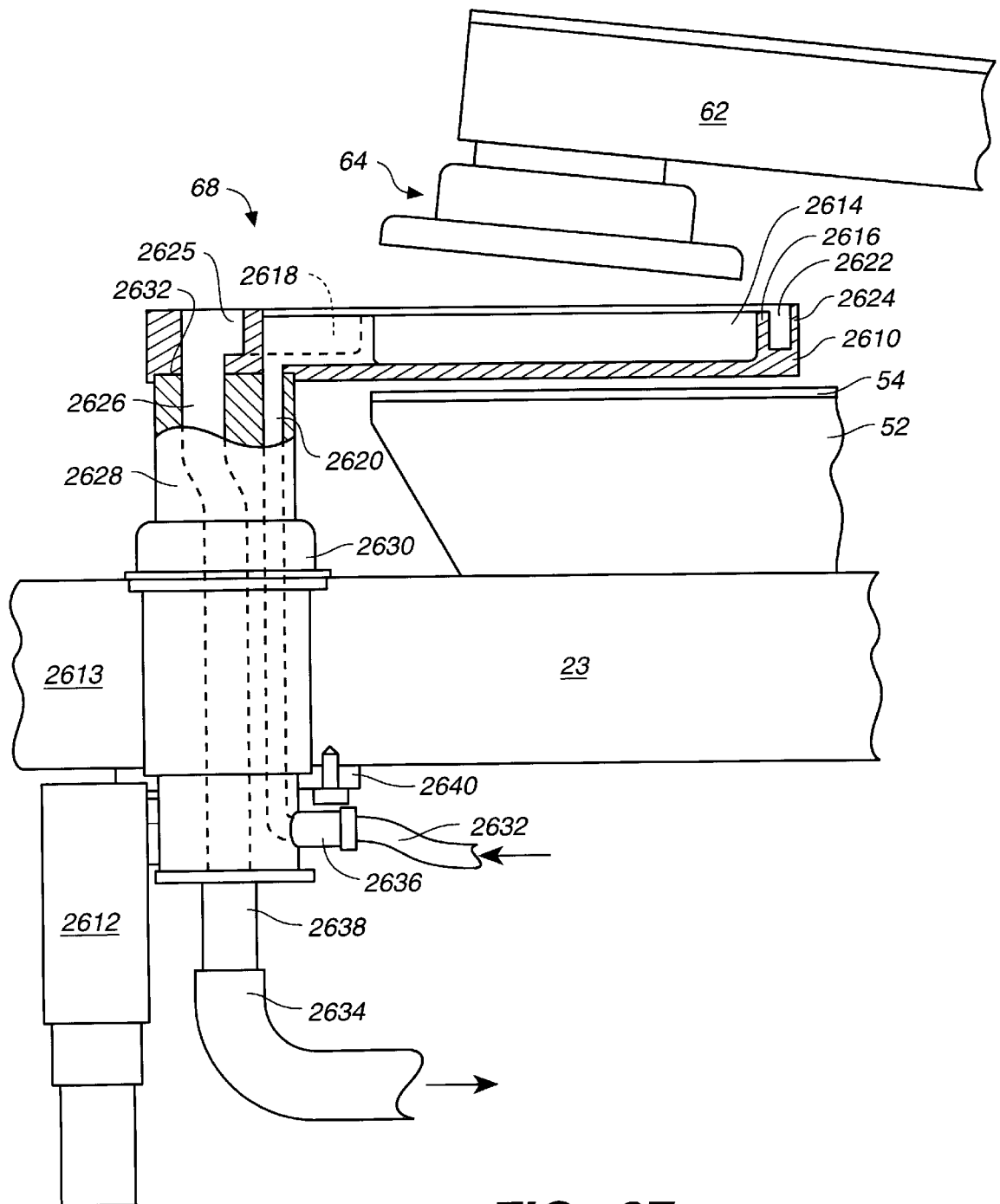
FIG._37

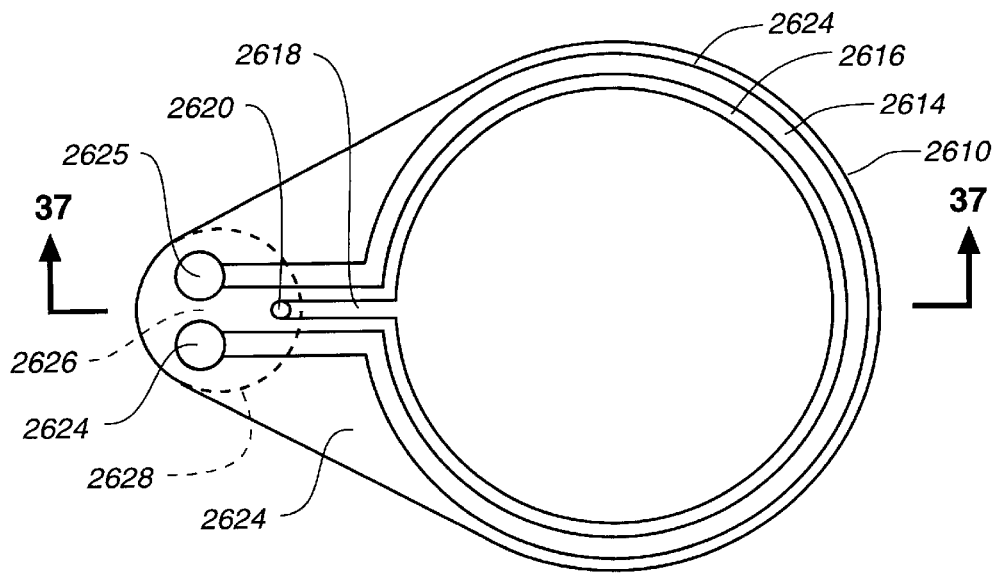
FIG._38
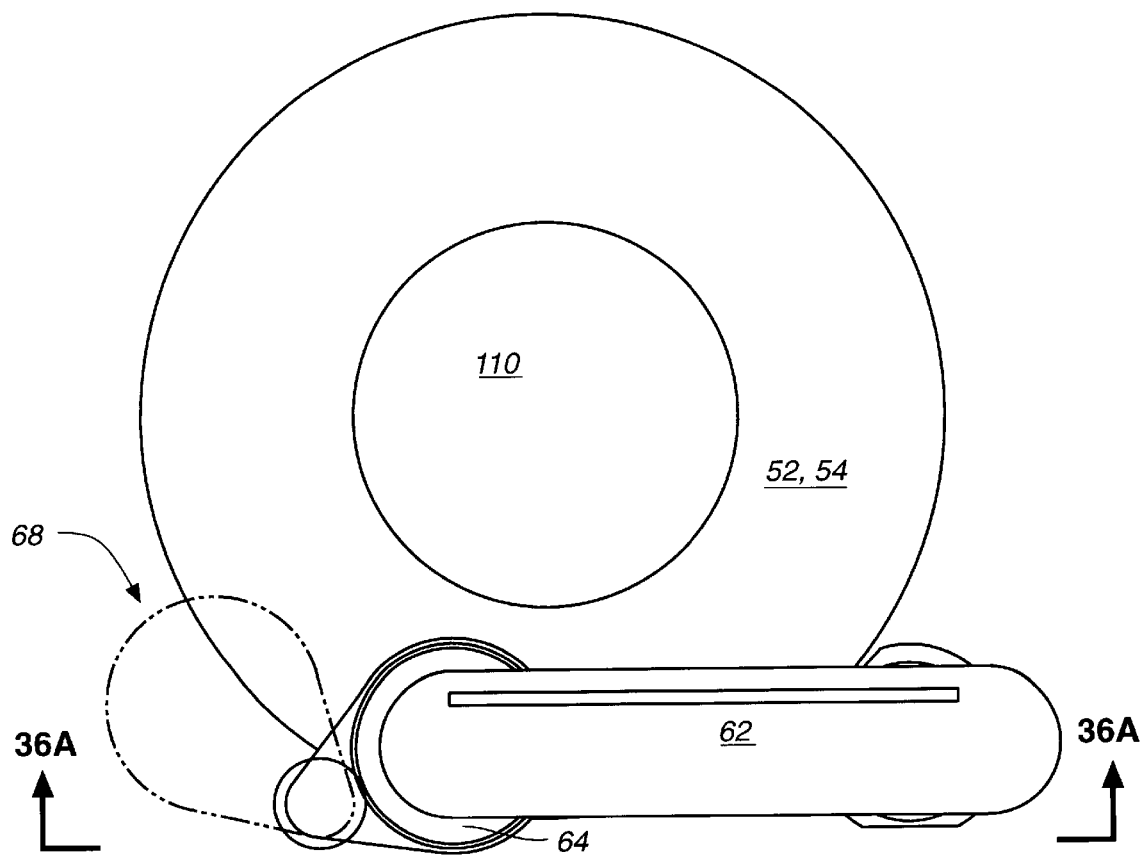
FIG._39A

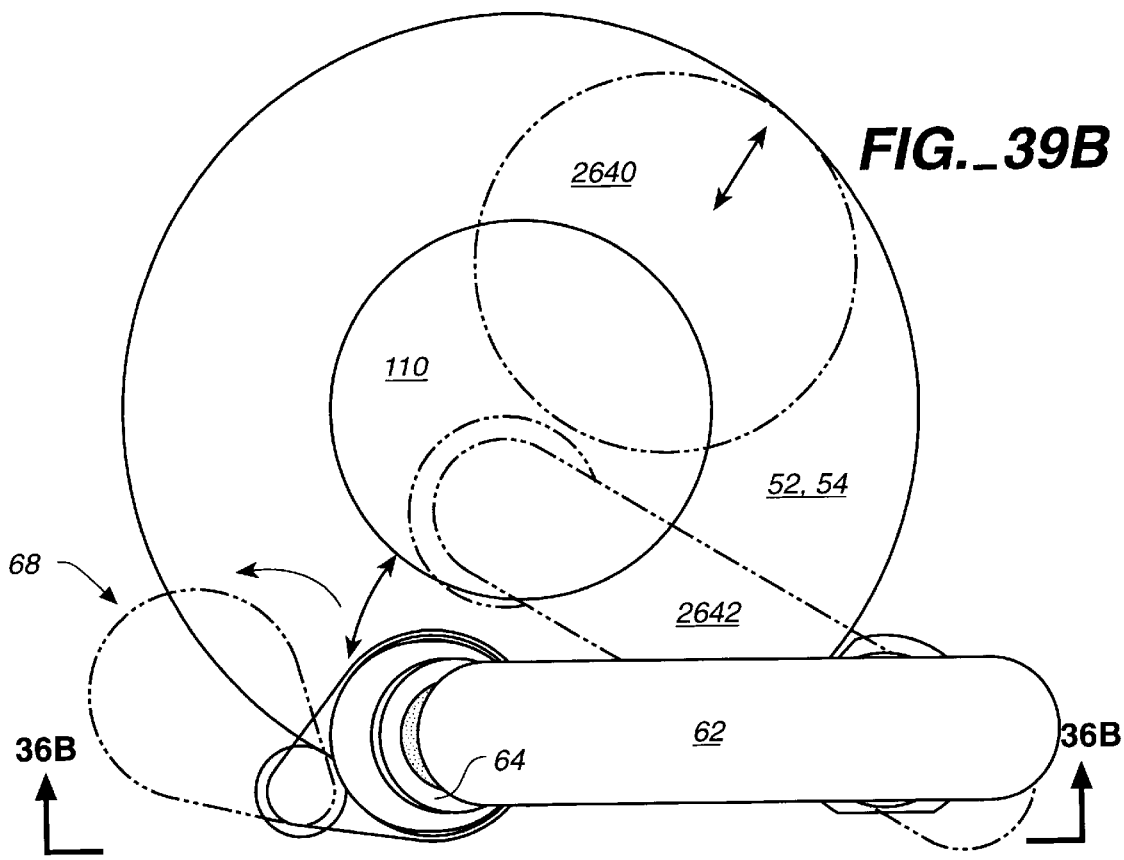
FIG._39B
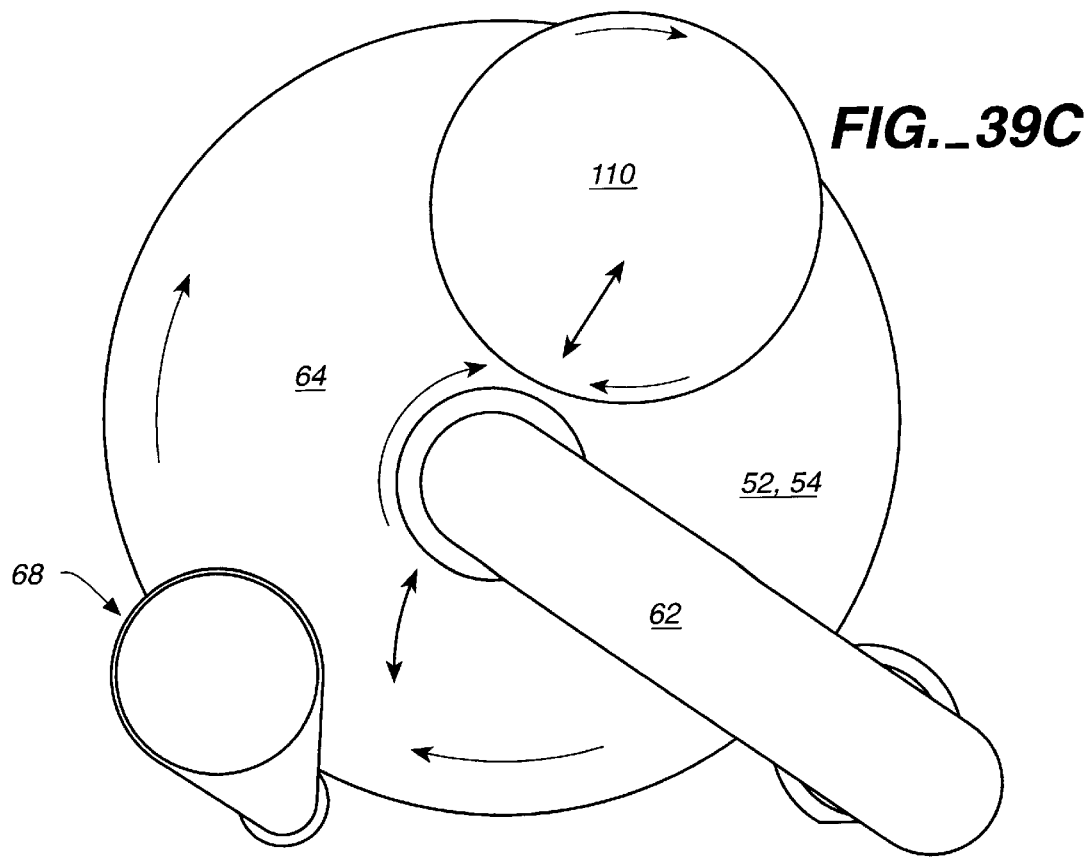
FIG._39C

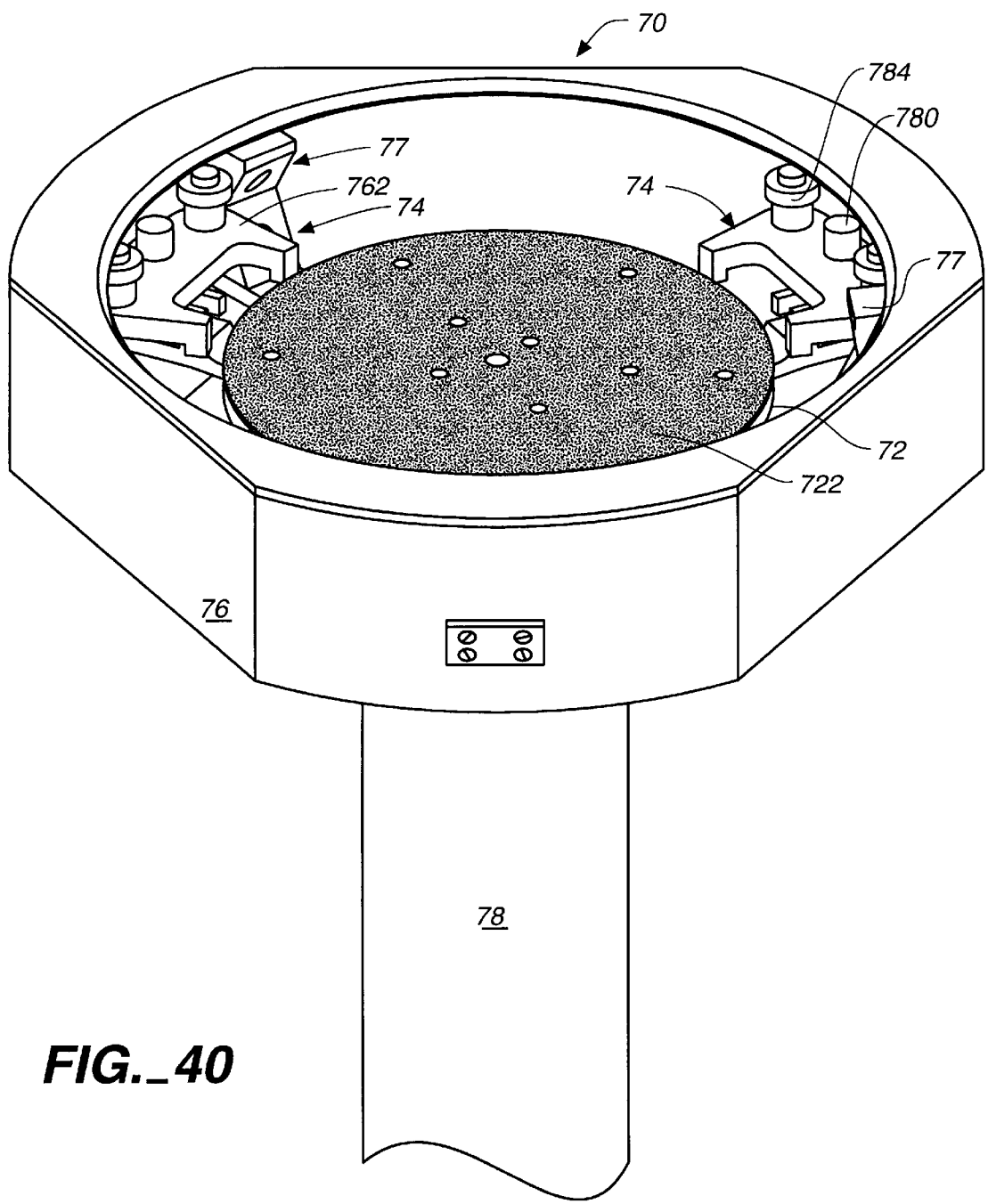
FIG._40

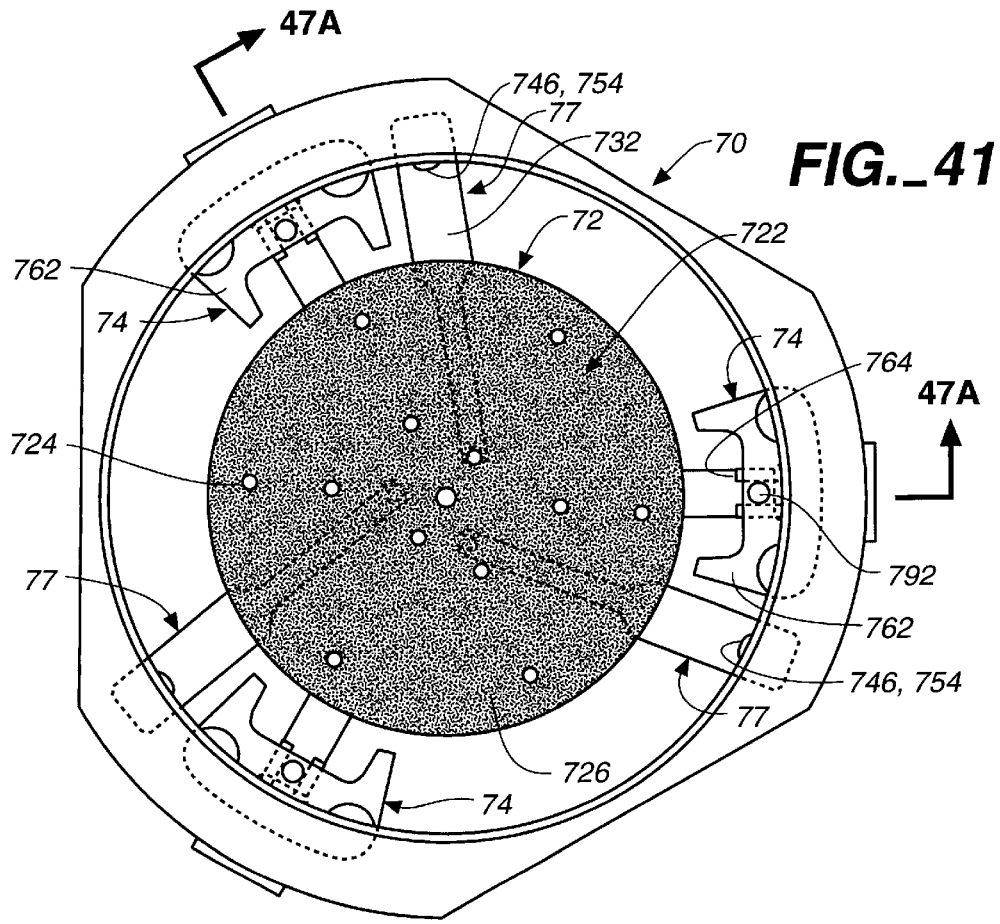
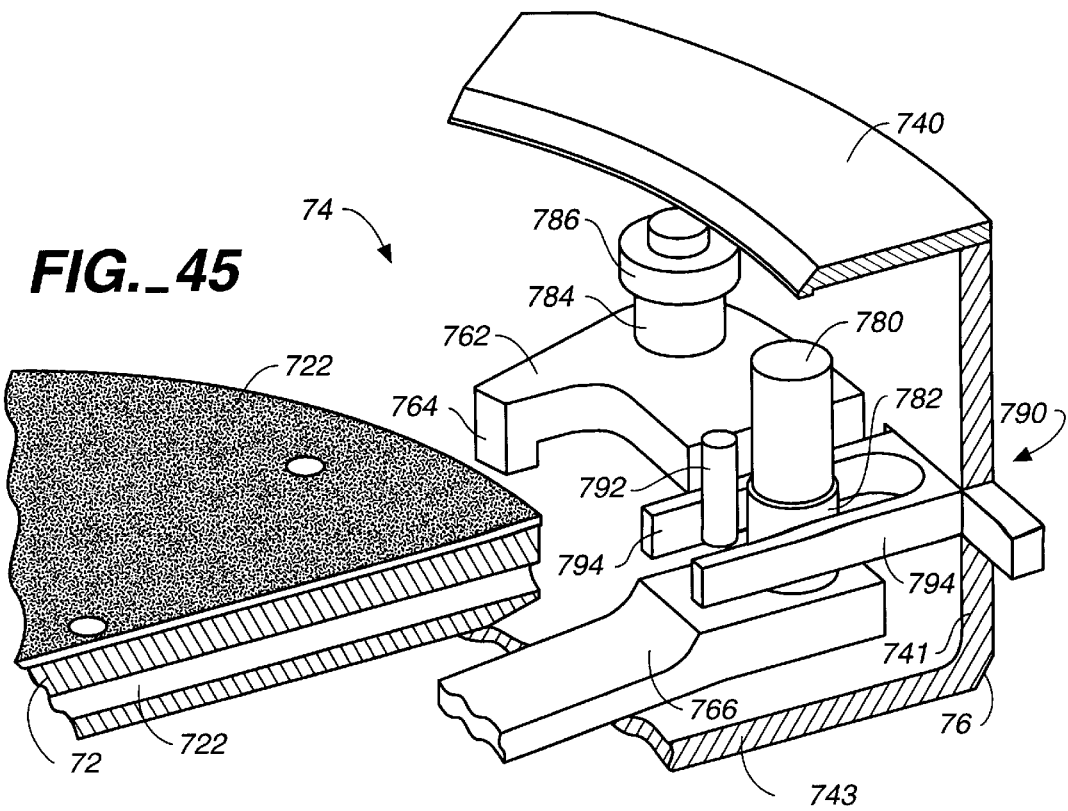

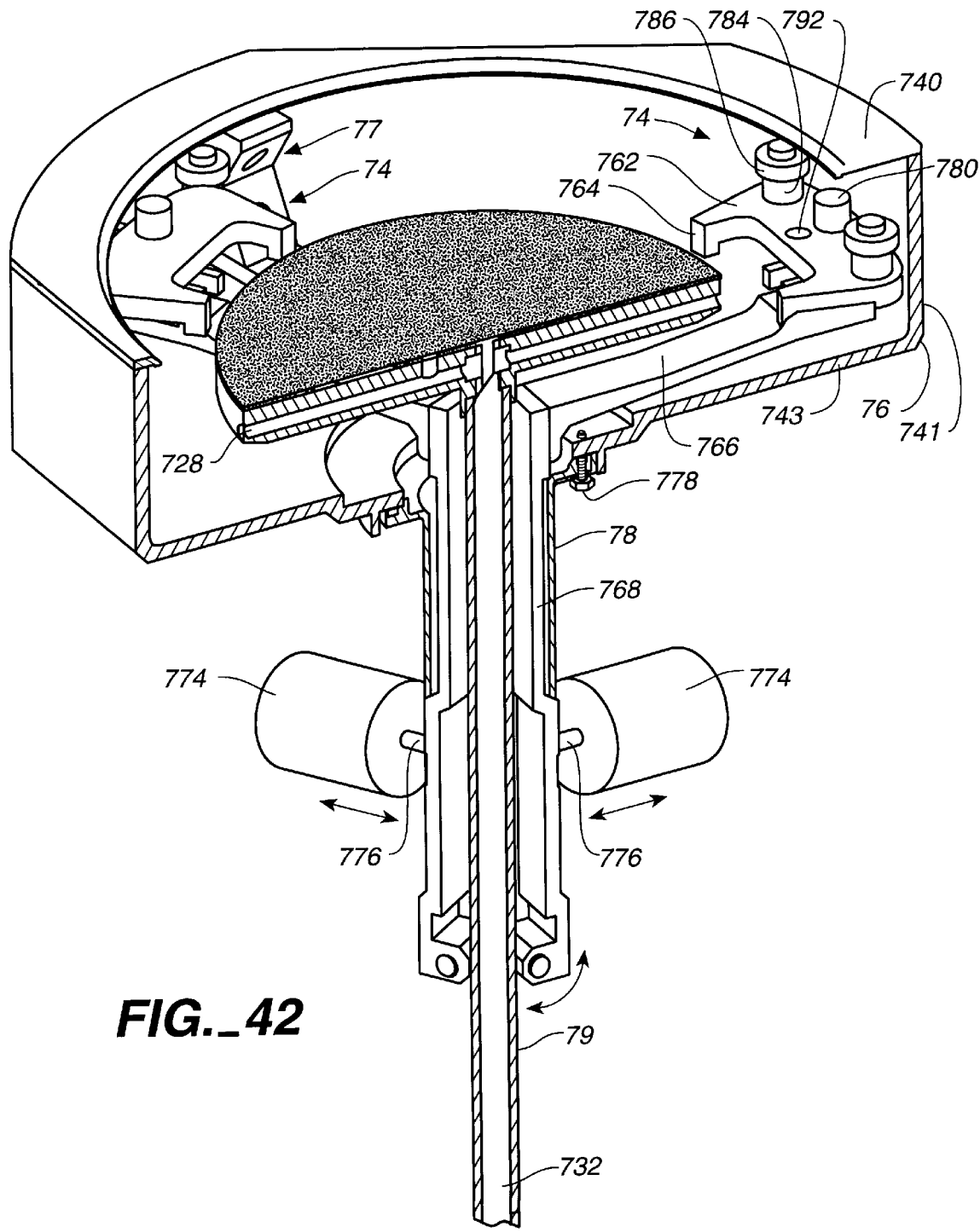
FIG._42

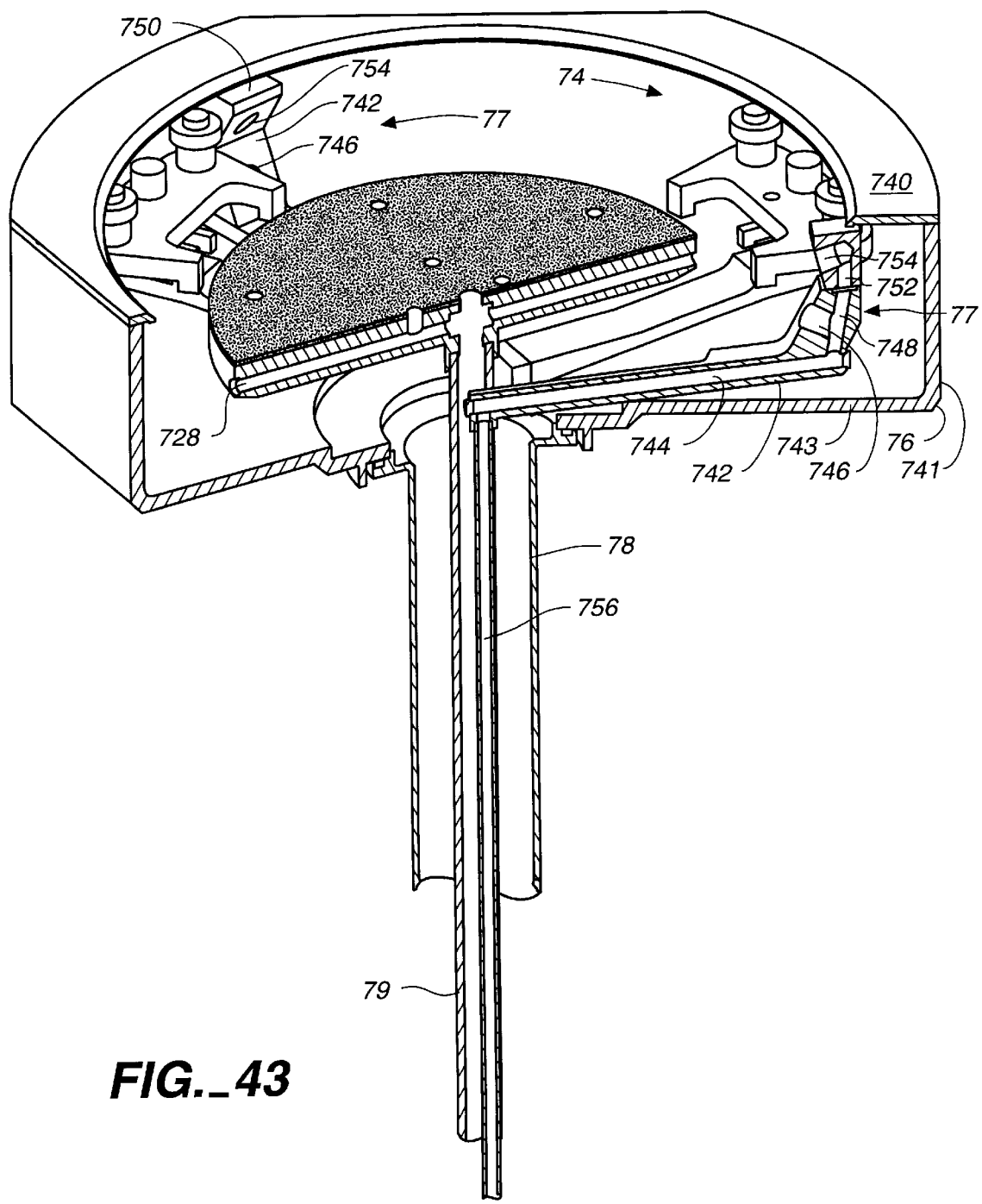
FIG._43

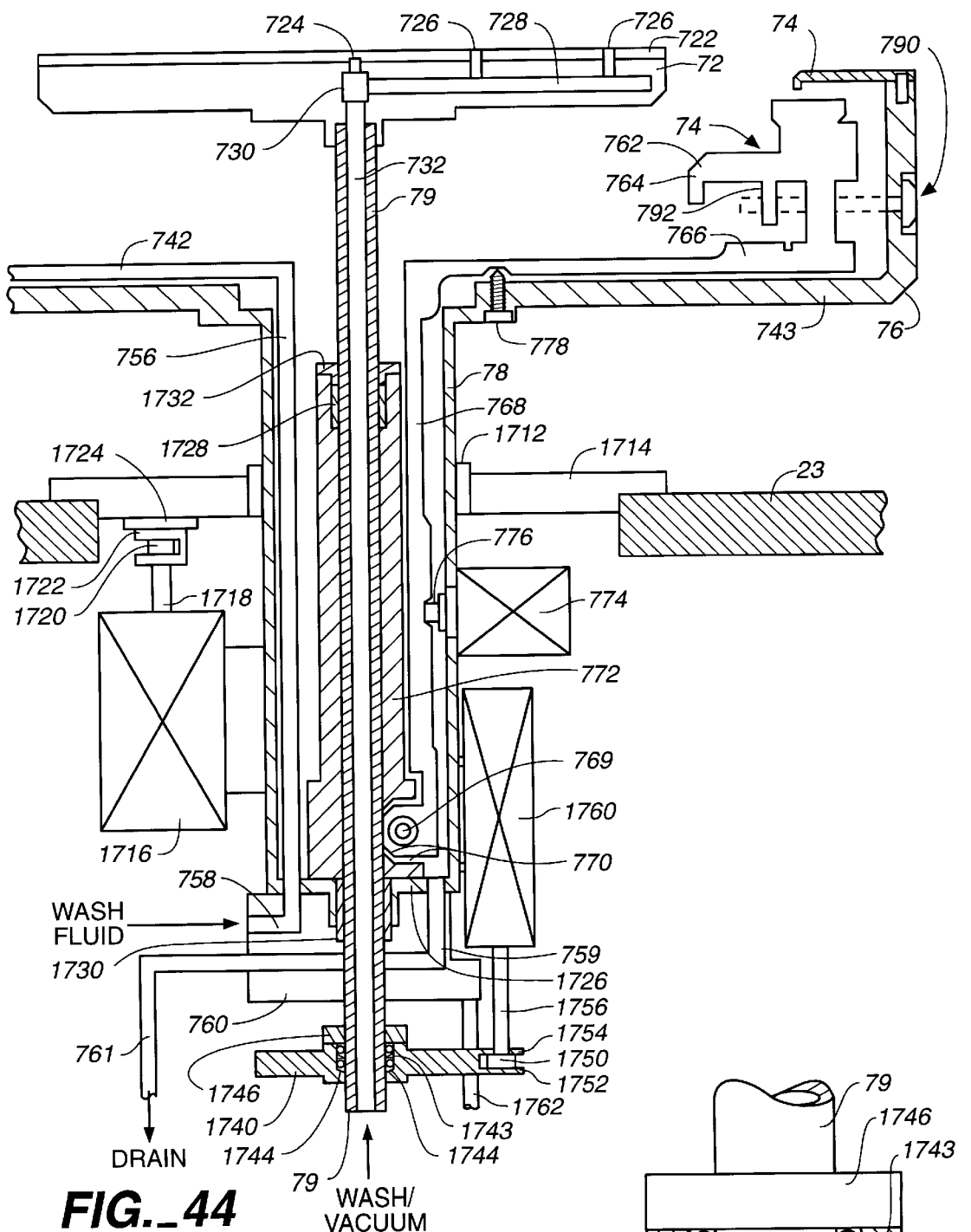
FIG._44
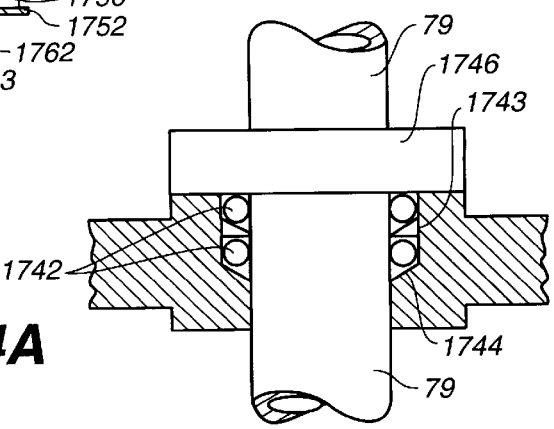
FIG._44A

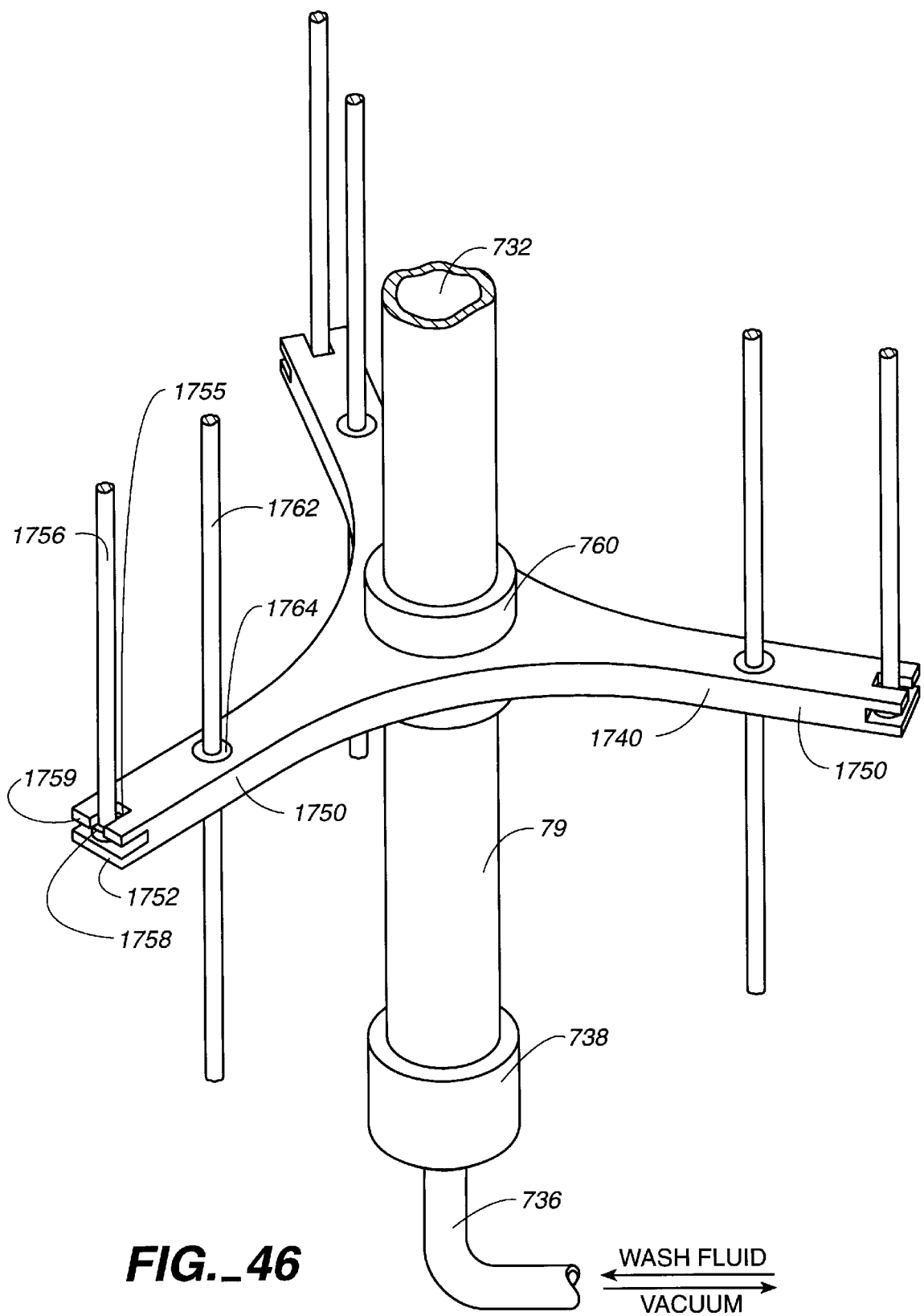
FIG._46

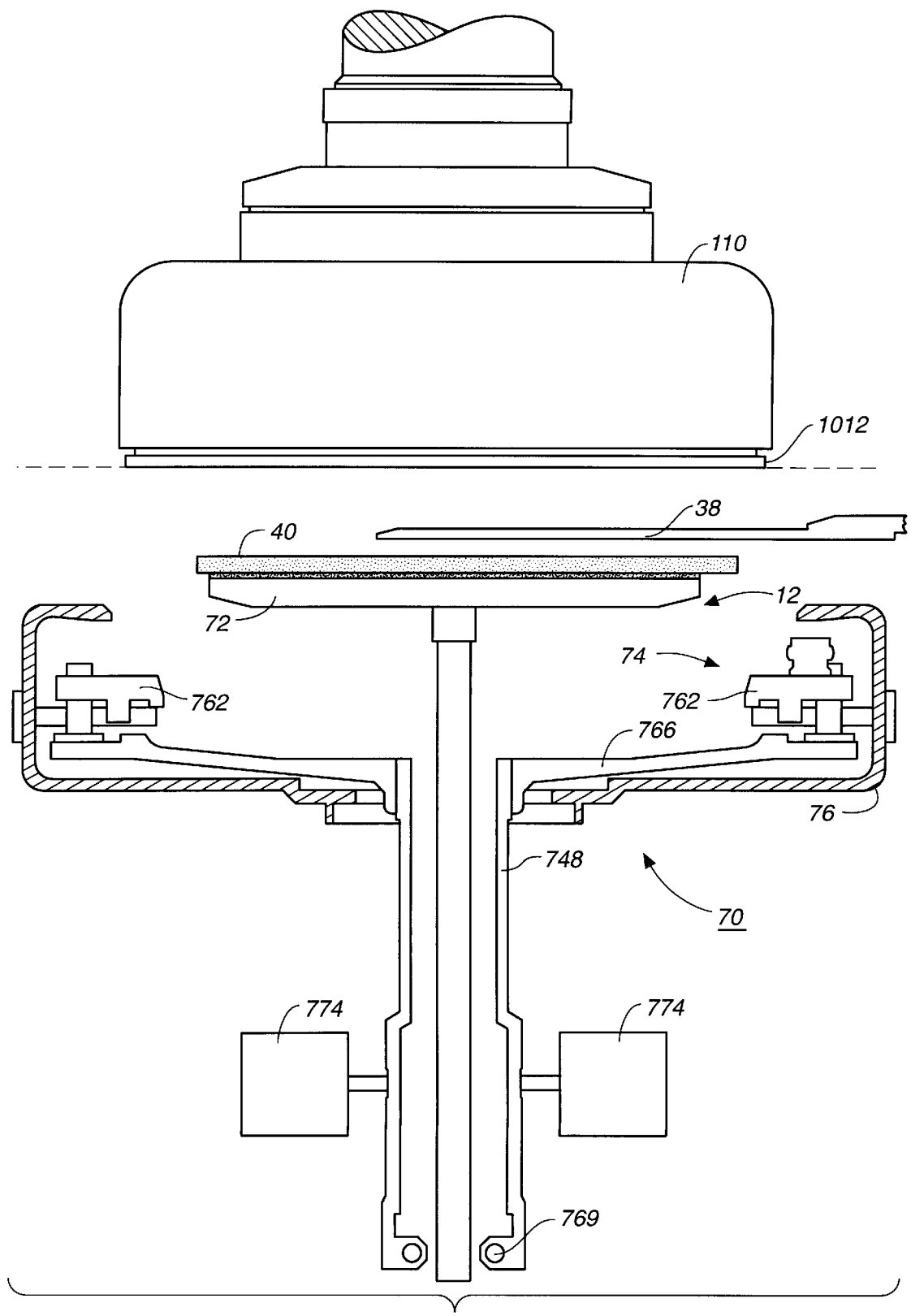
FIG._47A

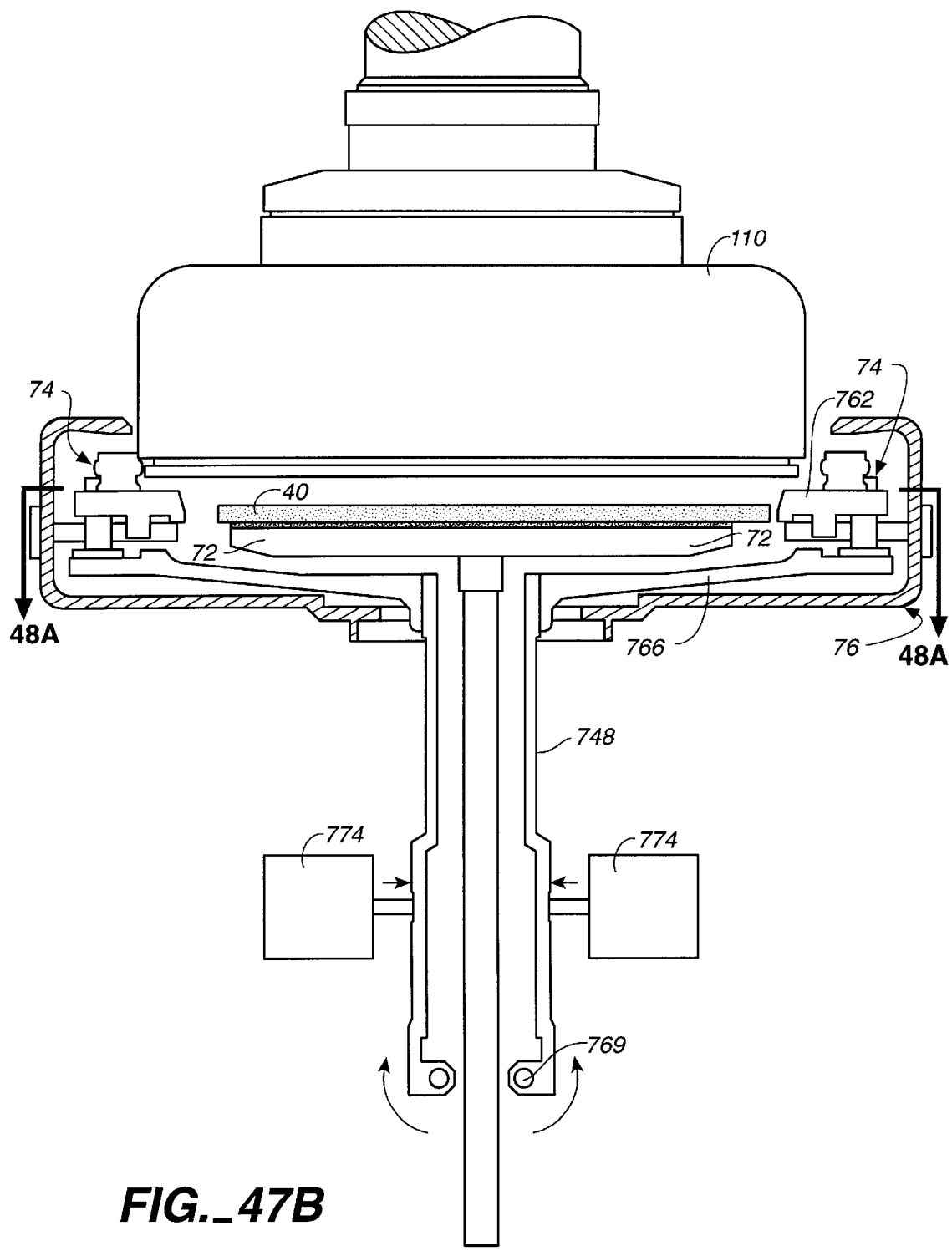
FIG._47B

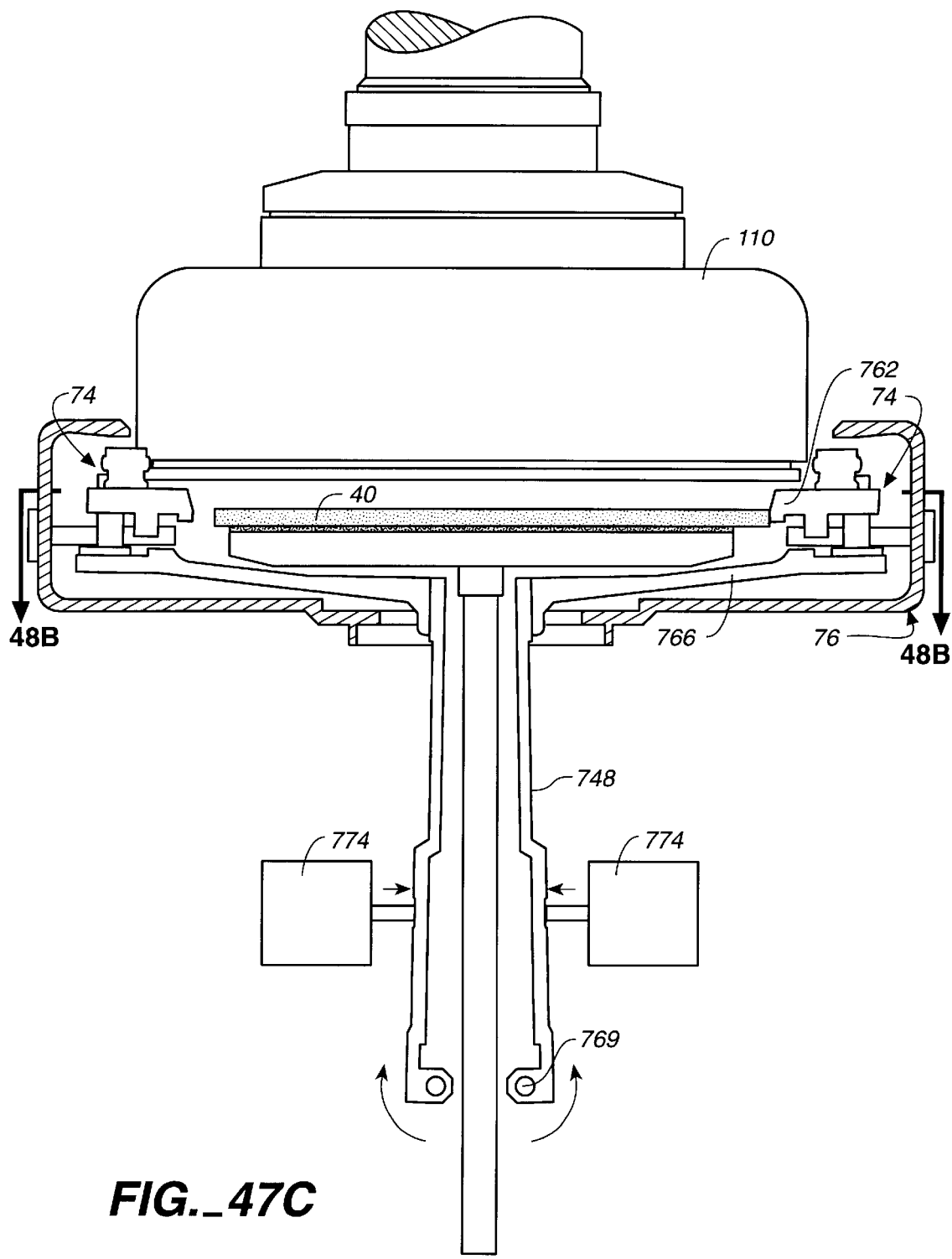
FIG._47C

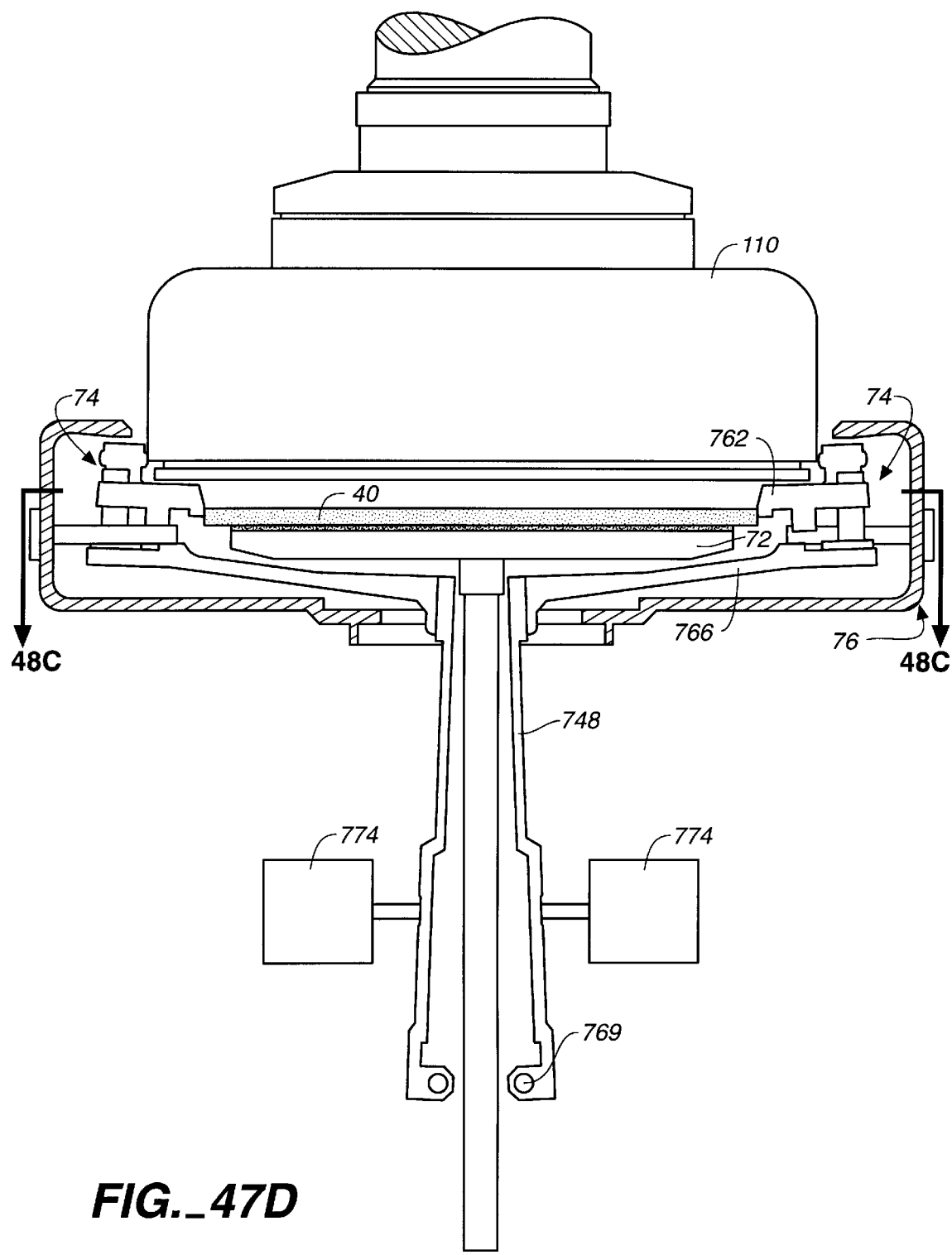
FIG._47D

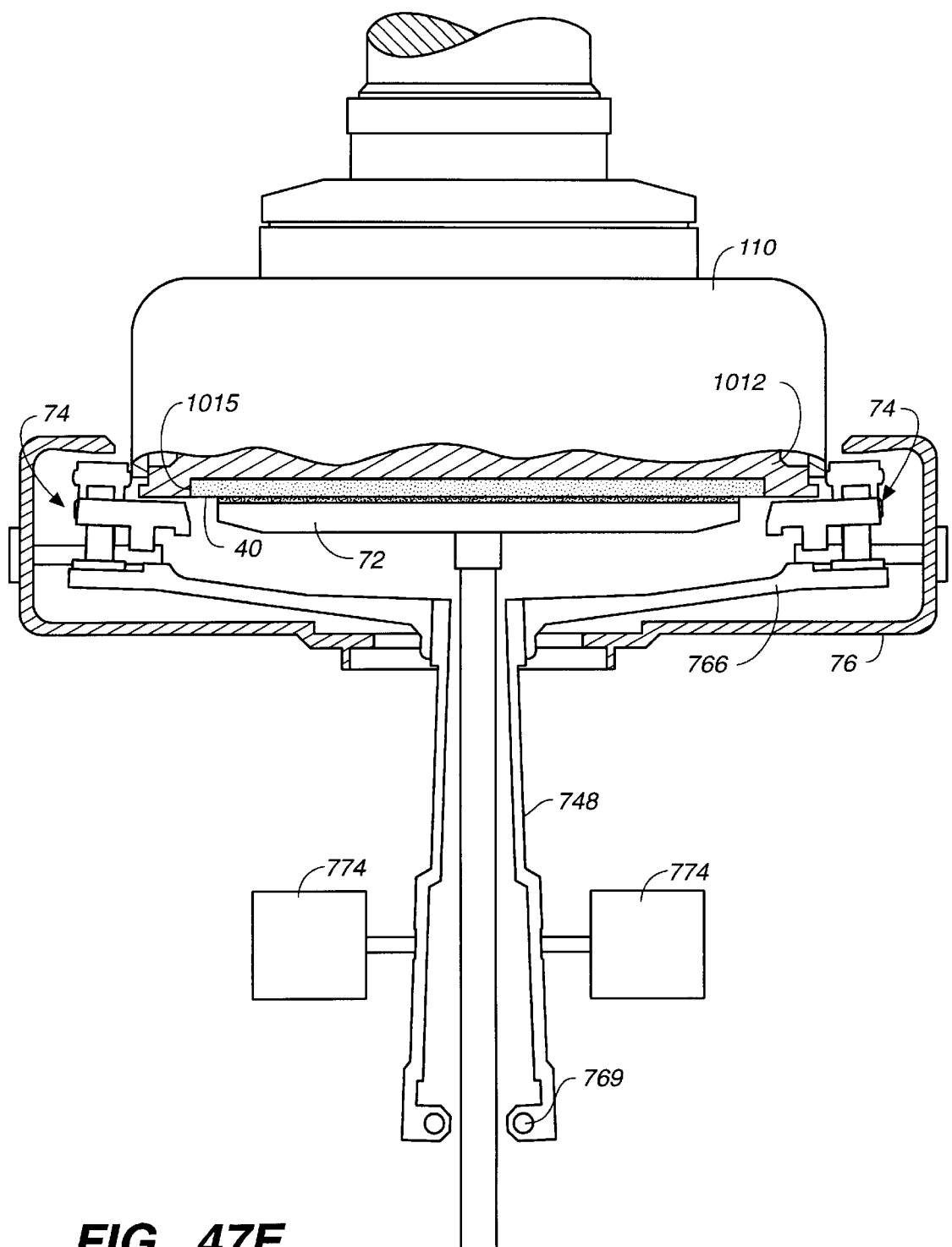
FIG._47E

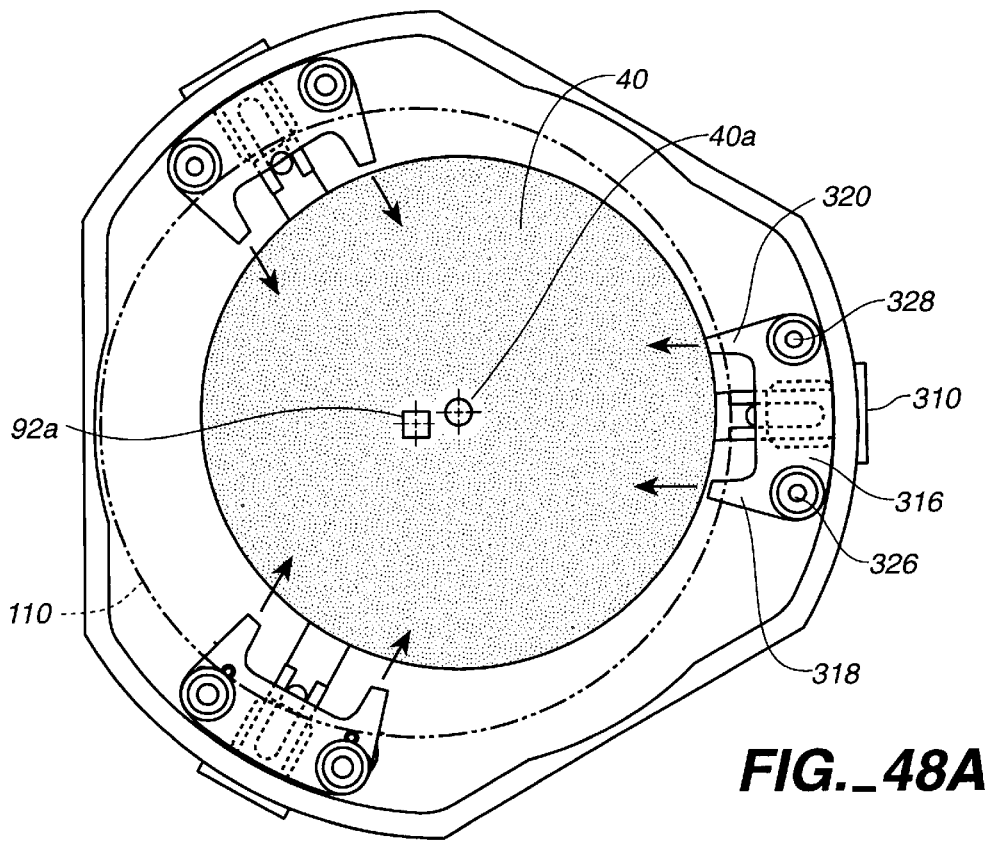
FIG._48A
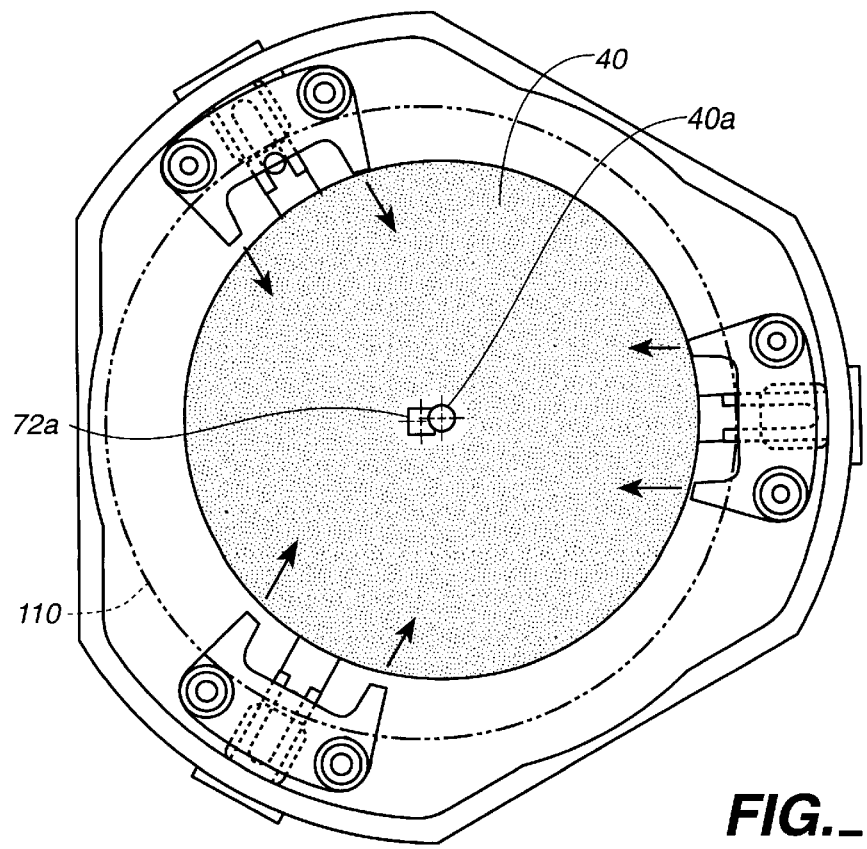
FIG._48B

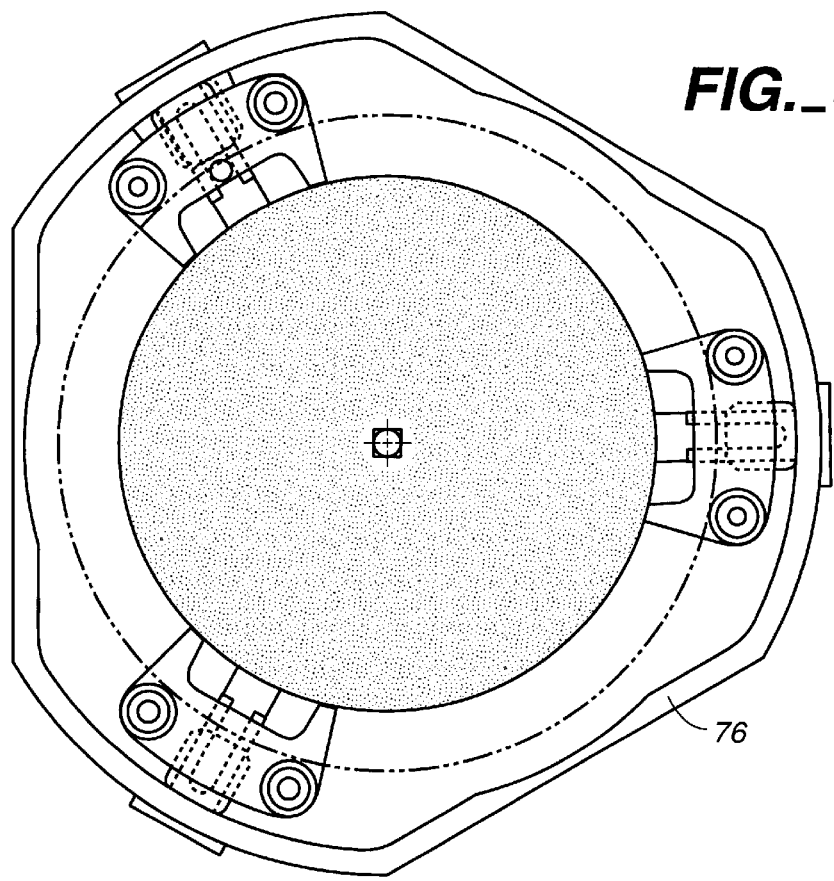
FIG._48C
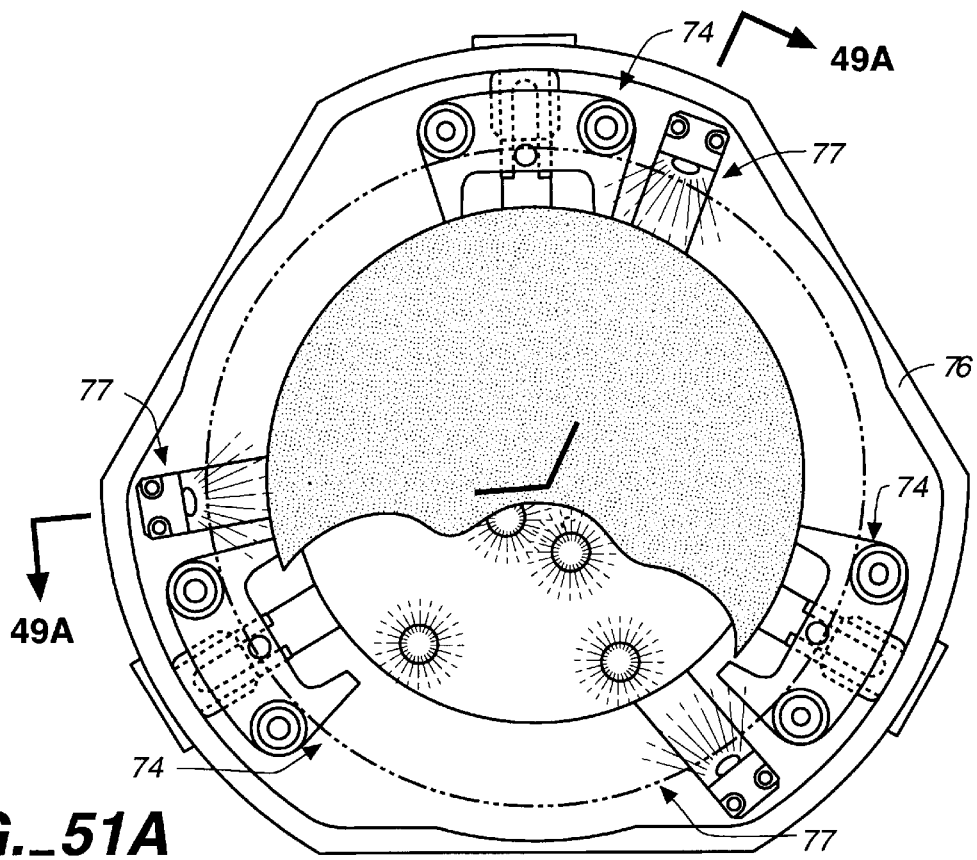
FIG._51A

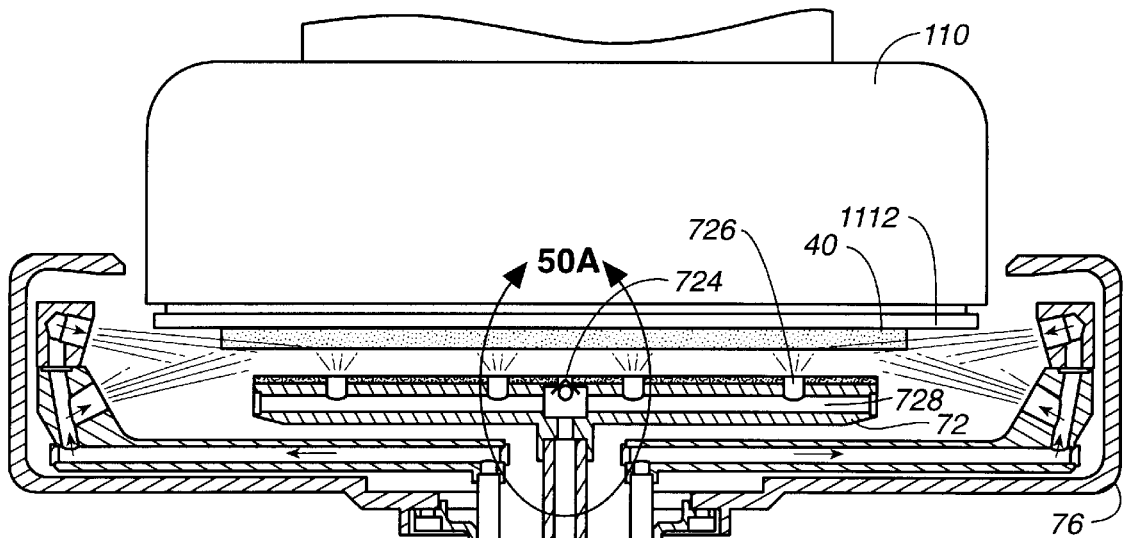
FIG._49A
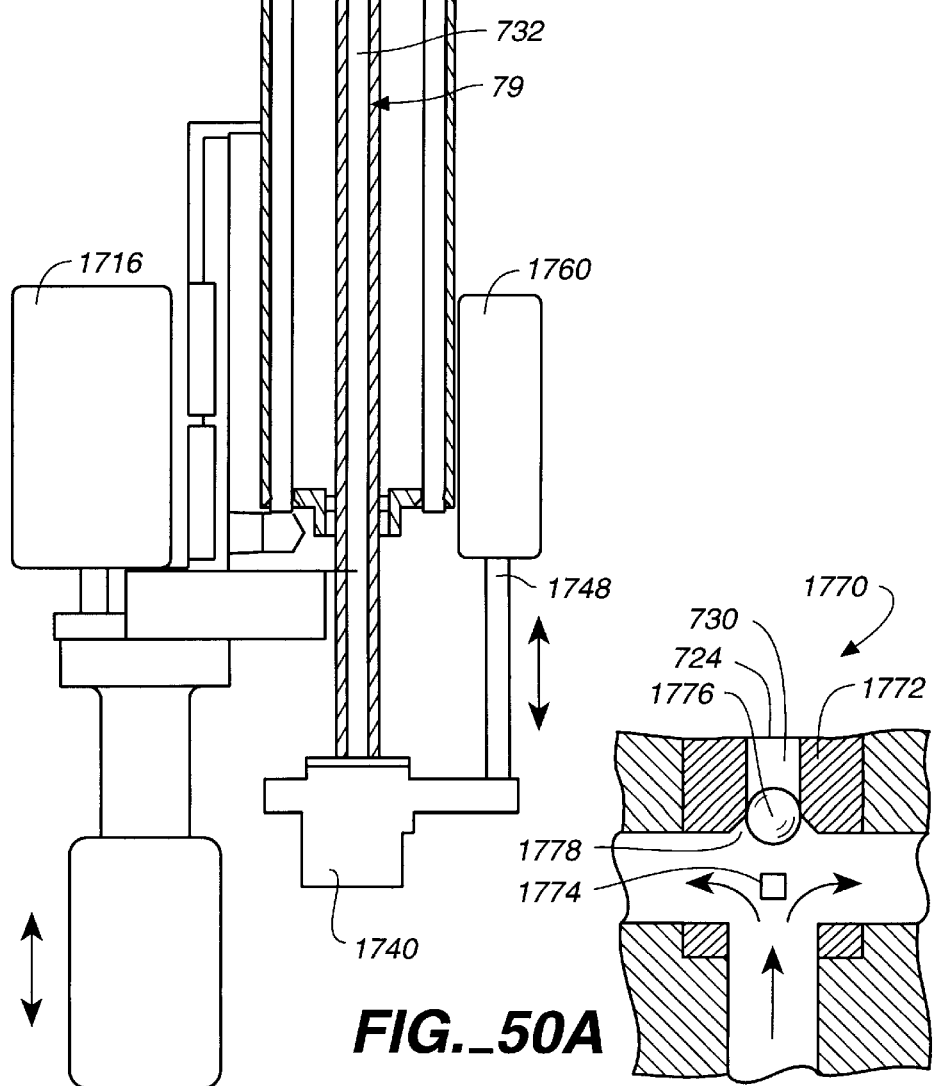
FIG._50A

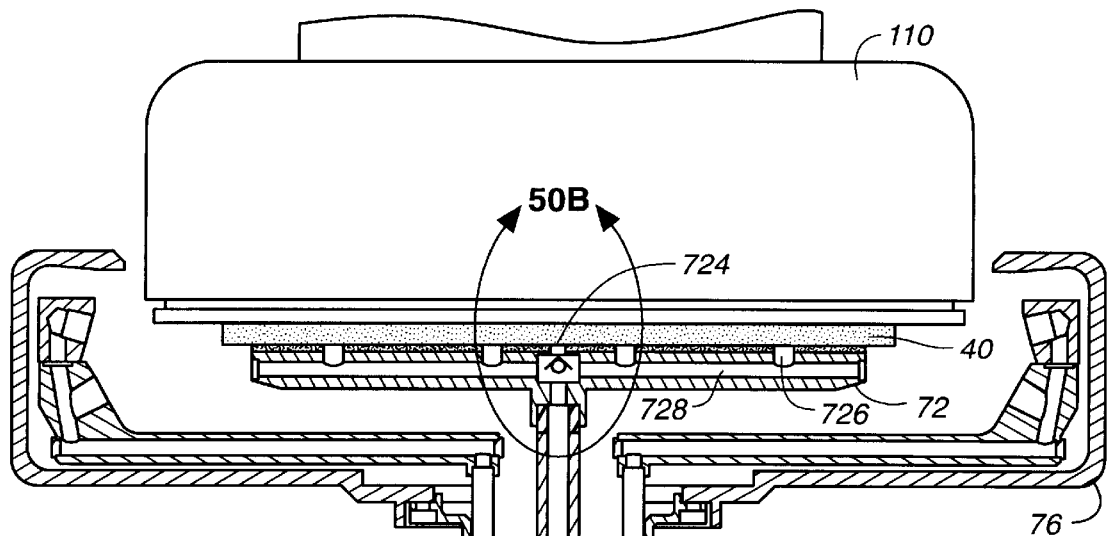
FIG._49B
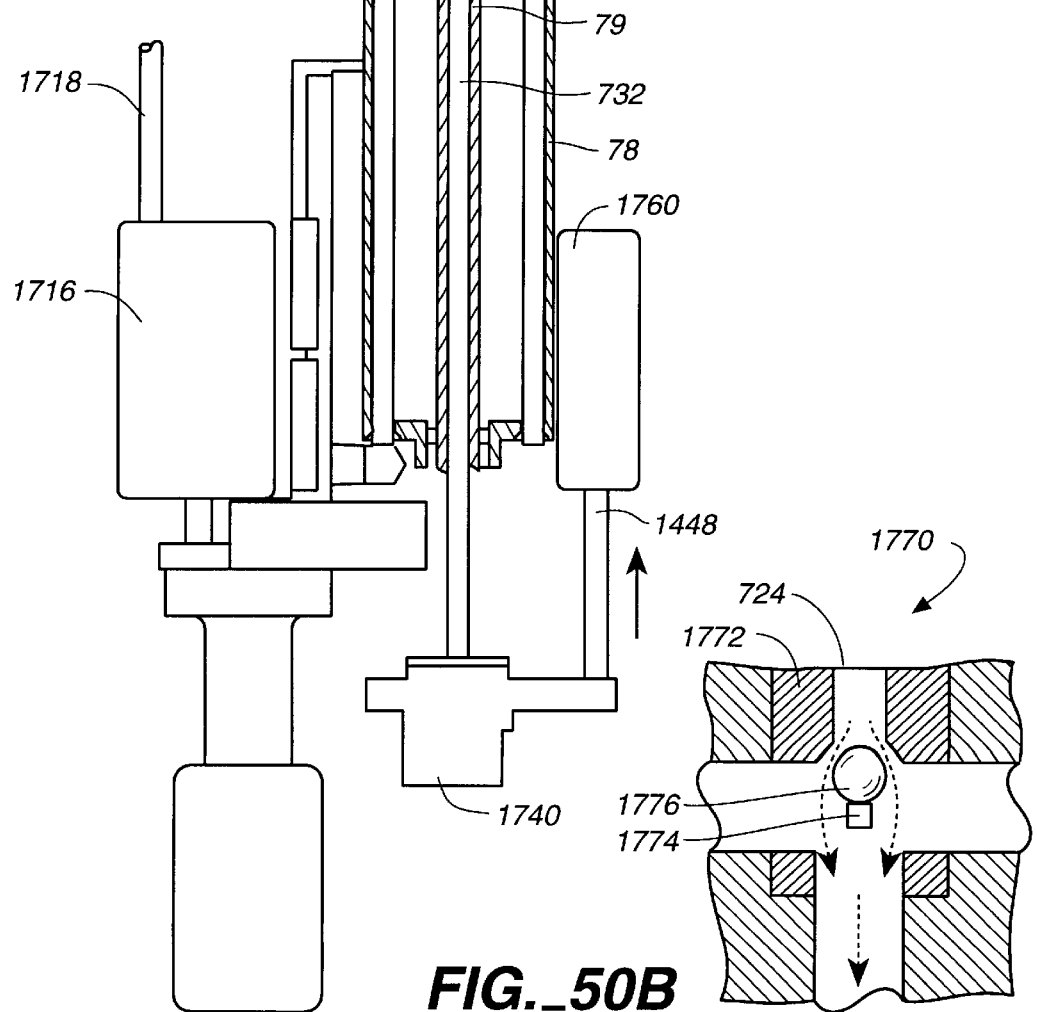
FIG._50B

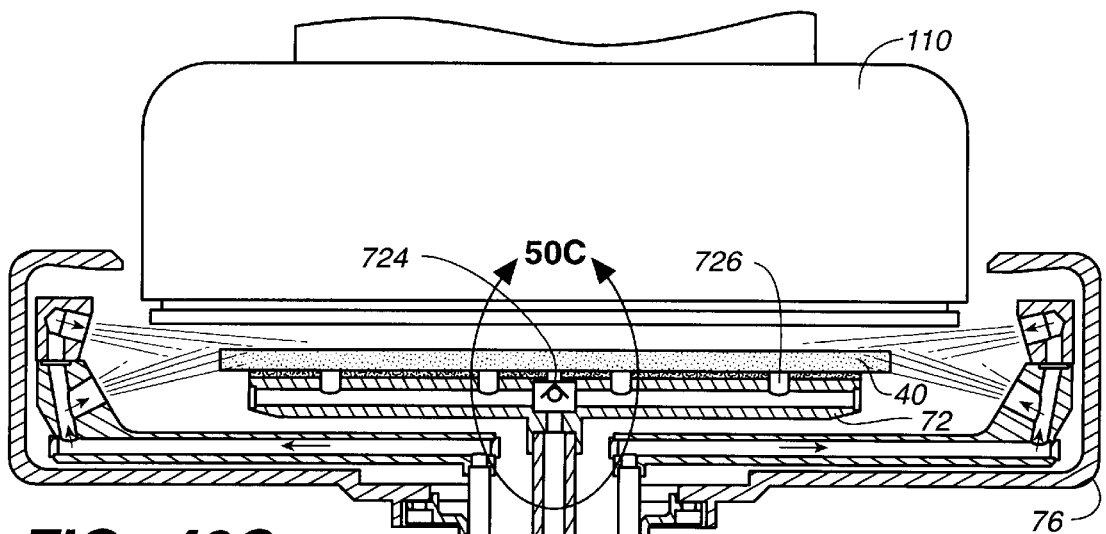
FIG._49C
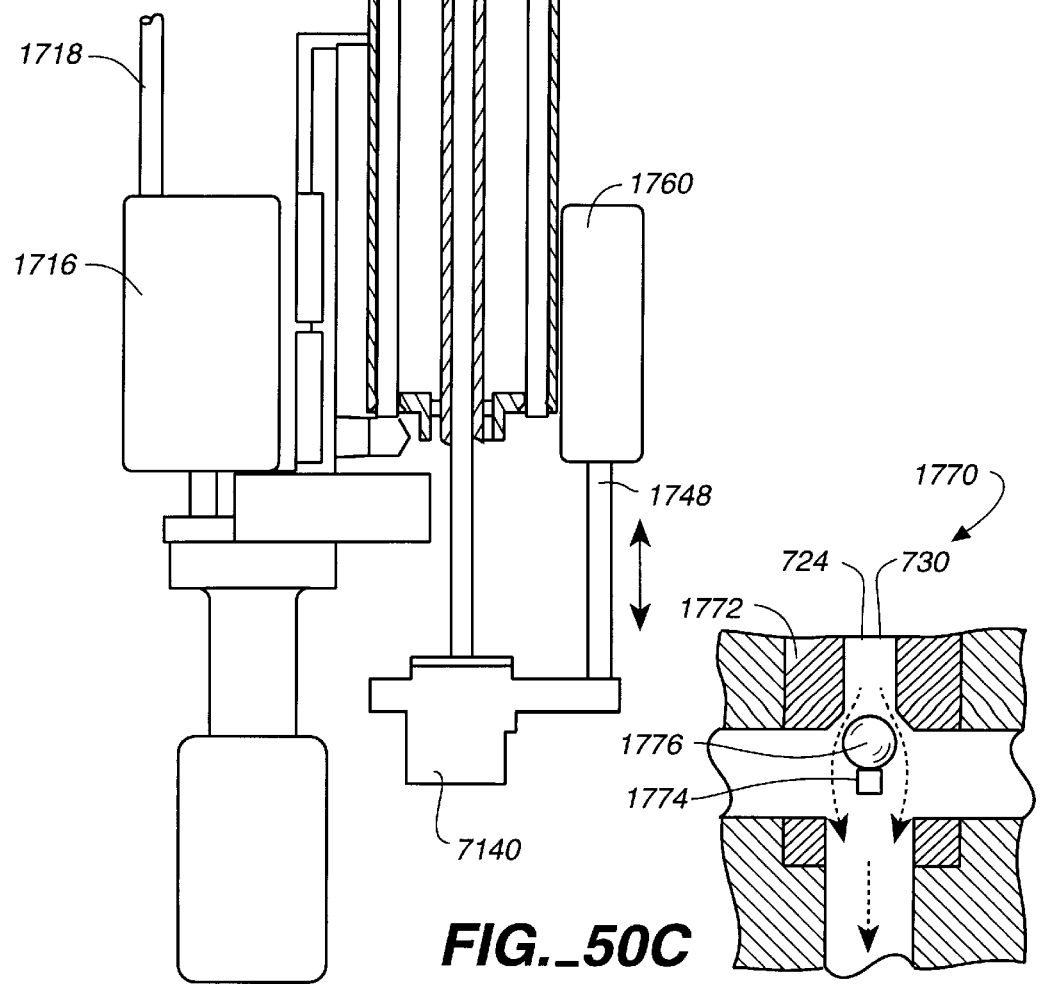
FIG._50C

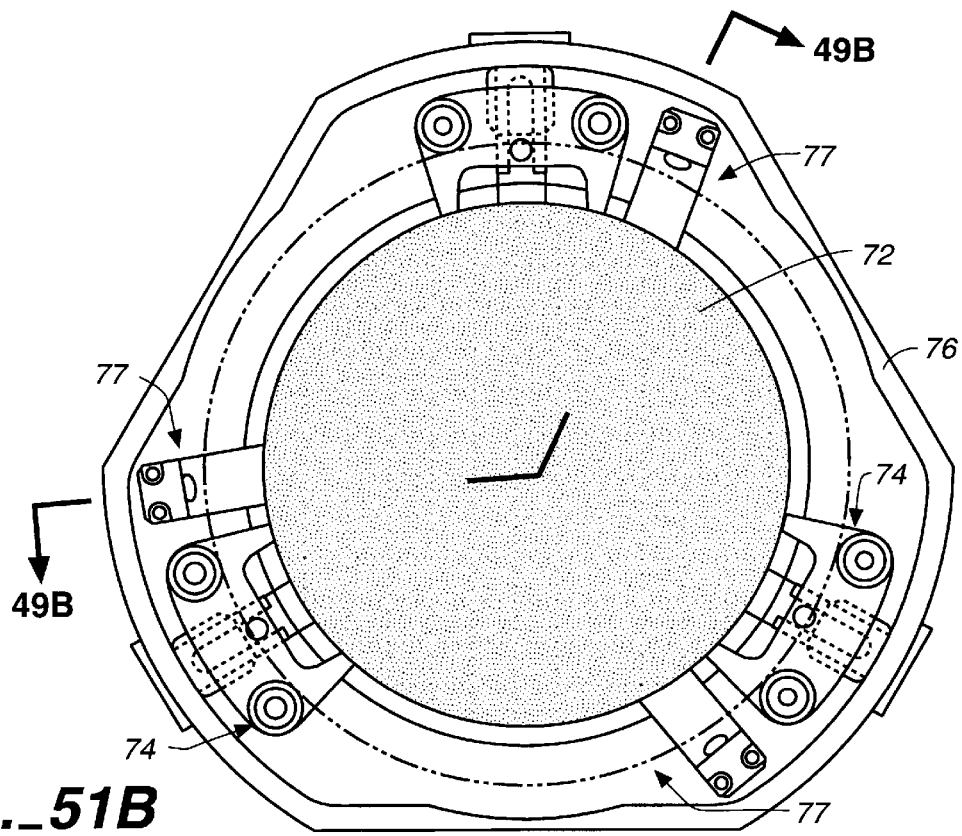
FIG._51B
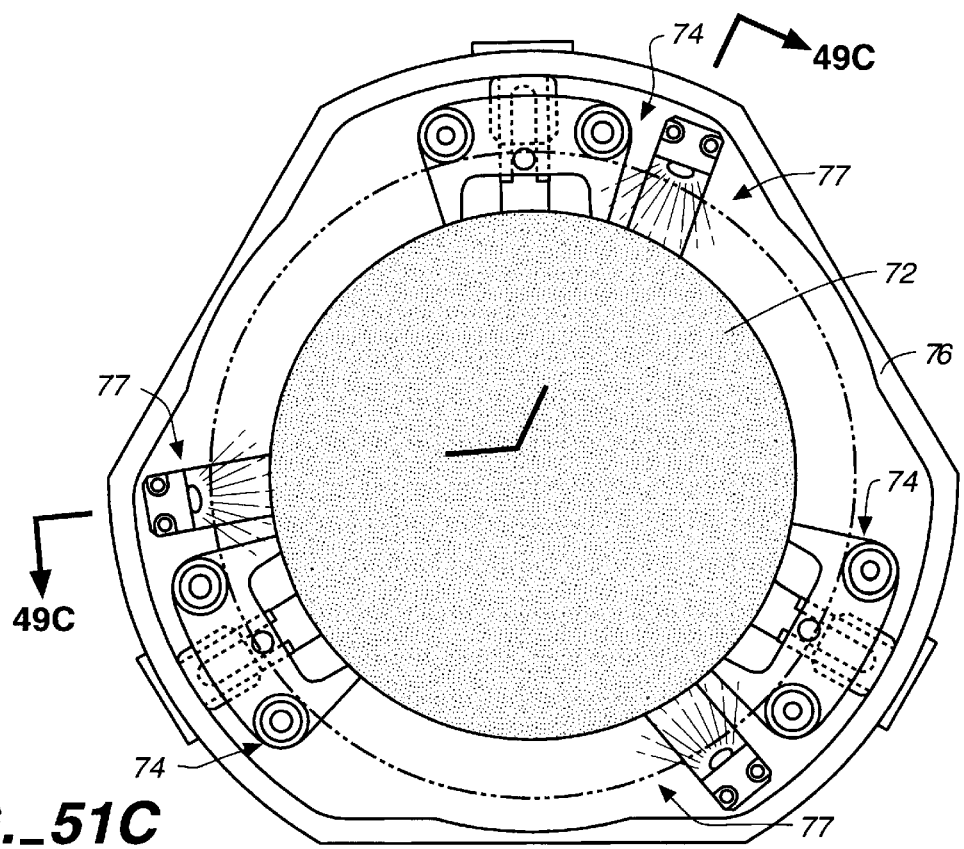
FIG._51C

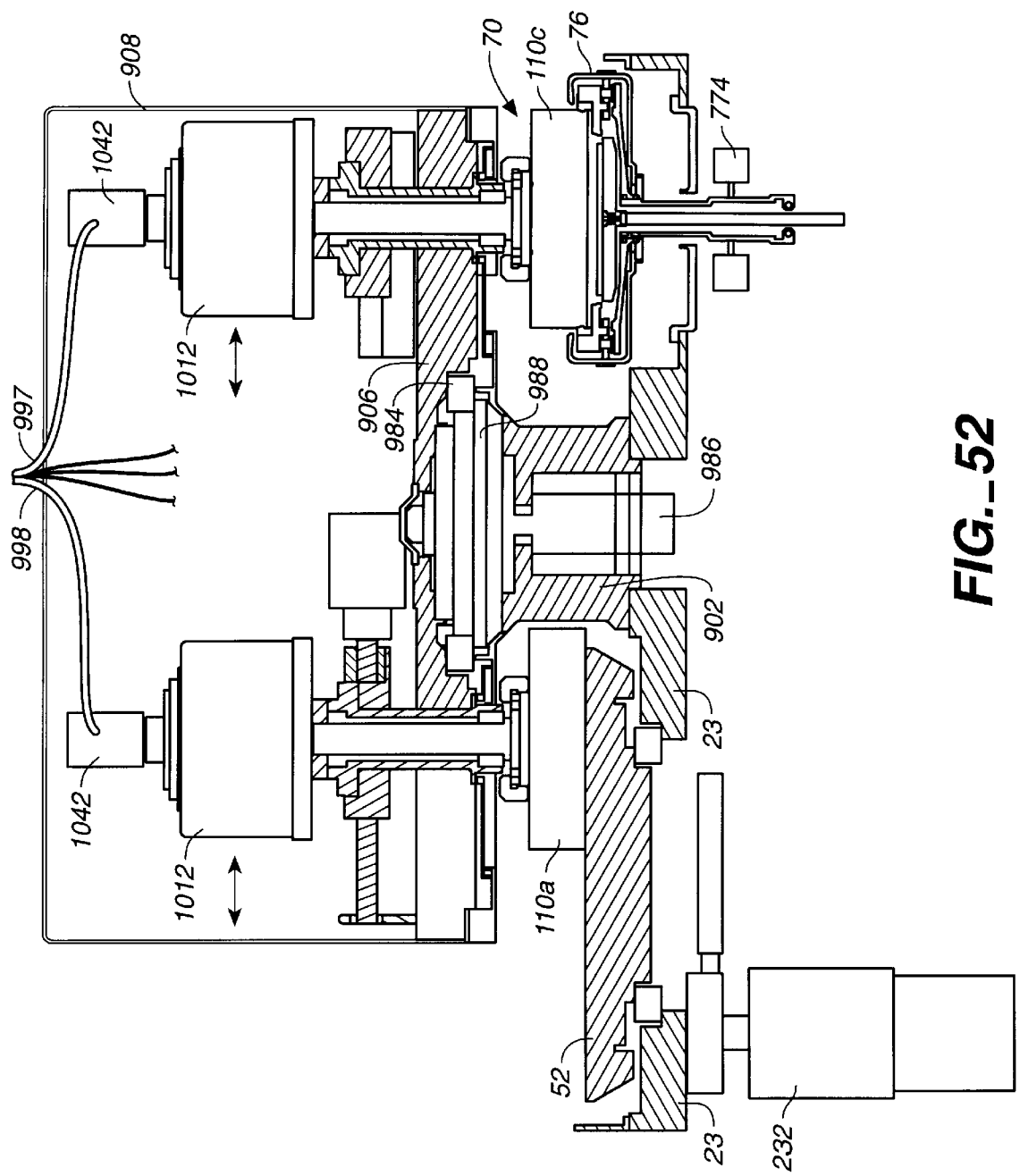
FIG._52

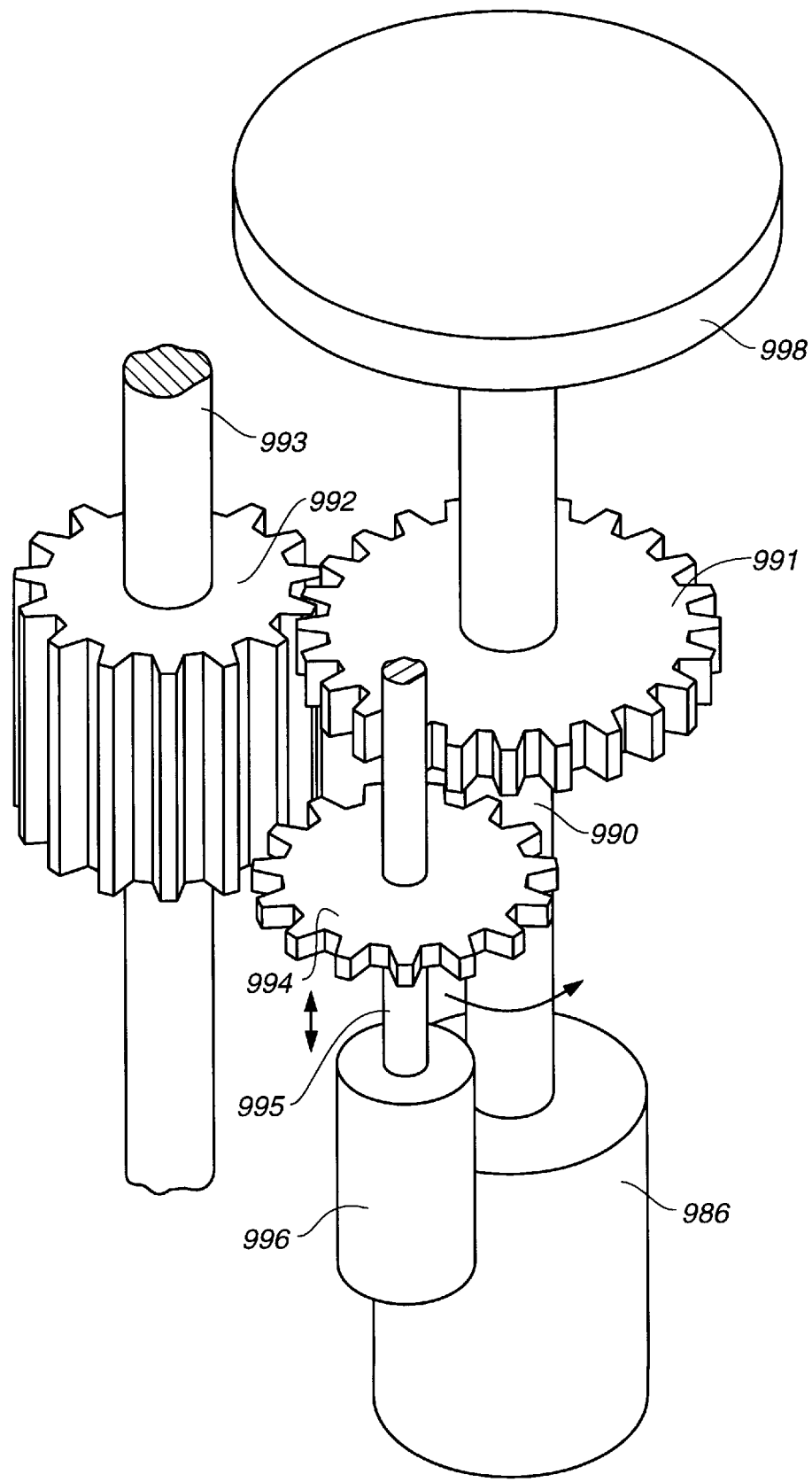
FIG._53

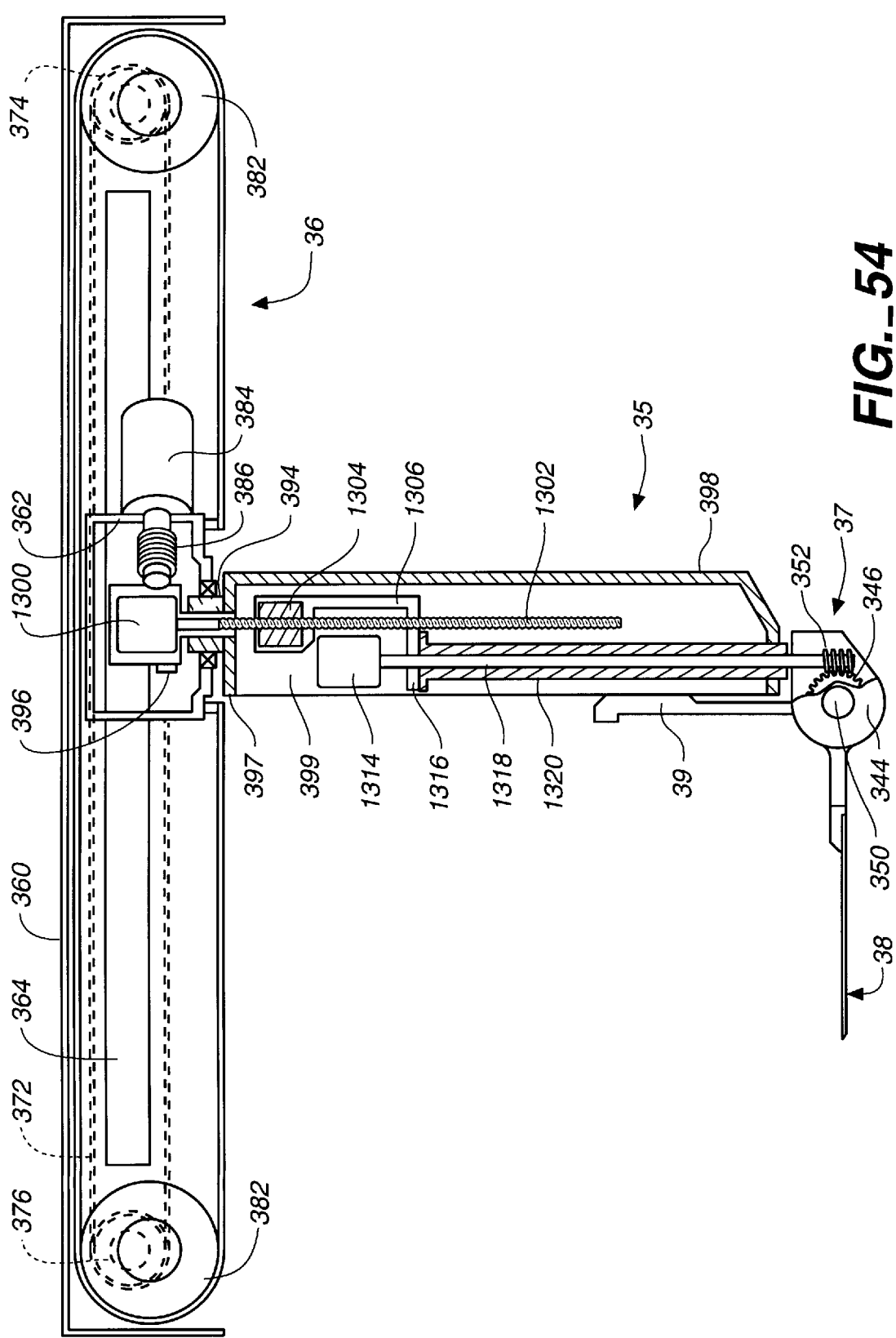
FIG._54

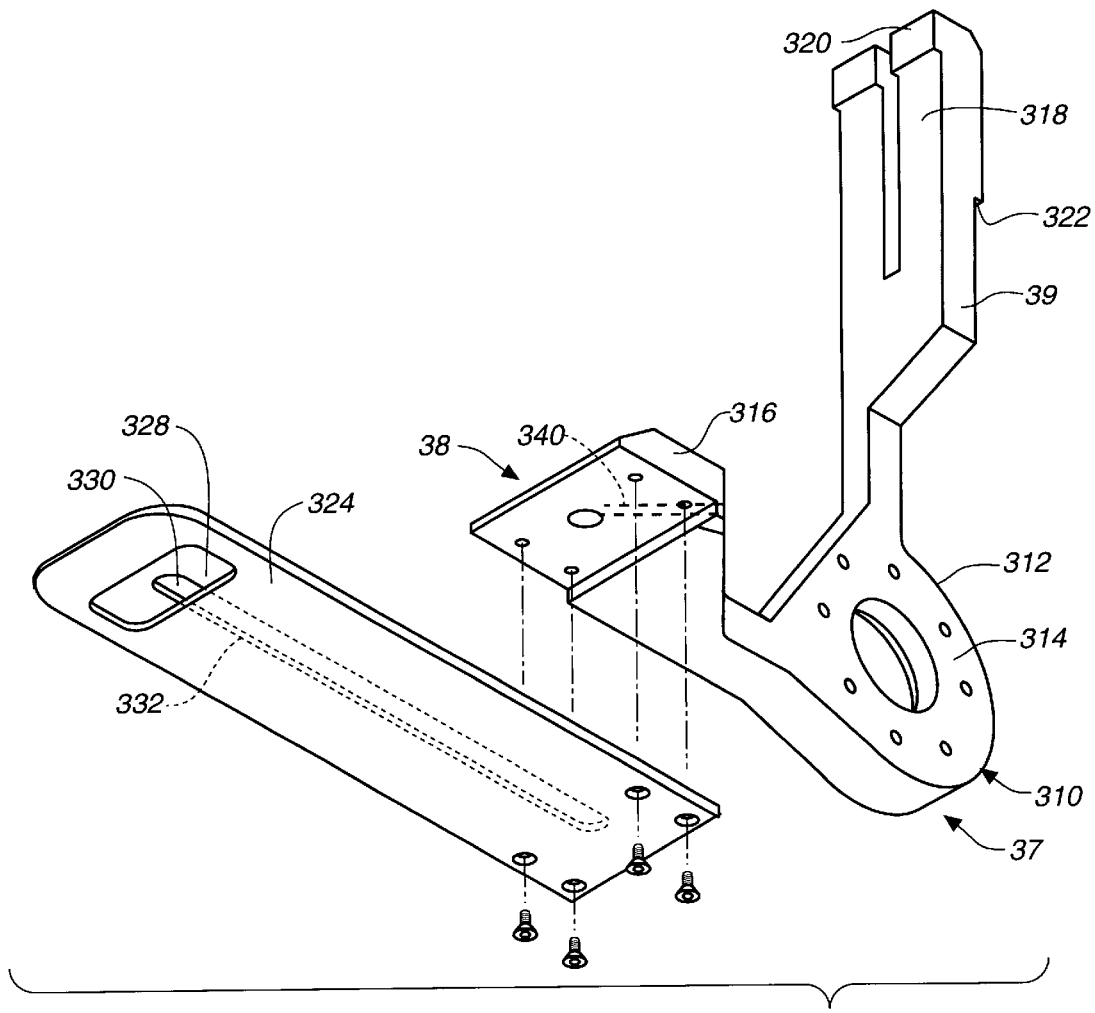
FIG._55
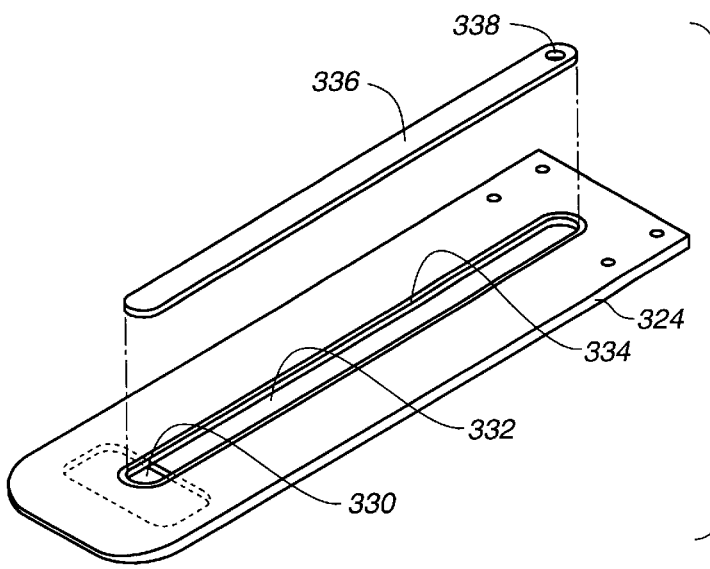
FIG._56

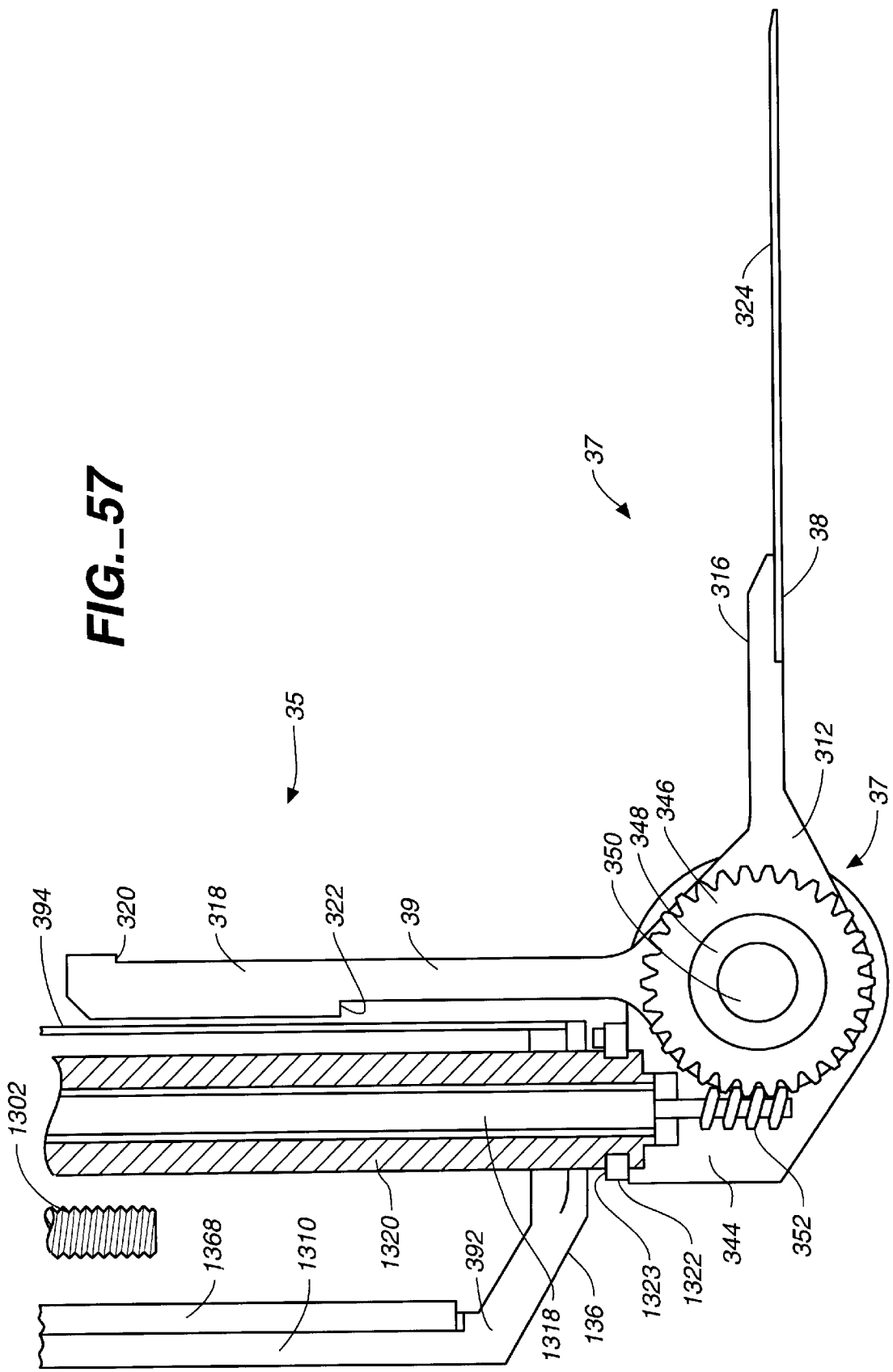

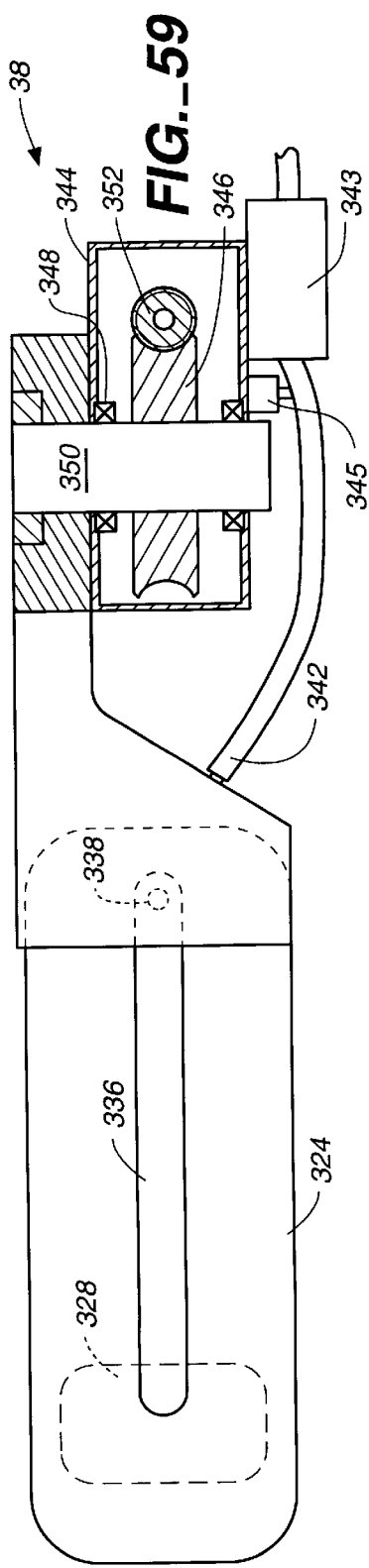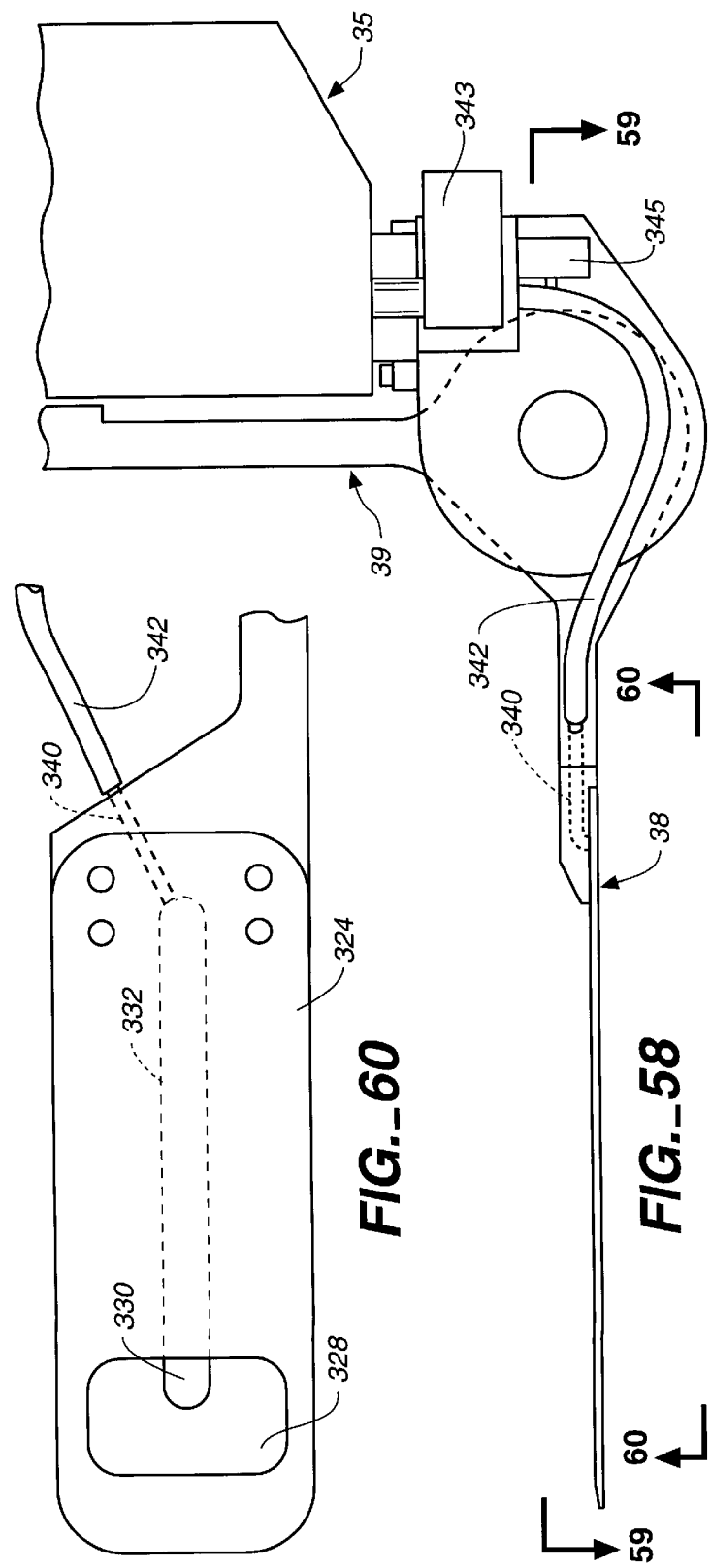

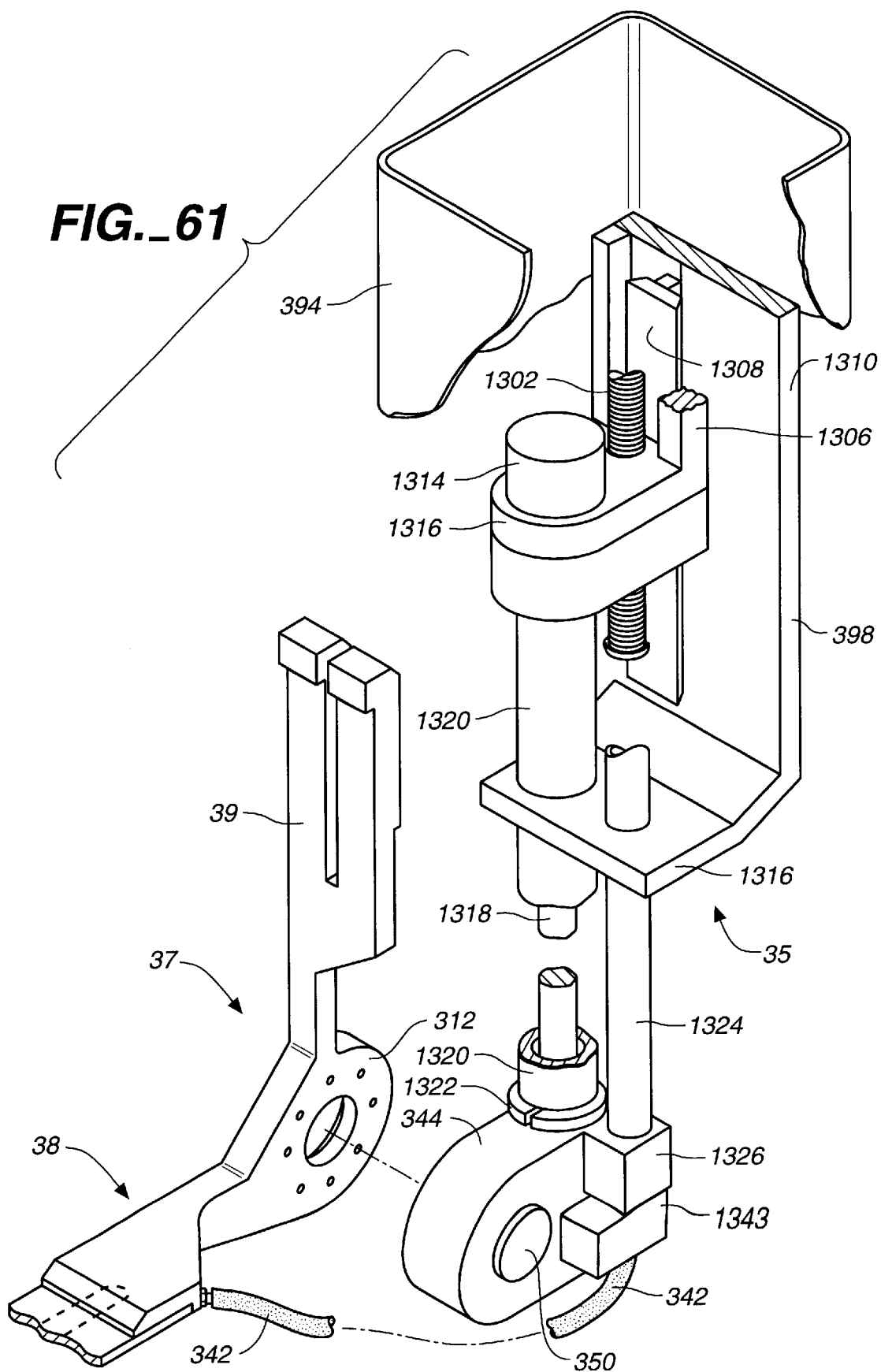
FIG._61

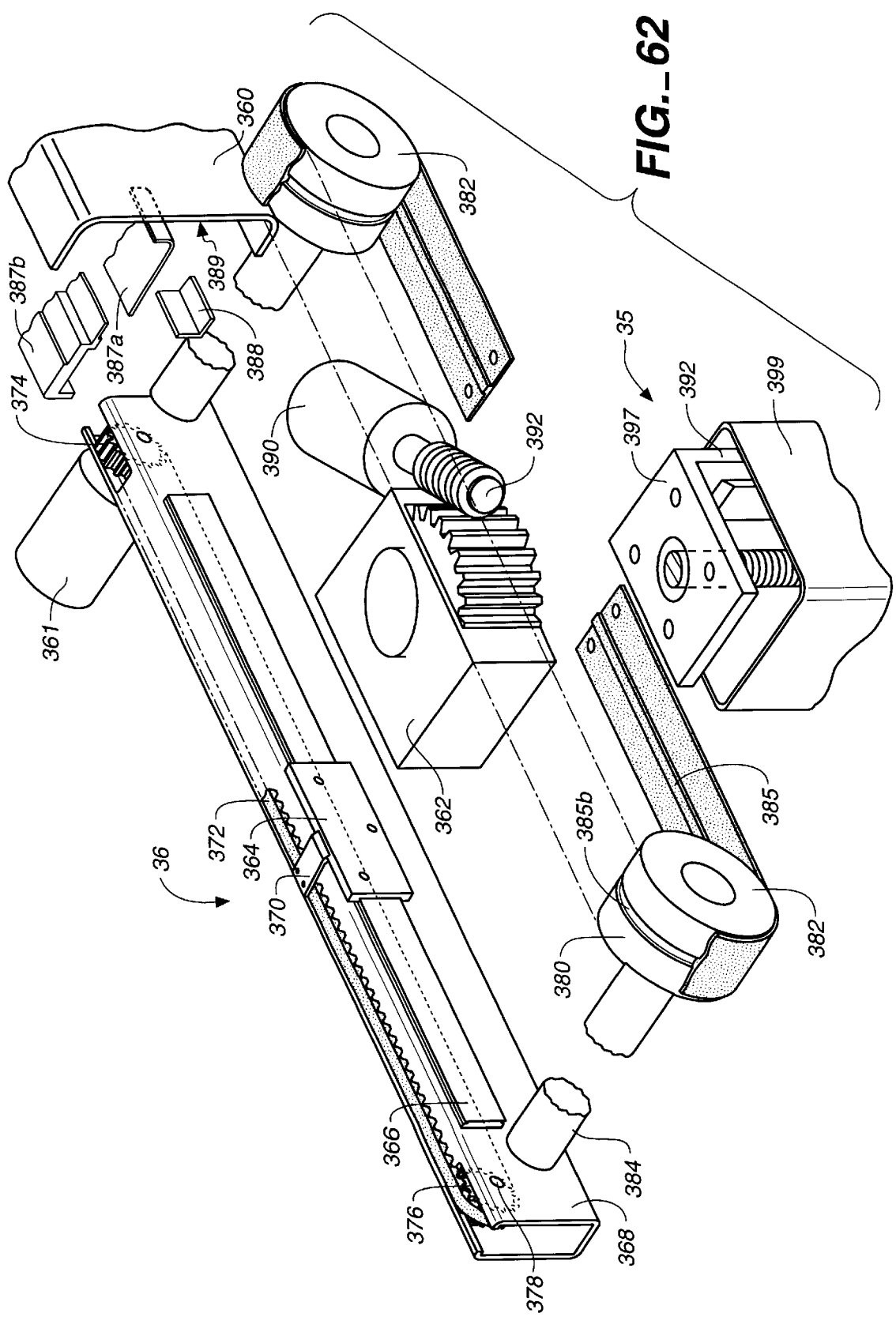

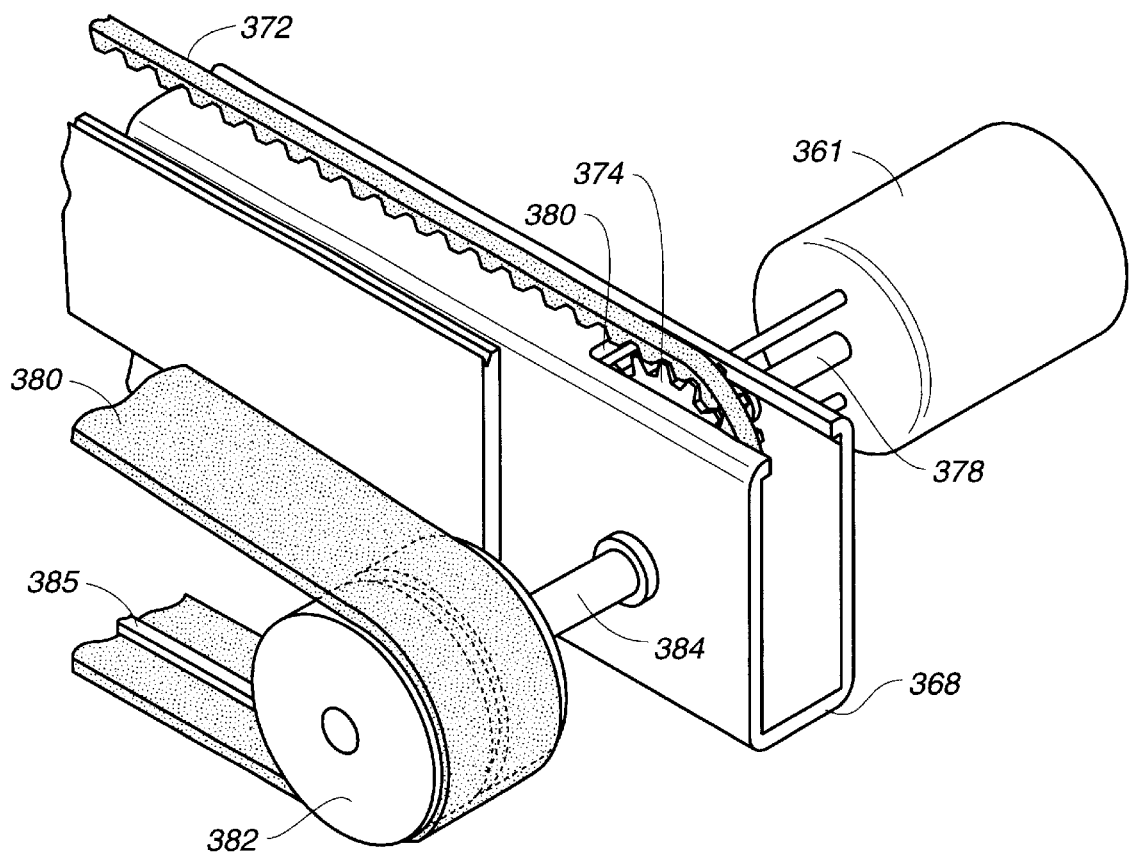
FIG._63

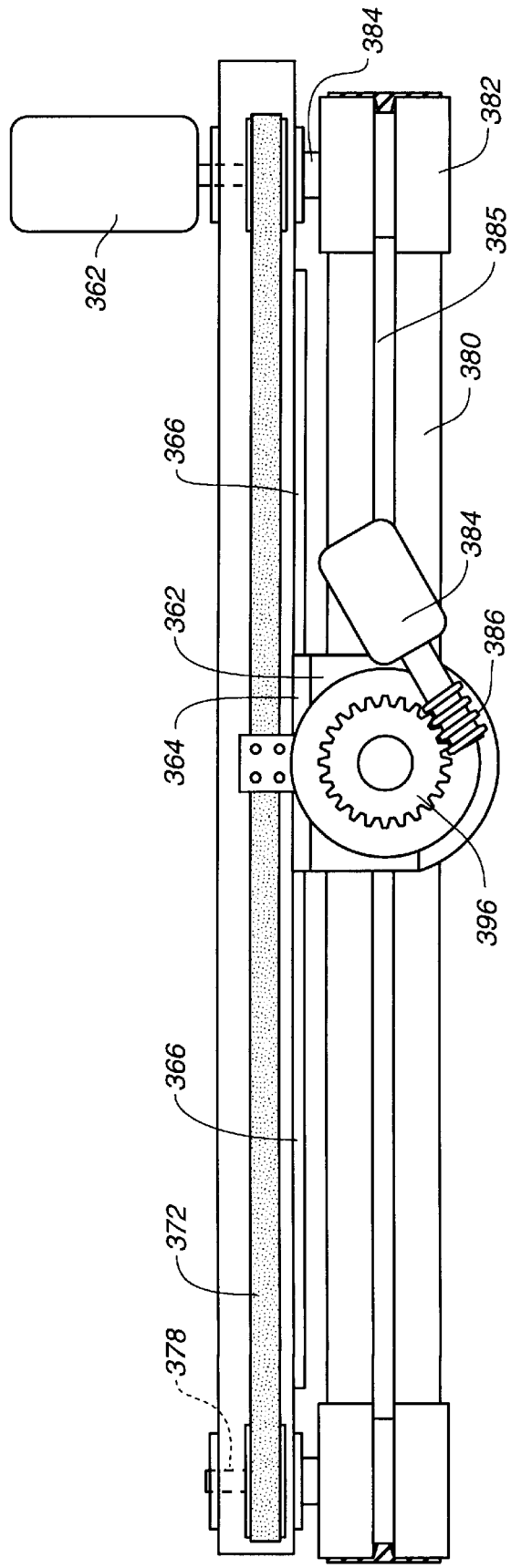

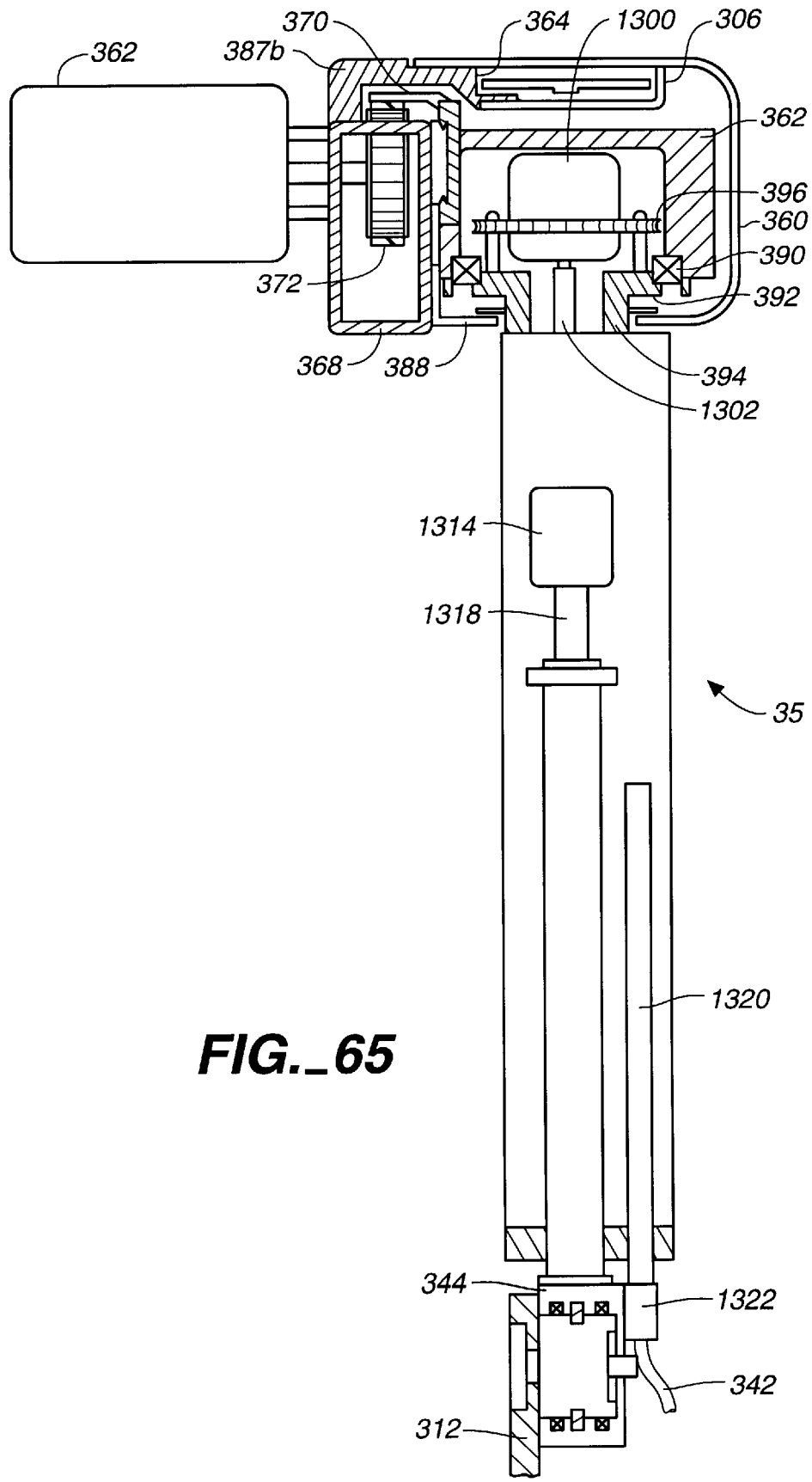
FIG._65

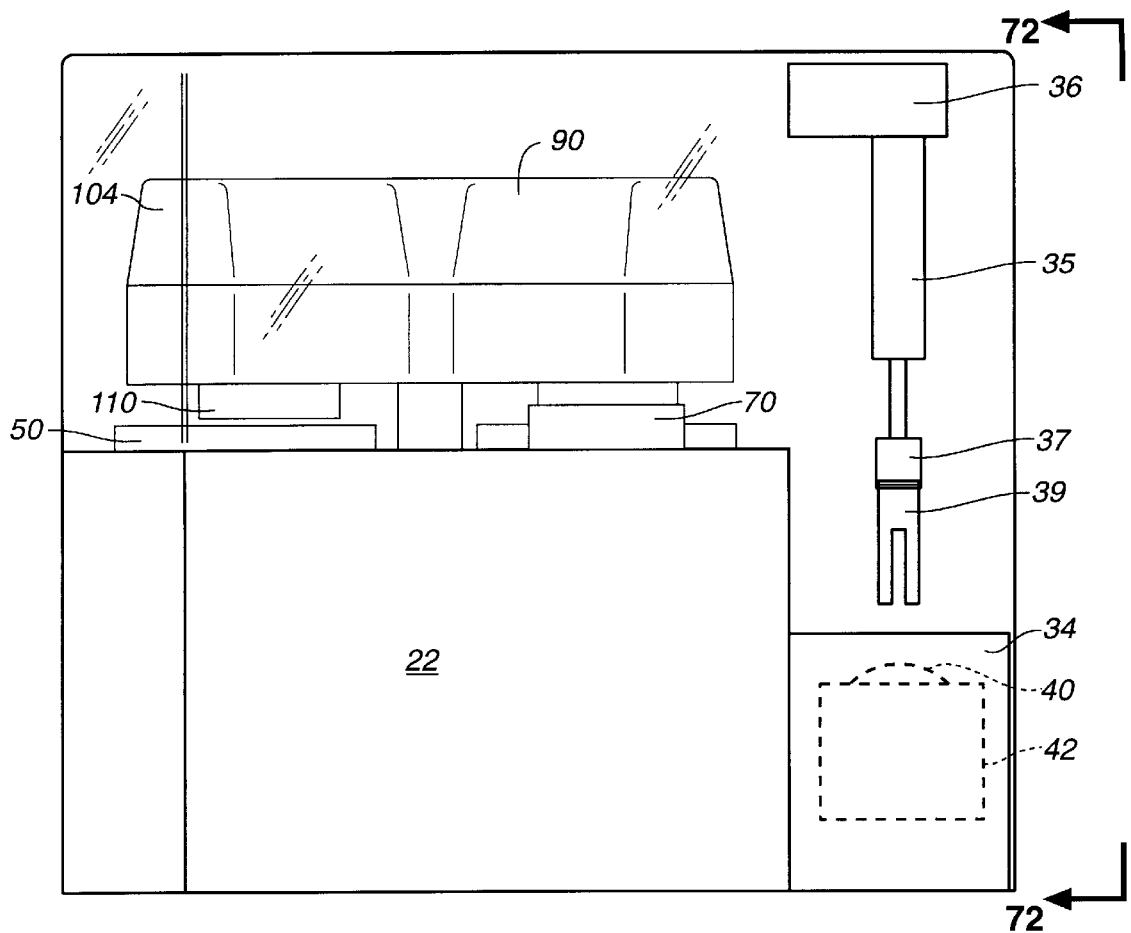
FIG._66

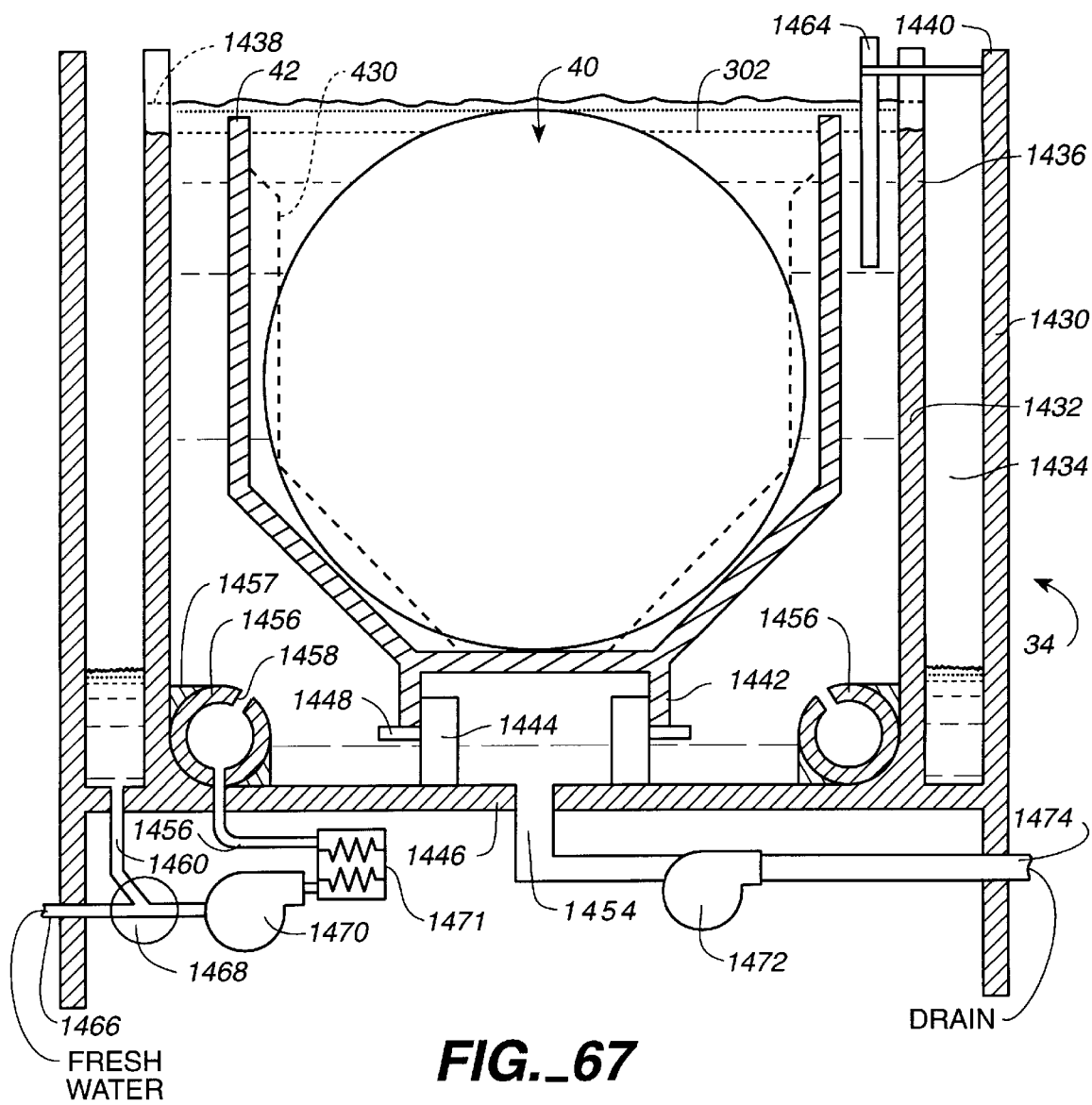
FIG._67
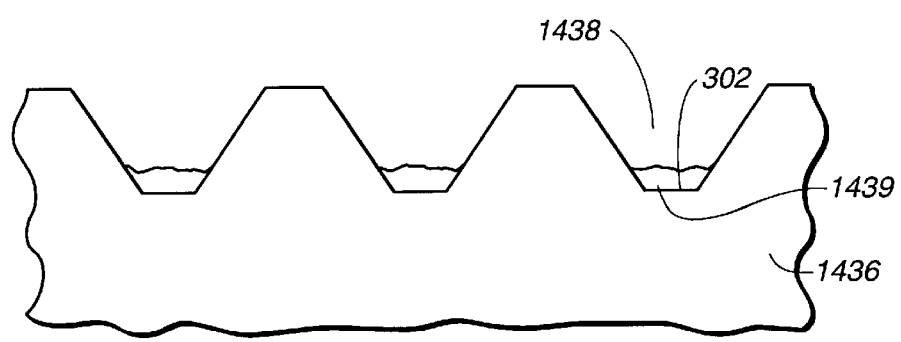
FIG._68

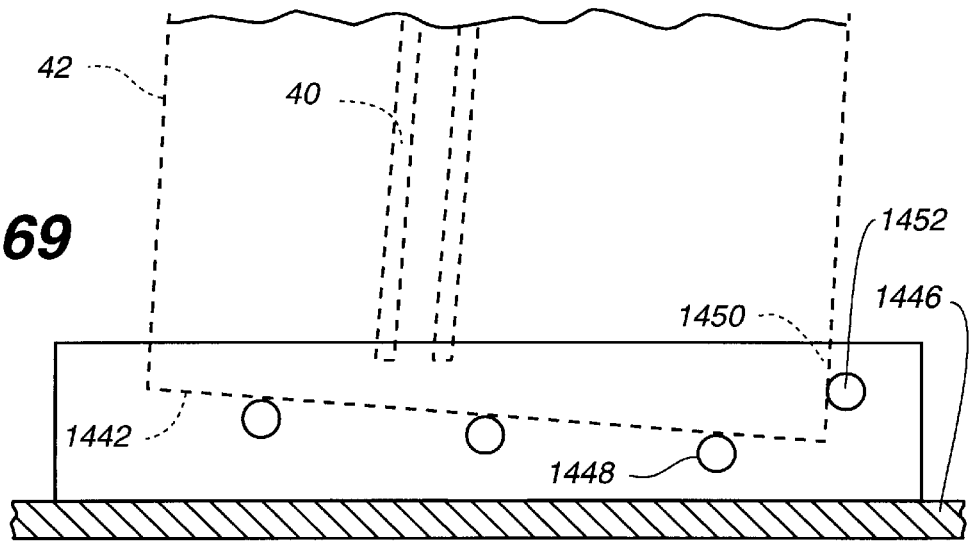
FIG._69
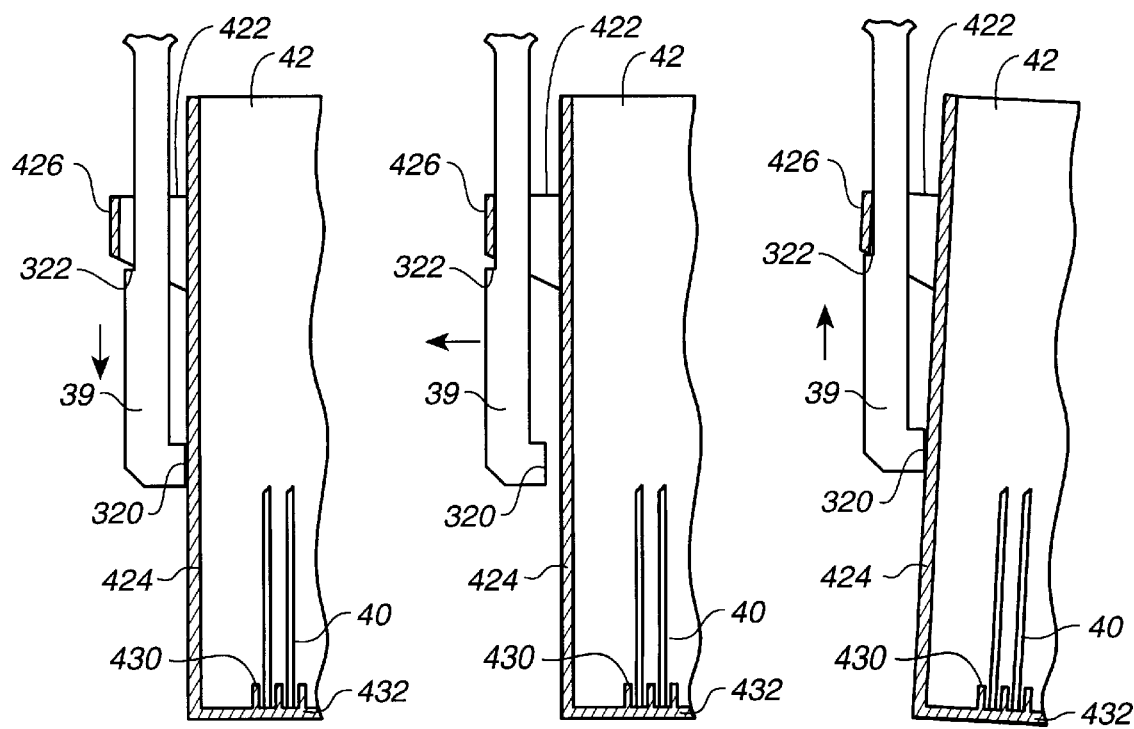
FIG._71A   FIG._71B   FIG._71C

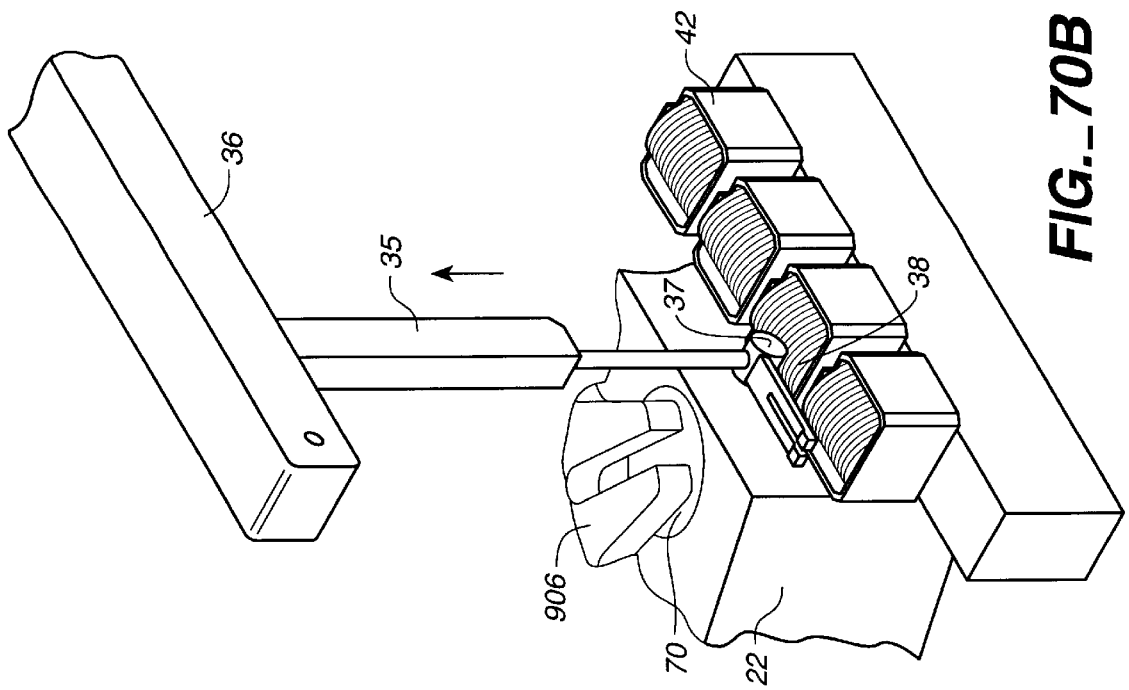
FIG._70B
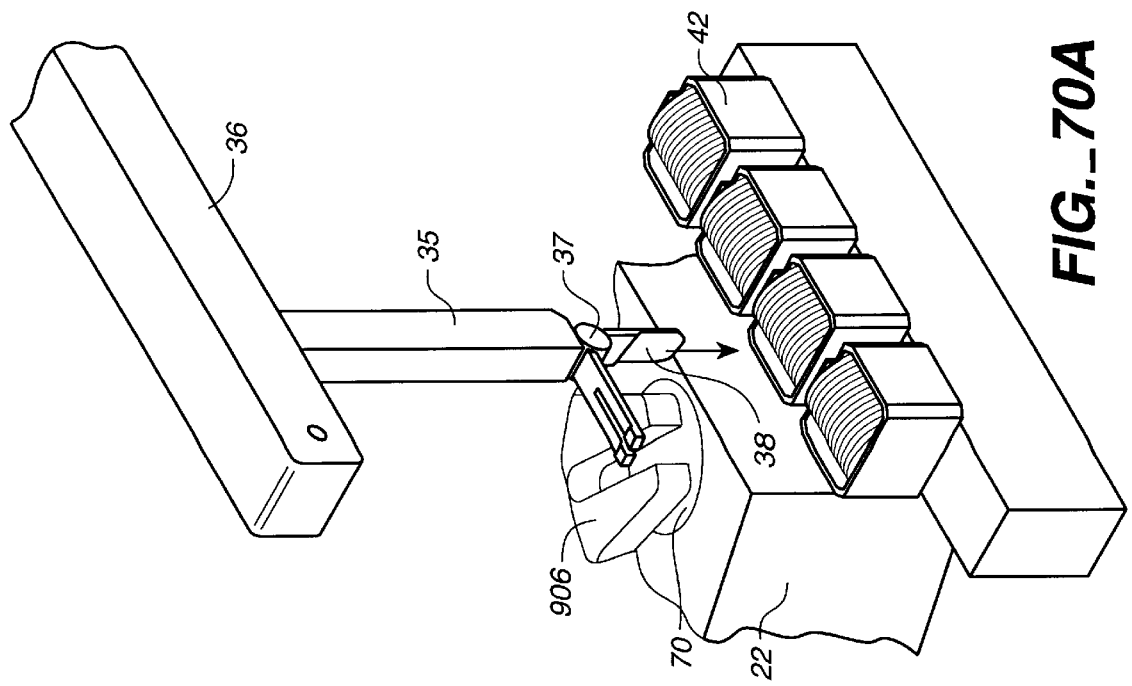
FIG._70A

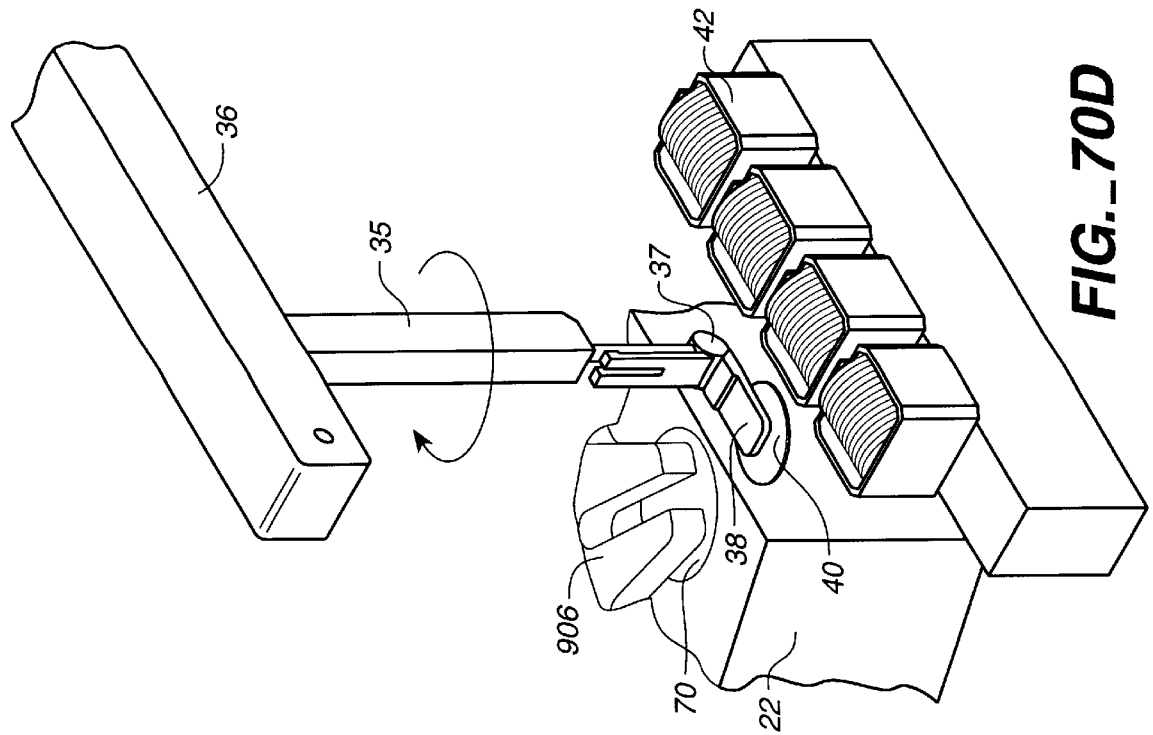
FIG._70D
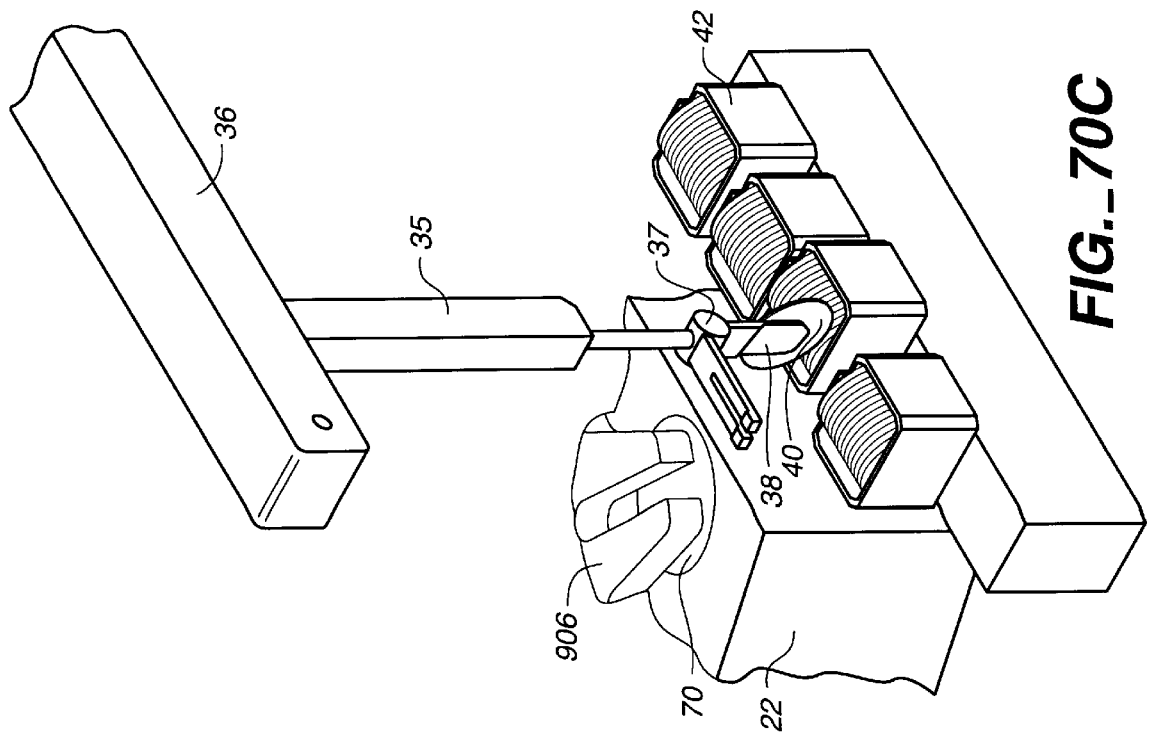
FIG._70C

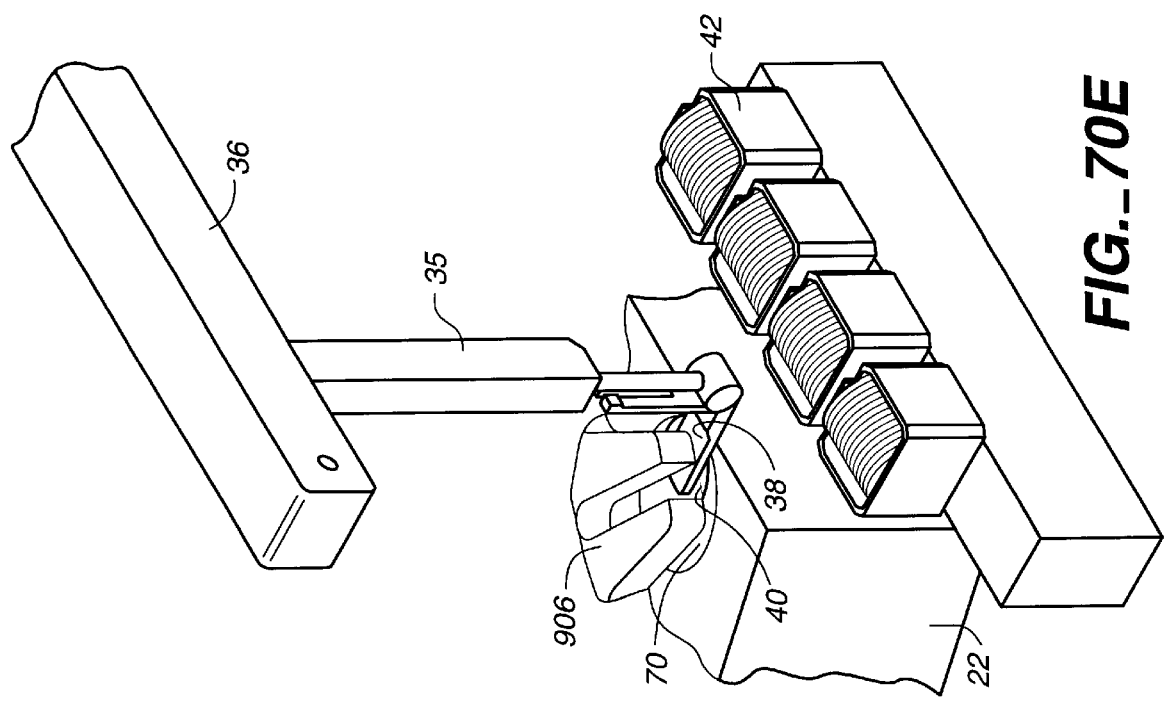

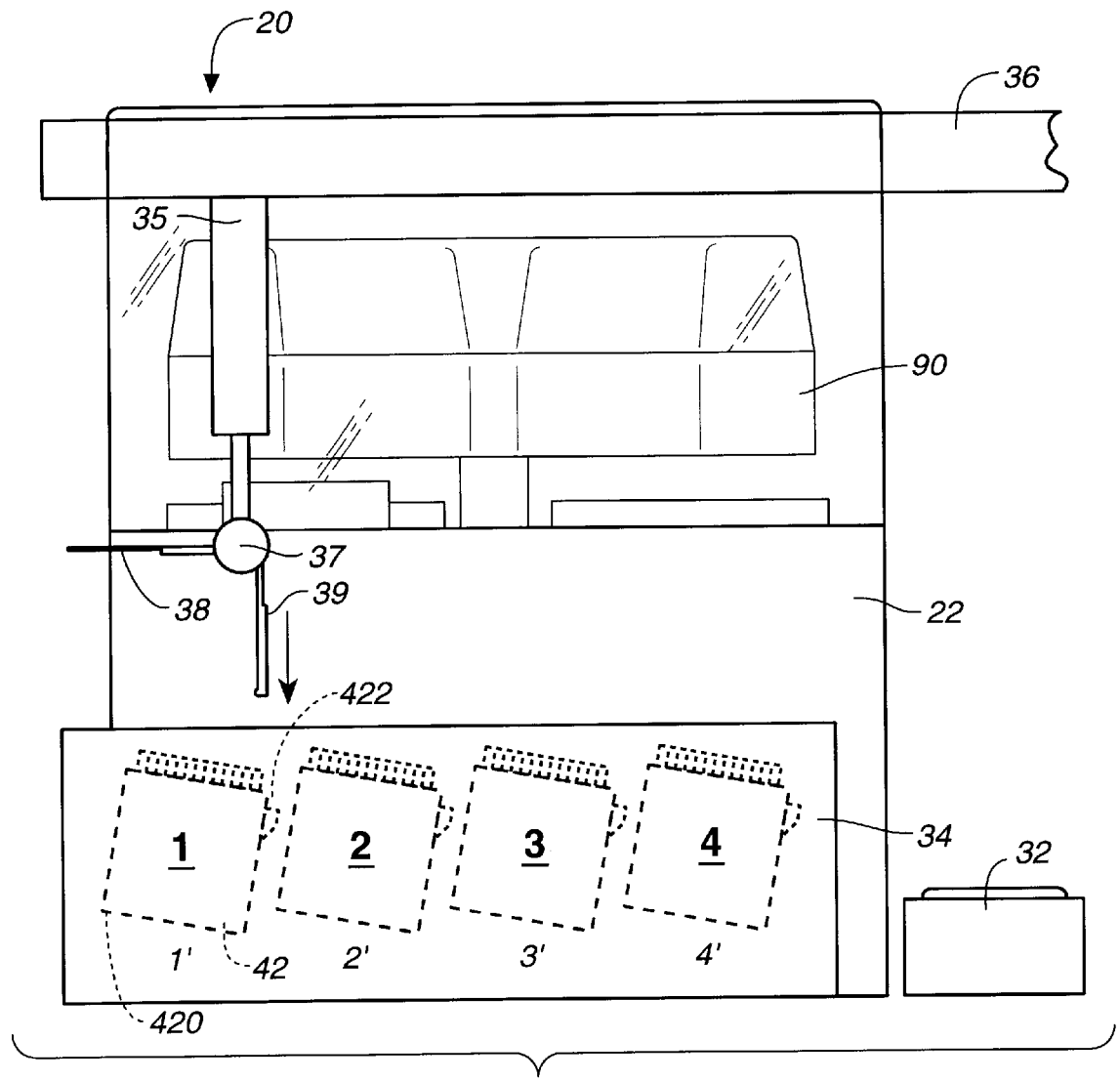
FIG._72A

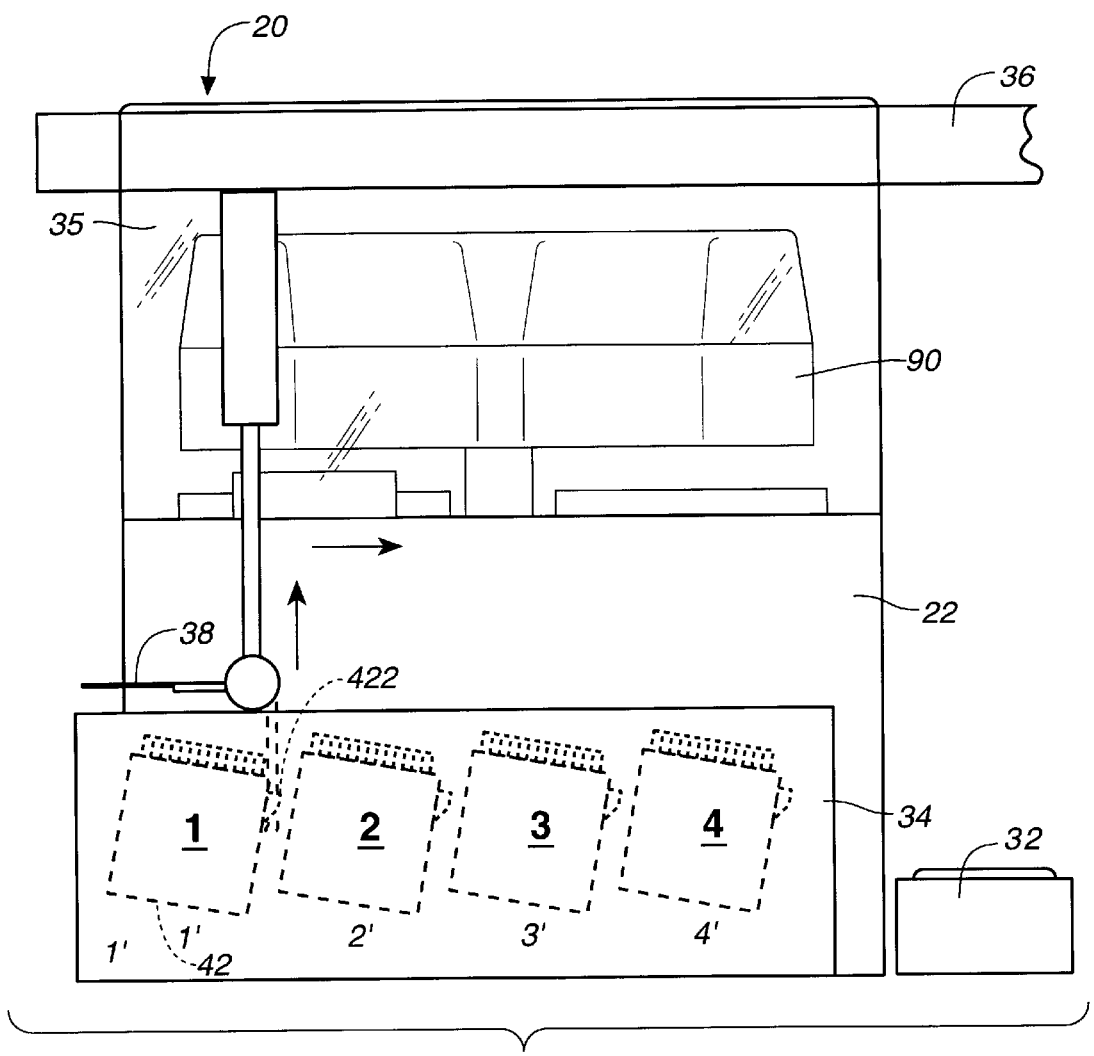
FIG._72B

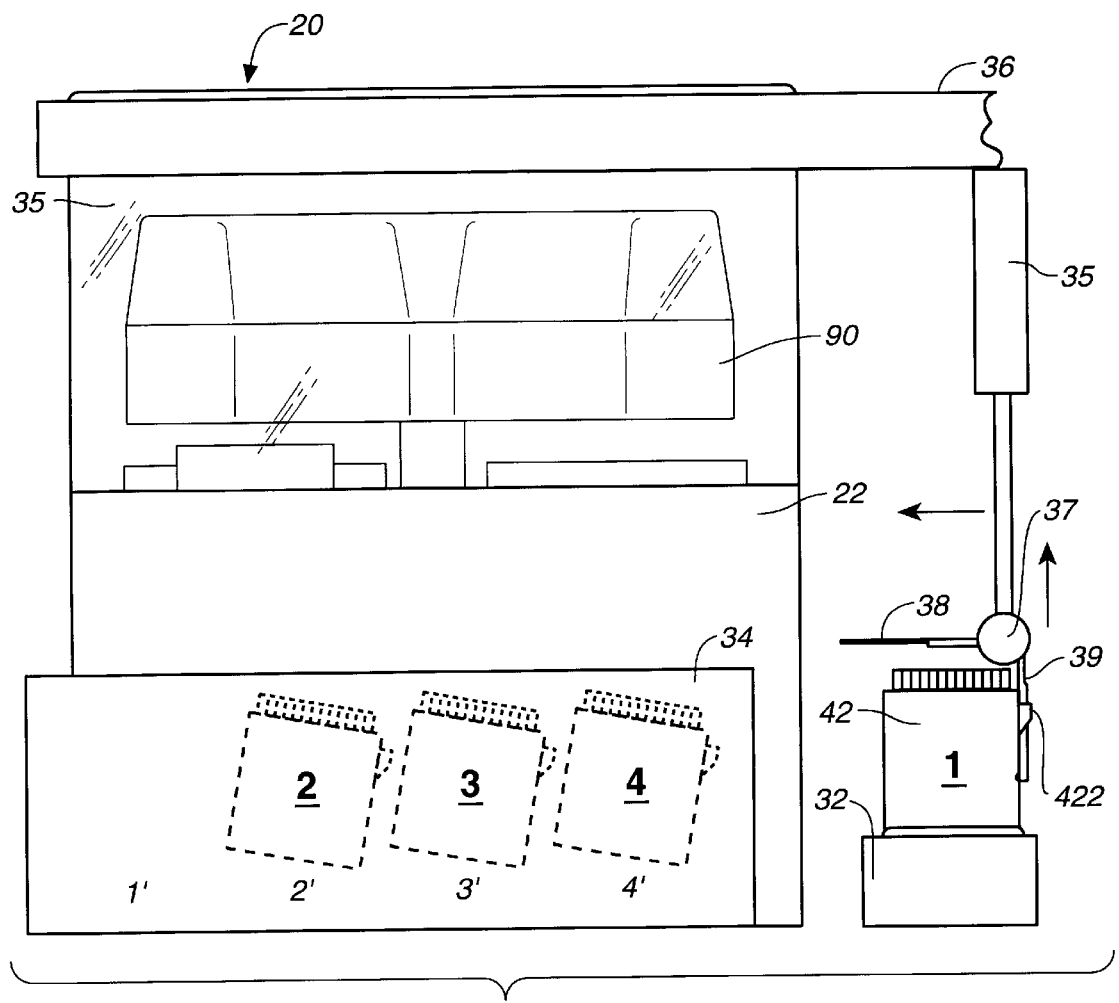
FIG._72C

WASHING TRANSFER STATION IN A SYSTEM FOR CHEMICAL MECHANICAL POLISHING

RELATED APPLICATIONS

This application is a divisional of Ser. No. 09/042,204, filed Mar. 13, 1998, which is a divisional of Ser. No. 08/549,336, filed Oct. 27, 1995, now issued as U.S. Pat. No. 5,738,574, and incorporated herein by reference. This application is also related to applications Ser. No. 08/549,001, filed Oct. 27, 1995, now issued as U.S. Pat. No. 5,804,507, Ser. No. 08/549,607, filed Oct. 27, 1995, and Ser. No. 09/058,945, filed Apr. 10, 1998, which are incorporated herein by reference in their entireties.

FIELD OF THE INVENTION

This invention relates to an apparatus and method for chemical mechanical polishing of substrates using continuous or batch processing. Various aspects of the invention include simultaneously polishing two substrates at two polishing stations or sequentially polishing one substrate at two stations, while simultaneously another substrate is being loaded or unloaded from the system. In particular, the invention relates to a washing and transfer station and method of using it in conjunction with the chemical mechanical polishing.

FIELD OF THE INVENTION

This invention relates generally to an apparatus and method for chemical mechanical polishing of semiconductor substrates using continuous or batch processing. In particular, the invention relates to the storage of substrates to in a liquid-filled bath and the transfer of substrates between the bath and the polishing apparatus.

BACKGROUND OF THE INVENTION

Integrated circuit devices are typically formed on substrates, most commonly on semiconductor substrates, by the sequential deposition and etching of conductive, semiconductive, and insulative film layers. As the deposition layers are sequentially deposited and etched, the uppermost surface of the substrate, i.e., the exposed surface of the uppermost layer on the substrate, develops a successively more topologically rugged surface. This occurs because the height of the uppermost film layer, i.e., the distance between the top surface of that layer and the surface of the underlying substrate, is greatest in regions of the substrate where the least etching has occurred, and least in regions where the greatest etching has occurred.

This non-planar surface presents a problem for the integrated circuit manufacturer. The etching step is typically prepared by placing a resist layer on the exposed surface of the substrate, and then selectively removing portions of the resist to provide the etch pattern on the layer. If the layer is non-planar, photolithographic techniques of patterning the resist layer might not be suitable because the surface of the substrate may be sufficiently non-planar to prevent focusing of the lithography apparatus on the entire layer surface. Therefore, there is a need to periodically planarize the substrate surface to restore a planar layer surface for lithography.

Chemical mechanical polishing or planarizing (CMP) is one accepted method of planarization. This planarization method typically requires that the substrate be mounted in a wafer head, with the surface of the substrate to be polished exposed. The substrate supported by the head is then placed against a rotating polishing pad. The head holding the substrate may also rotate, to provide additional motion between the substrate and the polishing pad surface. Further, a polishing slurry (typically including an abrasive and at least one chemically reactive agent therein, which are selected to enhance the polishing of the topmost film layer of the substrate) is supplied to the pad to provide an abrasive chemical solution at the interface between the pad and the substrate. For polishing of an oxide layer, the slurry is usually composed of silica grit having diameters in the neighborhood of 50 nm. The grit is formed by fuming and is then placed in a basic solution having a pH in the neighborhood of 10.5. The solution is then strongly sheared by blending so that the grit remains in colloidal suspension for long periods. For metal polishing, the grit may be formed from either silica or alumina.

The combination of polishing pad characteristics, the specific slurry mixture, and other polishing parameters can provide specific polishing characteristics. Thus, for any material being polished, the pad and slurry combination is theoretically capable of providing a specified finish and flatness on the polished surface. It must be understood that additional polishing parameters, including the relative speed between the substrate and the pad and the force pressing the substrate against the pad, affect the polishing rate, finish, and flatness. Therefore, for a given material whose desired finish is known, an optimal pad and slurry combination may be selected. Typically, the actual polishing pad and slurry combination selected for a given material is based on a trade off between the polishing rate, which determines in large part the throughput of wafers through the apparatus, and the need to provide a particular desired finish and flatness on the surface of the substrate.

Because the flatness and surface finish of the polished layer are dictated by other processing conditions in subsequent fabrication steps, throughput insofar as it involves polishing rate must often be sacrificed in this trade off. Nonetheless, high throughput is essential in the commercial market since the cost of the polishing equipment must be amortized over the number of wafers being produced. Of course, high throughput must be balanced against the cost and complexity of the machinery being used. Similarly, floor space and operator time required for the operation and maintenance of the polishing equipment incur costs that must be included in the sale price. For all these reasons, a polishing apparatus is needed which has high throughput, is relatively simple and inexpensive, occupies little floor space, and requires minimal operator control and maintenance.

An additional limitation on polishing throughput arises because the pad's surface characteristics change as a function of the polishing usage, and the pad also becomes compressed in the regions where the substrate was pressed against it for polishing. This condition, commonly referred to as "glazing", causes the polishing surface of the polishing pad to become less abrasive to thereby decrease the polishing rate over time. Glazing thus tends to increase the polishing time necessary to polish any individual substrate. Therefore, the polishing pad surface must be periodically restored, or conditioned, in order to maintain desired polishing conditions and achieve a high throughput of substrates through the polishing apparatus. Pad conditioning typically involves abrading the polishing surface of the pad to both remove any irregularities and to roughen the surface.

Pad conditioning, although it raises the average polishing rates, introduces its own difficulties. If it is manually performed, its consistency is poor and it incurs operator costs and significant downtime of the machinery, both decreasing the cost adjusted throughput. If the pad conditioning is performed by automated machinery, care must be taken to assure that the surface abrading does not also gouge and damage the polishing pad. Furthermore, if the relative motion between the conditioning tool and pad is primarily provided by the pad rotation, the relative velocity and dwell time varies over the radius of the pad, thus introducing a radial non-uniformity into the reconditioned pad.

A further limitation on traditional polishing apparatus throughput arises from the loading and unloading of substrates from the polishing surface. One prior art attempt to increase throughput, as shown by Gill in U.S. Pat. No. 4,141,180, uses multiple polishing surfaces for polishing the substrate to thereby allow optimization of polishing rate and finish with two different pad or slurry combinations. A main polishing surface and a fine polishing surface are provided within the described polishing apparatus at a polishing station. A single polishing head, controlled by a single positioning apparatus, moves a single substrate between the different polishing stations on the apparatus.

Another method of increasing throughput uses a wafer head having a plurality of substrate loading stations therein to simultaneously load a plurality of substrates against a single polishing pad to enable simultaneous polishing of the substrates on the single polishing pad. Although this method would appear to provide substantial throughput increases over the single substrate style of wafer head, several factors militate against the use of such carrier arrangements for planarizing substrates, particularly after deposition layers have been formed thereon. First, the wafer head holding the wafer being polished is complex. To attempt to control the force loading each substrate against the pad, one approach floats the portion of the head holding the wafer. A floating wafer holder necessitates a substantial number of moving parts and pressure lines must be included in the rotating and moving geometry. Additionally, the ability to control the forces pressing each individual substrate against the pad is limited by the floating nature of such a wafer head assembly, and therefore is a compromise between individual control and ease of controlling the general polishing attributes of the multiple substrates. Finally, if any one substrate develops a problem, such as if a substrate cracks, a broken piece of the substrate may come loose and destroy all of the other substrates being polished on the same pad.

Polishing throughput is yet further limited by the requirement that wafers be washed at the end of polishing and sometimes between stages of polishing. Although washing time has been limited in the past by simultaneously washing multiple wafer head, insofar as the washing requires additional machine time over that required for polishing, system throughput is adversely affected.

Therefore, there is a need for a polishing apparatus which enables optimization of polishing throughput, flatness, and finish while minimizing the risk of contamination or destruction of the substrates.

The high-speed polishing required for a high-throughput polishing apparatus imposes severe restrictions and requirements on the polishing apparatus. The mechanical forces are large, but minute scratches incurred in polishing are fatal to integrated circuits. Hence, the design must control and minimize mechanical aberrations. The environment of CMP processing is harsh so that the machinery must be carefully designed to lengthen lifetime and reduce maintenance. Also, the slurry, when allowed to dry on the wafer or any part of the apparatus, tends to form a hardened layer that becomes very difficult to remove. In general, a high-throughput apparatus needs to be easy to operate, require little operator intervention, be easily serviced for regular or unscheduled maintenance, and not be prone to failure or degradation of its parts.

If a polishing system is to be commercialized, it must be flexible and adaptable to a number of different polishing processes. Different integrated-circuit manufacturers prefer different polishing processes dependent on their overall chip design. Different layers to be planarized require distinctly different polishing processes, and the chip manufacturer may wish to use the same polishing system for two different polishing processes. Rather than designing a polishing system for each polishing process, it is much preferable that a single design be adaptable to the different processes with minimal changes of machinery.

SUMMARY OF THE INVENTION

The present invention provides a chemical mechanical polishing apparatus, and a method of using the apparatus, to provide a high rate of throughput of substrates with improved flatness and surface finish of the planarized substrate.

In one configuration according to the invention, multiple, for example four, identical wafer heads are mounted equally distributed about the center support of a carousel support plate. The centrally supported carousel frame when rotated positions the wafer heads and the substrates. Each head can rotate independently and can independently oscillate radially in slots formed in the head plate. Because the carousel assembly which holds the wafer head is vertically fixed, raising or lowering the wafer from the surface of the polishing pad requires relative motion between the wafer receiving surface of the wafer head and the vertically fixed support of the carousel arm. In one configuration relative movement between a wafer receiving member of the wafer head and a top member of the wafer head supplies the needed vertical motion.

In use, multiple ones, for example, three, of the wafer heads are simultaneously positioned above polishing stations while the remaining wafer head is positioned over a transfer station. Each polishing station is complete with an independently rotating platen supporting a polishing pad whose surface is wetted with an abrasive slurry which acts as the media for polishing.

In use, one of the wafer heads is positioned above a transfer station for loading and unloading wafers to and from the heads while the other heads are positioned above the polishing stations and their wafer are being polished. The transfer station can also be used to align wafers and to wash the wafers and the wafer heads.

Wafers are transported to the system in wafer cassettes. Preferably, the cassettes are stored in a circulating water bath to reduce slurry caking and metal oxidation. A single transfer apparatus is used to both transfer cassettes between a dry position and the bath and to transfer individual wafers between the cassettes in the bath and the polishing apparatus.

The substrates to be polished are withdrawn from a liquid-filled cassette carrying the wafers in a substantially vertical orientation by a vacuum-chucking robot blade attached to a nearly infinitely adjustable robot transfer mechanism that allows flexible positioning of the wafer in its transit between the cassette and the polishing apparatus. The wafer to be polished is inserted into the polishing apparatus by the transfer mechanism positioning the wafer above a transfer pedestal at a transfer station that loads and unloads the wafers, aligns them, and washes them. During this operation, the vacuum surface of the robot blade of the transfer mechanism vacuum chucks the backside of the wafer on the downward facing side of the blade. The pedestal is first lowered to wash the wafer with jets arranged in the pedestal surface. The pedestal is then raised to support the wafer, the vacuum-chucking vacuum is released, and the robot blade is removed.

Alignment jaws are then raised to surround the wafer and the bottom portion of the wafer head. The jaws contract to contact the wafer head and simultaneously center the wafer under the wafer receiving recess in the wafer head. The wafer, now aligned to the wafer receiving recess in the wafer head, is then raised by the transfer pedestal to insert the wafer into the wafer/substrate receiving recess and hold the wafer in contact with the head. Optionally, a vacuum supply through the head to the inside of the recess is activated to retain the wafer in the head and the pedestal is lowered. This head, now loaded with an unpolished wafer, is then ready to be rotated by the carousel head to a polishing position. Rotation of the carousel advances one of the other wafer heads to a position over the alignment transfer cleaning station.

For unloading, after a substrate has been polished in the apparatus according to the invention and the wafer head with such a wafer is returned to the wafer alignment transfer cleaning station, a washing cup/basin is raised to generally surround the bottom portion of the wafer head. A cleaning solution (e.g., deionized water) flows through spray nozzles (located in both the top of the transfer pedestal and in several perimeter nozzles arms) which are directed at the face of the head and the lower portion of the wafer head to dislodge and remove slurry and other debris which may be present on the wafer and lower wafer head surfaces to reduce contamination prior to more complete subsequent cleaning. The washing cup captures nearly all of the sprayed solution to guide it away to be recycled or discarded. The transfer pedestal is then raised into contact with the wafer. Optionally, a vacuum seal between the wafer and the top face of the pedestal is formed as the piping connection to the fluid nozzles in the pedestal is changed to be ported to a vacuum system so that the nozzles act as vacuum ports to firmly hold the wafer to the surface of the pedestal. The wafer is then released from the face of the wafer head by the application of gas pressure through and/or from within the head. The pedestal with the wafer now firmly attached is lowered into the wash basin/cup and this time only the perimeter spray nozzles are again activated to cleanse the back side of the wafer and the area of the wafer head which was formerly hidden by the wafer when the wafer was attached. Once cleaning is completed, the washing basin is lowered to reveal the wafer still attached to the transfer pedestal. The pedestal is then raised out of the washing basin, and the transfer robot blade then moves in to retrieve the wafer. Vacuum is applied through the blade to securely attach to the wafer to the blade. Once such attachment is confirmed, any vacuum applied on the surface of the transfer pedestal is released, leaving only the robot blade attached to the wafer. The transfer pedestal can then be lowered, and the wafer retracted from the apparatus. While the wafer head is free of an attached wafer, it can be washed by the basin being raised about the lower end of the wafer head and wash solution sprayed toward it by the ports in the pedestal head and by side sprays within the basin.

The placement and movement of wafer cassettes and substrates and the duration of polishing or cleaning performed at each station are preferably controlled by a controller, such as a microprocessor, which is programmed to direct the positioning and loading of the substrates and to provide optimal polishing finish, flatness, and throughput.

BRIEF DESCRIPTION OF THE DRAWINGS

FIG. 1 is an isometric view of an embodiment of the polishing apparatus of the invention;

FIG. 2 is an exploded view of the polishing apparatus of FIG. 1 showing the upper housing and mechanism separated from the lower housing and mechanism;

FIG. 3 is a graph schematically illustrating glazing causes polishing rates to decrease with time;

FIG. 4 is a schematic illustration of the variations in polishing rates over the areas of a rotating wafer and a rotating pad;

FIGS. 5A, 5B, 5C, 5D, 5E, and 5F schematically show the progressive movement of wafers as they are sequentially loaded and polished in the carousel carrier polishing apparatus according to the invention;

FIGS. 6A, 6B, 6C, and 6D show the movement of the wafer from and to the transfer-cleaning station as is seen in FIGS. 5E and 5F and show the actual movement of substrates in the polishing carousel;

FIG. 7 is an exploded view of the carousel of FIG. 2;

FIG. 8 is a top view of the carousel according to the invention with the upper housing removed;

FIG. 9 is a cross section of the wafer head system of FIG. 8 taken at line 9—9 of FIG. 8, including one type of wafer head;

FIG. 10 is a close up view of the wafer head to shaft housing connection as shown in FIG. 9;

FIGS. 11 and 12 are cross-sectional views of a second type of wafer head;

FIG. 12A is a cross-sectional view a third type of wafer head related to that of FIGS. 11 and 12;

FIG. 13 is a cross-sectional view of a novel rotary union;

FIGS. 14A, 14B, and 14C show the progressive positions of the shaft follower slot splash shield plate as a wafer head assembly oscillates radially from its innermost position to its outermost position;

FIGS. 15A, 15B, and 15C show progressive end cross sectional views of the shaft follower slot splash shield plate as a wafer head assembly oscillates radially from its innermost position to its outermost position corresponding to the views shown in FIGS. 14A, 14B, and 14C;

FIGS. 16A, 16B, and 16C show progressive side cross sectional views of the operation of the splash plates taken along the radial axis of a carrier arm and corresponding to the views shown in FIGS. 14A, 14B, and 14C;

FIGS. 17A, 17B, and 17C show progressive perspective views of the splash plates as shown in FIGS. 14A, 14B, and 14C;

FIG. 18 shows a top view of the polishing apparatus according to the invention with the carousel head plate and wafer head assemblies removed;

FIG. 19 shows a cross sectional view of a platen of FIG. 18 taken at 19—19;

FIG. 20 is an enlarged cross-sectional view of the reservoir portion of the platen of FIG. 19;

FIG. 21 is a yet further enlarged cross-sectional view of the pneumatic pump of the reservoir of FIG. 20;

FIG. 22 is a schematic cross-sectional view of an overhead slurry dispenser located to the side and over a platen;

FIG. 23 is a plan view of the overhead slurry dispenser of FIG. 22;

FIG. 24 is an enlarged elevational view of the dispensing end of the overhead slurry dispenser of FIG. 22;

FIG. 25 is a schematic diagram of the slurry distribution system;

FIGS. 26A, 26B, 26C, 26D, and 26E are lateral cross-sectional views of the intermediate washing station located between adjacent polishing platen. The sequence of these five similar views show the progressive action of a wafer head and attached wafer being washed at the intermediate washing station;

FIG. 26F is a longitudinal side view taken at 26F—26F of FIG. 26D of the intermediate washing station of FIGS. 26A through 26E;

FIG. 26G is a top plan view taken at 26G—26G of FIG. 26E of the intermediate washing station of FIGS. 26A through 26F;

FIG. 27 is a side cross-sectional view of a second embodiment of the intermediate washing station;

FIG. 28 is a plan view of the washing station of FIG. 27;

FIG. 29 shows the side cross sectional view of a polishing pad conditioner apparatus according to the invention;

FIG. 30 shows an exploded perspective view of the conditioning disk fit into the conditioner head;

FIG. 31 shows a close up view of the conditioner head shown in FIG. 29;

FIG. 32 shows a schematic view of a prior art configuration for a conditioner head apparatus;

FIG. 33 shows a schematic view of a conditioner head apparatus according to the invention;

FIG. 34 shows an exploded view of the conditioner support/drive end connection with the conditioner arm and the drive sheave;

FIG. 35 shows a cross-sectional view, partly in plan schematic view, of the conditioner arm support and drive mechanism;

FIGS. 36A, 36B, and 36C shows the progressive steps as a conditioner apparatus raises its conditioner head out of its washing cup and lowers the conditioner head into position on the polishing pad;

FIG. 37 shows a side cross sectional view of the conditioner head washing cup according to the invention;

FIG. 38 shows a close up top view of the washing station according to the invention;

FIGS. 39A, 39B, and 39C show a top view of a polishing position showing the general relative movements of the polishing platen, wafer head, and conditioner head as shown in FIGS. 36A–36C;

FIG. 40 shows a perspective view of a wafer transfer alignment cleaning station according to the invention;

FIG. 41 shows a top view of the wafer transfer alignment cleaning station of FIG. 40;

FIG. 42 shows a perspective view in partial cross-section of the wafer transfer alignment cleaning station of FIG. 40, showing the pneumatic actuators which are used to actuate the alignment jaws to align the wafer to the wafer head;

FIG. 43 shows a partial perspective cross-section of the wafer transfer alignment cleaning station of FIG. 40, showing the center and perimeter fluid passages to spray nozzles and suction ports;

FIG. 44 shows a cross-sectional view of the transfer station pedestal and surrounding wash basin;

FIG. 44A shows an enlarged cross-sectional view of the part of FIG. 44 illustrating the connection between the pedestal column and the basin housing;

FIG. 45 shows a closeup sectional view in perspective of the alignment jaw to alignment yoke connection of FIG. 42;

FIG. 46 shows a perspective view of the spider assembly at the lower end of the pedestal shaft;

FIGS. 47A, 47B, 47C, 47D, and 47E show side elevational cross-sectional views of progressive steps according to the invention taken to align and load a wafer into the wafer receiving recess of a wafer head for subsequent polishing;

FIGS. 48A, 48B, and 48C provide top cross sectional schematic views of the wafer transfer cleaning station showing the alignment of a wafer being loaded on a wafer head, corresponding to the respective views of FIGS. 47A, 47B, and 47C;

FIGS. 49A, 49B, and 49C; their respective counterparts 50A, 50B, and 50C; and 51A, 51B, and 51C show side cross-sectional, partial cross sectional, and top cross sectional and schematic views of the wafer transfer-cleaning station and the check valve in the pedestal, in progressive steps as a wafer and the lower portion of a wafer head to which the wafer is still initially attached is thoroughly rinsed by all available nozzles; and in progressive steps the wafer is released from the head and held on the pedestal by vacuum and rinsing of the assembly in this configuration is performed before removal of the wafer from the polishing apparatus by a robot blade;

FIG. 52 shows a side cross sectional view showing the head plate in position over the polishing stations and one wafer head assembly in position over and within a wafer alignment transfer cleaning apparatus according to the invention, for example taken at line 52—52 of FIG. 2;

FIG. 53 shows a perspective view of a gear locking assembly at the bottom of the carousel;

FIG. 54 shows a front partial cross sectional schematic view of a wafer loading apparatus according to the invention;

FIG. 55 shows a perspective view of an "L" shaped member which includes the robot blade and a wafer cassette tray lifting claw as used for the device of FIG. 53;

FIG. 56 shows a perspective view of the bottom of the robot blade of FIG. 55;

FIG. 57 shows a back partial cross sectional schematic view of the blade, claw, and bottom of the arm of the wafer loading apparatus of FIG. 54;

FIG. 58 shows a side plan view of the robot blade of FIG. 54;

FIGS. 59 and 60 show respectively top and bottom partial cross-sectional plan views of the robot blade of FIG. 58;

FIG. 61 shows a simplified exploded perspective view of the descending arm and wrist assembly of the wafer loading apparatus of FIG. 54;

FIG. 62 shows a simplified exploded top perspective view of the overhead track of the wafer loading apparatus of FIG. 54;

FIG. 63 shows a perspective view of an end of the overhead track of FIG. 62;

FIG. 64 shows a top partial plan view of the overhead track of FIG. 54;

FIG. 65 shows an end partial cross sectional schematic view of the wafer loading apparatus of FIG. 54;

FIG. 66 shows a end view of the wafer and cassette loading apparatus according to the invention showing the location of the wafer bath and wafer cassettes in the wafer bath with respect to the polishing apparatus;

FIG. 67 shows an axial cross-sectional view of tub holding one or more wafer cassettes in a liquid bath;

FIG. 68 shows a side view of a top of a weir controlling the surface level of the bath in the tub of FIG. 67;

FIG. 69 shows an elevational view of a support rail of the tub of FIG. 67;

FIGS. 70A, 70B, 70C, 70D, and 70E are schematic perspective views showing progressive steps and movement of a robot blade according to the invention by which wafers are loaded and unloaded into and from the polishing apparatus;

FIG. 71A, 71B, and 71C show the movement of the cassette lifting fork of the "L" shaped member as it lifts the wafer cassette; and FIGS. 72A, 72B, and 72C show the progressive movement of the wafer cassettes such that in a batch operation particular cassettes can be move to provide progressive and continuous polishing and utilization of the apparatus according to the invention.

DETAILED DESCRIPTION OF THE PREFERRED EMBODIMENT

This description will first give an overview of the system and a general description of the processing steps. Then, the individual sub-systems and the detailed processes will be further described.

Appatratus Overview

FIG. 1 shows a perspective view of an apparatus according to the invention. A polishing system 10 includes a polishing apparatus 20 adjacent to a wafer loading apparatus 30. Wafers 40 brought to the system 10 in a cassette 42, which is immediately stored in a tub 34 so as to keep the wafers wet. The wafers 40 are individually loaded from the cassette 42 into the wafer polishing apparatus 20, which polishes them and then returns them to the original cassette 42 or another one in the tub 34. The figure does not show a wall interposed between the polishing apparatus 20 and the wafer loading apparatus 30 so as to contain the slurry and other polishing debris within polishing apparatus 20 and away from the tub 34. An unillustrated sliding door in the wall is opened for transfer of wafers between the two apparatus 20 and 30. The wall may act as the barrier between the clean room containing the wafer loading apparatus 30 and a dirtier area containing the polishing apparatus 20.

The polishing apparatus 20 includes a lower machine base 22 with a table top 23 mounted thereon and a removable upper outer cover 24 surrounding a series of polishing stations 50a, 50b, and 50c. As shown in the exploded isometric view of FIG. 2, a fence 25 surrounds the table top 23 to contain the liquids and slurry being thrown about and which are drained through unillustrated drains in the table top.

Each polishing station 50a, 50b, or 50c includes a rotatable platen 52 on which is placed a polishing pad 54, and it further includes an associated pad conditioner apparatus 60a, 60b, or 60c, each with a rotatable arm 62 holding a conditioner head 64 and an associated washing basin 68 for the conditioner head 62. The base 22 also supports a transfer station 70 positioned in a square arrangement with the three polishing stations 50a, 50b, and 50c. The transfer station 70 serves multiple functions of receiving individual wafers 40 from the loading apparatus 30, possibly rinsing them, loading them to wafer heads (to be described later) which hold them during polishing, receiving the wafers 40 back from the wafer heads, washing them, and finally transferring them back to the loading apparatus 30. It also washes the wafer head after its wafer has been unloaded.

Two intermediate washing stations 80a and 80b are located between neighboring ones of the polishing stations 50a, 50b, and 50c, and a third washing station 80c may be located between the last polishing station 50c and the transfer station 70. These rinse a wafer 40 as it passes from one polishing station to another and to the transfer station 70 and may effectively buff the wafer 40 as well.

A rotatable multi-head carousel 90 includes four wafer head systems 100a, 100b, 100c, and 100d which receive and hold wafers 40 and polish them by pressing them against respective polishing pads 54 held on the platens 52 at the respective polishing stations 50a, 50b, and 50c. The carousel 90, which is in the shape of a cross because the area between its arms is removed, is supported on a stationary center post 902 and is rotated thereon about a carousel axis 904 by a motor assembly located within the base 22.

In this configuration according to the invention, the four identical wafer head systems 100a, 100b, 100c, and 100d are mounted on a carousel support plate 906 at equal angular intervals about the carousel axis 904. The center post 902 centrally supports the carousel support plate 906 and allows the carousel motor to rotate the carousel support plate 906, the wafer head systems 100a, 100b, 100c, and 100d, and the wafers 42 attached thereto about the carousel axis 904.

Each wafer head system 100a, 100b, 100c, or 100d includes a wafer head 110 that is rotated about its own axis by a head-rotation motor 1002 connected to it by a shaft. The heads 110 can rotate independently as driven by their dedicated head-rotation motors 1002 (shown in FIG. 2 by the removal of one carousel quarter-cover 908), and can further independently oscillate radially in slots 910 formed in the carousel support plate 906. Raising or lowering wafers attached to the bottom of the wafer heads 110 is performed within the wafer head systems 100. An advantage of the overall carousel system is that very little vertical stroke is required of the wafer head 110 to accept the wafers and position them for polishing and washing. What little vertical stroke is required can be accommodated within the lowermost member at the very end of the wafer head 110. An input control signal causes relative motion (extension and retraction of the head) between a wafer head lower member which includes a wafer receiving recess and a vertical stationary wafer head upper member according to an input control signal (e.g., a pneumatic, hydraulic, or electrical signal).

During the actual polishing, the wafer heads 110 of three of the wafer head systems, e.g., 100a, 100b, and 100c, are positioned at and above respective polishing stations 50a, 50b, and 50c, each having an independently rotatable platen 52 supporting a polishing pad 54 whose surface is wetted with an abrasive slurry which acts as the media for polishing the wafer 40. During polishing, the wafer head systems 100a, 100b, and 100c independently oscillate along respective radii of the carousel 90 so that the associated wafer heads 110 move along a diameter of a respective polishing pad 54. In a typical process, the sweep axis of a wafer head 110 is aligned to the center of the polishing pad 54.

In use, the wafer head 110, for example, that of the fourth wafer head system 100d, is initially positioned above the wafer transfer station 70. When the carousel 90 is rotated, it positions different wafer head systems 100a, 100b, 100c, and 100d over the polishing stations 50a, 50b, and 50c and over the transfer station 70. The carousel 90 allows each wafer head system 100 to be sequentially located first over the transfer station 70, then over one or more of the polishing stations 50, and then back to the transfer station 70.

Each polishing pad 54 can be continuously or periodically conditioned by one of the pad conditioner apparatus 60, each having an independently rotating conditioner head 64 attached to the conditioner arm 62. An abrasive conditioning plate or a similar conditioning surface needs to be included at the bottom of the conditioner head 64. The arm 62 sweeps the conditioner head 64 across the associated polishing pad 54 in an oscillatory motion generally between the center of the polishing pad 54 and its perimeter. The conditioner head 64 is pressed against the pad 54 to abrade and condition the pad so that it thereafter effectively polishes any wafer 40 pressed against it while it is rotating.

In the wafer loading system 30, shown in FIG. 1, the cassette 42 is first transferred from a holding station 32 to a holding tub 34 filled with a liquid bath 302 such as deionized water to a level to submerse the cassettes 42 and the wafers 40 contained therein. Then, individual wafers 40 to be polished are withdrawn from the wafer cassette 42 in the tub 34 to the polishing apparatus 20. A rotatable, extensible descending arm 35 descending pending from an overhead track 36 includes at its distal end a wrist assembly 37 including both a wafer blade 38 and a cassette claw 39. The cassette claw 39 can move cassettes 42 between the holding station 32 and the tub 34, and the wafer blade 38 can move and reorient wafers 40 between the cassettes 42 in the tub 34 and the transfer station 70. Although FIG. 1 and the remaining figures show the holding station 32 disposed on a side of the machine base 22 away from the transfer station 70, this illustration is so arranged only for clarity. In fact, the corner of the machine base 22 holding the transfer station 70 is pulled in relative to its other corners. Hence, the holding station 32 is advantageously disposed in the more open area at the corner of the transfer station 70 outside the machine base 22.

General Polishing Processes

The apparatus outlined above can be used for a number of different types of polishing sequences. Three principal polishing processes are the in-line process, the multi-step process, and the batch process.

The in-line process divides the polishing operation into multiple steps at different polishing stations 50, and the steps are substantially equivalent. In the simplest case, the same type of polishing pad and the same slurry are used at the three polishing stations 50*a*, 50*b*, and 50*c*. As will be described in more detail below, a wafer head 110 carries a wafer to each polishing station in sequence, and one-third of the total polishing is performed at each polishing station.

A motivation for the in-line polishing system arises from the need to condition a pad before a complete polishing operation is completed. Polishing pads tend to become glazed during polishing. As schematically illustrated in the graph of FIG. 3, the polishing removal rate begins at a high level for a new or freshly conditioned pad, but the removal rate decreases with cumulative polishing time for the pad. To achieve high throughput, the pad is conditioned before the removal rate falls to too low a level. The period between conditioning depends on the polishing pad, the polishing process, and the material being removed from the wafer. An important use of CMP is planarizing silicon dioxide, a very hard material, and up to 2 $\mu$m of silicon dioxide may need to be removed for some semiconductor fabrication processes. If this thickness corresponds to a polishing time far down the curve of FIG. 3, then the pad needs to be conditioned at least once during the polishing. Since pad conditioning often requires the wafer to be removed from the pad and the wafer head system to be moved away from at least the center of the pad, a break in the polishing for pad conditioning can be used to move the wafer to another equivalent polishing station.

A yet further motivation for the in-line process is that the loading, unloading, and washing being performed at the transfer station 70 constitute an overhead time for the process. If this overhead is performed while the wafer heads are positioned where no polishing is being performed, polishing throughput is decreased. With the three polishing stations 50*a*, 50*b*, and 50*c* and the transfer station 70 arranged at equivalent positions around the carousel, the overhead at the transfer station 70 can be concurrently performed while three wafers are being polished. The overhead is thus reduced to the time required to move a wafer between the polishing stations and between them and the transfer station.

A further advantage of the in-line process in dividing up the polishing between equivalent polishing stations is that irregularities in particular polishing stations tend to average out over the different polishing stations.

The multi-step process divides a polishing process into multiple and different steps, typically with gradated polishing. For example, the first polishing station 50*a* may perform a rough polish on the wafer, the second polishing station 50*b* may perform a fine polish, and the third polishing station 50*c* may buff the wafer. Buffing is a very gentle polish which primarily removes extraneous loose matter from the surface. The intensity of polishing may be varied by the slurry composition, pad material, and other polishing parameters. Of course, the invention provides for an integrated multi-step process with low overhead. However, the multi-step process has inherent throughput problems because not all three polishing steps require the same time. Usually, the rough polish requires significantly more time than the fine polish or buffing. Therefore, system throughput is limited by the rough polish while the other two polishing stations may lie idle for long periods. Similar scheduling problems exists when the different polishing stations are being used for different steps of the polishing process, for example, the previously mentioned polish directed to silicon dioxide followed by a polish directed to a metal layer.

The batch process completely polishes multiple wafers at respective polishing stations. In the apparatus of FIG. 1, the same type of pad is mounted at and the same type of slurry supplied to the three polishing stations 50*a*, 50*b*, and 50*c*, and each wafer is completely polished at one polishing station. That is, three unpolished wafers are simultaneously presented to the three polishing stations. The operations at the transfer station present a high overhead in a batch process, but the apparatus of FIG. 1 at least allows the loading, unloading, and washing of one wafer to be performed while polishing is on going with the similar operations for the other two wafers necessarily interrupting polishing.

The distinctions between in-line, multi-step, and batch processes are not clearly defined, and a chosen process may have aspects of more than one. For example, two of the polishing stations 50*a* and 50*b* may be used for equivalent in-line or batch polishing, and the third polishing station 50*c* for a multi-step fine polish or buff. As will be described later, the three intermediate wash stations 80*a*, 80*b*, and 80*c* can be used for a short buffing, wafer washing, or even light polishing step. In this situation, batch processing for the polishing stations becomes more feasible with a higher utilization of the expensive parts of the apparatus.

The invention provides a significant process advantage in allowing over-center polishing, that is, the wafer 40 can be swept across the center of the rotating polishing pad 54.

Polishing using a rotating wafer 40, a rotating pad 54, or a combination thereof suffers from an inherent non-uniformity. Namely, as illustrated in FIG. 4, both the wafer 40 and the pad 54 are rotating about their respective centers 40a and 54a. Polishing removal rates are usually proportional to the relative velocity between the wafer 40 and pad 54, and the velocity of a rotating object increases with the radius. Therefore, the outer portion of the rotating wafer 40 will be polished more quickly than its inner portion. Similarly, the outer portion of the pad 54 polishes the wafer more quickly than does the inner portion of the pad. The divisions of the wafer 40 and pad 54 into two zones is overly simplistic since there is a continuous gradation. To reduce these inherent non-uniformities, the sweep pattern and timing of the wafer 40 over the pad 54 can be optimized, as has been disclosed by Tolles et al. in U.S. patent application, Ser. No. 08/497,362, filed Jun. 30, 1995, now issued as U.S. Pat. No. 5,599,423. The ability to sweep the wafer 40 over the center 54a of the pad to a position 40c on the other side of pad center 54a provides another degree of freedom in the optimization. The additional degree of freedom from over-center polishing has not been typically available in commercially available wafer polishing systems.

The in-line process will now be described in detail because of its importance. FIGS. 5A, 5B, 5C, 5D, 5E, and 5F show a sequence of six phases between which the carousel 90 rotates. The description begins with the insertion of a wafer (W) and continues with the subsequent movement of wafer head systems 100a, 100b, 100c, and 100d supported on the carousel support plate 906 of the carousel 90.

As shown for the first phase in FIG. 5A, a first wafer W#1 is loaded from the loading apparatus 30 to the transfer station 70, which loads the wafer into a wafer head 110, e.g., that of the wafer head system 100a. The carousel 90 is then rotated counter-clockwise on the supporting center post 902 so as to position the first wafer head system 100a and its wafer W#1 over the first polishing station 50a, as shown for the second phase stage in FIG. 5B. The polishing station 50a there performs a first-stage polish of the wafer W#1. While the first polishing station 50a is polishing the first wafer W#1, a second wafer W#2 is being loaded from the loading apparatus 30 to the transfer station 70 and from there to the second wafer head system 100b, now positioned over the transfer station 70.

After the completion of the second phase of FIG. 5B, the carousel 90 is again rotated counter-clockwise so that, as shown for the third phase in FIG. 5C, the first wafer W#1 is positioned over the second polishing station 50b and the second wafer W#2 is positioned over the first polishing station 50a. The third wafer head system 100c is positioned over the transfer station 70, from which it receives a third wafer W#3 from the loading system 30. During the third phase of FIG. 5C, both wafers W#1 and W#2 are being polished at respective stations 50a and 50b. To enter a fourth phase, as illustrated in FIG. 5D, the carousel 90 again rotates counter-clockwise by 90° so as to position wafer W#1 over the third polishing station 50c, the second wafer W#2 over the second polishing station 50b, and the third wafer W#3 over the first polishing station 50a while the transfer station 70 receives a fourth wafer W#4 from the loading apparatus 30. Alter the completion of the polishing of the third phase during which the first wafer W#1 receives a third-stage polish, the second wafer W#2 receives a second-stage polish, and the third wafer W#3 receives a first-stage polish, then the carousel 90 is again rotated. However, rather than being rotated counter-clockwise by 90°, the carousel 90 is rotated clockwise by 270° in order to avoid the need to use rotary couplings and to allow simple flexible fluid and electrical connections to the carousel 90 through flexible but continuous lines. This equivalent rotation, as illustrated in FIG. 5E, places the first wafer W#1 over the transfer station 70, the second wafer W#2 over the third polishing station 50c, the third wafer W#3 over the second polishing station 50b, and the fourth wafer W#4 over the first polishing station 50a. While the other wafers W#2, W#3, and W#4 are being polished, the first wafer W#1 is washed at the transfer station 70 and is loaded from the first wafer head system 100a back to the loading apparatus 30 and thence back to its original location in the cassette 42, and a fifth wafer W#5. as illustrated in FIG. 5F is loaded onto the first wafer head system 100a. After this phase, the process is repeated with a 90° counter-clockwise rotation.

This description has not included the processing sequence in which the carousel stops with the wafer heads located between platens at the intermediate washing stations to rinse the wafers between polishing stages or after completion of polishing.

This description is applicable both to a multi-step polishing system or to an in-line process involving substantially similar polishing at the different stations. In the multi-step system, the multiple stages of polishing involves progressively finer polishing or polishing directed to different layers by means of variations of the pad structure or slurry composition. In the in-line process, each of the multiple polishing stations performs substantially similar polishing on the same wafer and for a substantially equal time. The in-line process is advantageous in that the overhead time per wafer associated with loading and unloading is reduced by the multiplicity of polishing stations. Also, any non-uniform polishing introduced by one polishing station is likely to be averaged out by the other polishing stations.

FIGS. 5A, 5B, 5C, and 5D show further details of the movement of the carousel 90 between the positions of FIGS. 5D and 5E. In FIG. 6A, the second, third, and fourth wafers W#2, W#3, and W#4 are being polished as their juxtaposed pads 54 and platens 52 are rotating while the first wafer W#1 is being washed at the transfer station 70. In FIG. 6B, the first wafer W#1 is loaded back to its cassette 42, and in FIG. 6C a fifth wafer W#5 is loaded from its cassette 42 to the transfer station 70, at which it is washed. All this time, the other three wafers W#2, W#3, and W#4 continue to be polished. In FIG. 6D, the carousel 90 rotates by about 45° so that the second, third, and fourth wafers W#2, W#3, and W#4 lie over respective intermediate washing stations 80c, 80b, and 80a. In a process to be described more fully later, the two wafer head systems 100b, 100c, and 100d stepwise rotate their respective wafers over the associated washing stations 80a, 80b, and 80c so as to rinse any residual slurry and debris from a former polishing, station 50 so as to not contaminate a subsequent polishing station 50. A further washing station 80 may be positioned between the transfer station 70 and the first polishing station 5OIL to rinse the wafer prior to polishing. This pre-rinse can be performed without any additional overhead time over that already consumed by the intermediate washing stations 80a and 80b. After rinsing, the next carousel rotation of 45° is completed and polishing continues.

The various subsystems will now be described in more detail.

Carousel

FIG. 7 shows an exploded view of the carousel 90 in which the quarter outer covers 908 has been removed. The center post 902 supports the large, thick (approx. 2⅜" (6 cm)) carousel support plate 906 (preferably made of aluminum). The carousel support plate 906 and most of the structure of the carousel 90 is arranged in the shape of a cross with four arms fixed at equal angular intervals 90° for the four-head configuration. The carousel support plate 906 includes four open-ended slots 910 extending radially and oriented 90° apart; FIG. 2 shows instead a lower cover having a closely related closed-end slot 948. The top of the carousel head support plate 906 supports a set of four paired slotted wafer head support slides 908, also shown in the top plan view of FIG. 8 and the side cross section of FIG. 9. The slides 908 are aligned with and slide along the respective slots 910 in the carousel support plate 906 to freely move radially with respect to the center of the carousel support plate 906. Each slide 908 is supported by a linear bearing, assembly 912, two of which bracket the slot 906. Each linear bearing assembly 912, as shown in cross section in FIG. 9, includes a rail 914 fixed to the carousel support plate 906 and two linear guides 916 (only one of which is illustrated on each side) with ball bearings 917 rolling in between the grooves of the rail 914 and guides 916. Although not distinctly illustrated, two linear guides 916 are mated with each rail 914 to provide free and smooth movement between them. The linear bearing assemblies 912 permit the slides 908 and whatever is attached thereto to freely move along the slots 910 in the carousel support plate. As shown in the top plan view of FIG. 8, a bearing stop 917 is anchored to the outer end of one of the rails 914 to act as a safeguard to prevent the slide 908 from accidentally coming off the end of the bearing rails 914.

As shown in the top plan view of FIG. 8 and the cross section of FIG. 9, one side of each slider 908 contains an unillustrated recirculating ball threaded receiving cavity (or nut) fixed to the slide 908 near its medial end. The threaded cavity or nut receives a lead screw 918 driven by a motor 920, the sweep motor, mounted on the carousel support plate 906. Turning the lead screw 918 causes the slide 908 to move radially. The four sweep motors 920 are independently operable, as illustrated best in the top plan view of FIG. 8, thereby enabling separate movement of the four slides 908 along the slots 910 in the carousel support plate 906.

An optical position sensor is attached to a side of each slide 908, as illustrated at the lower left of FIG. 8. A position flag 924 having a horizontally extending fin 926 is attached to the worm side of each slide 908. An optical sensor 928 in conjunction with the position flag 924 provides center position sensing of the sweep motor 920. The sensor 928 is fixed to the carousel support base 906 at a height such that the fin 926 passes through the trigger gap of the sensor 928. Further, it is fixed at a linear position along the slot 910 and has length such that the fin 926 obstructs trigger gap of the optical sensor 928 for one-half of its travel, for example, center to innermost position and does not obstruct it from the center to outermost position. The transition at the center calibrates the system. Although the slide position is nominally monitored by the input to the slide motor 920 or an encoder attached thereto, such monitoring is indirect and accumulates error. The optical position sensor calibrates the electronic position monitoring and is particularly useful for determining the slide position when there has been a power outage or similar loss of machine control. In the recovery phase, the presence or absence of an optical signal immediately indicates the direction of movement required to pass the center calibration point. This optical sensor is presented in detail and presents only one of many optical sensors used in the polishing system of the invention to safeguard against overshoot and to enable recalibration, especially in case of loss of power. Such sensors are attached to almost every movable part of the system whose absolute position is important.

As illustrated in perspective in FIG. 7 and in cross-section in FIG. 9, fixed to each of the four slides 908 is a respective wafer head assembly 100, each including the wafer head 110, the wafer head motor 1012 and a head rotation drive shaft 1014 with a surrounding nonrotating shaft housing 1015 connecting the two, as well as several other parts to be described later. Each wafer head assembly 110 can be assembled away from the polishing apparatus 20, slid in its untightened state into the slot 910 of the carousel support plate 906, between the arms of the slide 908, and onto the rails 914, and there tightened to grasp the slide 908.

WAFER HEAD

Any of a number of different types of wafer heads can be used with the invention, for example, the one described by Shendon in U.S. Pat. No. 5,205,082, incorporated herein by reference.

Diamond Wafer Head

Another exemplary head 110, schematically illustrated in cross section at the bottom of FIG. 9 and referred to generally as the diamond head, is the subject of U.S. patent application Ser. No. 08/549,474, filed on Oct. 27, 1995 and now issued as U.S. Pat. No. 5,762,544, incorporated herein by reference. This head 110 includes a downwardly facing bowl member 1110 of generally cylindrical form and a floater member 1112 generally fit within the central cavity of the bowl member 1110. The floater member 1112 includes on its lower side a wafer receiving recess 1115 surrounded by a retaining ring 1116 to define the recess 1114 into which the wafer 40 to be polished is fit. The retaining ring 1116 may be fixed, as illustrated, to the floater member 1112 or may be flexibly connected to the floater member 1112 or to the bowl member 1110 through an elastic connection which tends to urge the retaining ring 1116 into contact with the polishing surface of the polishing pad 54. The retaining ring 1116 also prevents the wafer from sliding out sideways from under the wafer head 110 during polishing. In one configuration, a central shaft bushing assembly 1118 keeps the floater member 1112 in alignment with the bowl member 1110. Misalignment of the wafer receiving portion and the rest of the head has been a problem in the past. A bushing 1120 fit into a central aperture at the top of the floater member 1112 receives a central shaft 1130 extending downwardly from the top of the bowl member 1110 to thereby allow vertical movement between the bowl member 1110 and the floater member 1112 while maintaining them in horizontal alignment.

A flexible seal connects the floater member 1112 to the bowl member 1110 of the wafer head 110. Such a seal creates a fluid-tight cavity 1132 at the back of the floater member 1112 while still allowing free relative vertical movement between the bowl and floater members 1110 and 1112. The seal may also be used to provide circumferential torque between the bowl and floater members 1110 and 1112 so as to keep them generally circumferentially aligned. An example of a flexible seal is a rolling seal 1134 generally comprising an annular strip of elastomeric material that is sealed between the inside of the bowl member 1110 and the floater member 1112 of the wafer head 110 as the bowl and floater members 1110 and 1112 move relative to each other. In this movement, the elastomeric strip of the rolling seal 1134 rolls over while maintaining a seal without interfering with adjacent pieces or adding a vertical force component between the bowl and floater members 1110 and 1112.

3C Wafer Head

Yet another exemplary head 110', illustrated in cross section in FIGS. 11 and 12 and referred to as the 3C head.

Shendon et al. disclose such a head in U.S. patent application, Ser. No. 08/488,921, filed Jun. 9, 1995.

Referring now to FIG. 11, the internal structure of the 3C wafer head 110' is shown in detail. Preferably, the head 110' includes a bowl member 1160 having a downwardly facing recess 1162 therein, and within which a carrier plate 1164 is received. To connect the head 110' to the head drive shaft 1014, the bowl member 1160 includes an upwardly extending, externally threaded, boss 1166 and the shaft 1014 terminates against the raised boss 1166. A cup-shaped perimeter nut 1168, having a downwardly extending, internally threaded lip 1170 and a central recess 1172 in the nut 1170 secures the head drive shaft 1014 to the bowl member 1160. The end of the shaft 1014 extends through the nut recess 1172, and a snap ring 1174 is placed into a snap ring bore located adjacent to the end of the shaft 1014 after the shaft end is extended through the nut bore 1172. The snap ring 1174 prevents retraction of the shaft 1014 from the nut bore 1172. The cup-shaped perimeter nut 1168 is then locked over the boss 1166 by threading the lip 1170 over the externally threaded surface of the boss 1166, thereby trapping the snap ring 1174 between the cup-shaped perimeter nut 1168 and the bowl member 1160. To rotationally lock the head drive shaft 1014 and the bowl member 1160, the shaft 1014 includes a keyway 1176 extending inwardly of its lower end, and the boss 1170 also includes a keyway 1178, which aligns with the shaft keyway 1176 when the shaft 1014 is received in the perimeter nut 1170. A key extends between the two keyways 1176 and 1178. Alternatively, a pin 1180 may be inserted into respective holes in the boss 1166 of the bowl member 1160 and the head drive shaft 1014.

The bowl member 1160 provides a substantially vertically fixed, rotationally movable, reference surface from which the substrate 40 is loaded against the polishing surface. In the preferred embodiment of the invention as shown in FIG. 11, the substrate loading is accomplished by selectively positioning the carrier plate 1164 vertically with respect to the reference surface provided by the bowl member 1160 by means of a primary, upper biasing chamber 1182 and a secondary, lower biasing chamber 1184. Preferably, the central recess 1162 is defined within the boundaries of the bowl member 1160, which in the preferred embodiment is a one-piece member, having an upper, horizontally extending plate-like portion 1186 and a downwardly extending rim 1188. The carrier plate 1164 is received within the recess 1162 and is extensible therefrom to locate a substrate received thereon against a polishing surface.

To enable selective positioning of the carrier plate 1164 in the recess 1162, the primary biasing chamber 1182 includes a bellows 1190, which extends between the underside of the upper plate 1186 and the upper surface of the carrier plate 1164. These bellows 1190 are sealed at their connection to the carrier plate 684 and the upper plate 1186 of the bowl member 1160, and these connections are also of sufficient strength to support the mass of the carrier plate 1164 hanging from the bowl member 1160 without separation. Preferably, a bellows cavity 1192 is formed within a removable bellows insert 1194, which includes an upper bellows plate 1196 and a lower bellows plate 1198 between which the bellows 1190 extend. The bellows 1190 are affixed to the plates 1196 and 1198 to create the removable bellows insert 1194. To affix the bellows insert 1194 to the bowl member 1160 and to the carrier plate 1164, a plurality of unillustrated bolts extend through the rim of the lower bellows plate 1198 and into the top of the carrier plate 1164, and a plurality of unillustrated bolts extend through the plate-like portion of the bowl member 1160 and into threaded holes in the upper bellows plate 1196.

The secondary loading assembly 1184 of the wafer head 110' includes a bow chamber 9102 which is formed within the carrier plate 684. The bow chamber 9102 is a sealable cavity having a thin, generally planar membrane 9104 against which a conformable material 9106, such as a piece of polishing pad material, may be located to form a conformable substrate receiving surface for the surface of the wafer.

To polish a substrate using the head 110', a substrate is loaded against the material 9106 covering the planar lower surface of the membrane 9104. The head 110' is then positioned over one of the polishing pads 54, and the bellows cavity 1192 is pressurized to enlarge itself to thereby bias the carrier plate 1164 toward the polishing surface and thereby load the substrate against it. To vary the pressure between the center and the edge of the substrate, the bow chamber 9102 is pneumatically pressurized. The positive pressure will bend the planar membrane 9104 outwardly, and the center of the planar surface will extend furthest outwardly in a convex structure to increase the loading between the substrate and the polishing surface near the center of the substrate. Negative pneumatic pressure, on the other hand, tends to create a concave structure.

Referring still to FIG. 11. the head 110' also preferably includes a retainer ring 9110, which, during polishing, extends into contact with the polishing surface and which is otherwise retractable inwardly and upwardly of the head 110'. In this embodiment of the head 110', the ring 9110 is an annular member having a planar base 9112 on which a replaceable contact ring 9114 is fixed, and it further includes an outwardly extending annular ledge portion 9116. The bowl member 1160 includes an inwardly extending annular ledge 9118, which extends below the surface of the outwardly extending ledge portion 9116 of the retainer ring 9110. To secure the retainer ring 9110 within the recess 1162 of the bowl member 1160, a plurality of compressed springs 9120 extend between the inwardly extending ledge 9118 and the underside of the outwardly extending ledge 9116. These springs continuously bias the retainer ring 9110 inwardly and upwardly of the bowl member 1160. To project the retainer ring 9110 downwardly out of the bowl member 1160, and to vary and control the extent of projection, an inflatable toroidal bladder 9122 extends between the upper surface of the outwardly extending ledge 9116 of the retainer ring 9110 and the underside of a middle ledge 9124 of the bowl member 1160 about the entire circumference of the retainer ring 9110. When the bladder 9122 is evacuated, as shown in FIG. 8, through structure similar to a stem on a tire tube, the retainer ring 9110 is retracted inwardly and upwardly of the head 110'. When the bladder 1188 is positively pressurized, the bottom of the retainer ring 9110 extends downwardly from the head 110', as shown in FIG. 12. The bladder 1188 may be replaced by two annular bellows of either rubber or metal defining an annular cavity between them.

FIG. 11 additionally shows vertical passages 9130, 9132, 9134, 9136, and 9138 extending along the drive shaft 1014 and sealed to various passages in the head 110' to selectively supply vacuum, pneumatic pressure or fluid to elements of the head. The vertical passage 9130 connects via side passage 9140 and vertical passage 9142 to the bladder 9122. The vertical passage 9132 connects via side passage 9144 to the area between the bellows insert 1182 and the retaining ring 9110. The vertical passage 9134 connects via passage 9146 to the bellows cavity 1192. The vertical passage 9136 connects via passage 9148 to the bow chamber 9102. The vertical passage 938 connects via side passage 9150 and vertical passage 9152 to a port 9154 at the bottom surface 9106 of the membrane 9104 so as to selectively hold and eject wafers in and from the head 110'.

3C3 Wafer Head

FIG. 12A shows an alternate embodiment of a wafer head 110", referred to the 3C3 head, which is a modification of the 3C wafer head 110' of FIGS. 11 and 12. The 3C3 wafer head 110" comprises three major assemblies: a base assembly 9202, a housing assembly 9204, and a retaining ring assembly 9206. A bellows system 9208 is positioned between the housing assembly 9204 and the base and retaining ring assemblies 9202 and 9206. Each of these assemblies is explained in detail below.

The base assembly 9202 applies a load to the wafer 40; that is, it pushes the wafer 40 against the polishing pad 54. The base assembly 9202 can move vertically with respect to housing assembly 9204 to carry the wafer to and from the polishing pad. The bellows system 9208 connects the housing assembly 9204 to the base assembly 9202 to create an annular primary pressure chamber 9210 therebetween. Fluid, preferably air, is pumped into and out of the primary pressure chamber 9210 to control the load on the wafer 40. When air is pumped into the primary pressure chamber 9210, the pressure in the chamber increases and the base assembly 9202 is pushed downwardly.

The bellows system 9208 also connects the housing assembly 9204 to the retaining ring assembly 9206 to create an annular secondary pressure chamber 9212. Fluid, preferably air, is pumped into and out of the secondary pressure chamber 9212 to control the load on the retaining ring assembly 9206.

As explained below, the housing assembly 9204 is connected to and rotated by the drive shaft 1084. When the housing assembly 9204 rotates, the bellows system 9208 transfers torque from the housing assembly 9204 to the base assembly 9202 and the retaining ring assembly 9206 and causes them to rotate.

The base assembly 9202 includes a disk-shaped carrier base 9214 having a nearly flat bottom surface 9216 which may contact the wafer 40. A top surface of the carrier base 9214 710 includes a centrally located circular depression 9220 surrounded by a generally flat annular area 9222. The annular area 9222 is itself surrounded by a rim 9224. Several vertical conduits 9226, evenly spaced about a central axis 9228 of the wafer head 110", extend through the carrier base 9214 from the bottom surface 9216 to the central circular depression 9220.

A generally flat annular plate 9230 rests primarily on the annular area 9222 of the carrier base 9214, with the outer edge of the annular plate 9230 abutting the rim 9224 of the carrier base 9214. An inner portion 9232 of the annular plate 9230 projects over the central circular depression 9220. The annular plate 9230 may be attached to the carrier base 9214 by bolts 9234 which extend through passages in the annular plate 9230 and engage threaded recesses in the carrier base 9214.

A stop cylinder 9240 is mounted in a central opening 9238 in the annular plate 9230. The stop cylinder 9240 includes a tubular body 9242, a radially outwardly projecting lower flange 9244, and a radially outwardly projecting upper flange 9246. The lower flange 9244 engages a lip 9248 at the inner edge of the annular plate 9230 to support the stop cylinder 9240 above the annular plate 9230. The gap between the lower flange 9244 of the stop cylinder 9240, the circular central depression 9216 of the carrier base 9210, and the inner portion 9232 of the annular plate 9230 creates a central cavity 9250 in the base assembly 9202. A central channel 9252 extends vertically through the tubular body 9242 from the lower flange 9244 to the upper flange 9246 to provide access for fluid to the central cavity 9250 and the vertical conduits 9226.

The housing assembly 9204 includes at its top a disk-shaped carrier housing 9260. The bottom surface of the carrier housing 9260 has a cylindrical cavity 9262. The bottom surface also has an inner annular surface 9264 and an outer annular surface 9266 which may be separated by a downwardly projecting ridge 9268. The top surface of the carrier housing 9260 includes a cylindrical hub 9270 with a threaded neck 9274 which projects above an upwardly facing middle annular area 9272. A gently sloped section 9276 surrounds the middle annular area 9272, and a ledge 9278 surrounds the sloped section 9276.

The housing assembly 9204 also includes below the carrier housing 9260 an annular inner plate 9280 and an annular outer plate 9282. The inner plate 9280 is mounted to the inner annular surface 9264 on the bottom of the carrier housing 9260 by a set of bolts 9284, and the outer plate 9282 is mounted to the outer annular surface 9266 by another set of bolts 9286. The outer edge of the inner plate 9280 abuts the ridge 9268 in the carrier housing 9260. The inner edge of the inner plate 9280 projects horizontally under the cylindrical cavity 9262 to form an inwardly pointing lip 9290 surrounding an opening 9292 between it and the stop cylinder 9240. The top of the cylindrical cavity 9262 is closed by a ceiling 9294. The stop cylinder 9240 of the base assembly 9202 extends through the opening 9292 into the cylindrical cavity 9262, and its upper flange 9246 projects horizontally over the lip 9290.

There are several conduits in the housing assembly 9204 to provide for fluid flow into and out of the wafer head 110". A first conduit 9300 extends from the bottom surface of the inner plate 9280, through the carrier housing 9260, and (in an unillustrated passage) to top of the hub 9270. A second conduit 9302 extends from the cylindrical cavity 762 through the carrier housing 9260 to the top of the hub 9270. A third conduit 9304 extends from the bottom surface of the outer plate 9282 through the carrier housing 9260 to the top of the hub 9270. O-rings 9306 inset into the top and bottom surfaces of the hub 9270 surrounds each conduit so as to seal them against adjoining members.

The wafer head 110" may be attached to the drive shaft 1084 by placing two dowel pins (not shown) into dowel pin holes (not shown) and lifting the wafer head so that the dowel pins fit into paired dowel pin holes (not shown) in a drive shaft flange 1084a. This aligns angled passages in the drive shaft 1084 to the conduits 9300, 9302 and 9304. Then the threaded perimeter nut 1068 can be screwed onto the threaded neck 9274 to attach the wafer head 110" firmly to the drive shaft 1084.

The bellows system 9208 includes several cylindrical metal bellows disposed concentrically in the space between the base assembly 9202 and the housing assembly 9204. Each bellows can expand and contract vertically. An inner bellows 9310 connects the inner edge of the inner plate 9280 to the lower flange 9244 of the stop cylinder 9240 to seal the upper central cavity 9262 and the central channel 9252 from the primary pressure chamber 9210. A pump (not shown) can pump air into or out of the vertical conduits 9226 via the second conduit 9302, the upper central cavity 9262, the central channel 9252, and the lower central cavity 9250 to vacuum-chuck or pressure-eject the wafer to or from the bottom surface of the wafer head 110".

An outer bellows 9312 connects the outer edge of the inner plate 9280 to the annular plate 9230. The ring-shaped space between the concentric inner bellows 9310 and outer bellows 9312 forms the primary pressure chamber 9210. A pump (not shown) can pump air into or out of the primary pressure chamber 9210 via the first conduit 9300 to adjust the pressure in the primary pressure chamber 9210 and thus the load that the head 110" exerts on the wafer 40.

When the primary pressure chamber 9210 expands and the base assembly 9202 moves downwardly with respect to the housing assembly 9204, the metal bellows 9310 and 9312 stretch to accommodate the increased distance between the annular plate 9230 and the inner plate 9280. However, the flange 9246 of the stop cylinder 9240 will catch against the lip 9290 of the housing assembly 9204 to stop the downward motion of the base assembly and prevent the bellows from over-extending and becoming damaged.

The retaining ring assembly 9206 includes an L-shaped ring support 9320 with a inwardly directed horizontal arm 9322 and an upwardly directed vertical arm 9324. A backing ring 9330 is attached to the top of the horizontal arm 9322 by bolts 9332. An outer portion 9333 of the backing ring 9330 abuts the vertical arm 9324 of the L-shaped ring support 9320, and an inner portion 9334 of the backing ring 9330 may project horizontally over the rim 9224 of the carrier lease 9214. A flexible seal 9335 connects the retaining ring assembly 9306 to the carrier base 9214 to protect the wafer head from slurry. The outer edge of the seal 9335 is pinched between the backing ring 9330 and the horizontal arm 9322 of the L-shaped ring support 9320, whereas the inner edge of the seal 9335 is attached by an adhesive to the carrier base 9214. A vertically extending flange 9336 is attached to the outside of the vertical arm 9324 of the L-shaped ring support 9320 and forms the outer wall of the wafer head 110". The flange 9336 extends upwardly to almost touch the carrier housing 9260. A seal 9338 rests on the ledge 9278 of the carrier housing 9260 and extends over the vertically extending flange 9336 to protect the wafer head 110" from contamination by slurry. A retaining ring 9340 is mounted to the bottom surface of the horizontal arm 822 of the L-shaped ring support 9320 by unillustrated recessed bolts. The retaining ring 9340 includes a inner, downwardly protruding portion 9342 which will contact the polishing pad 54 and block the wafer 40 from slipping out from under the base assembly 9202.

A third cylindrical bellows 9314 connects the inner edge of the outer plate 9282 of the housing assembly 9302 to the inner portion 9333 of the backing ring 9330. A fourth cylindrical bellows 9316 connects the outer edge of the outer plate 9282 to the outer portion 933 of the backing ring 9330. The ring-shaped space between the concentric third and fourth bellows 9314 and 9316 forms the secondary pressure chamber 9212. A pump (not shown) can pump air into or out of secondary pressure chamber 9212 via the third conduit 9304 to adjust the pressure in the secondary pressure chamber 9212 and thus the downward pressure on retaining ring 9340. Because the primary and secondary chambers 9210 and 9212 are pressurized independently, the base assembly and retaining ring can be independently actuated in the vertical direction.

Wafer Head Mounting

Referring now additionally to the enlarged cross section of FIG. 10 with particular reference to the diamond wafer head 110 of FIG. 9 although large parts of the discussion are also applicable to the 3C wafer head 110' of FIG. 11 and the 3C3 wafer head 110 of FIG. 12A, the vertical polishing force to polish the wafer is supplied by pressurized fluid routed to the fluid-tight cavity 1132 between the bowl and floater members 1110 and 1112. The pressurized fluid, which may be air or water, is supplied to the wafer head 110 though a first axial channel 1040 (one of four such channels) in the head drive shaft 1014. A rotary coupling 1042 (to be described later) at the top of the shaft above the rotary motor 1012 couples four fluid lines into the shaft channels of the rotating shaft 1014. A first angled passageway 1044 formed in a shaft flange 1046 of the head drive shaft 1014 connects the first shaft channel 1040 to a vertical passageway 1048 in a top hub 1150 of the downwardly facing bowl member 1110. The vertical passageway 1148 extends down to the fluid-tight cavity between the bowl and floater members 1110 and 1112 to control the pressure therein. A similar angled passageway 1052 and vertical passageway 1054 connect a second shaft channel 1056 to the interior of the wafer head 10, and like elements are provided for the remaining two shaft channels if desired. Plugs 1058 are placed at the bottom of the bored shaft channels 1040 and 1056 to seal them. Seals are placed between the respective angled passageways 1044 and 1052 in the shaft flange 1046 and the vertical passageways 1044 and 1052 in the bowl member 1110 to confine the fluids contained therein.

When the drive shaft 1014 and the wafer head 110 are placed together, two dowel pins 1060 are placed in paired dowel holes 1062 and 1064 in the bowl hub 1050 and the shaft flange 1046 to circumferentially align the shaft 1014 and bowl member 1110, particularly their fluid passages. A perimeter 1066 of the bowl hub 1050 is threaded, and a perimeter nut 1068 is screwed thereon. The perimeter nut 1068 has a lip 1070 that is smaller than the outside diameter of the shaft flange 1046 and fits over the top of the flange 1046 of the drive shaft 1014 to thereby clamp and hold the drive shaft 1014 to the bowl member 1110 of the wafer head 110.

The separate fluid connections can be used for a number of purposes. For example, the passages can be utilized (1), to route a vacuum or pressurized gas source to the recess 115 where the wafer is brought into contact with the wafer head 110 (this is the configuration on the right side of FIG. 9 which requires a sliding seal 1072 through the fluid-tight cavity 1132 to a vertical passageway 1074); (2), to route a vacuum or pressurized gas source to the bowl member 1110 of the wafer head 110 to control the vertical extension and retraction of the floater member 1112 of the wafer head 110 from the bowl member 1110 (this is the configuration of both heads 110 and 110'); (3), to use two passages (a supply and return) to circulate cooling water through the wafer head 110 to control the wafer temperature; and (4), if the rotary coupling 1042 permits it, to route electrical lines through the channels, e.g., to measure a temperature of the wafer head 110.

The lower floater member 1112 of the wafer head 110 moves vertically relative to the upper fixed bowl member 1110 based upon the fluid pressure supplied to the sealed cavity 1132 between the former members 1110 and 11112. Air pressure supplied behind the rolling seal 1034 between the floater member 1112 and the bowl member 1110 causes the floater member 1112 to descend to contact the polishing pad 54 for polishing the wafer 40 mounted in the recess 1115 of the floater member 1112. Similarly, when it is desired to raise the wafer 40 to move it to the next polishing station or transfer station, vacuum is supplied to the sealed cavity 1132 to cause the floater member 1112 holding the wafer 40 to rise.

As illustrated, the stroke of the floater member 1112 within the bowl member 1110 is very small, of the order of 0.2 inches (5 mm), and this is the only vertical motion of either the wafer head systems 100, the carousel 90, or the polishing stations 50. Such a short stroke is easily accommodated within the lower end of the wafer head and can be achieved pneumatically. The short stroke is a major factor is simplifying the design and reducing the cost of manufacturing and operating the polishing system of the invention.

Head Shield Plates

The overall design of the wafer head system 100 requires that it pass through the slot 910 of the carousel support plate 906 and radially oscillate within that slot 910. Chemical mechanically polishing is a wet and particle-intense operation. The wafer head 110 and associated elements have been carefully designed to exclude the polishing environment from the interior of the head 110. The linear bearing rail assemblies 912 and motors 1012 and other equipment above the carousel support plate 906 are sensitive to moisture and grit, and it would be preferable to design a seal about the point where the wafer head assembly 100 passes through the carousel support plate 906 that would prevent the polishing environment from substantially penetrating past it. The splash plate assembly to be described now performs that function.

As best shown generally in perspective in FIG. 7, a splash plate assembly 940 is attached to the underside of the carousel support plate 906. The splash plate assembly 940 prevents polishing slurry, which is abrasive, chemically active, and tends to coat everything in its vicinity with a thin layer of slurry and/or alkaline residue, from getting up into the upper portion of the multi-head carousel assembly 90 and creating undesired effects (such as shorting of electrical connections and contamination of exposed sliding and rolling metal surfaces). The splash plate assembly 940 includes a series of moving slot covers which are configured to provide a slot splash-guard closure within the range of radial oscillation of the wafer head system 100. The closure is accomplished with a horizontal projection that provides a splash shield for the slot without a horizontal projection substantially longer than the length of oscillation in the slot.

The splash plate assembly 940 attached to the underside of the carousel support plate 906 includes a central shield plate 942 that can be screwed to the bottom side of carousel support plate 906 prior to its assembly on the center post 902. The carousel support plate 906 further includes four outer shield plates 944 which can also be screwed to the bottom of the carousel support plate 906 in butted sealing juxtaposition to the central shield plate 942 when the wafer head systems 100 are being fit into the carousel support plate 906. Both the central and outer shield plates 942 and 944 form a rectangular, round-cornered, elongate recess 946 offset from the centerline of each slot's radial axis. An elongated, round-cornered splash slot 948 is formed in both the central and outer shield plates 942 and 944 at their junction. As best shown in the cross section of FIG. 10, both the central and outer shield plates 942 and 944 are formed with an upwardly extending flange 950 facing and surrounding the splash slot 948. As shown in the plan views of FIGS. 14A through 14C, the linear axis of the splash slot 948 generally follows the axis of the corresponding slot 910 in the carousel support plate 906. The rounded portions of the splash slot 948 have an inner diameter substantially larger than the outer diameter of the non-rotating drive shaft housing 1015 that passes therethrough, and the linear portion has a length generally matching the distance of the radial oscillation range of each wafer head system 100.

As best shown in perspective in FIG. 7, a D-shaped splash follower 952 has one convexly curved edge and a second substantially straight or less curved edge smoothly joined to each other. The splash follower 952 includes a circular hole 954 disposed near its curved edge. The drive shaft housing 1015 is rotatably fitted in this hole 954, as will be described shortly, to allow the D-shaped splash follower plate 952 to rotate as the wafer head 110 and attached drive shaft housing 1015 oscillate along the slot 910 of the carousel support plate 906. Each D-shaped plate 952, as best shown in the cross section of FIG. 10, has a downwardly facing flange 956 along the entirety of its outside perimeter. The flanges 950 and 956 of the central and outer splash plates 942 and 944 and of the splash follower 952 are generally of the same length and facing respectively up and down at the edges of the stationary and moving shield pieces. When assembled, the flanges 950 and 956 and the flat bottoms of the opposed pieces 942, 944, and 952 are separated by gaps of about 0.064" (2.15 mm). The flanges 950 and 956 thus create a generally tortuous labyrinthine path to prevent slurry splashed toward the slots 910 from passing from the slurry side of the carousel support plate 906 through the slots 910 and into the motors and bearings located inside the carrier assembly cover 908.

As best shown in the cross section of FIG. 10, each D-shaped splash plate 952 is rotatably fixed to a splash flange 960 formed on the outside of the shaft housing 1015. A perimeter skirt 962 is fitted to the lower end of the drive shaft housing 1015 and has an upwardly extending portion 964 including a ledge 966 which presses the internal race of a splash shield bearing 968 against the splash flange 960 of the drive shaft housing 1015. The outside race of the bearing 968 is clamped tightly from the bottom by an inwardly extending flange 970 of the D-shaped splash follower 952 and from the top by a collar assembly 972 of two or more pieces and by screws 974 which clamp the bearing 968 to the flange 970 of the splash follower 952. The collar 972 overlaps, but does not touch the top of the splash shield flange 960 on the shaft housing 1015.

The D-shaped splash follower 952 is attached to the bearing 968 to be thereby held firmly, but rotates freely relative to the shaft housing 1015. The D-shaped splash follower 952 has a vertical (pivot) pin 976 fixed to its top. This vertical pin 976 has a roller bearing 978 attached to its upper end that is guided within a horizontal guide groove 980 formed in the bottom of the carousel support plate 906. As shown in the perspective view of FIG. 8 and in the plan views of FIGS. 14A through 14C, the pivot pin 976 is disposed on the medial line of splash follower 952 between the circular hole 954 and the flat edge of the D-shaped splash follower 952. The outside of the roller bearing 978 rides in the horizontal guide groove 980 on the bottom of the carousel support plate 906, which extends to or almost to the radial slot 910 in the carousel support plate 906 but is angularly offset from it. Preferably, the guide groove 980 is perpendicular to the radial slot 910.

As the shaft 1014 and shaft housing, 1015 radially oscillate in the carousel support plate 906 to move the wafer head 110, the center hole 954 of the splash follower 952 follows the shaft housing 1015. This motion also moves the pivot pin 976 on the splash follower 952 whose direction of motion is restricted to the perpendicular direction as it follows the guide groove 980 in the carousel support plate 906. The splash follower 952 is thereby caused to rotate as it is held in alignment between the shaft housing 1015 and the pivot pin 976. The oscillatory motion of the shaft housing 1015 thus causes a corresponding oscillatory and partially orbital motion in the D-shaped splash follower 952.

The motion of the D-shaped shield plate 688 can be seen in the top views of FIGS. 14A, 14B, and 14C. As the wafer head 110 moves from an innermost position to an outermost position along the slot 910 of the carousel support plate 906, that is, as the drive shaft housing 1015 moves along the slot 910, the guide groove 980 constrains the pivot pin to move perpendicularly to the slot 910 and to thus cause the splash follower 952 to partially orbit the drive shaft housing 1015 as it follows it in the slot direction.

The D-shaped splash follower 952 orbits as it is constrained between two points, the central axis of the drive shaft housing 101 5 and the central axis of the vertical pivot pin 978. As the drive shaft housing 1015 oscillates, the D-shaped splash follower moves with the drive shaft housing 1015. The pivot pin 976 also moves under the influence of the drive shaft housing 1015, but instead of moving radially in the radial slot 910, as does the drive shaft housing 1015, it moves in the perpendicular guide groove 980 of the carousel support plate 906. Since the splash follower 952 is connected to the drive shaft housing 1015 through a ball bearing 968 and the pivot pin 976 of the splash follower 952 is connected the guide groove 964 of the carousel support plate 906 through a roller bearing 978, there is no sliding contact between pieces which could generate metal particles which could fall on wafers being polished and damage them. In all positions, the slot 910 is covered by the orbiting splash follower 952 and direct splashing of the slurry through the slot is prevented. Nonetheless, the splash follower 952 has an operating span that is less than if it did not orbit about the drive shaft housing 1014.

The motion of the splash plate assembly 940 and particularly the motion of the D-shaped splash follower 952 are shown in three longitudinal cross-sectional views of FIGS. 15A, 15B, and 15C taken along the axis of the slot 910 of the carousel support plate 906, in three axial cross-sectional views of FIGS. 16A, 16B, and 16C, and in three perspective views of FIGS. 17A, 17B, and 17C. Like-lettered figures in these three sets correspond to the plans views of FIGS. 14A, 14B, and 14C, respectively. In the perspective views, the pivot pins 976 on the top of the splash follower 952 is shown engaging the guide groove 980 of the otherwise unillustrated carousel support plate 906.

FIGS. 10A, 10B, and 10C clearly show the pivot pin 976 moving from an inward position, to an outward position, and again to the inward position within the guide groove 980 as the drive shaft housing 1015 moves from the radially innermost position of FIG. 16A, to a median position of FIG. 16B, to a radially outermost position of FIG. 16C. Especially, FIGS. 16A, 16B, and 16C show that the splash follower 952 always covers the closed slot 948 formed in the central and outer splash plates 942 and 944 which is the principal path from the polishing area to the back of the carousel support plate 906. The plan views of FIGS. 14A, 14B, and 14C and the perspective views of FIGS. 17A, 17B, and 17C show that the closed slot 948 is covered by a mechanism that takes up a minimum of radial space along the central and outer splash plates 942 and 944 and thus along the radial slot 910 of the carousel support plate. Thereby, the size of the mechanism is reduced with an accompanying reduction in the footprint of the polishing system.

Both sets of side-view figures shows that the flange 950 extending upwardly from the central and outer splash plates 942 and 944 and the flange 956 extending downwardly from the splash follower 952 always create a labyrinthine path for moisture and particles attempting to penetrate to the back of the carousel support plate 906.

Rotary Union

The rotary union 1042 of FIG. 9 can be achieved by commercially available units. However, a preferable, novel rotary union 2100 is illustrated in cross section in FIG. 13. The spindle shaft 1014 above the wafer head motor 1012 contains four vertical channels, only two such channels 1040 and 1056 being illustrated. At its upper end, above the rotary motor 1012, it is joined to a spindle 2114 having four similar vertical passages 2116 aligned to those of the spindle shaft 1014 by a dowel 2118 at the lower end of the spindle 2114 and sealed thereto by unillustrated O-rings in recesses 2120. A quick-disconnect clamp 2122 joins the spindle 2114 to the spindle shaft 1014. Both the spindle shaft 1014 and the spindle 2114 are rotating with the wafer head 110. A anti-rotation plate 2134, on the other hand, is fixed to some point on the assembly, such as the casing of the wafer head motor 1012.

A rotary assembly 2140 comprises four vertically stacked and separable sections 2142*a*, 2142*b*, 2142*c*, and 2142*d*, principally composed of respective annular rotary members 2143*a*, 2143*b*, 2143*c*, and 2143*d*. Each rotary member 2143*a* through 2143*d* includes a tapped hole 2144 to be threaded with a male threaded end of a detachable connector for a fluid line or other line. This design is easily integrated with a section providing one or more electrical connections down through the spindle 2114 in which a radial spring-loaded contact slides on a circumferential commutator rotating on the spindle 2114. Each tapped hole 2144 is connected by a radial passageway 2146 to an annular manifold 2148 surrounding the spinning spindle 2114. The rotary seal between the sections 2142*a*–2142*d* and the spindle 1014 is accomplished by flanget shaft seals 2150. Each such flanget shaft seal 2150 is an annular elastic U-shaped member 2150, with the bottom of the U oriented away from the center of the annular manifold 2148 and having substantially flat sides sealing the sides of the spindle 2114 against respective ones of the rotary members 2143. Each lip seal 2150 has a tail 2149 extending radially outwardly. The outer surface of each lip seals 2150 is composed of a moderately hard elastomeric material. Each lip seal 2150 includes within its U-shaped cavity an annular spring member joined along its radially innermost portion within the U and having fingers extending down the inner wall toward the bottom of the U and then upwardly along the outer wall so as to force the two walls apart to seal the rotary members 2143 relatively rotating about the spindle 2114. An example of such a flanget seal is Model W30LS-211-W42, available from Variseal.

The two lip seals 2150 are fit into the sides of the annular manifold 2148. However, such lip seals 2150 work best only if their interior sides have positive pressure with respect to the pressure outside the bottom of the U. But, it is desired that at least the middle two of the four lines have a negative pressure, that is, less than atmospheric pressure, applied through them for at least some of the time. Accordingly, a male connection of a detachable connector of a vacuum line is threaded into a tapped vacuum hole 2151 in one central rotary member 2142*b*. The bottom of the vacuum hole 2151 connects to a vertical vacuum passage 2152 bored in the center ones of the rotary members 2142*b* and 2142*c*. The vertical vacuum passages 2152 connect to three inter-sectional manifolds 2148 formed between the four rotary members 2142. A stainless-steel washer 2156 fits within a recess of the rotary members 2142 and fills the inner portion of each inter-sectional manifold 2154 up to but not quite touching the rotating spindle 2130 and supports the back of the lip seals 2150. The washers 2156 trap the tails 2149 of the lip seals 2151 against the rotary members 2142. Separate elements perform similar trapping at the very top and bottom. Each washer 2156 has four radial grooves formed in each principal surface so as to distribute the vacuum to the back of each adjacent lip seal 2150. As a result, regardless of the pressure applied through the tapped holes 2144 to the respective manifolds 2148, a positive pressure is always maintained from the interior of the lip seal 2150 and its outside. It should be mentioned that the top and bottom sections 2042d and 2042a have not been designed for a negative pressure. Therefore, the uppermost and bottommost lip seal 2150 are not provided with backside vacuum.

As shown in FIG. 13, each of the stationary rotary members 2143a through 2143d is connected to a respective one of the vertical passages 2116 in the rotating spindle 2114 via a side passage 2160 bored radially in the spindle 2114 at the proper height for that section. Each side passage 2160 is continuously connected to its associated annular manifold 2148.

An upper flange 2180 is placed over the uppermost rotary member 2143d and four bolts 2182 pass through a respective through hole 2184 aligned with through holes 2162 of the upper three rotary members 2143b, 2143c, and 2143d and are screwed into the tapped hole 2164 of the bottom rotary member 2143a. O-rings 2166 are placed between neighboring sections to ensure fluid sealing.

The lower rotary member 2143a includes at least one tapped hole 2168 for respective bolts fixing the rotary union 2100 to the spatially fixed anti-rotation plate 2134. It further includes an inner, lower recess for a collar 2172 pressing the outer race of a lower ring bearing 2170 against a ledge 2176 in the anti-rotation plate 2134. The inner race of the lower ring bearing 2170 is held on its lower side by a ledge 2178 in the spindle 2114 but floats on its upper end.

The rotary assembly 2140 is placed over the spindle 2114 with the lower ring bearing 2170 at the bottom and an upper ring bearing 2186 placed on upper ledges of the spindle 2114 and the upper flange 2180. The outer race of the upper ring bearing 2186 is held by a bearing flange 2187 fixed by screws 2188 to the upper flange 2180. The inner race of the upper ring bearing 2186 is biased toward the ledge of the spindle 2114 by an O-ring 2189 pressured by a wave spring 2190 pressed downward by a top flange 2192 secured to the top of the spindle 2114 by screws 2194.

This rotary coupling is particularly advantageous in that its total height above the drive shaft is 10.4 cm (4.08 inches), that is, 2.6 cm per section. The simple design also minimizes the lateral dimension and the total weight. All these factors contribute to a polishing apparatus and particular wafer head systems that are compact.

Of course, the invention of the rotary union is not limited to the four sections. It is applicable to a single rotary feedthrough, but it is most advantageous to two or more rotary feedthroughs.

Assembly of the Wafer Head Assembly

The principal parts of the wafer head system 100 have already been described. This section will describe a few final parts necessary to join it to the other parts and to provide proper sealing and bearing surfaces, as required.

The wafer head system 100 is shown in the complete cross section of FIG. 9 and the partial enlarged cross section of FIG. 10. The drive shaft housing 1015 holds the shaft 1014 by paired sets of lower ring bearings 1080 and an upper ring bearing 1082. The outer race of the lower ring bearings 1080 are held in an inside counterbore 1084 at the bottom end of the drive shaft housing 1015 by a notched retainer rim 1086 tightened against the drive shaft housing 1015 by a set of screws 1088. The retainer rim 1086 also supports and clamps the ascending portion 964 of the perimeter skirt 962 against the splash bearings 968 so as to affix the inner race of the splash bearings 968 to the drive shaft housing 1015.

The offset of the collar from the bearing provides a small degree of elastic compliance to allow for dimensional differences due to manufacturing.

The inner race of the lower ring bearing 1080 rests on a shoulder 1090 near the bottom of the spindle shaft 1014. A shaft bushing 1092 is loosely fitted between the spindle shaft 1014 and drive shaft housing 1015 and acts as a collar clamping and separating the inner races of the lower and upper ring bearings 1080 and 1082 while the outer races are held by the drive shaft housing 1015. A pair of retaining nuts 1094 are threaded onto the upper portion of the spindle shaft 1014 to hold and lock the inner races of the rings bearings 1080 and 1082 to the spindle shaft 1014. The outer race of the upper bearing 1082 is also locked to the top of the shaft housing 1015, as the tightening of the nuts 1094 tends to clamp the bearings 1080, 1082 to the shaft housing 1015. The spindle shaft 1014 passes upwardly through the hollow shaft of the wafer rotation motor 1012. The upper end of the spindle shaft 1014 above the motor 1012 is held by a clamp collar 1095 that is attached to the rotor of the motor 1012. A motor bracket 1096 is connected to the upper end of the drive shaft housing 1014 below the motor 1012 to support the motor 1012 on the shaft housing 1015, and a lip 1098 depending from the bracket 1096 positions the bracket 1096 to the drive shaft housing 1015.

The wafer head system 100 can be assembled while removed from the carousel 90, with the exception of the outer splash plates 944 and a loosened central splash plate 942, and then the nearly complete assembly is inserted into the slot 910 of the carousel support plate 906. An upper flange 1100 of the drive shaft housing 1015 fits onto ledges 1102 formed on the inner sides of the arms of the slide 908 and a set of bolts 1104 fasten the upper flange 1100 and thus the drive shaft housing 1015 to the slide 908. This simple mating between the wafer head system 100 and the carousel 90 significantly reduces downtime when a wafer head needs to be replaced.

Table Top Layout

FIG. 18 shows a top plan view (with the exception of the center post 802) of the table top 23 of the machine base 22. As described before, the three polishing stations 50a, 50b, and 50c and the transfer station 70 are arranged in a square configuration on top of the machine base. Each polishing station includes the respective rotatable platen 52 overlaid with the polishing pad 54, where the polishing pads 54 for the different polishing stations may have different characteristics. The first elongate intermediate washing station 80a is located between the first two polishing stations 50a and 50b, and the second intermediate washing station 80b is located between the second two polishing stations 50b and 50c. A third washing station 80c is located between the third polishing station 50 and the transfer station 70, and optionally a fourth washing station 80aa may be located between the transfer station 70 and the first polishing station 50a. These serve to wash slurry from the wafer as it passes from one polishing station to the next.

Associated with each polishing, station is the respective conditioner apparatus 60a, 60b, or 60c, each including its pivotable arm 62 holding its conditioner head 64 on its distal end and further including its conditioner storage cup 68 for storing the conditioner head 64 when it's not in use. Although the detailed embodiments describe a disk-shaped rotating conditioner head, the conditioner head could be a wheel or rod. FIG. 18 shows the storage cups 68 of the first an54 for the different polishing stations may have different characteristics. The first elongate intermediate washing station 80a is located between the first two polishing stations 50a and 50b, and the second intermediate washing station 80b is located between the second polishing stations 50b and 50c. A third washing station 80 is located between the third polishing station 50c and the transfer station 70, and optionally a four washing station 80aa maybe located between the transfer station 70 and the first polishing station 50a. These serve to wash slurry from the wafer as it passes from one polishing station to the next.

Associated with each polishing station is the respective conditioner apparatus 60, 60b, or 60c, each including its pivotable arm holding its conditioner head 64 on its distal end and further including its conditioner storage cup 68 for storing the conditioner head 64 when it's not in use. Although the detailed embodiments describe a disk-shaped rotating conditioner head, the conditioner head could be a wheel or rod. FIG. 18 shows the storage cups 68 of the first and second polishing station 50a and 50b being in inactive positions outboard of the sweep path of the conditioner arm 62 with the conditioner head 64 positioned over the pad 54, which it reconditions as the rotatable arm 62 sweeps across the pad. On other hand, this figure shows the storage cup 68 of the third polishing station 50c being swung from its inactive position 68' (shown in dashed lines) to a storage position 68" inboard of the conditioner arm 62 so that the conditioner head 64 can be stored therein when the conditioning arm 62 is idle.

The structural details and operation of these various parts will now be described in separate sections.

Platen Assembly

A platen assembly 500, shown in the cross-sectional view of FIG. 19, is replicated at every polishing station 50a, 50b, and 50c. The platen 52 includes a platen top 510 and a platen base 512 joined to it by several peripheral screws 513 countersunk into the bottom of the platen base 512. For polishing of 8-inch (200 mm) wafers, the platen 52 may have a diameter of 20 inches (51 cm). The bottom of the platen 52 includes a downwardly projecting, wedge-sectioned rim 514 that rotates within a corresponding annular drain channel 515 formed in the table top 23 leaving only a narrow, winding passage therebetween 523 for slurry to penetrate towards the bearings.

A collar 516 at the bottom of the platen base 512 captures the inner race of a platen ring bearing 518 and presses it against a flat cylindrical cornice 519 formed on the lower side of the platen base 512. A set of screws 520 countersunk into the bottom of the collar 516 are threaded into the bottom of the platen base 52 and clamp the collar 516 to hold the inner race. Another collar 522 supported on the table top 23 and protruding upwardly into an annular cavity on the outer, lower portion of the platen base 512 captures the outer race of the platen ring bearing 516 against a ledge 222 formed in the table top 23 of the machine base 22. A set of screws 524 countersunk into the bottom of the table top 23 are threaded into the second collar 522 to hold the collar 522 holding, the outer race.

A circular fence 526 surrounds the rotating platen 52 and captures slurry and associated liquid centrifugally expelled from the platen 52. This slurry falls down to a trough 528 formed in the table top 23 and further into the drain channel 515 and drains through a hole 530 through the table top 23 to a drain pipe 532 connected thereto by screws 534 passing through a flange 536 of the drain pipe 532 and threaded into the bottom of the table top 23. The narrow, winding passageway between the platen 52 and table top 23 combined with the centrifugal force from the rotating platen assembly 500 keeps the slurry away from the bearings 518.

A platen motor assembly 540 is bolted to the bottom of the table top 23 through a mounting bracket 542. The motor assembly 540 includes a motor 543 with a output shaft 545 extending vertically upwards which is spline fit to a solid motor sheave 544. A drive belt 546 is wound around the motor sheave 544 and a hub sheave 548 joined to the platen base 512 through a reservoir hub 550 and a platen hub 552. An example of the platen motor is a Yasakawa SGMS-50A6AB with a gear box, which can drive the platen 52 at a rotation rate in the range of 0 to 200 RPM.

SLURRY DELIVERY

At least two types of slurry feed may be used, a top dispensing tube and a bottom center feed. The bottom center feed will be described first.

An angular passage 554 is formed in the platen top 510 to supply slurry to the center of the platen 52. The anglular passage 554 is aligned and sealed with an O-ring in a recess 556 connecting to a vertical passage 558 in the platen base 512. The characteristics of the slurry feed to the pad 54 from the center of the platen 52 are such that the rotation of the platen 52 tends to generally equally distribute the slurry over the surface of the unillustrated polishing pad 54.

Such slurry supplies through the platen are known, but in the past they have used a rotary coupling on the platen hub or drive shalt. However, the use of abrasive slurry in a rotary coupling causes it to wear out rapidly or requires excessively frequent maintenance.

Rotating Slurry Reservoir

These problems are avoided by a reservoir system 5100 illustrated in more detail in the enlarged cross section of FIG. 20. The outer periphery of the reservoir hub 550 is formed with an upwardly extending dam wall 5110 and an inward lip 5112. The dam wall 5110 and the platen hub 552 sealed to the central portion of the reservoir hub 550 forms a rotating reservoir 5114 for slurry 5116. A stationary slurry feed assembly 5120, illustrated on the right, includes a bracket 5122 attached to the bottom of the table top 23. The bracket includes a tapped hole 5124 to which can be threaded a male end of a fitting for stationary slurry feed line. A horizontal passage 5126 bored and sealed in the bracket 5122 is connected to a vertical passage 5128 extending downwardly to the bottom of the bracket 5122 over the reservoir 5114 to supply slurry thereto. A fluid level sensor 5130 extends downwardly from the bracket 5122 to detect the level or slurry 5116 in the reservoir 5114 so that, when the level becomes too low, additional slurry is supplied from an externally controlled supply through the tapped hole 5124.

A diaphragm pump 5140, illustrated in more detail in the yet further enlarged cross section of FIG. 21, pumps the slurry 5116 from the reservoir 5114 to the central hole 554 (FIG. 19) at the top of the platen 52. The diaphragm pump 5140 principally consists of a lower diaphragm cavity 5144 formed in the reservoir hub 550, an opposed upper diaphragm cavity 5146 formed in an overlying upper pump member 5148. A flexible diaphragm 5150 is sealed between the two diaphragm cavities 5146 and 5146, and the upper pump member 5148 is secured to the reservoir hub 550 by unillustrated threaded fasteners to clamp the diaphragm 5150.

The diaphragm pump 5140, which rotates with the platen 52, is powered pneumatically by a fluid selectively supplied under varying pressures by a stationary pneumatic source installed in or adjacent to the machine base 22. A positive pressure applied to the lower diaphragm cavity 5144 causes the diaphragm 5150 to flex upwardly, while a negative pressure causes it to flex downwardly. The flexing, together with a set of inlet and outlet check valves to be described below, pumps the slurry fluid in the upper diaphragm cavity 5146. The pneumatic fluid is supplied to the lower diaphragm cavity 5144 through a passageway 5152 connecting the lower diaphragm cavity 5144 to the lower side of the reservoir hub 550 opposed to an O-ring sealing chamber 5154. A second passageway 5155 in the solid motor sheave 544 connects the O-ring chamber 5154 to a tapped hole 5156 at the bottom of the motor sheave 544 to which is connected a flexible fluid line 5157. As illustrated in FIG. 19, the fluid line 5157 is connected through a coupling 5158 to an axial passage 5160 in a rotating motor shaft 5162. A rotary coupling 5164 connects the rotating axial passage 5160 to the stationary pneumatic source via an unillustrated pneumatic line.

As shown in FIG. 21, the upper pump member 5148 overlying the diaphragm 5150 seals the diaphragm 5150 to the reservoir hub 550 to prevent fluid leakage between the upper and lower diaphragm cavities 5146 and 5144. Two flow check valve assemblies, only a front one of which is illustrated, are formed in the pump member 5148 to prevent back flow of fluid oppositely to the pumping direction. Each flow check valve assembly includes a cylindrical chamber having a large cylindrical upper part 5170, a tapered middle part 5172, and a small cylindrical lower part 5174. A valve ball 5176 is placed in the cylindrical chamber. The ball 5176 has a diameter smaller than that of the cylindrical upper part 5170 but larger than that of the cylindrical lower part 5174 so that it can effectively seal itself against the tapered middle part 5172. The respective flow check valve assembly is sealed when the fluid pressure in the respective cylindrical upper part 5170 is greater than that in the respective cylindrical lower part 5170, and the sealing is assisted by gravity since the valve ball 5176 naturally seats itself on the downwardly tapering middle part 5172. The tops of the cylindrical chambers are sealed with a generally rectangular seal member 5178 clamped in place by a pump cover 5180 screwed into the upper pump member 5148.

The unillustrated backside flow check valve assembly is used to supply slurry to the top diaphragm cavity 5149 of the diaphragm pump 5140 and is positioned in the flow path between the slurry reservoir 5114 and top diaphragm cavity 5148. The top of the cylindrical upper part 5170 is connected by an unillustrated passage to the upper diaphragm cavity 5146. The cylindrical lower part 5174 is opened to an unillustrated sump portion of the reservoir 5114 so that slurry is always present in the right circular lower part 5176 and can flow into the upper diaphragm cavity 5146 when the diaphragm 5150 is pneumatically flexed downwardly to provide negative pressure in the upper diaphragm cavity 5146. However, if the diaphragm 5150 is pneumatically flexed upwardly to provide positive pressure in the upper diaphragm cavity 5146, the valve ball 5176 seats against the tapered portion 5172 and thereby closes the supply check flow valve assembly against any backward flow of slurry.

The illustrated frontside flow check valve assembly is used to feed slurry from the upper diaphragm cavity 5146 of the diaphragm pump 5140 to the central aperture 554 at the top of the platen 52. The lower cylindrical part 5174 of the feed flow valve check assembly communicates directly with the upper diaphragm cavity 5146. A passage 5184 in the upper pump member 5148 connects the upper cylindrical part 5170 of the feed flow check assembly to a hook-shaped passage 5186 in the reservoir hub 550 and platen hub 552, which ultimately connects to the central aperture 554 at the top of the platen 52. (It is noted that in interest of clarity some of the passages are illustrated differently than actually embodied in our prototype, but the differences do not significantly affect the invention.) When positive pneumatic pressure, whether liquid or air, upwardly flexes the diaphragm 5150, the slurry in the upper diaphragm cavity 5146 is pumped through the passages 5184 and 5186 to the top of the platen 52. When the positive pneumatic pressure is released, the seating of the valve ball 5176 in the feed check flow valve assembly prevents the back flow of slurry, particularly due to the head created by the back pressure of slurry pumped above the level of slurry 5116 in the reservoir 5114.

This configuration of the slurry feed eliminates the problem of having a slurry running through a rotary coupling and provides a high degree of reliability as well as shortens the length of the slurry line which might get plugged if slurry were to sit in the slurry line for a long time.

Overhead Slurry Dispenser

It is advantageous to additionally include an overhead slurry dispenser 5200, as illustrated in schematic cross-sectional view in FIG. 22 and in plan view in FIG. 23. It includes a dispensing tube 5202 rotatably supported on a dispenser base 5204 located on the table top 23 within the surrounding fence 25. The dispensing tube 5202 is rotatable over the platen 52 and attached polishing pad 54 such that its dispensing end 5206 can be located to one or more points adjacent to the wafer head 110. As has been described before, the wafer head 110 is supported on the carousel 90 and, during polishing, slides linearly across a diameter of the pad 54. FIGS. 22 and 23 are somewhat schematic in not showing the complete overhang of the carousel 90 over the pad 54. If the wafer head 110 is performing over-center polishing, the end 5206 cannot be parked near the center of the polishing pad 54. Either it is parked to the side of the furthest outward position of the wafer head 110 or its motion is synchronized with that of the wafer head 110 to avoid any collision. The dispensing tube 5202 is also rotatable to an off-platen position 5208 at which the dispensing end 5206 is positioned off the polishing pad 54 and directly over the table top 23. This dispensing tube 5202 is moved to the off-platen position 5208 when it is desired to flush it so that the flushed liquid and possible debris are collected on the table top 23 and drained from it without contaminating the polishing pad 54.

Preferably, the overhead slurry dispenser 5200 has two dispensing ports for alternately or even simultaneously dispensing two slurries or a slurry and another liquid. As shown in the enlarged elevational view of FIG. 24, the dispensing tube 5202 includes two supply tubes 5210 and 5212 joined to each other and including respective downwardly projecting tube dispensing ends 5214 and 5216. One tube dispensing end 5214 should be longer than and laterally separated from the other so as to minimize the splashing of slurry from an active tube dispensing end to an inactive one, which would tend to cause slurry to dry and cake on the inactive tube dispensing end. Similarly, the middle portion of the dispensing tube 5202 extending horizontally over the pad 54 should be at a sufficient height above the pad 54 to reduce the amount of slurry that splashes from the pad 54 onto the dispensing tube 5202. The supply tube 5210 and 5212 and other exposed parts of the slurry dispenser 5200 should be composed of a material such as Teflon which is resistant to corrosive slurry and is preferably hydrophobic.

The limited rotation of the dispensing tube 5202 allows the rotational fluid coupling to be accomplished with two flexible supply conduits 5218 and 5220 joined to respective supply tubes 5210 and 5212 or associated fluid channels terminating at the bottom of the table top 23.

Slurry Supply

It is noted that the above slurry dispenser 5200 as well as slurry reservoir system 5100 and associated platen supply passage 554 of FIGS. 19, 20, and 21 allow different slurries to be supplied to the three polishing systems 50*a*, 50*b*, and 50*c*. Also, the drain 532 of FIG. 19 below the platen 52 collects most of the excess slurry for that polishing station and can be isolated from corresponding drains at the other polishing stations. Hence, different slurries can be used at the different polishing stations but their drains can be substantially isolated. The isolation alleviates disposal problems and permits recycling of slurry even in a complex process.

The polishing system 10 of the invention is intended for a variety of polishing processes that can be selected by the user and even changed with a minimum of mechanical reconfiguration. Hence, the slurry delivery system should be both general and flexible and provide for cleaning functions for the lines which tend to clog with dried slurry. An example of such a slurry delivery module 5230 is schematically illustrated in FIG. 25. The figure illustrates a supply unit 5232 for all three polishing stations 50*a*, 50*b*, and 50*c* and one of three flow control units 5234 for respective ones of them. The plumbing connections adjacent to the platen 52 are not illustrated and may be easily replumbed between the slurry feed assembly 5120 illustrated in FIG. 20 for the slurry reservoir system 5100 and the two flexible conduits 5218 and 5220 of the overhead slurry dispenser 5200 of FIG. 22.

The supply unit 5232 includes a bulkhead unit 5236 containing many pneumatic on-off valves and connecting piping. It also includes three supply sources 5238*a*, 5238*b*, and 5238*c*, each of which includes a supply tank 5240, a supply tube 5242 and associated pump 5244, and a return tube 5246 to provide a recirculating source of slurry or liquid. Associated level monitors and fresh supply tubes are not illustrated but are well known in the art. It is anticipated that two supply source 5238*a* and 5238*b* will be typically used for two different slurries while the third supply source 5238*c* will be used for a non-slurry liquid chemical, such as ammonium hydroxide. Of course, a greater or lesser number of supply sources 5238 may be used depending on the polishing requirements and the necessity to economize.

The bulkhead unit 5236 contain an on-off valve 5248 for each supply line 5242 and a flow check valve 5250 for each return line 5246. Although the illustrated bulkhead unit 5236 uses only one supply valve 5248 for all three polishing stations so that the same liquids flow to all three stations, additional valving would allow independent and separate supplies. The bulkhead unit 5236 also receives nitrogen and deionized water (DIW) through on-off valves 5252 and 5254, both of which connect to a purge line 5256 which is gated to any of the supply sources 5238*a*, 5238*b*, or 5238*c* through respective on-off valves 5258. The nitrogen or DIW is used to purge and clear various lines as required. The purge connections are not illustrated. For clearing clogged lines, the purge connections can be manually made since the supply sources 5238*a*, 5238*b*, and 5238*c* are located in an accessible area.

FIG. 25 shows only two supply units 5238*a* and 5238*c* connected to the flow control unit 5230 of the one illustrated polishing station 50*a*, 50*b*, or 50*c* although the remaining supply unit 5238*b* could be connected to one of the other polishing stations. Each flow control unit 5230 includes two metering units 5260*a* and 5260*b*, each of which contains a diverter valve 5262*a* or 5262*b* connected to different recirculating paths from the supply units 5238*a* and 5238*c*. A diverter valve selectively connects a third port to a flow path between its first two ports, which are in the recirculating path. The valved output of the diverter valve 5262*a* or 5262*b* is routed through a bulk flow controller 5264 which will deliver a liquid flow rate to the associated slurry port at the platen 52 that is proportional to an analog control signal SET input to the bulk flow controller. It is anticipated that flow rates in the range of 50 to 500 ml/min will be typically required, but the range may shift down to 13 ml/min and up to 2000 ml/min depending on polishing process that is implemented. Preferably, the delivered flow rate is measured and returned on a monitoring line MON. Although fluid equivalents to mass flow controllers could be used for the bulk flow controller 5264, the required high levels of reliability with corrosive pump fluids have initially required use of a metering pump, such as a peristaltic pump which does not directly provide the monitoring function.

A line carrying deionized water is led through both metering units 5260*a* and 5260*b*, and respective diverter valves 5266 direct DIW through the respective bulk flow controllers 5264. The DIW is used to flush the lines and clean the polishing pad, but it may also be used in the polishing process, for example a polishing station dedicated to buffing. Alternatively, a dedicated DIW line 5268 and associated on-off valve 5270 may be connected to one of the slurry ports at the platen 52.

Pad Peeling

The polishing pad 54 on the surface of the platen 52 wears out over time and has to be periodically replaced. One of the difficulties in replacing a worn polishing pad is that strong pressure-sensitive adhesive is used to attach the pad to the platen and the two remain strongly bonded together over periods of use. In the past, to remove the polishing pad it was necessary to use a large force to pull the polishing pad away from the top of the platen to overcome the adhesive seal between the pad and platen. This large force requires significant operator involvement and time.

An embodiment of the invention for automatically peeling the pad 54 from the platen 52 is illustrated in the cross section of FIG. 19. It includes the option of injecting high pressure air or fluid through a blow port 560 opening at the top of the platen top 510 near its center but offset therefrom because the slurry port 554 is at the center. The pressure tends to create a bubble between the pad 54 and platen 52 which gradually expands and thus gently peels the pad 54.

The blow port is connected to four vertical passages 561, 562, 564, and 565 formed in the platen 510, the platen base 512, the platen hub 552, and the reservoir hub 550 and is also connected thereafter to an angled passage 566 in the solid motor sheave 544. These passages are joined to each other by O-rings placed in recesses 568, 570, 571, and 572. The angled passage 566 connects to a tapped hole 574, into which can be threaded the fixed end of a quick-release fitting 576 of a high-pressure air line 578. During the polishing operation, the fixed end of the quick-release fitting is fixed on the platen assembly 500 and is rotating with the platen 52. When the platen 52 is stopped, the detachable end of the quick-release fitting connected to the high-pressure hose 578 is freely connectable to the fixed end of the quick-release fitting to connect passages to the blow port 560.

In use, when it has been determined that the polishing pad 54 needs to be replaced because is surface has been degraded, the platen 52 is stopped, and the operator or an automatic mechanism connects the two parts of the quick-release fitting to thereby connect the high-pressure air supply hose 578 to the blow port 560. The air pressure so applied while the platen is stationary injects air beneath the polishing pad 54 in the area of the blow port 560 at the top of the platen 52 and tends to create a bubble there, which gradually increases and has the effect of peeling the pad 54 from the platen 52. The bubbling effects reduces, if not eliminates, the force necessary to peel the polishing pad 54 from the platen 52. The opening 554 for the slurry located in the center of the platen 52 will be generally so small that the air released through it will be negligible or it can be temporarily plugged by the user placing his finger over the opening or otherwise providing some sort of temporary seal. Of course, the quick-release fitting is disconnected after the pad has been removed and before the platen again is rotated. The removal and replacement of the polishing pad is therefore accomplished more easily than has been done in previously known configurations.

Although it would be possible to completely automate the peeling process through a rotary coupling connecting the high-pressure air line 578 to the blow port 560, the relatively infrequent need to change pads reduces the desirability of the added complexity. High-pressure liquid rather than gas could alternatively be used for the peeling operation.

Intermediate Washing Stations

In the preferred operation of the invention, the wafers are sequentially polished at two or all three of the polishing stations 50a, 50b, and 50c shown in the top view of FIG. 18. One polishing method is a multi-step polishing process in which, for example, a rough polish is followed by two successively finer polishes. One method of achieving increasingly fine polishing is to use at the different polishing stations 50 slurries having different characteristics or particle sizes. In this situation, it is important to avoid cross contamination of slurry between different platens; that is, to assure that the slurry, both particles and polishing liquid, of one polishing station is completely removed from a wafer before it is moved to the next polishing station. When wafers are transferred between polishing stations 50, much of the slurry used in the prior polishing step that is initially attached to the wafer as it is lifted from the pad drips from the wafer to the pad 54 and associated platen 52, as shown in FIG. 19, from whence much of it drips into the drainage basin defined by the fences 526 surrounding the platens 52. However, sonic slurry remains attached to the wafer unless special precautions are taken, and this adhered slurry can contaminate the next polishing station, especially the subsequent polishing pad 54, in a degree that increases with time.

Therefore, in some highly sensitive processes, it is desirable to include the intermediate washing 80a and 80b, as shown generally in FIG. 18, that are located between the platens 52 of neighboring polishing stations 50a, 50b and 50b, 50c. These intermediate polishing stations wash wafers passing between the neighboring polishing stations and dispose of the cleaned slurry so as not to contaminate the next polishing station. It is also desirable to additionally include another intermediate washing station 80c between the last polishing station 50c and the transfer station 70. As will become evident in some later discussions, the intermediate washing stations 80 can be used for a light buffing of the wafers and well as removing slurry and loose material. Furthermore, a preliminary intermediate washing station 80aa can be included between the transfer station 70 and the first polishing station 50a. This replication of intermediate washing stations has little impact on wafer throughput because they can all simultaneously be washing or buffing respective wafers.

The intermediate washing stations 80 could be retractable or even horizontally movable. However, in a configuration according to the invention, they are stationary with an upper surface slightly above the level of the polishing surface of the polishing pad 54 so that, when the wafer head 100 raises the wafer from the platen 52, moves it over the washing station 80, and lowers it onto the washing station 80, the wafer 40 comes into contact with the washing station 80 at a position above that of the neighboring platen 52. The gap is essential because the wafer on the washing station 80 will also overlie the two neighboring platens 52. The intermediate washing station 80 in general, provides a scaled opening below the surface of the wafer head 110. It usually includes a wash chamber which can be sealed by placing the wash wafer head on a lip of the chamber.

In a configuration according to an embodiment of an intermediate washing station 800 of the invention shown in the three perpendicularly arranged cross-sectional views of FIGS. 26A and 26F and plan view of FIG. 26G, a wash chamber 810 has an elongate upper opening 812 having the shape of a relatively narrow elongated slot located between adjacent platens 52. As shown in FIG. 26G, two sides 814 of the opening 812 have lengths sufficient to generally reach across the wafer 40 when the center of the opening 812 is aligned with the center of the wafer 40, and the other two sides 816 have arcuate shapes corresponding to the circumference of the wafer 40.

The intermediate wash station 80 is formed by a spray pipe 820 extending along the elongate opening 812 and having a number of vertically oriented nozzle openings 822. The ends of the spray pipe 820 are sealed by plugs 824, and the spray pipe 820 is fixed to a support member 826 having an upper end generally defining the opening 812 of the wash chamber 810. A tapered elastic seal 828 is placed inside the support member 826 to define the lateral sides of the washing chamber 810. The seal 828 has an upper end conforming to the shape of the opening 812 of the wash chamber 810 and protruding slightly above the top of the support member 828. Its lower end is supported on the spray pipe 820 so as to leave exposed the nozzle openings 822 and the drain opening to be shortly described. Preferably, the elastic seal 828 is formed of a foamy or fibrous material that acts as a barrier to break a spray but that allows the flow of water and entrained slurry through it. Thereby, slurry does not become embedded in the seal 828, and accreted slurry cannot scratch the wafer 40. Exemplary seal materials include the material used for polishing pads.

As best shown in FIG. 26F, a supply pipe 830 is sealed to the bottom of the spray pipe 820 at a supply opening 832 in a lower side and longitudinal end of the spray pipe 820. A drain pipe 834 is sealed to the supply pipe 820 and passes from the bottom side to the top side thereof at a drain opening 836. When washing is desired, a washing liquid 840, such as deionized water, is supplied under pressure through the supply pipe 830 into the interior of the spray pipe 820. When sufficient washing liquid 840 has been supplied to fill the spray pipe 820, any further washing liquid is sprayed through the nozzles openings 822 in sprays to cover the portion of the wafer 40 overlying the elongate opening 812. Excess washing liquid and entrained slurry rinsed from the wafer 40 fall down to the bottom of the washing chamber 810 and drain out through the drain opening 836 for recycling or disposal.

The operation of the intermediate washing station will now be described. When a polishing step at a first polishing station, e.g., 50a illustrated in FIG. 26A, has been completed, the rotation of the wafer head 110 is stopped, the lower end of the wafer head 110 holding the wafer 40 is raised from the platen 52 and polishing pad 54 by a short distance of, for example, ¼ inch (6 mm), the slide 908 holding the wafer head 110 is placed at a radial position of the carousel 90 aligned with the intermediate washing station, e.g. 80a, and the carousel 90 is rotated to move the wafer head to a position at which, as shown in FIG. 26B, places the center of the wafer head 110 and its wafer 40 over the center of the intermediate washing station 80a. The lower end of the wafer head 110 is then lowered, as shown in FIG. 26C, to place the wafer into low-pressure contact with the elastic sealing member 828 of the intermediate washing station 80a so as to provide a water barrier therebetween but not to damage the wafer 40. The required pressure is comparable to or less than those used at the polishing stations 50. In FIGS. 26D and 26F, the washing liquid 840 is pressurized in sufficient amount to wash the portion of the wafer 40 exposed above the washing chamber 810, and the washed off slurry drains out through the drain pipe 838.

Preferably, the wafer 40 is washed continuously, as illustrated in FIGS. 26D and 26F, as the wafer head motor 1012 continuously rotates the wafer 40 past the elastic sealing member 828. Of Course, the material of the sealing member 828, the applied force, and the rotation speed must be chosen such that the wafer 40 is not gouged or scratched as it slides over the water-tight seal with the sealing member 828. A large number of revolutions during the washing will produce a buffing effect.

Alternatively, the wafer could be washed in discrete steps as it is lowered, washed, raised, and partially rotated to a new position so as to wash all portions of the wafer.

A combination of these methods can be used as long as wash water is not permitted a path to escape from the wash chamber 816 and directly spray the bottom of the multi-head carousel 90 since such spraying could cause the splash shield to be breached. The wafer head can be slowly spun so that at least ill of the surfaces are cleaned or are essentially squeegeed off by the seal between the washing station and bottom of the wafer head and the squeegeed liquid is drained away from the bottom of the chamber. The wafer head can then be raised and moved to its polishing location at the next platen. This ensures that at least all loose particles from one wafer head are removed.

Although the above description involves only a single wafer at a particular intermediate washing station 80, the carousel positions all the wafer heads 110 over respective washing stations such that washing stations are present at all those angular positions. Therefore, two, three, or even four wafers can be simultaneously washed according to the above process by multiple washing stations 80.

After completion of the washing of the complete wafer 40, the wafer head 110 raises the wafer 40 off the sealing member of the elastic sealing member 828 and, as shown in FIG. 26E, the carousel 90 rotates the wafer head 110 and attached wafer 40 to the next polishing station 50b.

A design for an alternative intermediate wash station 80' is illustrated in cross section in FIG. 27 and in plan view in FIG. 28. A wash housing 850 having an enclosed wash cavity 852 is fixed to the top of the table top 23. A linear wash aperture 854 is formed at the top of the wash housing 850 to a length substantially equal to the diameter of the wafer 40 and is generally aligned along the boundary between two polishing stations 50 and perpendicularly to the rotation direction of the carousel 90. However, it is noted that the intermediate washing stations 50 or 50' can advantageously be placed at corresponding positions before and after the polishing sequence for a total of four such intermediate washing stations in the three-pad system of FIG. 6A.

A contact pad 856 is glued with adhesive to the top of the wash housing 850 except above the wash aperture 854 to thereby allow the wafer head 110 to gently press a wafer 40 against the top of the washing station 80' without scratching the wafer 40 but still forming a fairly water-tight seal. Such a contact material needs to be soft and pliable and can be similar to the elastomeric sheet placed on the pedestal 72 of the transfer/wash station 70 or can be a fibrous or foamy pad similar to a fine polishing pad material. Alternatively, the contact material may be incorporated into a removable top which is easily connectable to the washing housing 850

A ridge nozzle mount 860 is fixed to the table top 23 and rises within the wash cavity 852 of the wash housing 850. A ridge peak 862 at its top is positioned just below the wash aperture 854 and includes several vertically directed nozzle holes 864 having diameters, for example, of 0.025" (0.64 mm). The nozzle holes 864 are connected to a longitudinally extending supply passage 866 connected to a centrally located vertical supply passage 868, which is sealed by an O-ring recess 870 to a vertical passage 872 in the table top 23 having a tapped hole 876 at its bottom to which can be coupled a selectively applied supply of wash liquid. A number of horizontally extending scuppers 878 extend through the bottom of the wash housing 850 at its juncture with the table top 23 so that wash liquid falling to the bottom of the wash cavity 852 can flow outwardly to the top of the table top 23, which includes several drains for excess slurry and other polishing liquids.

The top of the contact pad 856 above the wash housing 850 is slightly above the top of the platen 52 of the polishing stations 50. After a wafer 40 has been polished at one polishing station 50, the wafer head 110 lifts the wafer 40 from the platen and brings it above the intermediate washing station 80' and lowers it thereagainst. The nozzles 864 eject wash liquid towards the wafer 40, the debris laden liquid falls within the cavity 852 to be drained through the scuppers 878.

The wafer 40 can be polished either by the stepwise washing described previously or by slowly and continuously rotating the water head 110 and attached wafer 40 in loose contact with the contact pad 856. If the porosity of the elastomeric seal 856 is properly chosen, the wafer 40 is squeegeed as it passes over the intermediate washing station 80'.

In the prior art, a separate polishing station was required to buff the wafer 40 at the end of polishing, that is, to very lightly polish the wafer so as to remove any dust and debris. The buffing was done on a buffing pad similar to a polishing pad. The operation of the intermediate polishing station, especially one at the end of the polishing sequence, performs very similar functions to those of buffing. As a result, the inclusion of intermediate polishing stations frees the third polishing station for actual polishing, thus substantially increasing the throughput of the system.

Furthermore, one or more of the intermediate washing stations 80 or 80' can be considered to be a separate polishing station. Therefore, one or more washing stations 80 or 80' can be angularly arranged relative to the polishing stations 50 so that the wafer heads 100 simultaneously overhang both the washing station 80 or 80' and the polishing stations 50. As a result, the washing or buffing at the washing station can be performed simultaneously with the polishing at the polishing stations, thereby increasing the throughput of the polishing apparatus.

Pad Conditioner

The polishing pad, prior to its needing to be completely replaced, needs to be occasionally (or regularly) conditioned to prevent its surface from becoming glazed. In the embodiment described herein, the pad conditioner is a rotating disk having a rough surface that is continuously brought into contact with the rotating polishing pad during conditioning and is swept back and forth across the pad 54 from its perimeter to the center. Other types of conditioners are possible. The conditioning member can be planar but noncircular, it can be a cylindrical member having, a circumferential surface contactable with the pad, or it may be one or more styli, among other possibilities. The surface of a conditioner can be abrasive, be toothed, or have sharp aperture edges, among other possibilities. The surface of the conditioning member can move relative to the pad, the conditioner member can roll over the pad and primarily emboss its surface pattern in the pad, the conditioning member can be dragged as a stationary body across the pad, or it can be rotated in different planes relative to the pad, among other possibilities. All such conditioning members are included within the concept of a conditioning head positionable over and movable relative to the polishing pad.

In overview, as shown in the cross section of FIG. 29, the pad conditioner 60 includes a conditioner head 64 suspended on the distal end of an arm 62. The proximal end of the arm 62 is supported by a support assembly 65 which can rotate the entire arm 62 in the plane of the wafer so as to place the conditioning head 64 in place for pad conditioning and to sweep it over the pad 54, can slightly elevate the conditioner head 64 by about 1¼" (32 mm) to put the conditioner head 64 in selective contact with the pad 54, and rotates the conditioning head 64 through a belt drive.

Conditioner Head

The conditioner head 64 holds within a recess 610 on its bottom face a toothed or otherwise very abrasive surface conditioning disk 612 or other generally cylindrical member. Its downwardly facing surface 614 is rough enough that, when engaged with a glazed polishing pad 54 and moving relative thereto, it can deglaze the pad 54 by scouring its surface.

The conditioner head 64 is illustrated in more detail in the cross section of FIG. 31. The conditioning disk 612 includes a central, lower aperture 616 at the center and bottom of which is located at the effective rotational center 618 of rotation of the conditioning disk 612. The effective rotational center 618 is the point around which, when the compression and varying lateral consistency of the pad 54 and conditioner surface 614 are taken into account, provides a point about which the torque can be minimized because the rotational frictional engagement between the conditioning surface and the polishing pad produces no net torque relative to that point in the vertical direction.

As additionally illustrated in the perspective view of FIG. 30, the conditioning disk 612 is held in the recess 610 at the bottom of a conditioner head face plate 620 by a flexible holding pad 621 placed into the recess 610 and having a sticky face that adheres to the face plate 620 and a lower magnetic face. The conditioning disk 612 is fit into the recess 610 adjacent to the holding pad 621. The conditioning disk 612 is made of a magnetic material that is held to the magnetic side of the holding pad 621, and its other side is impregnated with diamonds for scraping the polishing pad 54 against the edges of a triangular array of circular holes 615 penetrating the conditioning disk 612. The holes have diameters of about ⅛" (3 mm). Such a conditioning disk 612 is available from TBW Industries of Furlong, Penn. as a grid-abrade model. A gate 619*a* is formed in a wall 619 of the recess 610 to allow the conditioning disk 612 to be pried from the recess 610.

It is understood that the perforated conditioning disk 612 of FIG. 30 is illustrative only and other conditioning members are included within the invention.

Gimbal Drive

As illustrated in FIG. 31, a novel gimballing structure connects the conditioner head face plate 620 and attached conditioning disk 614 to the conditioner arm 64. Any gimballing structure allows rotational movement to be imparted to a disk-like structure while the drive axis is tilted relative at angle which is not necessarily perpendicular to the disk. However, as illustrated in FIG. 32, a conventional gimballing structure 621 has a gimbal rotational center 622 (it is assumed that the two horizontal axes of rotation in the gimbal structure intersect) about which a drive axis 624 and a normal axis 626 can deviate by an angle $\alpha_{gimbal}$. The conventional gimbal rotational center 622 is located above the horizontal torque center 627 at the interface between the conditioning disk 612 and the polishing pad 54. The offset from the horizontal torque center 627 means that a finite vertical torque 628 is created as the conditioning disk 614 is swept over the pad 54 and experiences net horizontal linear frictional force offset from the gimbal center rotational center 622. The net vertical torque 628 may be demonstrated in that the shaft rotating the conditioning disk 612 and linearly translating it along the surface exerts a resultant force R in the horizontal plane that passes through the gimbal rotational center 622 while the net linear frictional force F that the pad 54 exerts against the translating conditioning disk 612 lies at the interface between the conditioning disk 612 and the pad 54. That is, even though the two forces are equal though opposite, the two forces are separated by a moment arm which creates the finite vertical torque 628. The vertical torque 628 causes a leading edge 630 of the conditioning disk 612 to have a greater vertical pressure against the conditioning pad 54 to be deglazed than the vertical pressure applied against a trailing edge 632 of the conditioning disk 612.

The vertical torque 628 causes the polishing process to abrade the leading edge 630 more than the trailing edge 632. This torque which causes differential loading and polishing is increased when the conditioner head is swept in the direction having the larger downward pressure so that the sweep force is partially converted to a downward force on the leading edge.

This problem of differential polishing is reduced or nearly eliminated in the geometry of the head according of FIG. 33 in which the horizontal torque center 627 is coincident with the gimbal rotational center 622 at a common center 636. Both the resultant force R' from dragging the conditioning disk 612 across the pad 54 and the frictional force between the conditioning disk 612 and the pad 54 lie within the same plane at the interface between the conditioning disk 612 and the pad 54. The rotational torque 628 resultant from sweeping over a frictional surface is reduced to zero because the torque center 628 lies within the plane resisting that torque, that is, the resultant force R' and frictional force F' lie within the same plane with no moment arm between them. As a result, the differential loading caused by an offset gimballing center 622 is significantly reduced.

Referring to the perspective view of FIG. 34, the oscillation of the conditioner arm 62, that is, its sweep across the polishing pad 54 from its center to its perimeter, is performed by rotation of the conditioner support shaft housing 1630 being rotated by a harmonic drive 1668 coupled to an arm sweep drive motor 1670. This structure will be described more fully later, The conditioner arm 62 is turned by the conditioner sweep drive motor 1670 through the set of stub shafts 1642 bolted to the drive housing 1630 discussed above.

Referring back to the schematic of FIG. 33 of the novel gimballing structure, as the conditioner disk 612 is forced along the surface of the glazed pad 54, a frictional force F' is developed. However, because of the centrally placed common center 636, the motive force R' is equal, opposite, parallel, and in line. As a result, there is no net torque on the conditioner head.

This effect can be achieved by a ball-and-socket joint 640 in which the spherical center of symmetry lies on the interface between the conditioning disk 612 and the polishing pad 54. Additional means prevent the socket part 642 from rotating within the horizontal plane with respect to the ball part 644. By placing the center of the ball-and-socket connection through which force is transmitted at the surface of the polishing pad 54 in direct opposition to the frictional force, this configuration eliminates any tendency of the head to rotate and create a greater pressure on one side of the conditioning head than on the others, as happens in the prior art.

A particular design according to the invention, as shown in the cross-sectional view of FIG. 31, attaches the backside of the conditioning disk 612 including the abrasive conditioning head surface 614 to a cylindrical lower ball joint part, having attached thereto in its lower, inner corner a bearing element 652 having a convex annular segmented surface 654 having a center of curvature at the common center 618. This part creates a ball of a ball-and-socket joint.

In opposition to the just described ball part, a socket part includes a conditioner head shaft 656 having a concave annular segmented surface 658 in opposition to the convex surface 654 and having a center of curvature at the common center 618. A ball-bearing cage 660 captures several bearing balls 662 rolling between the convex surface 654 of the bearing element 652 and the concave surface 658 of the conditioner head shaft 656. The bearing balls 662 allow the conditioner head shaft 656 to nutate (within the two vertical planes) with respect to the conditioner head face plate 620 and thus the pad 54. However, a very soft O-ring 664 (preferentially durometer 40) is captured in an annular, inwardly facing recess 666 of the bearing element 654 and faces an outwardly facing wall 668 of the conditioner head shaft 656. The compressibility of the O-ring 664 within the confining recess 666 limits the nutation of the conditioner head shaft 656 with respect to the bearing element 654 to a few degrees, more than enough for the operation of the conditioner head 64. The non-infinite compressibility, in fact, violates the assumption of no vertical torque in the gimballing structure. The nutation allows the conditioning disk 612 to move within a small range of polar angles to allow for any slight variations in the surface of the polishing pad 54 without providing greater pressure on one side of the conditioner head facing plate 620 than on the other.

A necked nut 670 is threaded onto an upper rim 672 of the conditioner head bearing element 620, and its upper neck 672 captures but only loosely surrounds an outer flange 674 of the conditioner head shaft 656, and its possible engagement presents an ultimate limit to the nutation of the conditioner head shaft 656 with respect to the bearing element 656. A shoulder bolt 676 is threaded into the bottom center of the conditioner head shaft 656. Its downwardly facing head 678 is captured on the upward side by an inwardly facing lip 680 of the bearing element 650. The selective engagement of the head 678 of the shoulder bolt 676 and the lip 680 of the bearing element 650 prevents the conditioner head bearing element 620 from falling from the conditioner head shaft 656 when the conditioner head 64 is lifted from the polishing pad 54.

The ball bearings 662 would ordinarily allow the free azimuthal rotation of the bearing element 652 and attached conditioning disk 612 with respect to the conditioner head shaft 656. However, a number of peripheral drive pins 682 (only one of which is shown in FIG. 31) are loosely captured in paired drive pin holes 685 and 686 in the conditioner head bearing element 620 and the conditioner head drive shaft 656 to prevent any substantial azimuthal motion therebetween. That is, the drive pin holes 686 in the conditioner head shaft 656 do not tightly capture the drive pins 682 in a polar direction so as to allow the limited nutation of the conditioner head shaft 656 with respect to the conditioner head bearing element 620, but they capture the drive pins 682 laterally to prevent substantial relative azimuthal rotation.

The gimballing of the conditioner head allows planar rotational drive for the conditioning disk of the conditioner head but allows the conditioner head to tilt somewhat from the normal to the polishing pad being conditioned. The gimbal drive, because of its low center of rotation, prevents differential conditioning of the substrate therebeneath.

The outer races of two annular bearings 688 are spaced by an outer annular spacer 690 and held by a top outer collar 692 screwed to a bottom outer collar 694 with a biasing annular spring 696 between the lower annular bearing 688 and the bottom outer collar 694. The top outer collar 692 includes a lower, outer skirt 693, which presents a labyrinthine path for slurry and other contaminants from reaching the bearings 688 supporting the conditioner head shaft 656.

This assembly is suspended by screws 1602 countersunk into a generally U-shaped arm body 1604 and tapped into a lower flange 1608 of the upper collar 692.

In assembly, the lower part of the conditioner head is raised into the center of the annular bearings 688 with the inner race of the lower annular bearing 688 resting on a ledge 1610 of the conditioner head shaft 656. An inner spacer 1612 separates the inner races of the two annular bearings 688. The inner race of the upper annular bearing 688 is captured by a cornice 1614 of a toothed sheave 1616. A bolt 1618 presses the sheave 1616 as it is threaded into the conditioner head shaft 656 and holds the inner races of the annular bearings 688.

Conditioner Arm and Support

Referring to the full cross section of FIG. 29, the enlarged cross section of FIG. 35 and the partial perspective of FIG. 34, the conditioner arm 62 supports and raises the conditioner head 64, sweeps it across the pad 54 being conditioned, and encloses the belt assembly powering the conditioner head 64.

The arm body 1604 includes a distal end wall 1618 and a channel cover 1620 screwed into the arm body 1604 to form a housing 1622 enclosing the drive belt assembly and protecting it from contamination by the slurry. The drive belt assembly includes a toothed drive belt 1624 wrapped around the toothed head sheave 1616 attached to the conditioner head 64 and also around a toothed drive sheave 1626 in the arm support 65. A toothed drive belt 1624 is required because of the varying torque required of the drive belt 1624 as the conditioner head 64 conditions different surfaces.

As shown in FIGS. 34 and 35, the rotatable support housing 1630 rotatably supports a proximal end 1632 of the arm body 1604 about a horizontal nutation axis 1634. The vertically extending support housing 1630 includes two flats 1636 in which are tapped four respective retaining holes 1638. When the flats 1636 of the support housing 1630 are located within the channel 1622 of the arm body 1604, two shaft bases 1640 having respective stub shafts 1642 are attached onto the flats 1636 by screws held in holes 1644 countersunk in the flanges of the shaft bases, and the screws are threaded into the retaining holes 1638 in the support housing 1630. The outwardly extending stub shafts 1642 are rotatably supported by the inner races of spherical bearings 1646 so as to be self-aligning and to accommodate misalignment between the stub shafts 1642. The outer races of these bearings 1646 are attached to bearing cover plates 1648, which are fixed to vertical skirts 1650 of the arm body 1604 by screws passing through bore holes 1652 in flanges of the bearing cover plates 1648 and threaded into tapped holes 1654 in the arm skirts 1650 to thereby establish the horizontal nutation axis 1634.

Thereby, the proximal end 1632 of the conditioner arm body 1604 is pivotably supported about the horizontal nutation axis 1634, and the conditioner arm body 1604 is also rotatable in the horizontal plane by the rotation of the support housing 1630.

The rotation of the conditioning arm 62 about the horizontal nutation axis 1634 is effected by an hydraulic ram 1656 connected to a pin caught in two horizontally holes 1658 of a yoke 1660 extending from the back of the arm body 1604 and also connected to a pivot support plate 1662 that is attached to and rotates with the shaft housing 1630. Extension or retraction of the hydraulic ram 1656 either presses the conditioner arm 62 and the attached conditioner head 64 toward the polishing pad 54 with a specified pressure as controlled by the pressure provided to the hydraulic ram 1656 or alternatively raises the conditioner arm 62 and head 64 away from the polishing pad 54 for storage or maintenance.

As illustrated in FIGS. 34 and 35, the drive sheave 1626 for the belt 1624 is fixed to an upper end of a drive shaft 1664 at a point above the horizontal nutation axis 1634. The drive shaft 1664 passes vertically within the shaft housing 1630. At its upper end, it is connected to the pivot support plate 1662 and a skirt 1663 protecting the bearings. Its lower end holds a gear 1665 which is coupled to a gear 1667 on the output shaft of a conditioner head motor 1666 to provide the motive power for the rotation of the conditioning disk 612. The conditioner head motor 1666 is mounted on a motor bracket 1676 fixed to the table top 23.

As a result of the geometry, the actuator 1656 does not cause the drive sheave 1626 to pivot with the conditioner arm body 1604; however, the head sheave 1616 does pivot with the conditioner arm body 1604. Therefore, because of the offset between drive sheave 1626 and the nutation axis 1634, the tension in the drive belt 1624 mounted between the drive sheave 1626 and the head sheave 1616 is reduced as the conditioner arm 62 is raised and is increased as the conditioner arm 62 is lowered. (The variations of tension with tilt angle would be opposite if the drive sheave 1626 were located below the nutation axis 1634.) The arrangement of the drive sheave 1626 offset above (albeit slightly) the center 1634 of vertical pivoting, also has an effect on the tension in the drive belt 1624. As the arm 62 pivots downward toward the polishing pad 54, the tension in the belt 1624 increases, and, as the arm 62 pivots away from the polishing pad 54, the tension in the belt 1624 decreases. This increase and decrease in belt tension will combine with the force from the hydraulic ram 1656 to affect the pressure of the conditioner head 64 on the polishing pad 54. The increase of tension of the belt 1624 will oppose the force generated by the hydraulic ram 1656 tending to press the conditioning head 64 toward the polishing pad 54. An increase in tension will tend to lift the arm 62, while a decrease in tension will tend to let the arm 62 press with greater force toward to the underlying polishing pad 54.

In this arrangement, a constant coefficient of friction between the conditioner head 64 and the polishing pad 54 will provide a certain nominal tension in the drive belt 1624, which together with the force from the hydraulic ram 1656 provides a certain nominal pressure between the conditioner head 64 and the polishing pad 54 regardless of small variation in the height of the interface between the conditioner head 64 and the polishing pad 54. If the friction between the conditioner head 64 and the polishing pad 54 increases, as in those instances when a rough polishing pad surface is encountered (which requires no additional roughening/conditioning as the surface is already rough), the increase in the coefficient of friction will cause an increase in the force needed to continue to rotate the conditioning head 64 at a constant speed. The increase of force will cause the tension in the conditioner drive belt 1624 to increase, thus tending to raise the conditioner head 64 off the polishing pad 54 to thereby reduce the pressure and thus abrasion of the conditioner head 64 on the polishing pad 54. Conversely, when the conditioner head 64 encounters an area having a low coefficient of friction, such as a glazed area on the surface of the polishing pad, resistance to rotation of the conditioner head 64 will diminish, thereby diminishing the tension in the conditioner head drive belt 1624. The reduction of tension will reduce the force of the drive belt 1624, thereby tending to lower the conditioner arm 62 and thereby causing the conditioner head force on the polishing pad to increase, to bite more into the polishing pad, and to thus provide additional conditioning at these location of glazing or low coefficient of friction.

The drive sweep motor 1670, shown in FIGS. 29 and 35 sweeps the conditioner arm 62 in an oscillatory path across the polishing pad 54 between its center and its perimeter. The drive sweep motor 1670 is mounted to the motor bracket 1676 at the bottom of the table top 23. A gear 1672 on its output shaft is coupled to a rim drive gear 1674 of the harmonic drive 1668, which multiplies the transmitted torque. An exemplary harmonic drive for the pad conditioner 60 is available from Harmonic Drive Technologies, Teijin Seiki Boston, Inc. of Peabody, Mass. in unit size 25. The belt drive shaft 1664 passes along the central axes of the harmonic drive 1668 and the rim gear 1674. The high-speed, low-torque side of the harmonic drive 1668 is fixed to the motor bracket 1676, and the low-speed, high-torque side is fixed to the shaft housing 1630.

The conditioner arm 62 is horizontally turned through the set of stub shafts 1642, bolted between the arm body 1604 and the shaft housing 1630, as discussed above. A conditioner head motor 1666 is connected to the drive shaft 1664 through a set of gears in a gear housing 1672 fixed to the table top 23. The drive shaft rotates the drive belt 1624, the conditioner head 64, and hence the conditioning disk 612.

The pad conditioner 60 of FIGS. 29 through 35 can be used in a number of different modes, all controllable and selectable by the software incorporated into the controller computer for the polishing system.

The polishing pad 54 can be conditioned while polishing is interrupted at that pad. The wafer head 110 is withdrawn to its radially innermost position, its bottommost portion is raised so as to separate any wafer held in the wafer head 110 above the pad surface, and the platen 52 rotates as the conditioner arm 62 sweeps the rotating conditioner head 64 in contact with and across the rotating pad 54 from its periphery to its center.

Alternatively, the polishing pad 54 can be conditioned while polishing continues at that pad, that is, in real time. The sweep of the conditioning head 64 generally extends across the outer portions of the pad 54 (as viewed from the center of the table top 23) while the wafer head 110 and its wafer 40 are swept across the inner portions. Nonetheless, the two sweeps may need to be synchronized to avoid collision. Synchronization is obviously required for real-time pad conditioning performed concurrently with over-center polishing since the wafer head 110 passes over and past the pad center 54*a* and this portion of the pad 54 requires conditioning.

Conditioner Head Cleaning Cup

The conditioning disk 614 of the conditioner head 64, as it sweeps across the polishing pad 54, tends to become covered with slurry on its abrasive face and outer surfaces adjacent to the polishing pad 54. While the conditioner head 64 is operating on the wet surface of the polishing pad 54, a slurry which is present on the surfaces of the conditioner head 64, does not have time to dry and is easily replenished by new wet slurry particles as the conditioning process continues. However, during times of inactivity, for example, when the conditioning head is stored during polishing but most particularly when the entire apparatus is not operating for a variety of reasons such as maintenance, the conditioner head will tend to dry out and the slurry that is coated onto the conditioner head tends to form a rock-hard cake or cause the sodium hydroxide in the slurry to crystallize on one of the surfaces of the conditioner head. It is then difficult to remove the caked-on slurry or cause the crystallized sodium hydroxide to return to a solution.

To obviate this problem, as shown in the general plan view of the table top 23 in FIG. 18, a cleaning cup assembly 68 is associated with each polishing station 50*a*, 50*b*, and 50*c* to store the inactive conditioner head 64 in an aqueous environment.

As illustrated schematically in cross section in FIG. 36A, each cleaning cup assembly 68 includes a cleaning cup 2610 that is mounted to a shaft of a motor 2612 which can rotate the cleaning cup 2610 to an inactive position at which the conditioner arm 62 lowers the conditioner head 64 into the cleaning cup 2610 when the conditioner head 64 is to be stored. A more complete illustration of the structure including the fluid lines is shown in FIG. 37. The inactive position is illustrated in the plan view of FIG. 18 for the polishing station 50*c*.

As illustrated in FIG. 36B, when the conditioner head 64 is to be returned to operation to condition the polishing pad 54, the conditioner arm 62 lifts the conditioner head 64 out of the cleaning cup 2610. Then, as illustrated in FIG. 36C, the motor 2612 rotates the cleaning cup 2610 to inactive position, also illustrated in plan view in FIG. 18 for polishing stations 50*a* and 50*b*. Returning to FIG. 36C, the conditioner arm 62 then lowers the conditioner head 64 onto the polishing pad 54 mounted on the platen 52. When the conditioning operation is completed, the conditioner head 64 is raised and the washing cup 2610 is swung back to the position of FIG. 36B, at which position the conditioner head 64 is lowered back into the cleaning cup 2610, as in FIG. 36A, for storage so that the slurry and sodium hydroxide attached to the conditioner head 62 remain in solution or are diluted and removed.

The washing cup assembly 68 is illustrated in cross section in FIG. 37, and the washing cup 2610 is illustrated in plan view in FIG. 38. The washing cup 2610 includes a central basin 2614 defined by a nearly circular weir 2616 of sufficient size and depth to receive the bottom part of the conditioning head 64. The weir 2616 is shaped to provide a longitudinal slip 2618 having at its outside end an aperture to a vertically extending wash supply line 2620 having a diameter of ⅛" (3.2 mm). Water or another cleaning solution is circulated through the cup 2610 from the wash supply line 2620. It is possible that, as the conditioning head 64 is lowered into the basin 2614 of the washing cup 2610, the conditioning head 64 would splash the wash solution contained therein. Therefore, it is recommended that, prior to lowering of the conditioning head 64 into the washing cup 2610, the basin 2614 be drained through the vertical supply passage 2620, which can be accomplished by plumbing and three-way valves connected to the supply line 2632.

A perimeter drain 2622 is formed between the outside of the weir 2616 and a slightly higher, surrounding dam 2624. Both ends of the perimeter drain 2622 extend outwardly parallel to the slip 2618 to two drain holes 2625 joined to a common vertically extending drain passage 2626 having a diameter of ¼" (6.4 mm). Whatever fluid overflows the basin 2614 is captured in the perimeter drain 2622 and is drained away through the drain passage 2626.

The washing cup 2610 is mounted on its support side to a rotatable shaft 2628, also formed with the vertical supply and drain passages 2620 and 2626, and the passages 2620 and 2628 between the shaft 2628 and the washing cup 2610 are sealed by unillustrated seals in recess. The shaft 2628 is mounted through the table top 23 by a support bearing 2630. Since the rotation of the washing cup 2610 is relatively limited, flexible supply and drain lines 2632 and 2634 can be directly connected to the respective passages 2620 and 2626 in the shaft 2628 through connections 2636 and 2638. The washing liquid drained through drain line 2634 can either be disposed of or recycled through the supply line 2632. To prevent splashing, it is preferred that the central basin 2614 be drained while the washing cup 2610 is being moved and when the conditioner head 64 is lowered into the washing cup 2610. The central basin 2614 can be drained through the wash supply line 2620 and the flexible supply line 2632 with a three-way valve being connected on the flexible supply line 2632 to change between the wash fluid source and the drain. The motor 2612 is fixed to the bottom of the table top 23 with a bracket 2640 and is geared to a side of the shaft 2628 through unillustrated gearing.

Because of the greater height of the outside dam 2624, as shown in FIG. 37, there is usually no loss of fluid from the cleaning cup assembly, and fresh cleaning solution is supplied or circulated as required to keep the cleaning solution fresh so that the conditioner head 64 can be stored indefinitely without slurry or chemical crystal caking and creating a problem on the surface of the conditioner head.

FIGS. 39A, 39B, and 39C show the relative motions of the conditioner arm 62, the wafer head 64, and the polishing platen 52 with respect to the cleaning cup assembly 68. FIGS. 39A, 39B, and 39C correlate to the positions of the conditioning arm 62 in FIGS. 36A, 36B, and 36C. In this embodiment of the use of the invention, the conditioner head 64 sweeps across the polishing platen 52 in a coordinated motion with the wafer head 110 during the simultaneous polishing and conditioning operation. The coordination is required to avoid interference with the wafer head 110 as it radially oscillates in the slot 910 of the carousel support plate 90.

In the plan view of FIG. 39A, the wafer head 110 is generally centered on the polishing pad 54 with the conditioner arm 62 located in its storage position with the conditioner head cleaning cup assembly 68 surrounding the conditioner head 64.

In FIG. 39B, the conditioner arm 62 is being pivoted vertically out of the cleaning cup assembly 68 and a phantom line 2640 shows the extreme outer position of both the wafer head from an inner extreme to an outer extreme without overlapping the platen edge while another phantom line 2642 shows a similar oscillation between inner and outer extremes for the conditioning arm 62.

In FIG. 39C, the cleaning cup assembly 68 has been moved out of the path in which the conditioner arm 62 travels during its oscillating swing across the polishing pad 54 from the center to the edge and back. Note that the wafer head 110, the conditioner head 64, and the platen 52 all rotate in the same (clockwise) direction. FIG. 39C shows an outer extreme position of the wafer head 110 when the head is allowed to hang over the edge of the platen 52. The retaining ring portion of the wafer head 110, but not the wafer held by wafer head, is allowed to hang over the edge of the platen 52.

In an alternative process, the conditioning and polishing steps are separated. During the polishing process, the conditioner head 64 is stored in the storage cup assembly 68, as generally illustrated in FIG. 39B, while the wafer head 110 is sweeping the wafer 40 across the rotating polishing pad 54. During the conditioning process, as generally illustrated in FIG. 39C, the wafer head 110 is stored at its innermost position nearest the center of the carousel 70 and above the rotating pad 54. The conditioner head 64 is lifted from the storage cup assembly 68, which is rotated to a non-interfering position, and the conditioner head 64 is swept over the rotating pad 54 to thereby condition it. When the pad conditioning is completed, the cup assembly is rotated back to a position at which the conditioning head 64 is returned to be stored in it.

Wafer Transfer Alignment and Cleaning Station

Referring back to FIGS. 1 and 2, the transfer station 70 serves the multiple purposes both of transferring the wafer back and forth between the loading apparatus 30 and the polishing apparatus 20 and washing the wafer after its polishing has been completed. FIG. 40 shows an enlarged perspective view of the wafer transfer station 70, which is raisable with respect to the table top 23. A wafer transfer pedestal 72 has a top surface extending generally horizontally to which a thin elastomeric film 722 is adhered for gently supporting a wafer on top of the pedestal 72 without scratching its principal surface. Three fork assemblies 74 are disposed around one vertical position of the pedestal 72 to laterally align the wafer supported on the pedestal 72. The pedestal 72 is vertically retractable within a washing shroud 76 so that, when three washing assemblies 77 attached to the shroud 76 jet rinse fluid toward the wafer, pedestal, or wafer head, the rinse fluid is contained within the shroud 76. The shroud 76 is also vertically raisable with respect to the table top 23.

FIG. 41 shows a plan view of the top of the platen and of the washing shroud. FIGS. 42 and 43 show perspective views at two different angles similar to FIG. 40, but partly in cross section to show the operation of the forks and water nozzles. FIG. 44 shows a detailed cross-sectional view of the pedestal area of the transfer station. The shroud 76 is supported on and sealed to a generally cylindrical basin shaft housing 78 while the pedestal is threaded on and supported by a tubular pedestal column 79 extending vertically within the basin housing 78.

Wash and Vacuum Ports on Pedestal and in Wash Basin

The pedestal 72 of the transfer station 70, as illustrated in the plan top view of FIG. 41 and the cross section of FIG. 44, includes both central ports 724 and multiple offset ports 726 on the top surface of the pedestal 72 offset from its center and penetrating the elastomeric film 722. That is, the ports 724 and 726 for water and vacuum open through the top of the pedestal 72 and the elastomeric film 722. The ports 724 and 726 are connected to lateral passageways 728 in the pedestal 72 (only two of which are illustrated in the cross section of FIG. 44) connecting to a vertical passageway 730 in opposition to a central passageway 732 in the tubular pedestal column 79. Either pressurized wash fluid or a vacuum is applied to the bottom of the central passageway 732 in the pedestal column 79 through a flexible fluid hose 736 detachably coupled to the pedestal column 79 through a threaded union 738. In order to avoid contamination of the vacuum source with the wash fluid, a vacuum generator and a three-way valve are connected to the flexible line 736 at its junction with the vacuum line and the wash supply line. The vacuum generator uses water pressure to generate a generate a vacuum. An exemplary vacuum generator is a Model L10 vacuum pump available from PIAB of Hingham, Mass. Through the three-way valve, the central passageway 723 of the pedestal column 79 and its associated ports can be supplied with pressurized liquid or a vacuum with reduced possibility of the vacuum source being contaminated with the liquid.

As shown in the plan view of FIG. 41 and in the side sectional view of FIG. 49A, disk tip nozzles are screwed into the ports 724 and 726, preferably Model 680.345.17 available from Lechler of St. Charles, Ill. A one-way check valve, to be described later, is installed in the central port 724 to prevent wash fluid from being ejected therefrom but to allow vacuum to be pulled at the central port. When a pressurized cleaning solution is supplied through the offset ports 726, the upwardly directed liquid cleans a bottom surface of a wafer head 110 and any wafer adhered thereto. When a wafer is in contact with the elastomeric film 722, a vacuum supplied to the ports 724 and 726 seals the wafer tightly to the top of the pedestal 72.

The three washing assemblies 77, illustrated both in perspective and cross section in FIG. 43, are disposed at about 120° intervals about the pedestal 72 and generally disposed in the periphery of the shroud 76 beneath a porch roof 740 and inside an outer wall 741. Each washing assembly 77 includes a lower member 742 fixed to an inside bottom 743 of the basin 76 and having a radial passageway 744 connecting to a first tapped nozzle hole 746 through a vertical passageway 748. The washing assembly 77 further includes an upper member 750 fixed on the lower member 742 and having its own vertical passageway 752 sealed to the other vertical passageway 748 and connecting to a second tapped nozzle hole 754. Respective flat-spray nozzles are screwed into the nozzle holes 746 and 754 with their respective slit orientations chosen to optimize the overall spray pattern. The lower nozzle hole 746 has a longitudinal axis directed upwardly by about 30° with respect to the horizontal plane of the pedestal 72, and the upper nozzle hole 754 has its longitudinal axis directed downwardly by about 15°; that is, the two nozzle holes 746 and 754 are offset from the plane of the wafer 40 by an angle in the range of approximately 10° to 45°. The offset of these two spray patterns may be arranged to intersect near to or outside the periphery of the pedestal 72 so as to more effectively wash the empty pedestal 72 and the wafer held by the polish.

As shown both in FIGS. 43 and 44, each washing assembly 77 further includes a supply tube 756 connected to the radially inner end of the lower member 742 and sealed to its radial passageway 744. The supply tube 756 of each washing assembly 78 runs vertically down the inside of the basin housing 78 to its lower end. At this point, it is joined to a passageway 758 in a lower collar 760 that has a tapped hole on its outer wall for a threaded connection to a flexible line for the wash fluid.

Thus, wash fluid can be independently supplied to the three generally horizontally oriented peripheral washing assemblies 78 and to the vertically oriented ports 726 on the top of the pedestal 72. The washing fluid from either source is substantially contained within the basin shroud 76 when the wafer head 110 is positioned over the transfer station 70 and the basin shroud 76 and associated washing assemblies 77 are raised to place the wafer head 110 and the attached wafer inside the porch roof 740 of the basin shroud 76. Excess washing fluid and entrained slurry are caught within the basin shroud 76 and drain downwardly toward the bottom of basin housing 78 where a drain passage 759 penetrates the bottom of the basin housing 78 and the collar 760 and connects to a drain pipe 761.

The raising of the basin shroud 76 around the wafer head 110 reduces the vertical stroke required of the wafer head 110. This short stroke contributes to a simpler and lighter design for the wafer head.

Wafer Alignment Forks

As illustrated generally in FIG. 40 and as will be explained in more detail later, the three fork assemblies 74 are used to align the wafer head 110 relative to the washing station 70 and its pedestal 72 after the wafer 40 has been loaded onto the pedestal 72 by the wafer transfer paddle. Then, the pedestal 72 is slightly lowered and the basin shroud 76 with attached fork assemblies 74 is significantly raised to laterally surround the pedestal 72, wafer 40, and the lower portion of the wafer head 110. Only after the centering is completed is the wafer 40 loaded into the wafer head 110.

FIG. 41 also shows in plan view the triangular orientation of the three wafer alignment fork assemblies 74. As additionally shown in the perspective view of FIG. 42, the expanded perspective and partially sectioned view of FIG. 45, and in the cross-sectional view of FIG. 44, each fork assembly 74 includes a fork 762 rotatable within a limited angular range and having a pair of alignment tines 764 for abutting the edge of the wafer to be centered. The fork 762 rotates on the distal end of a radially extending fork arm 766 having its proximal end fixed to a vertical rib 768 extending down the interior of the basin housing 78. The lower end of the rib 768 is hinged about a shaft 769 to a wing 770 of a support sleeve 772, to be described later, that is fixed to the basin housing 78. A pneumatic cylinder 774 is fixed to a side of the outside of the basin housing 78 and has an output shaft 776 penetrating the basin housing 78 and having on its shaft end a coupling threaded into a middle portion of the vertical rib 768. Although the present design dedicates one pneumatic cylinder 774 to each rib 768 and associated fork assembly 74, the design could easily be modified to actuate the three ribs 768 with one pneumatic cylinder.

The pneumatic actuation and deactuation of the fork pneumatic cylinder 774 controls the radial position of the fork 762 relative to the wafer on the pedestal 72. Actuation presses the rib 768 radially inward so as to cause the fork 762 to approach and possibly touch the wafer on the pedestal 72. Deactuation pulls the rib 768 radially outward so as to withdraw the fork 762 from the pedestal 72. It is noted that the geometry couples radial motion of the forks 762 with an axial motion of them so that the forks 762 rise as they approach a wafer 40. The fork pneumatic cylinder 774 is spring loaded so as to present a varying load to the pneumatic cylinder 774 and thus to allow a finer pneumatic control of position. A detent screw 778 is threaded from the bottom through a radially inner portion of the fork arm 766 so as to provide a vertically adjustable lower stop to the fork arm 766 and thus limit the radially outward travel of the fork 762.

As best illustrated in FIGS. 42 and 45, the fork 762 of the fork assembly 74 is rotatably supported on a fork rotation shaft 780 fixed to and extending vertically upward from the distal end of the fork arm 766. Two bushings 782 (only one of which is illustrated in FIG. 45, seize the yoke of the fork 762 and provide free rotation in the horizontal plane relative to the fork rotation shaft 780. The free rotation of the fork 762 allows the fork 762 to approach a badly misaligned wafer with minimal scraping action and thus provide six points of contact rather than three.

Two bumper assemblies 784 are rotatably supported about vertical axes generally radially in back of the fork tines 764. Each bumper assembly 784 has two ball bearings allowing free rotation in the horizontal plane of a knob-shaped bumper 786. The bumper 786 engages the side of the wafer head 110, which may not be precisely aligned with the pedestal 92 of the washing station 70. After a fork 762 has initially contacted the side of the wafer 110 with both its tines 764, further inward retraction of the fork assemblies 74 causes the unbraked carousel support plate 906 to rotate in the required direction so as to bring it into proper alignment with the pedestal 72. Only then is the carousel 90 locked in place. The bumper 786 also realigns any badly misaligned wafer 40.

The cantilevered design of the fork arm 766 and rib 768 pivoted about a remote shaft 769 has the disadvantage that the long moment arm and limited rigidity of the intervening support structure would allow the fork 762 to wander in both the circumferential and vertical directions. To prevent such wander but without preventing the substantially free movement of the fork assembly 74, each of three alignment fork assemblies 790 is screwed into a respective recess of and fixed to the outer wall 741 of the wash basin 76 at a circumferential positions separated by 120° and axial positions. These positions correspond to a post 792 fixed to and downwardly descending from the fork 762 at a position radially inward from both the fork rotation shaft 780 and the bumpers 786. The alignment fork assembly 790 has two tines 794 extending radially inward from the basin wall 741 so as to very loosely capture the downwardly descending post 792 of the fork rotation shaft 780 and thereby prevent the fork 762 from wandering in the circumferential direction by rotating beyond certain predetermined rotational limits. The fork 762 rotates about its bushing 782 within the tines 794 until its rotation is stopped by the post 792 engaging one or the other of the tines 794.

The above design for the wafer support, in which the process side of the wafer lies on the pedestal, runs counter to the conventional design philosophy of not unnecessarily contacting the process side of a wafer. An alternative design that avoids such contact includes three fingers extending upwardly from the face of the pedestal and positioned to engage either the rim of the wafer or the outermost periphery of the process side of the wafer. Ledges or tapers face inwardly at the upper tips of the fingers to promote alignment of the wafer with the fingers. Thereby, the central portion of the process side of the wafer is left suspended over the pedestal. A reflective optical sensor is incorporated into the face of the pedestal to sense when a wafer has been placed on the fingers.

Transfer Station Support and Movement

As previously mentioned and as best illustrated in the cross section of FIG. 44, both the transfer pedestal 72 and the wash basin 76 are independently movable vertically with respect to the table top 23 of the machine base 22.

The basin housing 78 freely passes through an aperture 1712 in a shoulder 1714 fixed on top of the table top 23. A pneumatic cylinder 1716 is fixed to a side of the lower end of the basin housing 78. Its output shaft 1718 extends vertically upwards, and its foot 1720 is captured in a jaw 1722 attached to the bottom of the shoulder 1714 through a plate 1724. The basin pneumatic cylinder 1716 thus provides for relative motion of the basin housing 78, and the elements attached thereto relative to the table top 23. The pneumatic cylinder 1716 also moves the pedestal 92 but separate motive means moved by the pneumatic cylinder 1716 can move pedestal 92 independently of the basin housing 78. An unillustrated vertical rail is attached to the shroud 1714, and an unillustrated hand attached to the basin housing 78 engages the rail so as to provide lateral stability to the basin housing 78 as it is being vertically moved by the basin pneumatic cylinder 1716.

A bottom inward lip 1726 of the basin housing 78 supports the bottom of the support sleeve 772 extending upwardly within the basin housing 78. Two cylindrical tursite bushings 1728 and 1730 are interposed between the support sleeve 772 and the pedestal column 79 so as to support it in the lateral direction but to freely guide it in the vertical direction. The upper bushing 1728 is pressed downwardly against the support sleeve by a collar 1732 screwed into the sleeve 772. The lower bushing 1730 only abuts a lower end of the support sleeve 772 and is held thereagainst and against the pedestal support column 79 by the lower collar 760. An unillustrated set of bolts pass through the lower collar 760, the lower lip 1726 of the basin housing 78, and are threaded into the lower end of the support sleeve 772 so as to rigidly join the basin housing 78 and the support sleeve 772. As mentioned previously, for each fork assembly 74, the rib 768 is pivoted on the shaft 769 passing through the wing 770 at the lower end of the support sleeve 772.

The pedestal column 79 and thus the pedestal 72 is movably held to the bottom of the basin housing 78 by a three-legged spider 1740 shown additionally in perspective in FIG. 46. The spider 1740 is rigidly held to the pedestal column by two O-rings 1742, shown in the enlarged cross section of FIG. 44A, with a wedge-shaped spacer 1743 placed therebetween, all placed in an annular recess 1744 having a lower tapered edge. Axial compression forces the O-rings 1742 into elastic contact with the spider 1740, the wedge-shaped spacer 1743, and the pedestal column 79, thereby fixing them together. The lip of an overlying collar 1746 is biased by screws against the spider 1740 so as to force the O-rings 1742 into the acute points of the respective tapers and thereby radially engage the pedestal column 79 and prevent any relative motion therewith.

As illustrated in both FIGS. 44 and 46A, each leg 1750 of the spider 1740 has at its distal end a jaw structure comprising a lower jaw 1752 and a bifurcated upper jaw 1754 with a slit 1755 between the two teeth of the upper jaw 1754. A spider support shaft 1756 passes between the teeth of the upper jaw 1754 and has attached to its lower end a foot 1758 that is engaged between the lower and upper jaws 1752 and 1754.

The spider support shaft 1756 is the vertically oriented output shaft of a pneumatic cylinder 1760 attached to a side of the basin shaft housing 78. Thus, the actuation of the pedestal pneumatic cylinder 1760 causes the pedestal 72 and the wafer supported thereon to move vertically with respect to the wash basin. Three guide posts 1762 pass through bushings 1764 in the arms 1750 of the spider 1740. The upper ends of the guide posts 1762 are fixed to the lower collar 760 of FIG. 44 fixed to the basin shaft housing 78 to thus provide stability to the movement of the spider 1740 and attached pedestal 72.

The above support and motive mechanism used three pneumatic cylinders 1760 to move the pedestal, but it could be easily redesigned for only one such pneumatic cylinder.

Wafer Loading to Transfer Stations

In loading a wafer 40 into the polishing system 20 from the loading system, as illustrated in FIG. 47A, the washing basin 76 and its attached elements are lowered away from the virtually vertically stationary wafer head 110, and the pedestal 72 is lowered somewhat to a position such that the transfer robot blade 38 with the wafer attached to its lower side (by a process and with apparatus to be described later) can pass beneath the vertically stationary wafer head 110 and above the pedestal 72. When the wafer blade 38 is centrally located, the pedestal 72 is raised so that its elastomeric surface 722 can gently receive the wafer 40. Thereafter, the pedestal 72 is lowered and the wafer blade 38 is withdrawn. As is illustrated, the wafer 40 may initially be badly misaligned with the pedestal 72.

In loading a wafer, the transfer washing basin shroud 76 and its internal pieces are lowered away from the wafer transfer pedestal 72. A robot blade 38, with vacuum chucking holes on its bottom holding the wafer 40, moves the wafer 40 into position, and positions the wafer 40 face down above the top of the pedestal 72 extending above the washing basin 67. The pedestal 72 is then raised to contact the wafer surface and the wafer is released from the robot blade 38. The pedestal is lowered, or the robot blade is raised slightly, to avoid contact between the wafer and the robot blade as the robot blade 38 is horizontally rotated out from between the wafer head 110 and the pedestal 72. The wafer head 110 and the washing basin shroud 76 are then raised (FIG. 47B) to surround the perimeter of the wafer head 110.

Thereafter, as illustrated in FIG. 47B, the pedestal 72 is raised somewhat but the basin 76 is substantially raised so as to surround the virtually stationary wafer head 110 and the wafer 40 deposited on the pedestal 72. During this operation, the wafer alignment assemblies 74 are in their relaxed, radially outward positions. When the basin shroud 76 has been raised so that the wafer 40 is horizontally aligned with the tines 764 of the forks 762, the fork pneumatic cylinders 774 are actuated to cause the fork 764 tines to move toward the center of the pedestal 72 and approach if not touch the periphery of the wafer 40 supported on the pedestal 72. The forks 764 will move radially inwardly until their bumper 786 contacts the outside of the wafer head 110. This contact will both cause the two-tined fork 762 to circumferentially align about the fork pivoting post 780. As illustrated in FIGS. 48A and 48B, further radially inward motion will align the wafer head 110 with the center 72a of the pedestal 72 and will also cause the tines 764 to align the center 40a of the wafer 40 with the center 72a of the pedestal 72. The tine 764 initially contacting the wafer 40 will pivot back until the opposed tine 764 in the same fork 762 also contacts the wafer 40. Thereafter, the two tines 764 will push the already generally centered wafer 40 toward the other two forks 762, as illustrated in FIG. 47D, until the bumpers 786 of those other two fork assemblies 74 are stopped by their contacting the wafer head 110. If the wafer 40 is properly aligned on the pedestal, the alignment fork 762 and its tines 764 will just barely touch the wafer 40.

The pushing force generated by the alignment forks 762 to align the wafer 40 to the center of the pedestal 72 for attachment to the wafer head 110 is distributed to several of the six tines 764 of the alignment forks 762. The pushing force of each fork 762 is distributed substantially equally through the yoke to push on the wafer 40 at two points. As the wafer 40 moves toward the center of the pedestal 72, the freedom of the yoke to horizontally rotate to maintain its contact with the edge of the wafer by pivoting without the necessity of a sliding contact, reduces stress concentrations at the wafer's edge which may fracture the wafer and distributes the frictional resistance to slippage between the alignment jaw and the wafer over a larger area, thereby reducing the possibility of a localized hang-up due to local deformations which are greater when the same force is applied over a smaller area. The use of the alignment yoke allows for some rotation and some slippage of the wafer as the wafer is pushed into alignment with the wafer head 110.

Once the wafer 40 is in alignment with the wafer head 110, as shown in FIGS. 47D and 26C, the wafer is positioned below the recess 1115 of the lower portion 1110 of the wafer head 110.

Thereafter, the fork actuators 774, as illustrated in FIG. 47E, cause the fork assemblies 74 to radially withdraw. The pedestal 72 is then raised to lift the wafer 40 into the wafer receiving recess 1115 of the lower portion 1110 of the wafer head 110. The wafer 40 is pressed firmly against the inner principal surface of the wafer receiving recess 1115 so that a vacuum or surface-tension attachment between the wafer 40 and the wafer head 110 can be confirmed before the pedestal 72 is lowered. In some configurations, the wafer head 110 will have vacuum ports in the wafer receiving recess 1115 so that an interlock sensor senses when the vacuum ports are sealed by the wafer 40. This assures that the wafer 40 is firmly attached to the wafer head 110 and that the pedestal 72, formerly supporting the wafer 40 from below, can be lowered without fear that the wafer is not properly attached to the wafer head 110. The washing basin 76 is then lowered and the wafer head 110 with the wafer 40 now attached is ready to be rotated to the next polishing station for polishing.

Wafer Cleaning and Unloading from Transfer Station

FIGS. 49A, 49B, 49C, 49A, 49B, and 49C provide side elevational and top views of the operations performed in flushing the wafer head and removing the wafer from the wafer head once wafer polishing has been completed.

FIGS. 50A, 50B, and 50C show the operation of a check-valve assembly 1770 located behind the center nozzle 724 at the center of the pedestal 72.

FIGS. 49A and 49A show a polished wafer 40 after polishing has been completed still attached to the wafer head 110 surrounded by the washing basin 76 and facing on its bottom side the pedestal 72. All washing jets are initiated, that is, all six nozzles 746 and 754 of the three side wash assemblies 77 and the offset nozzles 726 (but not the central nozzle 724 because of a check valve to be described below) in the surface of the pedestal 72 all actively spray deionized water or other chemical solution at the bottom and part of the sides of the wafer head 110 and across the top of the pedestal 72 to clean any particles which might have been picked up or have adhered themselves to the wafer head 110 and the wafer 40 during the polishing process. The wafer head 110 can be rotated during this spraying activity so that all areas and all crevices on the bottom of the wafer head 110 are flushed and cleaned. The water sprayed in the wash basin 76 drains through the center basin support housing 78 and is either recycled or discarded.

A close clearance of approximately 0.168" (4.3 mm) between the outside of the 3C3 wafer head 110" and the porch roof 74 of the wash basin shroud 76 reduces, if not eliminates, the likelihood that water will be splashed out of the basin shroud 76 into other areas of the machine. It should be mentioned that a reduced clearance of 0.146" (3.7 mm) exists between the roll of the bumper 786 and the wafer head 110.

As can be seen in FIG. 50A, the check-valve assembly 1770 includes an insert 1772 screwed into the pedestal 72 behind its center nozzle 724. At the intersection of the vertical passage 730 connecting to center port 724 at the center of the pedestal 72 and the lateral passages 728 a block 1774 captures a valve ball 1776 between it and tapered walls 1778 at the bottom of the vertical passage 730. As illustrated, pressurized water supplied from the central passage 732 of the pedestal column 79 forces the ball 1776 against the tapered walls of the vertical passage 730 to thereby block the central port 724. This blockage provides a more even distribution of water pressure to the non-centrally located ports 726 across the pedestal 72. If the check-valve of FIGS. 50A–50C were not in place, a larger proportion of the water to be sprayed would come out the large center nozzle 724 and less would be directed to the other smaller offset nozzles 726 in the pedestal 72.

FIGS. 49B and 49B show the next step of the unloading operation. The pedestal pneumatic cylinder 1760 raises the pedestal 72 into contact with the wafer 40, and a vacuum source is routed through the bottom of pedestal column 79 to the fluid passages 728 and 732 which just recently were conducting water to the offset spray ports 726. The spray nozzles 724 and 726 are now transformed into vacuum suction ports. The elastomer film 722 on the top of the pedestal 72 creates a tight seal between the wafer 40 and the top of the pedestal 72. As soon as a vacuum seal is sensed in the pedestal vacuum supply passage, by the lowering of pressure in the vacuum lines, the wafer receiving recess 1115 of the wafer head 110 is supplied with a pressurized gas behind the wafer 40 to more easily release the wafer 40 from the wafer head 110. Otherwise, a vacuum seal to the pedestal 72 would have to compete with the vacuum or other attachment force holding the wafer 40 to the wafer head 110.

Note that in FIG. 50B, the ball 1776 of the check-valve 1770 at the center port 724 of the pedestal 72 has fallen to be stopped on the block 1774 to thereby open the vertical passage 730 so that vacuum can be directly applied to a larger area which includes the center of the pedestal 72.

Once the wafer 40 has been captured by the vacuum on top of the pedestal 72, the vacuum of the pedestal is maintained and the pedestal is lowered to a second washing position, illustrated in FIGS. 49C and 49C. Slurry or other particles which were caught behind or next to the wafer 40 during the time the wafer 40 was attached to the wafer head 110 are now exposed, and the nozzles 746 and 754 of the washing assemblies 77 are activated to spray water across the back of the wafer 40 and into the wafer receiving recess 1115 so that all particulates and slurry particles can be flushed away. During this second washing step, the wafer head 110 can rotate to provide a more even distribution of the wash water which, in this second washing operation, is coming from only the three positions of the side washing assemblies 77 and not from the ports on top of the pedestal 72. During the second washing operation, a vacuum pressure continues to be ported to the fluid ports 724 and 726 on the top of the wafer pedestal 72 to prevent the wafer 40 from moving as a result of the force of the moving water flushing its surface. Note that in FIG. 50C, the ball 1776 of the check-valve 1770 remains in its open position. Once the second washing of the wafer 40 on the pedestal 72 is complete, the basin pneumatic cylinder 1716 lowers the washing basin 76, and the pedestal pneumatic cylinder 1760 lowers the pedestal 72 by its slight stroke to permit insertion (requiring approximately 0.25 inches or 6 mm) of the robot blade 38. The pedestal 72 can then be raised to assure that the robot blade 38 contacts the back of the wafer 40. Once the vacuum seal is sensed between the robot blade 38 and the back of the wafer 40, the vacuum in the pedestal 72 is released so that vacuum forces are not competing in trying to hold the wafer 40. The pedestal 72 is then lowered and the robot blade 38 is moved to place the newly polished wafer in a wafer cassette 42 for transport.

Table Top Arrangement

FIG. 52 shows a cross-sectional view through FIG. 2 at Section 52—52 showing the position of a first wafer head 110a polishing a wafer (not shown) on the platen 52, rotated by the platen rotation motor 232 and the position of the various pieces relative to one another. The oppositely located wafer head 110c is disposed at the transfer station 70, at which position the wafer head 110c and the attached wafer are washed after polishing or alternatively a wafer is loaded into the wafer head 110c once it has been received from the transfer station 70.

When the transfer washing basin shroud 76 is lowered away from the wafer head 110c and the other wafer heads 100 are retracted to their position that is uppermost and innermost to the carousel hub 902, the carousel support plate 906 is rotated to place the wafer heads in new positions. If there is no inter-station washing the rotation is 90°; for inter-station washing, the rotation is typically about 45°.

The carousel support plate 906 is rotatably supported on the stationary sleeve-like center post 902 through a center post bearing 984. A carousel drive motor 986 is supported by the center post 902 and its output is connected to a harmonic drive 988, such as unit size 65 available from the previously mentioned harmonic drive supplier. The harmonic drive 988 provides a very high torque multiplication drive which can rotate and hold the carousel support plate 906 precisely.

The harmonic drive 988 provides an acceptable rotational velocity to turn the wafer head assemblies between stations. However, the static holding torque of the harmonic drive 988 is insufficient for holding the carousel support plate 906 precisely at a particular reference position for polishing and transfer of wafers while the wafer heads 100 are engaging the rotating polishing pad 54 at varying radial positions.

To provide additional braking, a gear locking system illustrated in perspective in FIG. 53 may be disposed between the carousel drive motor 986 and the harmonic drive 988 on a drive shaft 990 linking the two. A shaft gear 991 is tightly fixed to the drive shaft 990. A thick first idler gear 992 is rotatably but tightly radially held on a first idler shaft 993. The upper part of the thick first idler gear 992 is always engaged with the shaft gear 991. A thinner second idler gear 994 freely rotating on a second idler shaft 995 also always engages the first idler gear 992, usually in the lower section of the first idler gear 992 and out of engagement with the shaft gear 991. However, the second idler shaft 995 is axially translatable by a pneumatic cylinder 996 fixed to the housing for the gears. When the locking pneumatic cylinder 996 is actuated, the second idler gear 994 slides towards the top of the first idler gear 992 and also engages the shaft gear 991. This engagement between the three gears 991, 992, and 994 prevents any of them from moving. The second idler shaft 993 together with the second idler shaft 995 provides the torque arm preventing any rotation of the drive shaft 990.

Alternatively, and perhaps preferably, a disk brake assembly may be used. A rotor disk is attached to the shaft 990, and a caliper has its arms set on opposite sides of the rotor disk with brake pads on the arms facing the disk. The caliper is selectively closed with a pneumatic cylinder, and the brake pads on the caliper arms bear against opposite sides of the rotor disk to thereby inhibit further rotation.

Returning to FIG. 52, wiring to the wafer head rotational motors and other electrical devices and fluid lines to the rotary couplings 1042 at the upper end of the wafer head shafts are routed through a wiring and hose bundle 997 generally entering the carousel covers 908 through a wiring opening 998 at its top. This routing avoids interference with wafers and reduces the likelihood that the slurry environment can enter the cover through the wiring/hose opening 998. Rotation of the carousel 90 does not cause binding and constriction of the wiring and tube bundle because rotation of the carousel 90 is limited to less than 360°, e.g., in a four head assembly arrangement, to 270° or 315° if all four intermediate washing stations are implemented. During sequential processing, a first wafer is loaded on a first head and is progressively rotated 90° to each subsequent station until it has reached the third station 270° from the loading position. The next rotation sequence progressively would take this first wafer another 90° to return it to the loading station, but to avoid wire and hose binding and constriction, the equivalent of a forward (clockwise) rotation of 90°, that is a reverse (counterclockwise) rotation of 270°, is performed to bring the wafer back to the transfer/loading position as discussed above for FIGS. 5A–5F and 6A–6D. The second and third wafers to be loaded in the sequence have their forward advance between polishing stations interrupted by the reverse rotation of 270° although the functional sequencing remains the same.

Loading Apparatus in General

As illustrated in the isometric view of FIG. 1 and as briefly described previously, the loading apparatus 30 moves wafer cassettes 42 between the holding station 32 and the holding tub 34 and also moves the individual wafers 40 between the cassettes 42 in the holding tub 34 and the polishing apparatus 20, which has just been completely described in extensive detail. Both sets of movement are effected in part by a wrist assembly 37 and in part by the arm 35 descending from the overhead track 36.

As additionally illustrated in the partial cross-sectional, partial plan side view of FIG. 54, the wrist assembly 37 is held by a descending arm 35 descending from a horizontal overhead track 36 along which the arm 35 horizontally moves. The wrist assembly 37 uses a wafer blade 38 to move the wafers 40 and uses a claw 39 to move the cassettes 42. To effect these various movements, the arm 35 is rotatable about its vertical axis and is extensible and retractable along that vertical axis, and the wrist assembly 37 is rotatable about a horizontal axis, itself being rotatable in the horizontal plane.

As illustrated in the side cross section of FIG. 54, the arm 35 depends from the overhead track 36 and moves along the track 36 so as to move cassettes between the holding station 42 and the holding tub 34 and to move individual wafers 40 from various positions within the holding tub 34 to a position at which the wafers 40 can be loaded into the polishing apparatus 20.

Details of the loading apparatus 30 will now be presented beginning with blade 38 and claw 39.

Blade and Claw

As illustrated in the exploded perspective view of FIG. 55, the wrist assembly 37 includes a claw member 312 including a hub portion 314, the claw 39 extending radially therefrom, and a blade bracket 316. Th claw 39 includes, as additionally shown in side plan view of FIG. 57, two parallel fingers 318 and two fingertips 320 extending perpendicular to the claw 39. The back of the claw 39 also includes a knuckle ridge 322 facing the hub portion 314.

A blade body 324 is secured with countersunk flat screws to an open recess in the blade bracket 316 such that one side of the blade body 324 is flush with a side of the blade bracket 316. The flush side of the blade body 324 includes at its distal end a generally rectangular vacuum recess 328 communicating via an aperture 330 with a vacuum channel 332, best shown in the upper perspective view of FIG. 56, extending axially along the blade body 324. The aperture 330 is formed, as additionally illustrated in the bottom plan view of FIG. 60, by milling the vacuum recess 328 and the vacuum channel 332 from opposite sides of the blade body 324 to a sum of depths greater than the thickness of the blade body 324. As a result, the aperture 330 is formed in the area in which the vacuum channel 332 overlaps the vacuum recess 328. By "bottom" of the blade 38 is meant the side with the vacuum recess 328 for vacuum holding the wafer 42 on its lower side as it is loaded to and unloaded from the polishing apparatus 20.

As shown in the top isometric view of FIG. 56, a surrounding ledge 334 is milled around the periphery of the vacuum channel 332. An insert 336 is fit onto and welded to the ledge 334 so as to seal the vacuum channel 332. However, the insert 336 includes a through hole 338 at its proximal end to provide a vacuum port for the vacuum source. The top plan view of FIG. 59 shows the insert 336 fitted into the blade body 324. As illustrated in the bottom perspective of FIG. 55 and the side view of FIG. 58, a vacuum hole 340 is bored through the blade bracket 316. A vertical end of the vacuum hole 340 overlies and is sealed to the through hole 338 in the blade insert 336. A horizontal end of the vacuum hole 340 is connected to a threaded coupling of a vacuum hose 342. Thereby, vacuum applied to the vacuum hose 342 can be used to vacuum chuck a wafer 40 to the blade 30. The vacuum chucking is used both to remove vertically oriented wafers from the cassettes 42 and to hold a wafer 40 horizontally on a lower side of the blade 38. The blade 38 vacuum chucks a wafer 40 on its substrate backside with the process side containing partially formed circuits being unobstructed. Thereby, mechanical damage to the process side is avoided. The blade 38 dechucks the wafer 40 process-side down on the soft elastomeric surface 722 of the pedestal 72 of the transfer station 70. Because the vacuum chucking is sometimes done in the liquid of the holding tub 38, the vacuum is supplied by a vacuum generator 343 of the sort described before which generates a negative air pressure from a positive liquid or fluid pressure source powered by positive pneumatic pressure. As mentioned previously, such a vacuum generator prevents the contamination of a main or house vacuum source when a vacuum is being drawn against a liquid. The vacuum generator 343 is fixed on the wheel housing 344 at the side of the wrist 37. Also attached thereto is an air pressure sensor 345 connected to the vacuum hose 342 to sense the pressure within the hose 342. This is particularly valuable to sense when the vacuum chuck has indeed chucked the wafer.

As shown in the isometric drawing of FIG. 61, the claw 39 and blade 38 are assembled together into the wrist assembly 37 by screwing the hub portion 312 of the claw 39 to the gear of a gear assembly rotatably supported in a worm wheel housing 344 that is rotatably and translationally supported by the arm 35.

As shown in side plan view in FIG. 57, a worm wheel 346 is fixed to the claw 39 and blade 38 and is rotatably held on the outer races ball bearing assemblies 348 having inner race fixed to a shaft 350 secured to the worm wheel housing 344 (see FIG. 61) and outer races fixed to the worm wheel housing 344. As shown in the side plan in FIG. 57 and in the top cross section in FIG. 61, a worm gear 352 descending vertically from the arm 35 engages the worm wheel 346. When the worm gear 352 turns, the blade 38 and claw 39 rotate in a vertical plane about the shaft 350 of the worm wheel 346. As will be described in detail later, this rotation is used (1) to exchange the blade 38 and claw 39 from their operative positions, (2) to rotate the wafers 40, once on the blade 38, between their vertical orientation in the cassettes 42 and their horizontal orientation for their presentation to the polishing apparatus 20, and (3) to engage and disengage the claw 39 from the cassettes 42.

Track and Arm

The discussion now returns to the overhead track 36 and to the arm 35 it supports. The arm 35 moves horizontally between the cassettes 42 and the wafers 40 contained therein, and it supports, rotates, and vertically moves the wrist assembly 37.

The overhead track 36 shown in FIG. 1 is covered by a protective cover 360. A belt motor 361 protrudes from one end although the motor 361 can advantageously be placed at the other end.

A carriage 362 rotatably supporting the arm 35 is, as additionally shown in the perspective view of FIG. 62, bolted to a slider 364 horizontally slidably supported on its one side by a side rail 366 extending linearly along the overhead track 36. The rail 366 is affixed to a side of a box beam 368, which forms the main support member for the overhead track 36. A cantilever bracket 370 fixed to the top of the slider 364 extends over the box beam 368 and is itself fixed by two connection points to a drive belt 372. The drive belt 372 is toothed on its inside and is wrapped around two toothed sheaves 374 and 376. The first sheave 374, as additionally illustrated in end perspective in FIG. 63, is attached to a shaft 378 rotatably supported on one side of the box beam 368. The second sheave 376 is similarly supported in a free wheeling fashion on the same side of the box beam 368. Both end portions of the box channel 368 adjacent to the sheaves 374 and 376 have top cut outs 380 through which the sheaves 374 and 376 protrude so that the top part of the drive belt 372 is led outside of the box beam 368 and the bottom part is led through the interior of the box beam 368.

As illustrated in both isometric views of FIGS. 62 and 63 and in the cut away top plan view of FIG. 64, a channel-closing belt 380 is wrapped around two free-wheeling capstans 382 rotating about shafts 384 mounted in side walls of the box channel 368 at positions below the shafts 378 of the drive belt sheaves 374 and 376. A ridge 385 in the center of the channel-closing belt 380 matches corresponding grooves 385a in the capstans 382 to maintain alignment of the belt 380 as the horizontal slide 364 is moved from end to end.

The ends of the channel-closing belt 380 are fixed to the bottom of the carriage 362 at an distance from the rail 366 generally corresponding to the arm 35 and wrist assembly 37. The channel-closing belt 380 thus provides a sliding seal which closes the bottom of the protective cover 360 so that particles do not fall out from the inside of the housing onto wafers being processed nor does slurry contaminate the mechanism.

Various parts 387a, 387b, and 388 shown in the isometric view of FIG. 62 extend longitudinally along the track 36 to provide additional support and covering. As illustrated, the lower corner part 388 and the cover 360 provide an open longitudinal slot 389 along which the arm 35 slides as it depends from the carriage 362. However, the slot 389 allows polishing debris to penetrate upward into the delicate mechanical elements of the track 36 and carriage 362 and further allows mechanical particles to pass downward to the wafers to thereby contaminate them. The channel-closing belt 380 provides both the function of stabilizing the carriage 362 as it moves from one end to the other and the additional function of preventing particulates and debris from inside the cover 360 from falling down to the wafer 42 and the further function of protecting the mechanical parts from slurry.

Both the shaft 378 for the free-wheeling sheave 376 for the drive belt 372 and the shaft 384 for one of the capstans 382 for the channel-closing belt 380 are mounted to their respective box-channel walls by flanges set in longitudinally extending slots in the walls. Each flange is selectively biased by a threaded coupling between it and an anchor post located outboard of the respective slot. Thereby, the respective belt 372 or 380 is selectively tensioned.

As shown best in the axial cross section of FIG. 65, the carriage 362 captures the outer race of a circular bearing assembly 390 while a flange 392 of a collar 394 captures the inner race. As will be described later, the collar 394 supports the arm 35. A horizontal worm wheel 396 is supported by and above the collar 394. As further shown in the vertical plan view of FIG. 64, the worm gear 386 engages the worm wheel 396 to thereby rotate the arm 35 and the wrist assembly 37 in the horizontal plane about the vertical axis of the arm 35.

As shown in both the perspective view of FIG. 62 and the side cross section of FIG. 54, a flat head plate 390 of an arm C-section 392 is bolted to the bottom of the collar 392 rotatably supported by the carriage 362. An arm cover 394 encloses the arm 35 while it's in use.

The extension and retraction of the arm 35 is controlled by a worm motor 1300, shown in the longitudinal and side views of FIGS. 54 and 65. It is mounted within the carriage 362 and its vertically oriented output shaft is connected to a worm gear 1302 passing downwardly through the collar 394 and the head plate 397 of the arm C-section 392 to within the arm 35. The vertically descending worm 1302 engages a traveling worm nut 1304 in an upper part of an L-bracket 1306. As shown best in the perspective view of FIG. 61, the back of the L-bracket 1306 has a linear bearing dovetail groove engaging a vertical linear bearing rail 1308 affixed to a vertical portion 1310 of the C-section 392. The worm drive 1300, 1302, 1304 provides a vertical travel of about 10½ inches (27 cm), which is enough to manipulate an 8-inch (200 mm) wafer 40 from a cassette 42 and position it atop the pedestal 75 positioned over the table top 23.

As shown in the side view of FIG. 54 and the perspective of FIG. 61, a motor 1314 is mounted on a foot 1316 of the L-bracket 1306. An output shaft 1318 passes through the foot 1316 and along the central passage of a support column 1320. Two half collars 1322, shown in the side plan view of FIG. 57 and the perspective view of FIG. 61, fit into an annular recess 1323 of the support column 1320 and are screwed into the worm wheel housing 344 to fix the support column 1320 at the bottom of the arm 35 to the worm wheel housing 344. The output shaft 1318 penetrates the worm wheel housing 344 and has the worm gear 352 on its lower end engaging the worm wheel 346 turning the blade 38 and claw 39.

Thereby, rotation by the motor 1314 rotates the blade 38 and the claw 39 in the vertical plane, rotation by the motor 384 rotate them rotates them in the horizontal plane, rotation by the motor 1300 translates them vertically, and rotation by the motor 361 translates them horizontally, for a total of four degrees of motion.

As shown in the perspective view of FIG. 61, a hollow trombone 1324 is fixed to an ear 1326 of the worm wheel housing 344 and slides through the foot 1316 of the C-section 398 into the interior of the arm 35 and parallel to the vertical section 1310. The trombone 1324 bears the negative pressure pneumatic line 342 (or positive pressure line if a local vacuum generator is used) and electrical lines led along the shaft 350 of the wrist assembly 37 for sensing the absolute angular position of the blade 38 and claw 39.

Wiring and tubing to the various motors and to the robot blade is routed via a chain link like rolling wire tray (not shown) positioned in back of the front of and parallel to the track cover 360 of FIG. 62. An end of the rolling wire tray is fixed to a trough in which the fixed end of the tray rests. The trough is supported on brackets supporting the track cover 360. The wiring and tubing is bound to the rolling wire tray, and the flexible rolling wire tray makes a C-bend before approaching the carriage 362, to which the other end of the wire tray is fixed. The second end of rolling wire tray follows the carriage 362 as it moves along the overhead track 36. The wiring and tubing is then routed around the worm drive motor 1300 in the carriage 362 and to the descending arm 35 through one or more open holes interspersed with flange bolts around the rotatable collar 394 of FIG. 65 between the carriage 362 and the descending arm 35. The rotation of the pieces to which wiring or tubing is connected is generally restricted to a rotation in the range of plus and minus approximately 180° so that all angles required for the manipulation of the wafer can be achieved within a back and forth motion within the range without excessively binding or constricting the wiring or tubing.

Holding Tub

The details of the holding tub 34 are shown in the axial cross-sectional view of FIG. 67. The tub 34 itself is an integral body preferably of polypropylene or other plastic materials of the sort used in wafer cassettes. It includes a generally rectangular outer wall 1430 and an inner weir 1432 of the same shape separated from the outer wall 1430 by a catch basin 1434 and having an outwardly and downwardly tapered top 1436 having a tip 1438 below the top 1440 of the outer wall 1430. The bath 302 is filled into the basin between the inner weir 1432 and is filled to the tip 1438 of the weir 1432 until it overflows into the catch basin 1434.

One or more cassettes 42—four appears to be a preferable number—holding multiple wafers 40 between their slot ridges 430 are loaded into the tub 34. The top 1438 of the weir 1432 is positioned to be above the top of the wafers 40 held in the tub 34 and includes, as shown in the side elevational view in FIG. 68, a series of truncated inverted triangular channels 1438 extending transversely through the wall of the weir 1432. The channels 1438 have bottoms 1439 slightly below the intended top level of the bath 302 which is above the top of the wafers 40, and these bottoms have widths substantially shorter than the average width of the channels 1438. Since only a limited amount of liquid can flow across the limited width of the bottoms 1439, the level of the bath 302 typically rises substantially above this level. This rise is sufficient to overcome any non-uniformity or elevational differences between the channels 1438 and thereby prevents the bath 302 from draining through only a few of the channels 1438.

Each cassette 42 has legs 1442 which are laterally aligned by two rails 1444 fixed to a bottom 1446 of the tub 34 and are held by three pairs of pins 1448 extending outwardly from the rails 1444. As shown in FIG. 69, the three sets of pins 1448 are vertically displaced along the rails 1440 so as to support the cassette 42 at the required angle of 3°. Although this inclination angle seems preferable, other angles up to 10° and possibly 15° would provide similar effects in having the wafers 40 being substantially vertical while being held at a definite position and angle. Edges 1450 of the cassette legs 1442 are laterally aligned along the rails 1440 by a set of alignment pins 1452 extending from the rails 1440 to engage the downwardly disposed edges of the cassette legs 1442.

The basin of the tub 34 includes a drain hole 1454 at its bottom, and supply tubes 1456 extend longitudinally along the rails 1440 at the bottom corners of the tub 34. The bottom corners along the supply tubes 1456 are curved and material 1457 is filled into acute corners to prevent accumulation of debris in the corners. The supply tube 1456 includes several nozzle holes 1458 directed toward the center of the basin and a supply passage 1460 penetrating to beneath the tub bottom 1446. The catch basin 1434 includes an overflow drain 1460 at its bottom to drain bath water 302 overflowing the weir 1438. A fluid level sensor 1464 is fixed to the outer wall 1430 and positioned to sense the level of the bath 302 at and a few inches below the top 1438 of the weir 1432.

The plumbing is located beneath the tub bottom 1446, and its configuration depends on the desired process, for example continuous overflow, recirculation, or continuous drain. A typical configuration shown in FIG. 67 includes fresh bath water being supplied through a supply inlet 1466 through a three-way valve 1468 to a pump 1470 pumping the bath water through a filter 1471 to the longitudinal supply tubes 1456 and from there into the basin. When the level sensor 1464 detects that the basin has been filled to overflowing, that is, to the top 1438 of the weir 1436, the three-way valve 1468 is switched to instead recirculate the overflow water in the catch basin 1434 draining from the overflow drain 1460. Periodically the basin is drained by turning on a drain pump 1472 selectively pumping bath water from the bottom drain 1454 to a tub drain 1474, and then the basin is refilled from the supply inlet 1466, as described above. Alternatively, on a more frequent basis, the basin is only partially emptied and then topped off with fresh bath water. The drain pump 1472 is additionally useful when an operator desires to manually lift a cassette 42 from the tub 34. The bath 302 may be corrosive so it is desirable that its level be temporarily lowered to allow the operator to grasp the top of the cassette 42. Thereafter, the basin is refilled.

Other plumbing configurations are possible. To assure recirculation, the recirculation pump 1470 can have its inlet connected to the basin drain 1454. If recirculation is not desired, the catch basin 1434 can be drained externally and only fresh bath water be supplied to the longitudinal supply tube 1458.

The tub 34 can be improved in at least two ways. First, the catch basin 1434 is narrow and deep, making it difficult to clean. An equally effective catch basin would be a relatively shallow hanging channel positioned outboard and just below the top of the weir 1432. Secondly, the recirculation flow can be made more uniform and predictable if a perforated horizontal plate were placed between the bottom of the cassette 42 and the drain hole 1454 so that the pump 1472 pulled bath liquid from a wider area of the tub 34.

Operation of the Loading Apparatus

The operation of the loading apparatus 30 will now be described. As illustrated very generally in the perspective view of FIG. 1 and in the end view of FIG. 66, the loading apparatus performs two functions with the same equipment.

First, the wafer blade 38 in conjunction with the arm 35 depending from the overhead track 36 loads individual wafers 40 from multiple wafer cassettes 42 stored in a bath 302 filled into a holding tub 34. Each cassette 42 holds multiple wafers 40 in a generally vertical orientation by means of shallow vertical slots formed in opposed vertical walls of the cassette 42 such that two opposed edges of the wafers 42 are captured in two opposed slots (see FIGS. 67 and 71A). The cassettes 42 are commercially available, for example, from Fluoroware. They are typically formed of polypropylene or PVDF plastic so as to not abrade the wafers 40 and to be chemically inert for the liquids being used. The bath 302 is composed of a liquid, such as deionized water, which prevents any adhering slurry from hardening on the wafer. Also, when CMP of a metal layer is performed, the bath protects the fresh metal surface from air, which would oxidize it. Although only a single holding tub 34 is illustrated and described in detail, it is understood that multiple holding tubs can be used, especially one for loading unpolished wafers to the polishing apparatus 20 and one for unloading polished wafers therefrom.

Secondly, the claw 39 in conjunction with arm 35 transfers entire cassettes 42 between the holding tub 34 and a holding station 32 along the longitudinal direction of the overhead track 36. It is anticipated that an operator or automatic transfer apparatus places cassettes 42 filled with wafers 40 to be polished at precisely indexed positions at the holding station 32 and removes therefrom such cassettes 42 filled with polished wafers 40. However, further automation is possible, particularly for a post-polishing cleaning step.

Wafer Loading

FIGS. 70A, 70B, 70C, 70D, and 70E are general isometric views showing the sequence of the loading operation in which the robot blade 38 picks a wafer 40 from one of several cassettes 42 positioned within the holding tub 34 (not illustrated in these drawings for sake of clarity) and depositing it onto the transfer station 70 atop the machine base 22 of the polishing apparatus 20. The unloading operation of transferring a wafer 40 from the transfer station 70 back to a cassette 42 operates in reverse from the illustrated sequence.

During the sequence of these operations, the basin shroud 76 of the transfer station 70 is withdrawn downwardly within the machine base 22, and, at least during the actual wafer transfer, the transfer pedestal 72 is raised upwardly to protrude above both the table top 23 of the machine base 22 and the top of the shroud 76. Also, during this series of operations, one of the arms of the carousel support plate 906 is positioned over the transfer station 70, and an unillustrated wafer head system 100 is positioned within the slot 910 of the carousel support plate 906 overlying the transfer pedestal 72. With the lowermost member of the wafer head 100 of FIG. 9, that is, the floater member 1112, retracted upwardly to within the bowl member 1110 of the wafer head 110, sufficient clearance exists between the top of the transfer pedestal 72 and the floater member 1112 for the wafer blade 82 and attached wafer 40 to be manipulated therebetween. Although this requirement is severe, the short vertical stroke of the wafer head system 100 simplifies the system design and reduces the mass of the carousel 90. Also, since one of the wafer head systems 100 is positioned over transfer station 70 during the transfer operation, polishing can continue with the three other wafer head systems 100 during the transfer and washing operations, thus increasing system throughput.

The loading operation begins, as illustrated in FIG. 70A, by moving the arm 35 linearly along the overhead track 36 so that the downwardly directed blade 38 is positioned over the selected wafer 40 in the selected cassette 42. As mentioned previously, during the loading and unloading operations, the cassettes 42 are submerged in the holding tub 34. The cassettes 42 within the holding tub 34 are supported on inclines 420 at about 3° from vertical. The orientation is such that the device side of the wafers 40 face slightly upwardly and away from the slot ridges 430 illustrated in FIGS. 67 and 71A which hold the wafers upright within the cassette 42. The precise linear position of the arm 34 along the overhead track 36 is controlled to fit the wafer blade 38 on the substrate side of the selected wafer 40 between it and the neighboring wafer or cassette wall and with the vacuum recess 328 of the blade 38 parallel to and facing the substrate side. The generally downward orientation of the blade 38 at the requisite 3° offset parallel to the stored wafers 40 puts the claw 39 in a generally horizontal position so as not to interfere.

The arm 34 is then lowered into the bath 302 along a direction slightly offset from the vertical so that the wafer 40 is roughly aligned on the wafer blade 38, as illustrated in FIG. 70B. The inclined path requires a coordinated motion in two dimension. Vacuum is applied to the vacuum recess 328 of the blade 38 while it is still separated from the wafer. The arm 35 then slowly moves the blade toward the selected stored wafer 40. When the vacuum sensor 345 of FIG. 58 senses a vacuum, the wafer has been vacuum chucked and the linear motion of the arm 35 stops. Although some of the bath liquid is sucked in before contact, once the wafer 40 is chucked, there is little leakage and that leakage is accommodated by the vacuum generator 343.

After completion of vacuum chucking, the arm 35 draws the wafer blade vertically upwards at the 3° offset, as illustrated in FIG. 70C. Once the wafer 40 has cleared the cassette 42 and the bath 302, the wrist assembly 37 rotates the wafer blade 38 about a horizontal axis to the position shown in FIG. 70D in which the blade 38 vacuum holds the wafer 40 on its lower side with the process side of the wafer 40 facing downwardly. This orientation of the wafer blade 38 positions the claw 39 vertically upwards near the arm 35 so as to not interfere with either the carousel 90 or the machine base 22 including its table top. Also, after the wafer 40 clears the cassette 42 and bath 302, the arm 35 is moved horizontally along the overhead track 36 to bring the blade 38 and attached wafer 40 in proper position for loading onto the transfer station 70 through the sliding door opening in the clean room wall. The raising, rotating, and linear motions of the arm 35 can be performed simultaneously once the wafer 40 is above the bath 302.

When the wafer blade 38 and attached wafer 40 have been oriented horizontally and properly positioned vertically and linearly along the overhead track 36, the arm 35 rotates the wafer blade 38 about a vertical axis to move the wafer 40 through the opening of the sliding door and place it directly over the transfer pedestal 72 and below the overhanging wafer head system 100, as illustrated in FIG. 70E. The transfer pedestal 72 is raised to engage or nearly engage its elastomeric surface 722 with the process side of the wafer 40. The wafer 40 is dechucked from the wafer blade 38 by releasing the vacuum to the vacuum recess 328 and is rechucked on the transfer pedestal 72 by applying vacuum to the ports 724 and 726 on the top of the transfer pedestal 72. Once the wafer 40 has been chucked on the pedestal 72, it is lowered, and the arm 35 horizontally rotates the now empty wafer blade 38 away from the transfer station 70 and the machine base 22 to complete the wafer loading operation. Thereafter, the transfer station 70 uses the three claw assemblies 72 to align the wafer 40 on the surface of the transfer pedestal 72.

Typically, the loading apparatus 30 then prepares to unload another wafer from the polishing apparatus 20 after completion of its polishing, carousel rotation, and washing in a series of operation generally inverse to those described above for loading. It is, however, recommended that in returning a wafer 40 to the cassette 42 in the holding tub 34 the downward motion of the blade 38 be stopped a centimeter or so above the point where the bottom of the wafer 40 is expected to engage the bottom of the cassette 42 and before the wafer 40 would engage the side slots 430 of the cassette 42. At that point, the wafer 40 should be dechucked from the vacuum recess 328 of the blade 38 and be left to drop the remaining distance. Precise alignments of the wafer 40 on the blade 38 and of the cassette 42 within the tub are difficult to achieve. If the wafer 40 were to hit the cassette 42 while still vacuum chucked to the fairly massive moving robot arm 35, the collision could break or at least damage the wafer.

Cassette Loading

The loading apparatus 30 is also used to transfer cassettes 42 between the holding station 32 and the holding tub 34. The claw 39 attached to the wrist assembly 37 at the bottom of the arm 35 is designed for effecting this movement.

As illustrated in elevational and partially sectioned views of FIGS. 71A, 71B, and 71C, the claw 39 is rotated from the lower end of the arm 35 to be vertically and downwardly descending from the arm 35. It is then positioned to a side of the cassette 42, which for 200 mm wafers has a closed handle 422 extending from a longitudinal side 424 of the cassette 42. As shown in FIG. 71A, the claw 39 is positioned such that its knuckle ridge 322 passes inside of a back 426 of the handle 422 of the cassette 42. Then, as shown in FIG. 71B, the claw 39 is horizontally moved away from the cassette 42 such that its knuckle ridge 322 is below the back 426 of the handle 422. Then, as shown in FIG. 71C, the arm 35 further vertically raises the claw 39 so that its knuckle ridge 39 engages the bottom of the back 426 of the handle 422 attached to the wafer cassette 42. Further raising of the claw 39 lifts the back 426 and that side of the cassette 42 such that the cassette tilts and a lower side engages the fingertip 320 of the claw 39. The rotation of the cassette 42 is limited to an amount sufficient that the knuckle ridge 39 and finger tips 320 firmly latch the cassette 42. Any further rotation endangers bumping a neighboring cassette 42 in the crowded tub 34. In this configuration, the claw 39 supports the cassette 42 and its wafers 40 and can move them to any position longitudinal of the overhead track 36. As illustrated, the wafer blade 38 is rotated to a horizontal position in which it does not interfere with the operation of the claw 39.

Unloading of the cassette 42 from the claw 39 is accomplished by the arm 35 lowering the cassette 42 against a lower bearing surface such that cassette 42 untilts and disengages its back 426 of its handle 422 from the ridge knuckle 32 at the back of the claw 39 when the arm 35 moves the claw 39 outwardly from the cassette 39. A lesser inward movement of the claw 39 clears it of the back 426 of the handle 422 such that the claw can be drawn vertically upwardly from the cassette 42, leaving the cassette 42 either at the holding station 32 or within the holding tub 34.

These FIGS. 71A, 71B, and 71C also show slot ridges 430 formed inside the cassette on its bottom wall 432 and two side walls to engage and align the wafers 40. In one type of wafer cassette to be used with the invention, the very bottom of the cassette is open to suspend the wafers 40 above the legs 1442 of the cassette 42. In this cassette, the slot ridges 430 are formed on two 45° oriented bottom walls and the two opposed side walls.

FIGS. 72A, 72B, and 72C are elevational views showing the movement of wafer cassettes 42 as they are moved between a position within the holding tub 34 adjacent to the polishing apparatus 20, (from which wafers 40 from those cassettes 42 are easily raised and rotated into and out of the polishing apparatus 20) and a position at the remote holding station 32. Cassettes 42 at the remote cassette holding station 32 carry wafers 40 to be polished as received from earlier processing step and/or provide already polished wafer in cassettes 42 to a later processing step.

An example of the movement of cassettes 42 will now be described. As shown in FIG. 72A, the wrist assembly 37 is rotated so as to place the claw 39 in downwardly facing orientation with the wafer blade 38 positioned horizontally above and generally out of the way for the cassette movement.

The arm 35 is linearly positioned along the overhead track 36 such that its claw 39 is positioned to pass through the cassette handle 422 between its back 426 and the side wall 424 of the cassette 42 that it is to move.

As shown FIG. 72B, the arm 35 vertically displaces the claw 39 downwardly at the necessary offset angle to engage the handle 422 of cassette #1, as shown in the process of FIGS. 71A, 71B, and 71C. The arm 35 and attached claw 35 lifts the cassette from a first cassette position 1' in the holding tub 34 is deposits it, as illustrated in FIG. 72C, at the remote cassette holding station 32. The depositing step at the holding station 32 is the inverse of the lifting step at the holding tub 34, as has been described above.

It is anticipated that, as soon as a cassette 42 is deposited at the holding station 32, an operator will manually remove it so as to prevent slurry solidification or metal oxidation and soon thereafter replace it with a cassette of unpolished wafers. In the meantime, the transfer arm 35 can be transferring wafers 40 between the holding tub 34 and the transfer station 70 of the polishing apparatus 20. At a convenient time after the operator has deposited a cassette 42 of unpolished wafers 40 at the holding station 32, the transfer arm 35 then moves that cassette from the holding station 32 into the holding tub 34 in a series of operations that are the inverse of those of FIGS. 72A, 72B, and 72C.

The cassettes 42 that are moved between the holding station 32 and the holding tub 34 may be full of wafers or may be empty such that unpolished wafers are transferred from a full unpolished wafer cassette to an empty polished wafer receiving cassette, or in any other manner imaginable by persons of ordinary skill in the art.

Although a single holding station 32 has been described in the preferred embodiments, multiple holding stations are possible. In particular, a separate holding station may be utilized for unpolished wafers and another for polished wafers just as different holding tubs may be utilized for polished and unpolished wafers. Although the illustrated holding station accommodated only a single cassette, multiple cassettes may be accommodated as long as the wafer processing problems for excessively long storage have been addressed. Further, the different holding stations may be disposed on different sides of the polishing station.

The above described polishing system is complex and contains many novel features. Many of these features are inventive of themselves and useful in applications other than wafer polishing.

Although the described system includes four wafer heads, three polishing stations, and one transfer station, many of the inventive advantages can be enjoyed by other configurations using lesser or greater numbers of these elements.

Although the system has been described in terms of polishing semiconductor wafers, the term wafer can be used in the broader sense of any workpiece having a planar surface on at least one side thereof that requires polishing. In particular, glass and ceramics substrates and panels can be polished with the described invention. The workpiece need not be substantially circular as long as the wafer head is adapted to receive a non-circular workpiece.

The invention thus provides a polishing method apparatus having a high throughput of substrates being polished. The relatively simple design of the apparatus is mechanically rigid and occupies relatively little floor area. The polishing apparatus can be nearly completely automated, and it is easy to maintain and repair. The advantages of the design are accomplished by several novel mechanical parts that are applicable to technological fields other than polishing.

While the invention has been described with regards to specific embodiments, those skilled in the art will recognize that changes can be made in form and detail without departing from the spirit and scope of the invention.

What is claimed is:

1. A substrate polishing system, comprising:
a horizontally movable polishing surface;
a transfer station having a pedestal;
a substrate head capable of selectively holding a substrate on a rotatable lower surface thereof;
a movable support from which said substrate head depends and which is movable alternatively to a first position at which substrate head presses said substrate against said polishing surface and to a second position at which said substrate head overlies said transfer station to unload said substrate from said substrate head to said pedestal; and
at least one set of nozzles positioned laterally to a side of said pedestal and directed to clean a back side of said substrate supported on said pedestal and said lower surface of said substrate head while disposed at said second position.

2. The polishing system of claim 1, wherein said polishing surface is rotatable.

3. The polishing system of claim 1, wherein said set of nozzles includes two nozzles obliquely directed with respect to each other.

4. The polishing system of claim 1, wherein said support is rotatable to thereby move said substrate head between said first and second positions.

5. The polishing system of claim 1, wherein said pedestal is vertically movable between an upper position at which it receives said substrate from said substrate head and a lower position at which said nozzles clean said backside of said substrate and said lower surface of said substrate head.

6. The polishing system of claim 1, wherein said transfer station additionally functions as a load station to load said substrate from said pedestal to said substrate head while said substrate head is disposed at said second position.

7. The polishing system of claim 6, wherein said pedestal is vertically movable between an upper position at which it receives said substrate from and transfers said substrate to said substrate head and a lower position at which said nozzles clean said backside of said substrate and said lower surface of said substrate head.

8. The polishing system of claim 6, comprising a plurality of said polishing surfaces disposed at a corresponding plurality of said first positions and wherein said movable support is rotatable to thereby move said substrate head between any of said first positions and said second position.

9. A substrate polishing system, comprising:
a horizontally movable polishing surface;
a substrate head capable of selectively holding a substrate on a rotatable lower surface thereof;

a transfer/wash station having a pedestal and configured to transfer said substrate from said pedestal to said substrate head and from said substrate head to said pedestal and including at least one liquid nozzle directed to clean a bottom surface of said substrate head and said substrate; and a movable support from which said substrate head depends and which is movable alternatively to a first position at which substrate head presses said substrate against said polishing surface and to a second position at which said substrate head overlies said transfer/wash station to unload said substrate from said substrate head to said pedestal.

10. The polishing system of claim 9, further comprising a robot capable of transferring said substrate to and from said pedestal from a position remote from said polishing surface.

11. The polishing system of claim 9, wherein said support is rotatable between said first and second positions.

12. The polishing system of claim 11, comprising a plurality of said polishing surfaces and wherein said support is rotatable between any of a plurality of first positions at which said substrate head overlies respective ones of said polishing surfaces.

13. The polishing system of claim 11, further comprising a robot capable of transferring said substrate to and from said pedestal from a position remote from said polishing surface.

14. The polishing system of claim 9, wherein said at least one nozzle is positioned laterally to a side of said pedestal and directed to clean a back side of said substrate supported on said pedestal and said lower surface of said substrate head while disposed at said second position.

15. The polishing system of claim 14, wherein said pedestal is movable to an upper position at which said substrate is transferred between said pedestal and said substrate head and a lower position at which the at least one nozzle cleans said back side of said substrate supported on said pedestal and said lower surface of said substrate head while disposed at said second position.

16. A method of polishing, transferring, and cleaning a substrate, comprising the steps of:

selectively chucking the substrate on a bottom surface of a substrate head;

moving a support from which said substrate head depends from a polishing position at which said substrate head overlies a horizontally movable polishing surface to an unloading position at which said substrate head overlies an unload station;

prior to said moving step, engaging a front surface of said substrate chucked on said substrate head with said polishing surface and moving said polishing surface to thereby polish said front surface of said substrate;

after said moving step, transferring said substrate from said substrate head to a top surface of said unload station; and while said support is disposed at said unloading position, washing said bottom surface of said substrate head and said substrate.

17. The method of claim 16, wherein said washing step washes said bottom surface of said substrate head and both said front surface of said substrate and a back surface of said substrate.

18. The method of claim 17, wherein said washing step simultaneously washes said bottom surface of said substrate head and said back side of said substrate.

19. The method of claim 16, wherein moving said polishing surface includes rotating said polishing surface about a vertical axis.

20. The method of claim 16, wherein said moving step rotates said support to move said substrate head between said polishing position and said unloading position.

21. The method of claim 16, wherein said unload station additionally serves as a load station to transfer said substrate from said top surface to said substrate head.

22. The method of claim 16, further comprising, while said support is disposed at said unloading position, washing said front surface of said substrate.

23. The method of claim 16:

further comprising, after said moving step, vertically moving a pedestal within said unload station to an upper position adjacent to said substrate head disposed at said unloading position; and wherein said transferring step dechucks said substrate from said substrate head to said pedestal disposed at said upper position.

24. The method of claim 23:

further comprising, after said transferring step, vertically moving said pedestal to a lower position while said substrate is supported on said pedestal; and wherein said washing step is performed while said substrate is supported on said pedestal positioned at said lower position.

* * * * *